US009134617B2

(12) United States Patent
Senzaki et al.

(10) Patent No.: US 9,134,617 B2
(45) Date of Patent: Sep. 15, 2015

(54) SOLVENT DEVELOPABLE NEGATIVE RESIST COMPOSITION, RESIST PATTERN FORMATION METHOD, AND METHOD FOR FORMING PATTERN OF LAYER INCLUDING BLOCK COPOLYMER

(75) Inventors: Takahiro Senzaki, Kawasaki (JP); Ken Miyagi, Kawasaki (JP); Shigenori Fujikawa, Wako (JP); Mari Koizumi, Wako (JP); Harumi Hayakawa, Wako (JP)

(73) Assignees: TOKYO OHKA KOGYO CO., LTD., Kawasaki-Shi (JP); RIKEN, Wako-Shi (JP)

( * ) Notice: Subject to any disclaimer, the term of this patent is extended or adjusted under 35 U.S.C. 154(b) by 0 days.

(21) Appl. No.: 14/125,020

(22) PCT Filed: Jun. 8, 2012

(86) PCT No.: PCT/JP2012/064811
§ 371 (c)(1),
(2), (4) Date: Dec. 9, 2013

(87) PCT Pub. No.: WO2012/169620
PCT Pub. Date: Dec. 13, 2012

(65) Prior Publication Data
US 2014/0113236 A1    Apr. 24, 2014

(30) Foreign Application Priority Data

Jun. 10, 2011   (JP) .................................. 2011-130689
Dec. 27, 2011   (JP) .................................. 2011-285196

(51) Int. Cl.
*G03F 7/004*    (2006.01)
*G03F 7/32*    (2006.01)
(Continued)

(52) U.S. Cl.
CPC . *G03F 7/32* (2013.01); *B82Y 10/00* (2013.01); *B82Y 40/00* (2013.01); *C08F 220/10* (2013.01);
(Continued)

(58) Field of Classification Search
CPC ....... G03F 7/004; G03F 7/002; G03F 7/0045; G03F 7/0046; G03F 7/038; G03F 7/0397; G03F 7/32; G03F 7/325; G03F 7/20; C08F 220/10; C08F 220/26

USPC ............. 430/270.1, 312, 434, 435, 322, 325, 430/329, 330, 331
See application file for complete search history.

(56) References Cited

U.S. PATENT DOCUMENTS 5,910,392 A    6/1999  Nozaki et al.
5,945,517 A    8/1999  Nitta et al.
(Continued)

FOREIGN PATENT DOCUMENTS

EP    2 325 695 A1    5/2011
JP    A-09-208554     8/1997
(Continued)

OTHER PUBLICATIONS

Proceedings of SPIE, vol. 7637, 76370G-1, 2010.
(Continued)

*Primary Examiner* — Amanda C Walke
(74) *Attorney, Agent, or Firm* — Knobbe Martens Olson & Bear LLP

(57) ABSTRACT

A solvent developing negative-tone resist composition containing a base component (A) which exhibits increased polarity and reduced solubility in an organic solvent under action of an acid and an acid generator component (B) which generates an acid upon exposure, the component (A) including a resin component (A1) containing: a structural unit (a2) derived from an acrylate ester containing a 4- to 12-membered lactone-containing cyclic group, a 3- to 7-membered ether-containing cyclic group or a 5- to 7-membered carbonate-containing cyclic group; and a structural unit (a1) derived from an acrylate ester containing an acid decomposable group which exhibited increased polarity by the action of acid, and the acid generator component (B) including an acid generator (B1) containing a compound which generates a sulfonic acid upon exposure.

18 Claims, 1 Drawing Sheet

(51) Int. Cl.

| | | |
|---|---|---|
| C08F 220/10 | (2006.01) | |
| G03F 7/038 | (2006.01) | |
| G03F 7/039 | (2006.01) | |
| G03F 7/00 | (2006.01) | |
| B82Y 10/00 | (2011.01) | |
| B82Y 40/00 | (2011.01) | |

(52) U.S. Cl.
 CPC ............ *G03F 7/0002* (2013.01); *G03F 7/0045* (2013.01); *G03F 7/0046* (2013.01); *G03F 7/038* (2013.01); *G03F 7/0397* (2013.01); *G03F 7/325* (2013.01)

(56) References Cited

U.S. PATENT DOCUMENTS

| | | | |
|---|---|---|---|
| 6,153,733 | A | 11/2000 | Yukawa et al. |
| 8,039,196 | B2 * | 10/2011 | Kim et al. .................. 430/270.1 |
| 8,114,573 | B2 * | 2/2012 | Sandhu et al. ............. 430/270.1 |
| 8,399,174 | B2 * | 3/2013 | Kim et al. .................. 430/270.1 |
| 2004/0110085 | A1 | 6/2004 | Iwai et al. |
| 2007/0297644 | A1 | 12/2007 | Ishikawa et al. |
| 2008/0241742 | A1 | 10/2008 | Hoshino et al. |
| 2008/0261150 | A1 | 10/2008 | Tsubaki et al. |
| 2009/0226842 | A1 | 9/2009 | Shimizu et al. |
| 2009/0317743 | A1 | 12/2009 | Shiono et al. |
| 2010/0086873 | A1 | 4/2010 | Seshimo et al. |
| 2010/0136478 | A1 | 6/2010 | Kawaue et al. |
| 2010/0178609 | A1 | 7/2010 | Dazai et al. |
| 2010/0255419 | A1 * | 10/2010 | Kodama et al. ............. 430/270.1 |
| 2010/0297847 | A1 | 11/2010 | Cheng et al. |
| 2011/0003247 | A1 | 1/2011 | Ohashi et al. |
| 2011/0223537 | A1 * | 9/2011 | Ebata et al. ................ 430/270.1 |
| 2011/0236826 | A1 * | 9/2011 | Hatakeyama et al. ..... 430/270.1 |
| 2011/0240596 | A1 * | 10/2011 | Millward ........................ 216/41 |
| 2011/0244399 | A1 | 10/2011 | Hirano et al. |
| 2011/0311914 | A1 | 12/2011 | Kamimura et al. |
| 2012/0058427 | A1 | 3/2012 | Enomoto et al. |
| 2012/0077124 | A1 * | 3/2012 | Nakahara et al. .......... 430/285.1 |
| 2012/0077131 | A1 | 3/2012 | Enomoto et al. |
| 2012/0094234 | A1 * | 4/2012 | Matsuda et al. ........... 430/285.1 |
| 2012/0127454 | A1 | 5/2012 | Nakamura et al. |
| 2012/0148957 | A1 | 6/2012 | Enomoto et al. |
| 2012/0282548 | A1 | 11/2012 | Enomoto et al. |
| 2013/0113082 | A1 | 5/2013 | Enomoto et al. |
| 2014/0127626 | A1 * | 5/2014 | Senzaki et al. ............. 430/281.1 |

FOREIGN PATENT DOCUMENTS

| | | |
|---|---|---|
| JP | A-11-035551 | 2/1999 |
| JP | A-11-035552 | 2/1999 |
| JP | A-11-035573 | 2/1999 |
| JP | A-11-322707 | 11/1999 |
| JP | A-2002-090991 | 3/2002 |
| JP | 2003177518 A | 6/2003 |
| JP | 2003222999 A | 8/2003 |
| JP | A-2003-241385 | 8/2003 |
| JP | A-2006-169330 | 6/2006 |
| JP | A-2008-035491 | 2/2008 |
| JP | A-2008-036491 | 2/2008 |
| JP | A-2009-025723 | 2/2009 |
| JP | A-2009-155661 | 7/2009 |
| JP | A-2009-188318 | 8/2009 |
| JP | A-2010-002870 | 1/2010 |
| JP | A-2010-113334 | 5/2010 |
| JP | A-2010-160346 | 7/2010 |
| JP | A-2010-164712 | 7/2010 |
| JP | A-2010-164958 | 7/2010 |
| JP | A-2010-197619 | 9/2010 |
| JP | A-2010-286831 | 12/2010 |
| JP | A-2011-013479 | 1/2011 |
| JP | A-2011-022560 | 2/2011 |
| JP | A-2011-095607 | 5/2011 |
| JP | A-2011-100089 | 5/2011 |
| JP | A-2011-123469 | 6/2011 |
| JP | A-2011-141494 | 7/2011 |
| JP | A-2011-141495 | 7/2011 |
| JP | A-2011-191727 | 9/2011 |
| JP | A-2011-221513 | 11/2011 |
| JP | A-2012-032780 | 2/2012 |
| JP | A-2012-068628 | 4/2012 |
| JP | A-2012-108369 | 6/2012 |
| JP | A-2012-128383 | 7/2012 |
| WO | WO 2004/074242 A2 | 9/2004 |
| WO | WO 2012/043415 A1 | 4/2012 |
| WO | WO 2012/046770 A1 | 4/2012 |

OTHER PUBLICATIONS

Cheng et al., "Simple and Versatile Methods to Integrate Directed Self-Assembly with Optical Lithography Using a Polarity-Switched Photoresist" ACS NANO, vol. 4, No. 8, pp. 4815-4823, Jul. 15, 2010.

Sanders et al., "Integration of Directed Self-Assembly with 193 nm Lithography" Journal of Photopolymer Science and Technology, vol. 23, No. 1, pp. 11-18, Jul. 16, 2010.

International Search Report mailed on Jul. 3, 2012 in International Application No. PCT/JP2012/064811.

International Search Report issued in International Application No. PCT/JP2011/072986 on Nov. 1, 2011.

Office Action in U.S. Appl. No. 13/877,563, mailed Jun. 3, 2015.

Office Action in Japanese Patent Application No. 2012-537737, mailed Jul. 7, 2015.

* cited by examiner

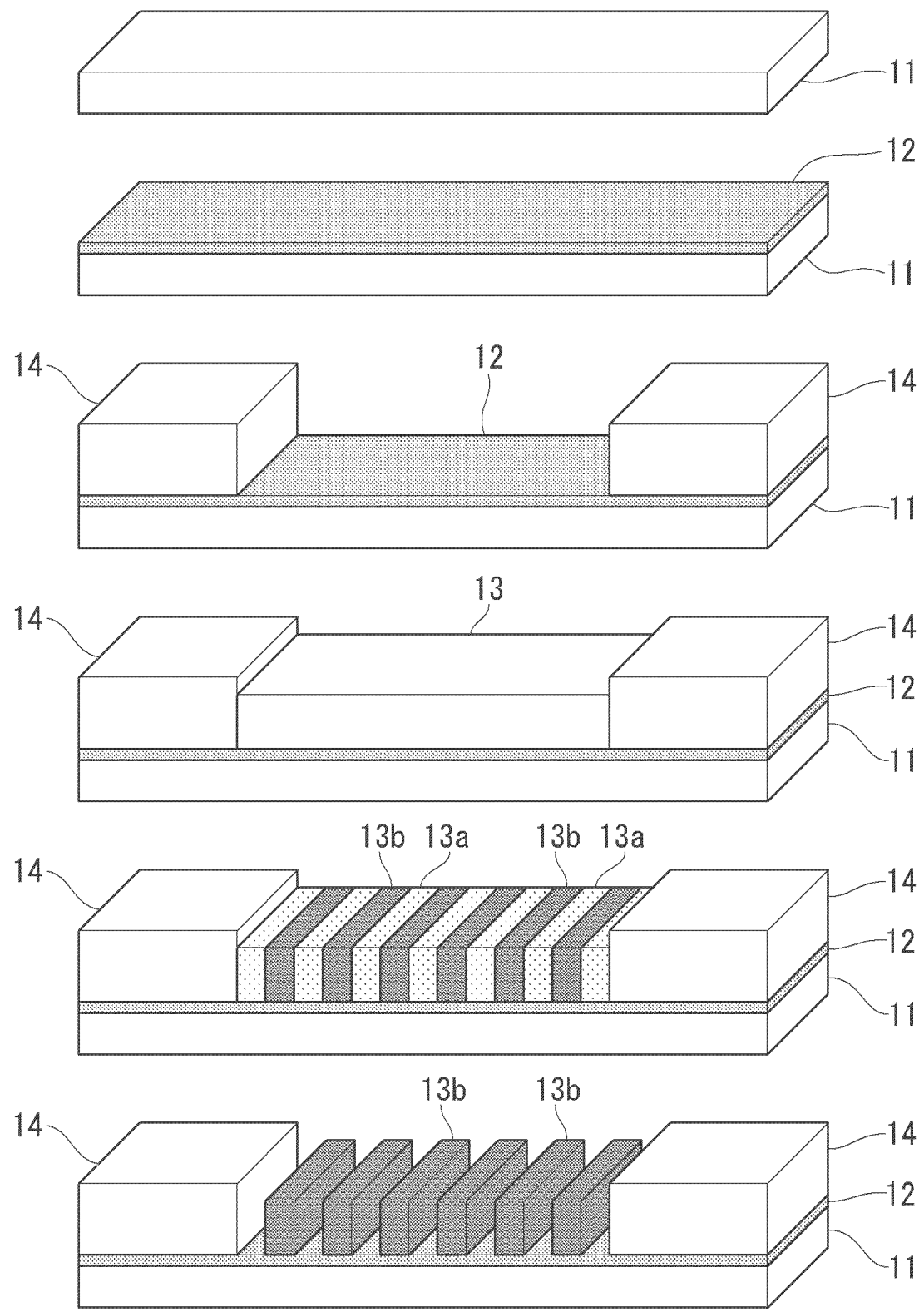

SOLVENT DEVELOPABLE NEGATIVE RESIST COMPOSITION, RESIST PATTERN FORMATION METHOD, AND METHOD FOR FORMING PATTERN OF LAYER INCLUDING BLOCK COPOLYMER

This application is the U.S. National Phase under 35 U.S.C. §371 of International Application No. PCT/JP2012/064811, filed Jun. 8, 2012, designating the U.S., and published in Japanese as WO 2012/169620 on Dec. 13, 2012, which claims priority to Japanese Patent Application No. 2011-130689, filed Jun. 10, 2011; and Japanese Patent Application No. 2011-285196, filed Dec. 27, 2011, 2011, the entire contents of which are incorporated herein by reference.

TECHNICAL FIELD

The present invention relates to a solvent developing negative-tone resist composition, a method of forming a resist pattern and a method of forming a pattern of a layer containing a block copolymer
Priority is claimed on Japanese Patent Application No. 2011-130689, filed Jun. 10, 2011, and Japanese Patent Application No. 2011-285196, filed Dec. 27, 2011, the contents of which are incorporated herein by reference.

DESCRIPTION OF RELATED ART

Techniques (pattern-forming techniques) in which a fine pattern is formed on top of a substrate, and a lower layer beneath that pattern is then fabricated by conducting etching with this pattern as a mask are widely used in the production of semiconductor devices and liquid display device. These types of fine patterns are usually formed from an organic material, and are formed, for example, using a lithography method or a nanoimprint method or the like. In lithography techniques, for example, a resist film formed from a resist material containing a base component such as a resin is formed on a support such as a substrate, and the resist film is subjected to selective exposure of radial rays such as light or electron beam, followed by development, thereby forming a resist pattern having a predetermined shape on the resist film. Using this resist pattern as a mask, a semiconductor or the like is produced by conducting a step in which the substrate is processed by etching.

The aforementioned resist material can be classified into positive types and negative types. Resist materials in which the exposed portions exhibit increased solubility in a developing solution is called a positive type, and a resist material in which the exposed portions exhibit decreased solubility in a developing solution is called a negative type.

In general, an aqueous alkali solution (alkali developing solution) such as an aqueous solution of tetramethylammonium hydroxide (TMAH) is used as the developing solution (hereafter, a process using an alkali developing solution is frequently referred to as "alkali developing process").

In recent years, advances in lithography techniques have led to rapid progress in the field of pattern miniaturization.

Typically, these miniaturization techniques involve shortening the wavelength (increasing the energy) of the exposure light source. Conventionally, ultraviolet radiation typified by g-line and i-line radiation has been used, but nowadays KrF excimer lasers and ArF excimer lasers are starting to be introduced in mass production of the semiconductor elements. Furthermore, research is also being conducted into lithography techniques that use an exposure light source having a wavelength shorter (energy higher) than these excimer lasers, such as electron beam (EB), extreme ultraviolet radiation (EUV), and X ray.

As shortening the wavelength of the exposure light source progresses, it is required to improve various lithography properties of the resist material, such as the sensitivity to the exposure light source and a resolution capable of reproducing patterns of minute dimensions. As resist materials which satisfy such requirements, chemically amplified resists are known.

As a chemically amplified composition, a composition including a base material component that exhibits a changed solubility in a developing solution under the action of acid and an acid generator component that generates acid upon exposure is generally used. For example, in the case where an alkali developing solution is used as a developing solution (alkali developing process), a base component which exhibits increased solubility in an alkali developing solution under action of acid is used.

Conventionally, a resin (base resin) is typically used as the base component of a chemically amplified resist composition. Resins that contain structural units derived from (meth) acrylate esters within the main chain (acrylic resins) are the mainstream as base resins for chemically amplified resist compositions that use ArF excimer laser lithography, as they exhibit excellent transparency in the vicinity of 193 nm.

Here, the term "(meth)acrylic acid" is a generic term that includes either or both of acrylic acid having a hydrogen atom bonded to the α-position and methacrylic acid having a methyl group bonded to the α-position. The term "(meth) acrylate ester" is a generic term that includes either or both of the acrylate ester having a hydrogen atom bonded to the α-position and the methacrylate ester having a methyl group bonded to the α-position. The term "(meth)acrylate" is a generic term that includes either or both of the acrylate having a hydrogen atom bonded to the α-position and the methacrylate having a methyl group bonded to the α-position.

In general, the base resin contains a plurality of structural units for improving lithography properties and the like. For example, a structural unit having a lactone structure and a structural unit having a polar group such as a hydroxy group are used, as well as a structural unit having an acid decomposable group which is decomposed by the action of an acid generated from the acid generator to form an alkali soluble group (for example, see Patent Document 1). When the base resin is an acrylic resin, as the acid decomposable group, in general, groups in which the carboxy group of (meth)acrylic acid or the like is protected with an acid dissociable group such as a tertiary alkyl group or an acetal group are used.

On the other hand, as acid generators usable in a chemically amplified resist composition, various types have been proposed including, for example, onium salt-based acid generators; oxime sulfonate-based acid generators; diazomethane-based acid generators; nitrobenzylsulfonate-based acid generators; iminosulfonate-based acid generators; and disulfone-based acid generators. Among these, as the onium salt-based acid generators, iodonium salts having an iodonium ion as the cation or sulfonium salts having a sulfonium ion as the cation have been conventionally used.

In a positive tone development process using a positive type, chemically amplified resist composition (i.e., a chemically amplified resist composition which exhibits increased solubility in an alkali developing solution upon exposure) in combination with an alkali developing solution, as described above, the exposed portions of the resist film are dissolved and removed by an alkali developing solution to form a resist pattern. The positive tone development process is advantageous over a negative tone development process in which a negative type, chemically amplified resist composition is used in combination with an alkali developing solution in that the structure of the photomask can be simplified, a satisfactory contrast for forming an image can be reliably obtained, and the characteristics of the formed resist pattern are excellent. For these reasons, currently, positive tone development process is tended to be used in the formation of an extremely fine resist pattern.

However, in the case of forming a trench pattern (isolated space pattern) or a hole pattern by the positive tone development process, it becomes necessary to form a resist pattern using an incident light weaker than that used in the case of a line pattern or a dot pattern, such that the contrast of the intensity of the incident light between exposed portions and unexposed portions becomes unsatisfactory. Therefore, pattern formation performance such as resolution tends to be restricted, and it becomes difficult to form a resist pattern with a high resolution.

In contrast, a negative tone development process using a negative type, chemically amplified resist composition (i.e., a chemically amplified resist composition which exhibits decreased solubility in an alkali developing solution upon exposure) in combination with an alkali developing solution is advantageous over the positive tone development process in the formation of a trench pattern or a hole pattern.

As a negative tone development process, a process has been proposed in which a positive type, chemically amplified resist composition is used in combination with a developing solution containing an organic solvent (hereafter, frequently referred to as "organic developing solution") (hereafter, a process using an organic developing solution is referred to as "solvent developing process" or "solvent developing negative tone process"). A positive type, chemically amplified resist composition exhibits increased solubility in an alkali developing solution upon exposure, but comparatively, the solubility in an organic solvent is decreased. Therefore, in a solvent developing negative tone process, the unexposed portions of the resist film are dissolved and removed by an organic developing solution to form a resist pattern (see, for example, Patent Document 2).

Recently, as further miniaturization of large scale integrated circuits (LSI) proceeds, a technology for processing a more delicate structure is demanded. In response to such demand, an attempt has already been started in which a fine pattern is formed using a phase-separated structure formed by self-assembly of a block copolymer having mutually incompatible polymers bonded together.

For using a phase separation of a block copolymer, it is necessary to form a self-assembly nano structure by a microphase separation only in specific regions, and arrange the nano structure in a desired direction. For realizing position control and orientational control, graphoepitaxy to control phase-separated pattern by a guide pattern and chemical epitaxy to control phase-separated pattern by difference in the chemical state of the substrate are proposed (see, for example, Non-Patent Document 1).

As a preferable method, there is disclosed a method in which an intermediate layer having a surface free energy of a mean value of the surface free energy of 2 block chains is formed on a substrate, so as to form a plurality of guide patterns on the substrate in which the surface free energy of a side face has a surface free energy close to the surface free energy of one of the 2 block chains (for example, see Patent Document 3).

DOCUMENTS OF RELATED ART

Patent Document

[Patent Document 1] Japanese Unexamined Patent Application, First Publication No. 2003-241385
[Patent Document 2] Japanese Unexamined Patent Application, First Publication No. 2009-025723
[Patent Document 3] Japanese Unexamined Patent Application, First Publication No. 2008-36491

Non-Patent Documents

[Non-Patent Document 1] Proceedings of SPIE (U.S.), vol. 7637, pp. 76370G-1 (2010)

SUMMARY OF THE INVENTION

Problem to be Resolved by the Invention

As further progress is made in lithography techniques and miniaturization of resist patterns, further improvement in resist materials has been demanded in terms of various lithography properties such as LWR and resist pattern shape.

For the reasons described above, since a trench pattern or a hole pattern can be obtained with a high contrast, in a solvent developing process, a mask having a large amount of portions where radiation is allowed to be transmitted during exposure (bright mask) is widely used. However, when the bright mask is used, since a large amount of acid is generated from the photoacid generator at exposed portions, a portion of the generated acid affects the unexposed portions, thereby deteriorating the lithography properties and the pattern shape.

Further, when a resist composition is used for forming a guide pattern in graphoepitaxy described above, the resist pattern requires solvent resistance and heat resistance. In terms of solvent resistance, a resist composition has been demanded, which can form a resist pattern with reduced thickness loss caused by developing solution at the pattern portions at the time of forming a resist pattern.

The present invention takes the above circumstances into consideration, with an object of providing a method of forming a resist pattern by a solvent developing negative tone process using a developing solution containing an organic solvent, which enables formation of a resist patterns with excellent lithography properties, pattern shape, and reduced thickness loss, and a solvent developing negative-tone resist composition used in the same method.

For solving the above-mentioned problems, the present invention employs the following aspects.

A first aspect of the present invention is a solvent developing negative-tone resist composition used for a method of forming a resist pattern, the method containing: forming a resist film on a substrate using a resist composition containing a base component (A) which exhibits reduced solubility in an organic solvent under action of an acid and an acid generator component (B) which generates an acid upon exposure, conducting exposure of the resist film, and patterning the resist film by a negative tone development using a developing solution containing an organic solvent to form a resist pattern, wherein the component (A) includes a resin component (A1) containing: a structural unit (a2) that is at least one structural unit selected from the group consisting of a structural unit derived from an acrylate ester containing a 4- to 12-membered lactone-containing cyclic group and which may have the hydrogen atom bonded to the carbon atom on the α-position substituted with a substituent, a structural unit derived from an acrylate ester containing a 3- to 7-membered ether-containing cyclic group and which may have the hydrogen atom bonded to the carbon atom on the α-position substituted with a substituent, and a structural unit derived from an acrylate ester containing a 5- to 7-membered carbonate-containing cyclic group and which may have the hydrogen atom bonded to the carbon atom on the α-position substituted with a substituent; and a structural unit (a1) that is derived from an acrylate ester containing an acid decomposable group which exhibited increased polarity by the action of acid and may have the hydrogen atom bonded to the carbon atom on the α-position substituted with a substituent, and the component (B) includes an acid generator (B1) containing a compound which generates a sulfonic acid upon exposure.

A second aspect of the present invention is a method of forming a resist pattern, including: using a solvent developing negative-tone resist composition of the first aspect to form a resist film on a substrate; conducting exposure of the resist film; and developing the resist film using a developing solution containing an organic solvent to form a resist pattern.

A third aspect of the present invention is a method of forming a pattern of a layer containing a block copolymer, the method including: a step in which an undercoat agent is applied to a substrate to form a layer containing the undercoat agent; a step in which a resist film is formed on a surface of the layer containing the undercoat agent by using the solvent developing negative-tone resist composition of the first aspect; a step in which the resist film is subjected to exposure; a step in which the resist film is subjected to developing using a developing solution containing an organic solvent to form a resist pattern; a step in which a layer containing a block copolymer having a plurality of blocks bonded is formed on a surface of the layer containing the undercoat agent having the resist pattern formed thereon, followed by a phase separation of the layer containing the block copolymer; and a step in which a phase containing at least one polymer of the plurality of polymers constituting the block copolymer is selectively removed from the layer containing the block copolymer.

In the present description and claims, the term "aliphatic" is a relative concept used in relation to the term "aromatic", and defines a group or compound that has no aromaticity.

The term "alkyl group" includes linear, branched or cyclic, monovalent saturated hydrocarbon, unless otherwise specified.

The term "alkylene group" includes linear, branched or cyclic, divalent saturated hydrocarbon, unless otherwise specified. The same applies for the alkyl group within an alkoxy group.

A "halogenated alkyl group" is a group in which part or all of the hydrogen atoms of an alkyl group is substituted with a halogen atom. Examples of the halogen atom include a fluorine atom, a chlorine atom, a bromine atom and an iodine atom.

A "fluorinated alkyl group" or a "fluorinated alkylene group" is a group in which part or all of the hydrogen atoms of an alkyl group or an alkylene group have been substituted with fluorine atom(s).

The term "structural unit" refers to a monomer unit that contributes to the formation of a polymeric compound (resin, polymer, copolymer).

An "acrylate ester" refers to a compound in which the terminal hydrogen atom of the carboxy group of acrylic acid ($CH_2=CH-COOH$) has been substituted with an organic group.

A "structural unit derived from an acrylate ester" refers to a structural unit that is formed by the cleavage of the ethylenic double bond of an acrylate ester.

Examples of the substituent bonded to the carbon atom on the α-position in the "acrylate ester which may have the hydrogen atom bonded to the carbon atom on the α-position substituted with a substituent" include a halogen atom, an alkyl group of 1 to 5 carbon atoms, a halogenated alkyl group of 1 to 5 carbon atoms and a hydroxyalkyl group. With respect to the "structural unit derived from an acrylate ester", the "α-position (the carbon atom on the α-position)" refers to the carbon atom having the carbonyl group bonded thereto, unless specified otherwise.

Examples of the halogen atom as the substituent which may be bonded to the carbon atom on the α-position include a fluorine atom, a chlorine atom, a bromine atom and an iodine atom.

Specific examples of the alkyl group of 1 to 5 carbon atoms for the substituent which may be bonded to the carbon atom on the α-position include linear or branched alkyl groups such as a methyl group, an ethyl group, a propyl group, an isopropyl group, an n-butyl group, an isobutyl group, a tert-butyl group, a pentyl group, an isopentyl group and a neopentyl group.

Specific examples of the halogenated alkyl group of 1 to 5 carbon atoms for the substituent include groups in which part or all of the hydrogen atoms of the aforementioned "alkyl group of 1 to 5 carbon atoms for the substituent" are substituted with halogen atoms. Examples of the halogen atom include a fluorine atom, a chlorine atom, a bromine atom and an iodine atom, and a fluorine atom is particularly desirable.

Specific examples of the hydroxyalkyl group of 1 to 5 carbon atoms for the substituent include groups in which part or all of the hydrogen atoms of the aforementioned "alkyl group of 1 to 5 carbon atoms for the substituent" are substituted with hydroxy groups.

In the present invention, it is preferable that a hydrogen atom, an alkyl group of 1 to 5 carbon atoms or a halogenated alkyl group of 1 to 5 carbon atoms is bonded to the carbon atom on the α-position, a hydrogen atom, an alkyl group of 1 to 5 carbon atoms or a fluorinated alkyl group of 1 to 5 carbon atoms is more preferable, and in terms of industrial availability, a hydrogen atom or a methyl group is the most desirable.

The term "(meth)acrylate ester" is a generic term that includes either or both of the acrylate ester having a hydrogen atom bonded to the α-position and the methacrylate ester having a methyl group bonded to the α-position.

The term "styrene" includes styrene itself and compounds in which the hydrogen atom at the α-position of styrene has been substituted with another substituent such as an alkyl group or a halogenated alkyl group.

A "structural unit derived from styrene or a styrene derivative" refers to a structural unit that is formed by the cleavage of the ethylenic double bond of styrene or a styrene derivative.

The term "exposure" is used as a general concept that includes irradiation with any form of radiation.

Advantageous Effect of the Invention

According to the present invention, there are provided a solvent developing negative-tone resist composition capable of forming a resist pattern with excellent lithography properties, pattern shape, and reduced thickness loss, a method of forming a resist pattern using the solvent developing negative-tone resist composition, and a method of forming a pattern of a layer containing a block copolymer using the solvent developing negative-tone resist composition.

BRIEF DESCRIPTION OF THE DRAWINGS

FIG. 1 is a diagram showing each step of the method of forming a pattern of a layer containing a block copolymer according to the third aspect of the present invention.

DETAILED DESCRIPTION OF THE INVENTION

<<Resist Composition>>

The solvent developing negative-tone resist composition (hereafter, frequently referred to simply as "resist composition") according to a first aspect of the present invention includes a base component (A) (hereafter, referred to as "component (A)") which exhibits reduced solubility in an organic solvent under action of an acid and an acid generator component (B) (hereafter, referred to as "component (B)") which generates an acid upon exposure, and is used in a method of forming a resist pattern including a steps in which a resist film is formed on a substrate using the resist composition, a step in which the resist film is exposed, and a step in which the resist film is patterned by a negative tone development using a developing solution containing an organic solvent to form a resist pattern.

In the resist composition, when radial rays are irradiated (when exposure is conducted), at exposed portions, acid is generated from the component (B), and the solubility of the component (A) in an organic solvent is decreased by the action of the generated acid. Therefore, in the formation of a resist pattern, by conducting selective exposure of a resist film formed by using the resist composition, the solubility of the resist film at the exposed portions in a developing solution containing an organic solvent is decreased, whereas the solubility at the unexposed portions in an organic developing solution is unchanged, and hence, a resist pattern can be formed by removing the unexposed portions by negative tone development using an organic developing solution.

<Component (A)>

In the present invention, the term "base component" refers to an organic compound capable of forming a film.

As the base component, an organic compound having a molecular weight of 500 or more is used. When the organic compound has a molecular weight of 500 or more, the organic compound exhibits a satisfactory film-forming ability, and a resist pattern of nano level can be easily formed.

The "organic compound having a molecular weight of 500 or more" is broadly classified into non-polymers and polymers.

In general, as a non-polymer, any of those which have a molecular weight in the range of 500 to less than 4,000 is used. Hereafter, a "low molecular weight compound" refers to a non-polymer having a molecular weight in the range of 500 to less than 4,000. As a polymer, any of those which have a molecular weight of 1,000 or more is generally used. In the present description and claims, the term "polymeric compound" refers to a polymer having a molecular weight of 1,000 or more.

With respect to a polymeric compound, the "molecular weight" is the weight average molecular weight in terms of the polystyrene equivalent value determined by gel permeation chromatography (GPC).

[Resin Component (A1)]

In the present invention, the component (A) includes a resin component (A1) (hereafter, referred to as "component (A1)") containing: a structural unit (a2) that is at least one structural unit selected from the group consisting of a structural unit derived from an acrylate ester containing a 4- to 12-membered lactone-containing cyclic group and which may have the hydrogen atom bonded to the carbon atom on the α-position substituted with a substituent, a structural unit derived from an acrylate ester containing a 3- to 7-membered ether-containing cyclic group and which may have the hydrogen atom bonded to the carbon atom on the α-position substituted with a substituent, and a structural unit derived from an acrylate ester containing a 5- to 7-membered carbonate-containing cyclic group and which may have the hydrogen atom bonded to the carbon atom on the α-position substituted with a substituent; and a structural unit (a1) that is derived from an acrylate ester containing an acid decomposable group which exhibited increased polarity by the action of acid and may have the hydrogen atom bonded to the carbon atom on the α-position substituted with a substituent.

In the component (A1) of the present invention, when acid is generated from the component (B) upon exposure, as described later, a part of the bond within an acid decomposable group of the structural unit (a1) is cleaved by the action of acid to exhibit increased polarity of the component (A1) at exposed portions. As a result, at exposed portions, the solubility of the component (A1) in an organic developing solution containing an organic solvent is decreased, whereas at unexposed portions, the solubility of the component (A1) in an organic developing solution is not changed and a high level of solubility is maintained, thereby generating dissolution contrast between the exposed portions and the unexposed portions to form a pattern.

Further, in the component (A1) of the present invention, when acid is generated from the component (B) upon exposure, in addition to the increase in the polarity, a lactone-containing cyclic group, ether-containing cyclic group or carbonate-containing cyclic group within the structural unit (a2) is cleaved by the action of acid to increase the molecular weight of the component (A1) at exposed portions. As a result, as well as a conventional solvent developing negative-tone resist composition which contains an epoxy resin and a polymerization initiator, the solubility of the component (A1) at exposed portions in an organic developing solution is decreased due to the increased molecular weight thereof, whereas at unexposed portions, the solubility of the component (A1) in an organic developing solution is not changed and a high level of solubility is maintained, thereby further improving dissolution contrast between the exposed portions and the unexposed portions to form a pattern with excellent resolution. Further, the polymerized component (A1) forms a pattern portion with excellent solvent resistance and heat resistance, as compared to the non-polymerized component (A1).

Although the resist composition of the present invention is a solvent developing negative-tone resist composition, when the resist composition is used in an alkali developing process, the polarity of the structural unit (a1) is increased by the action of acid. As a result, the solubility of the exposed portions in an alkali developing solution is increased, whereas the solubility of the unexposed portions in an alkali developing solution is unchanged and a low solubility is maintained. In addition, the molecular weight is increased due to the structural unit (a2). As a result, the solubility of the exposed portions in an alkali developing solution is decreased, whereas the solubility of the unexposed portions in an alkali developing solution is unchanged and a low solubility is maintained. The change of the solubility at exposed portions depends on the degree of increase in the solubility due to the structural unit (a1) and the degree of decrease in the solubility due to the structural unit (a2). Therefore, the solubility can be changed depending on the amount ratio of these structural units in the resin. However, in general, the major factor to control the solubility is the molecular weight. Therefore, it is presumed that there are many cases where the solubility at exposed portions is decreased. Therefore, when the resist composition is used in an alkali developing process, it is presumed that dissolution contrast cannot be obtained and a pattern cannot be formed.

The component (A1) may include a structural unit (a0) derived from an acrylate ester containing an —$SO_2$— containing cyclic group, and which may have the hydrogen atom bonded to the carbon atom on the α-position substituted with a substituent, as well as the structural units (a1) and (a2).

Furthermore, the component (A1) may include a structural unit (a3) derived from an acrylate ester containing a polar group-containing aliphatic hydrocarbon group, and which may have the hydrogen atom bonded to the carbon atom on the α-position substituted with a substituent, as well as the structural units (a1) and (a2), or the structural units (a1), (a2) and (a0).

(Structural Unit (a1))

The structural unit (a1) is a structural unit derived from an acrylate ester containing an acid decomposable group which exhibited increased polarity by the action of acid and may have the hydrogen atom bonded to the carbon atom on the α-position substituted with a substituent.

The term "acid decomposable group" refers to a group in which at least a part of the bond within the structure thereof is cleaved by the action of acid generated from the component (B) upon exposure.

Examples of acid decomposable groups which exhibit increased polarity by the action of an acid include groups which are decomposed by the action of acid to form a polar group.

Examples of the polar group include a carboxy group, a hydroxy group, an amino group and a sulfo group (—$SO_3H$). Among these, a polar group containing —OH in the structure thereof (hereafter, frequently referred to as "OH-containing polar group") is preferable, a carboxy group or a hydroxy group is more preferable, and a carboxy group is particularly desirable.

More specifically, as an example of an acid decomposable group, a group in which the aforementioned polar group has been protected with an acid dissociable group (such as a group in which the hydrogen atom of the OH-containing polar group has been protected with an acid dissociable group) can be given.

An "acid dissociable group" is a group in which at least the bond between the acid dissociable group and the adjacent carbon atom is cleaved by the action of an acid (acid generated from the component (B) upon exposure). It is necessary that the acid dissociable group that constitutes the acid decomposable group is a group which exhibits a lower polarity than the polar group generated by the dissociation of the acid dissociable group. Thus, when the acid dissociable group is dissociated by the action of acid, a polar group exhibiting a higher polarity than that of the acid dissociable group is generated, thereby increasing the polarity. As a result, the polarity of the entire component (A1) is increased. By the increase in the polarity, the solubility in an organic developing solution containing an organic solvent decreases.

As the acid dissociable group for the structural unit (a1), any of those which have been proposed as acid dissociable groups for a base resin of a chemically amplified resist may be used. Generally, groups that form either a cyclic or chain-like tertiary alkyl ester with the carboxyl group of the (meth) acrylic acid, and acetal-type acid dissociable groups such as alkoxyalkyl groups are widely known.

Here, a tertiary alkyl ester describes a structure in which an ester is formed by substituting the hydrogen atom of a carboxyl group with a chain-like or cyclic tertiary alkyl group, and a tertiary carbon atom within the chain-like or cyclic tertiary alkyl group is bonded to the oxygen atom at the terminal of the carbonyloxy group (—C(C=O)—O—). In this tertiary alkyl ester, the action of acid causes cleavage of the bond between the oxygen atom and the tertiary carbon atom, thereby forming a carboxy group. As a result, the polarity of the component (A1) is increased.

The chain-like or cyclic alkyl group may have a substituent.

Hereafter, for the sake of simplicity, groups that exhibit acid dissociability as a result of the formation of a tertiary alkyl ester with a carboxyl group are referred to as "tertiary alkyl ester-type acid dissociable groups".

Examples of tertiary alkyl ester-type acid dissociable groups include aliphatic branched, acid dissociable groups and aliphatic cyclic group-containing acid dissociable groups.

In the present description and claims, the term "aliphatic branched" refers to a branched structure having no aromaticity.

The "aliphatic branched, acid dissociable group" is not limited to be constituted of only carbon atoms and hydrogen atoms (not limited to hydrocarbon groups), but is preferably a hydrocarbon group.

Further, the "hydrocarbon group" may be either saturated or unsaturated, but is preferably saturated.

Examples of aliphatic branched, acid dissociable groups include tertiary alkyl groups of 4 to 8 carbon atoms, and specific examples include a tert-butyl group, tert-pentyl group and tert-heptyl group.

The term "aliphatic cyclic group" refers to a monocyclic group or polycyclic group that has no aromaticity.

The "aliphatic cyclic group" within the structural unit (a1) may or may not have a substituent. Examples of the substituent include an alkyl group of 1 to 5 carbon atoms, an alkoxy group of 1 to 5 carbon atoms, a fluorine atom, a fluorinated alkyl group of 1 to 5 carbon atoms, and an oxygen atom (=O).

The basic ring of the "aliphatic cyclic group" exclusive of substituents is not limited to be constituted from only carbon and hydrogen (not limited to hydrocarbon groups), but is preferably a hydrocarbon group. Further, the "hydrocarbon group" may be either saturated or unsaturated, but is preferably saturated. Furthermore, the "aliphatic cyclic group" is preferably a polycyclic group.

As such aliphatic cyclic groups, groups in which one or more hydrogen atoms have been removed from a monocycloalkane or a polycycloalkane such as a bicycloalkane, tricycloalkane or tetracycloalkane which may or may not be substituted with an alkyl group of 1 to 5 carbon atoms, a fluorine atom or a fluorinated alkyl group, may be used. Specific examples include groups in which one or more hydrogen atoms have been removed from a monocycloalkane such as cyclopentane and cyclohexane; and groups in which one or more hydrogen atoms have been removed from a polycycloalkane such as adamantane, norbornane, isobornane, tricyclodecane or tetracyclododecane.

As the aliphatic cyclic group-containing acid dissociable group, for example, a group which has a tertiary carbon atom on the ring structure of the cycloalkyl group can be used. Specific examples include groups represented by any one of general formulas (1-1) to (1-9) shown below, such as a 2-methyl-2-adamantyl group and a 2-ethyl-2-adamantyl group.

Further, as examples of aliphatic branched acid dissociable group, groups having an aliphatic cyclic group such as an adamantyl group, cyclohexyl group, cyclopentyl group, norbornyl group, tricyclodecyl group or tetracyclododecyl group, and a branched alkylene group having a tertiary carbon atom bonded thereto, as those represented by general formulas (2-1) to (2-6) shown below, can be given.

[Chemical Formula 1]

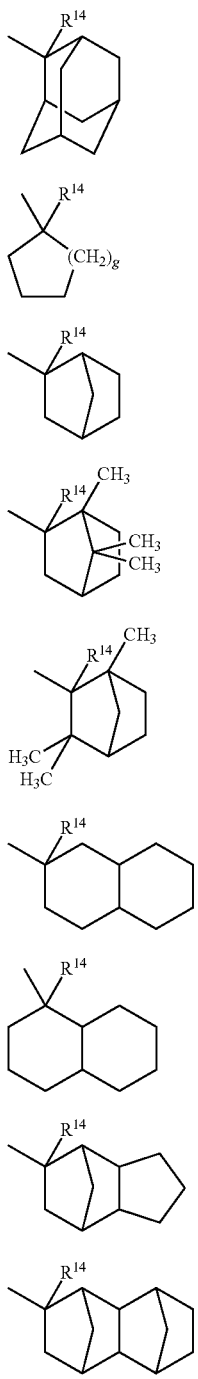

(1-1)
(1-2)
(1-3)
(1-4)
(1-5)
(1-6)
(1-7)
(1-8)
(1-9)

In the formulae above, $R^{14}$ represents an alkyl group; and g represents an integer of 0 to 8.

[Chemical Formula 2]

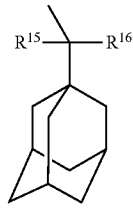
(2-1)

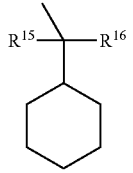
(2-2)

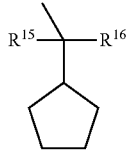
(2-3)

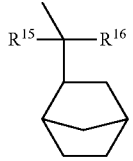
(2-4)

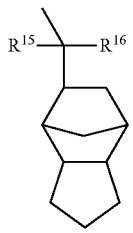
(2-5)

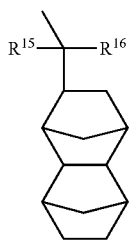
(2-6)

In the formulae, each of $R^{15}$ and $R^{16}$ independently represents an alkyl group (which may be linear or branched, and preferably has 1 to 5 carbon atoms).

As the alkyl group for $R^{14}$, a linear or branched alkyl group is preferable.

The linear alkyl group preferably has 1 to 5 carbon atoms, more preferably 1 to 4, and still more preferably 1 or 2. Specific examples include a methyl group, an ethyl group, an n-propyl group, an n-butyl group and an n-pentyl group. Among these, a methyl group, an ethyl group or an n-butyl group is preferable, and a methyl group or an ethyl group is more preferable.

The branched alkyl group preferably has 3 to 10 carbon atoms, and more preferably 3 to 5. Specific examples of such branched alkyl groups include an isopropyl group, an isobutyl group, a tert-butyl group, an isopentyl group and a neopentyl group, and an isopropyl group is particularly desirable.

g is preferably an integer of 0 to 3, more preferably an integer of 1 to 3, and still more preferably 1 or 2.

As the alkyl group for $R^{15}$ to $R^{16}$, the same alkyl groups as those for $R^{14}$ can be used.

In formulas (1-1) to (1-9) and (2-1) to (2-6), part of the carbon atoms constituting the ring may be replaced with an ethereal oxygen atom (—O—).

Further, in formulas (1-1) to (1-9) and (2-1) to (2-6), one or more of the hydrogen atoms bonded to the carbon atoms constituting the ring may be substituted with a substituent. Examples of the substituent include an alkyl group of 1 to 5 carbon atoms, a fluorine atom and a fluorinated alkyl group.

An "acetal-type acid dissociable group" generally substitutes a hydrogen atom at the terminal of an OH-containing polar group such as a carboxy group or hydroxyl group, so as to be bonded with an oxygen atom. When acid is generated upon exposure, the generated acid acts to break the bond between the acetal-type acid dissociable group and the oxygen atom to which the acetal-type, acid dissociable group is bonded, thereby forming an OH-containing polar group such as a carboxy group or a hydroxy group. As a result, the polarity of the component (A1) is increased.

Examples of acetal-type acid dissociable groups include groups represented by general formula (p1) shown below.

[Chemical Formula 3]

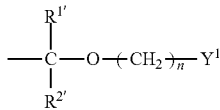

(p1)

In the formula, $R^{1\prime}$ and $R^{2\prime}$ each independently represent a hydrogen atom or an alkyl group of 1 to 5 carbon atoms; n represents an integer of 0 to 3; and $Y^1$ represents an alkyl group of 1 to 5 carbon atoms or an aliphatic cyclic group.

In general formula (p1) above, n is preferably an integer of 0 to 2, more preferably 0 or 1, and most preferably 0.

As the alkyl group of 1 to 5 carbon atoms for $R^{1\prime}$ and $R^{2\prime}$, the same alkyl groups of 1 to 5 carbon atoms as those described above for the substituent which may be bonded to the carbon atom on the α-position can be used, although a methyl group or ethyl group is preferable, and a methyl group is particularly desirable.

In the present invention, it is preferable that at least one of $R^{1\prime}$ and $R^{2\prime}$ be a hydrogen atom. That is, it is preferable that the acid dissociable group (p1) is a group represented by general formula (p1-1) shown below.

[Chemical Formula 4]

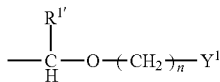

(p1-1)

In the formula, $R^{1\prime}$, n and $Y^1$ are the same as defined above.

As the alkyl group of 1 to 5 carbon atoms for $Y^1$, the same alkyl groups of 1 to 5 carbon atoms as those described above for the substituent which may be bonded to the carbon atom on the α-position can be used.

As the aliphatic cyclic group for $Y^1$, any of the aliphatic monocyclic/polycyclic groups which have been proposed for conventional ArF resists and the like can be appropriately selected for use. For example, the same groups described above in connection with the "aliphatic cyclic group" can be used.

Further, as the acetal-type, acid dissociable group, groups represented by general formula (p2) shown below can also be used.

[Chemical Formula 5]

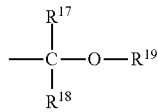

(p2)

In the formula, $R^{17}$ and $R^{18}$ each independently represent a linear or branched alkyl group or a hydrogen atom; and $R^{19}$ represents a linear, branched or cyclic alkyl group; or $R^{17}$ and $R^{19}$ each independently represents a linear or branched alkylene group, wherein the terminal of $R^{17}$ may be bonded to the terminal of $R^{19}$ to form a ring.

The alkyl group for $R^{17}$ and $R^{18}$ preferably has 1 to 15 carbon atoms, and may be either linear or branched. As the alkyl group, an ethyl group or a methyl group is preferable, and a methyl group is most preferable. It is particularly desirable that either one of $R^{17}$ and $R^{18}$ be a hydrogen atom, and the other be a methyl group.

$R^{19}$ represents a linear, branched or cyclic alkyl group which preferably has 1 to 15 carbon atoms, and may be any of linear, branched or cyclic.

When $R^{19}$ represents a linear or branched alkyl group, it is preferably an alkyl group of 1 to 5 carbon atoms, more preferably an ethyl group or methyl group, and most preferably an ethyl group.

When $R^{19}$ represents a cycloalkyl group, it preferably has 4 to 15 carbon atoms, more preferably 4 to 12 carbon atoms, and most preferably 5 to 10 carbon atoms. As examples of the cycloalkyl group, groups in which one or more hydrogen atoms have been removed from a monocycloalkane or a polycycloalkane such as a bicycloalkane, tricycloalkane or tetracycloalkane, which may or may not be substituted with a fluorine atom or a fluorinated alkyl group, may be used. Examples of such groups include groups in which one or more hydrogen atoms have been removed from a monocycloalkane such as cyclopentane or cyclohexane; and groups in which one or more hydrogen atoms have been removed from a polycycloalkane such as adamantane, norbornane, isobornane, tricyclodecane or tetracyclododecane. Among these, a group in which one or more hydrogen atoms have been removed from adamantane is preferable.

In general formula (p2) above, $R^{17}$ and $R^{19}$ may each independently represent a linear or branched alkylene group (preferably an alkylene group of 1 to 5 carbon atoms), and the terminal of $R^{19}$ may be bonded to the terminal of $R^{17}$.

In such a case, a cyclic group is formed by $R^{17}$, $R^{19}$, the oxygen atom having $R^{19}$ bonded thereto, and the carbon atom having the oxygen atom and $R^{17}$ bonded thereto. Such a cyclic group is preferably a 4 to 7-membered ring, and more preferably a 4 to 6-membered ring. Specific examples of the cyclic group include tetrahydropyranyl group and tetrahydrofuranyl group.

As the structural unit (a1), it is preferable to use at least one member selected from the group consisting of structural units represented by formula (a1-0-1) shown below and structural units represented by formula (a1-0-2) shown below.

[Chemical Formula 6]

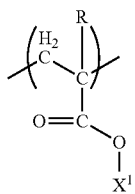

(a1-0-1)

In the formula, R represents a hydrogen atom, an alkyl group of 1 to 5 carbon atoms or a halogenated alkyl group of 1 to 5 carbon atoms; and $X^1$ represents an acid dissociable group.

[Chemical Formula 7]

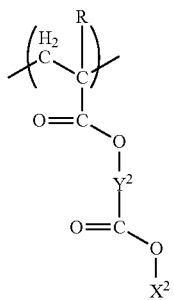

(a1-0-2)

In the formula, R represents a hydrogen atom, an alkyl group of 1 to 5 carbon atoms or a halogenated alkyl group of 1 to 5 carbon atoms; $X^2$ represents an acid dissociable group; and $Y^2$ represents a divalent linking group.

In general formula (a1-0-1) above, the alkyl group of 1 to 5 carbon atoms or halogenated alkyl group of 1 to 5 carbon atoms for R are the same as the alkyl group of 1 to 5 carbon atoms or halogenated alkyl group of 1 to 5 carbon atoms which can be used as the substituent for the hydrogen atom bonded to the carbon atom on the α-position of the aforementioned acrylate ester.

$X^1$ is not particularly limited as long as it is an acid dissociable group. Examples thereof include the aforementioned tertiary alkyl ester-type acid dissociable groups and acetal-type acid dissociable groups, and tertiary alkyl ester-type acid dissociable groups are preferable.

In general formula (a1-0-2), R is the same as defined above.

$X^2$ is the same as defined for $X^1$ in general formula (a1-0-1).

As preferable examples of the divalent linking group for $Y^2$, a divalent hydrocarbon group which may have a substituent, and a divalent linking group containing a hetero atom can be given.

A hydrocarbon "has a substituent" means that part or all of the hydrogen atoms within the hydrocarbon group is substituted with groups or atoms other than hydrogen.

The hydrocarbon group may be either an aliphatic hydrocarbon group or an aromatic hydrocarbon group. An "aliphatic hydrocarbon group" refers to a hydrocarbon group that has no aromaticity.

The aliphatic hydrocarbon group may be saturated or unsaturated. In general, the aliphatic hydrocarbon group is preferably saturated.

As specific examples of the aliphatic hydrocarbon group as the hydrocarbon group for $Y^2$, a linear or branched aliphatic hydrocarbon group, and an aliphatic hydrocarbon group having a ring in the structure thereof can be given.

The linear or branched aliphatic hydrocarbon group preferably has 1 to 10 carbon atoms, more preferably 1 to 8, still more preferably 1 to 5, and most preferably 1 or 2.

As the linear aliphatic hydrocarbon group, a linear alkylene group is preferable, and specific examples include a methylene group [—$CH_2$—], an ethylene group [—($CH_2$)$_2$—], a trimethylene group [—($CH_2$)$_3$—], a tetramethylene group [—($CH_2$)$_4$—] and a pentamethylene group [—($CH_2$)$_5$—].

As the branched aliphatic hydrocarbon group, a branched alkylene group is preferable, and specific examples include alkylalkylene groups, e.g., alkylmethylene groups such as —CH($CH_3$)—, —CH($CH_2CH_3$)—, —C($CH_3$)$_2$—, —C($CH_3$)($CH_2CH_3$)—, —C($CH_3$)($CH_2CH_2CH_3$)—, and —C($CH_2CH_3$)$_2$—; alkylethylene groups such as —CH($CH_3$)$CH_2$—, —CH($CH_3$)CH($CH_3$)—, —C($CH_3$)$_2CH_2$—, —CH($CH_2CH_3$)$CH_2$—, and —C($CH_2CH_3$)$_2$—$CH_2$—; alkyltrimethylene groups such as —CH($CH_3$)$CH_2CH_2$—, and —$CH_2$CH($CH_3$)$CH_2$—; and alkyltetramethylene groups such as —CH($CH_3$)$CH_2CH_2CH_2$—, and —$CH_2$CH($CH_3$)$CH_2CH_2$—. As the alkyl group within the alkylalkylene group, a linear alkyl group of 1 to 5 carbon atoms is preferable.

The linear or branched aliphatic hydrocarbon group (chain-like aliphatic hydrocarbon group) may or may not have a substituent. Examples of the substituent include a fluorine atom, a fluorinated alkyl group of 1 to 5 carbon atoms, and an oxygen atom (=O).

As examples of the aliphatic hydrocarbon group containing a ring in the structure thereof, a cyclic aliphatic hydrocarbon group (a group in which two hydrogen atoms have been removed from an aliphatic hydrocarbon ring), and a group in which the cyclic aliphatic hydrocarbon group is bonded to the terminal of the aforementioned chain-like aliphatic hydrocarbon group or interposed within the aforementioned chain-like aliphatic hydrocarbon group, can be given.

The cyclic aliphatic hydrocarbon group preferably has 3 to 20 carbon atoms, and more preferably 3 to 12 carbon atoms.

The cyclic aliphatic hydrocarbon group may be either a polycyclic group or a monocyclic group. As the monocyclic group, a group in which two hydrogen atoms have been removed from a monocycloalkane of 3 to 6 carbon atoms is preferable. Examples of the monocycloalkane include cyclopentane and cyclohexane.

As the polycyclic group, a group in which two hydrogen atoms have been removed from a polycycloalkane of 7 to 12 carbon atoms is preferable. Examples of the polycycloalkane include adamantane, norbornane, isobornane, tricyclodecane and tetracyclododecane.

The cyclic aliphatic hydrocarbon group may or may not have a substituent. Examples of the substituent include an alkyl group of 1 to 5 carbon atoms, a fluorine atom, a fluorinated alkyl group of 1 to 5 carbon atoms, and an oxygen atom (=O).

Examples of the aforementioned aromatic hydrocarbon group as the hydrocarbon group for $Y^2$ include a divalent aromatic hydrocarbon group in which one hydrogen atom has been removed from a benzene ring of a monovalent aromatic hydrocarbon group such as a phenyl group, a biphenyl group, a fluorenyl group, a naphthyl group, an anthryl group or a phenanthryl group; an aromatic hydrocarbon group in which part of the carbon atoms constituting the ring of the aforementioned divalent aromatic hydrocarbon group has been substituted with a hetero atom such as an oxygen atom, a sulfur atom or a nitrogen atom; and an aromatic hydrocarbon group in which one hydrogen atom has been removed from a benzene ring of an arylalkyl group such as a benzyl group, a phenethyl group, a 1-naphthylmethyl group, a 2-naphthylmethyl group, a 1-naphthylethyl group or a 2-naphthylethyl group.

The aromatic hydrocarbon group may or may not have a substituent. Examples of the substituent include an alkyl group of 1 to 5 carbon atoms, a fluorine atom, a fluorinated alkyl group of 1 to 5 carbon atoms, and an oxygen atom (=O).

When $Y^2$ represents a divalent linking group containing a hetero atom, examples thereof include —O—, —C(C=O)—O—, —C(C=O)—, —O—C(C=O)—O—, —C(C=O)—NH—, —NH— (H may be substituted with a substituent such as an alkyl group or an acyl group), —S—, —S(=O)$_2$—, —S(=O)$_2$—O—, "-A-O—B— (wherein O is an oxygen atom, and each of A and B independently represents a divalent hydrocarbon group which may have a substituent)" and a combination of a divalent hydrocarbon group which may have a substituent with a divalent linking group containing a hetero atom. As examples of the divalent hydrocarbon group which may have a substituent, the same groups as those described above for the hydrocarbon group which may have a substituent can be given, and a linear or branched aliphatic hydrocarbon group or an aliphatic hydrocarbon group containing a ring in the structure thereof is preferable.

When $Y^2$ represents a divalent linking group —NH— and the H in the formula is replaced with a substituent such as an alkyl group or an acyl group, the substituent preferably has 1 to 10 carbon atoms, more preferably 1 to 8 carbon atoms, and most preferably 1 to 5 carbon atoms.

When $Y^2$ is "A-O—B", each of A and B independently represents a divalent hydrocarbon group which may have a substituent.

The hydrocarbon group for A may be either an aliphatic hydrocarbon group, or an aromatic hydrocarbon group. An "aliphatic hydrocarbon group" refers to a hydrocarbon group that has no aromaticity.

The aliphatic hydrocarbon group for A may be either saturated or unsaturated. In general, the aliphatic hydrocarbon group is preferably saturated.

As specific examples of the aliphatic hydrocarbon group for A, a linear or branched aliphatic hydrocarbon group, and an aliphatic hydrocarbon group having a ring in the structure thereof can be given. These are the same as defined above.

Among these, as A, a linear aliphatic hydrocarbon group is preferable, more preferably a linear alkylene group, still more preferably a linear alkylene group of 2 to 5 carbon atoms, and most preferably an ethylene group.

As the hydrocarbon group for B, the same divalent hydrocarbon groups as those described above for A can be used.

As B, a linear or branched aliphatic hydrocarbon group is preferable, and a methylene group or an alkylmethylene group is particularly desirable.

The alkyl group within the alkyl methylene group is preferably a linear alkyl group of 1 to 5 carbon atoms, more preferably a linear alkyl group of 1 to 3 carbon atoms, and most preferably a methyl group.

Specific examples of the structural unit (a1) include structural units represented by general formulas (a1-1) to (a1-4) shown below.

[Chemical Formula 8]

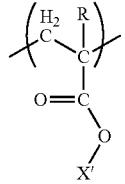

(a1-1)

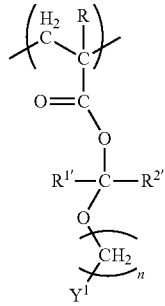

(a1-2)

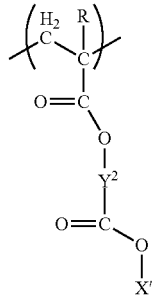

(a1-3)

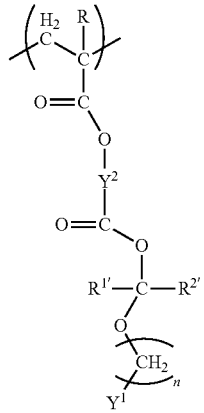

(a1-4)

In the formulas, X' represents a tertiary alkyl ester-type acid dissociable group; $Y^1$ represents an alkyl group of 1 to 5 carbon atoms or an aliphatic cyclic group; n represents an integer of 0 to 3; $Y^2$ represents a divalent linking group; R is the same as defined above; and each of $R^{1'}$ and $R^{2'}$ independently represents a hydrogen atom or an alkyl group of 1 to 5 carbon atoms.

Examples of the tertiary alkyl ester-type acid dissociable group for X' include the same tertiary alkyl ester-type acid dissociable groups as those described above for $X^1$.

As $R^{1'}$, $R^{2'}$, n and $Y^1$ are respectively the same as defined for $R^{1'}$, $R^{2'}$, n and $Y^1$ in general formula (p1) described above in connection with the "acetal-type acid dissociable group".

$Y^2$ is the same as defined for $Y^2$ in general formula (a1-0-2).

Specific examples of structural units represented by general formulae (a1-1) to (a1-4) are shown below.
In the formulas shown below, $R^\alpha$ represents a hydrogen atom, a methyl group or a trifluoromethyl group.
[Chemical Formula 9]
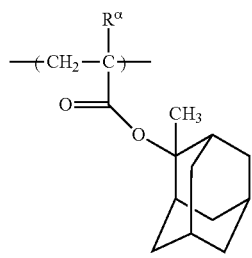
(a1-1-1)
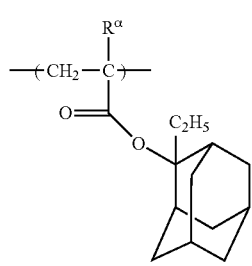
(a1-1-2)
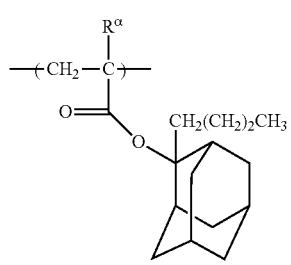
(a1-1-3)
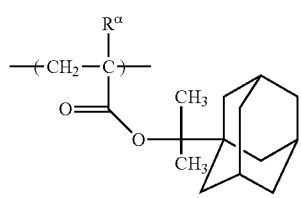
(a1-1-4)
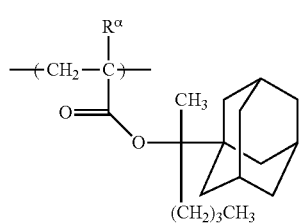
(a1-1-5)
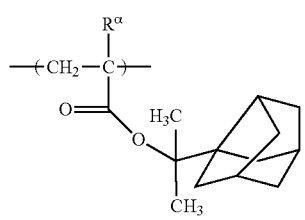
(a1-1-6)
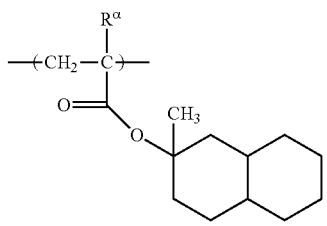
(a1-1-7)
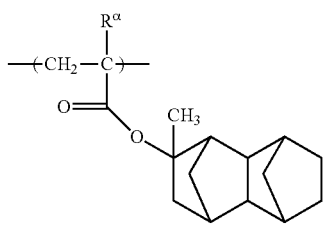
(a1-1-8)
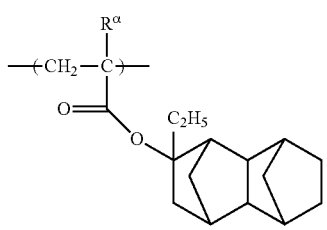
(a1-1-9)
[Chemical Formula 10]
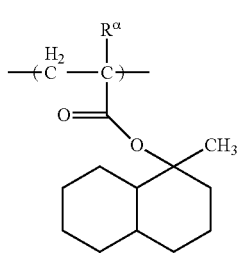
(a1-1-10)
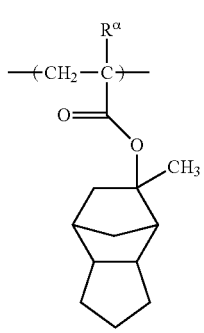
(a1-1-11)
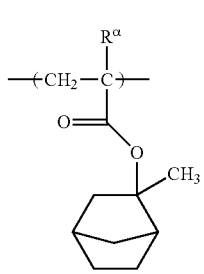
(a1-1-12)

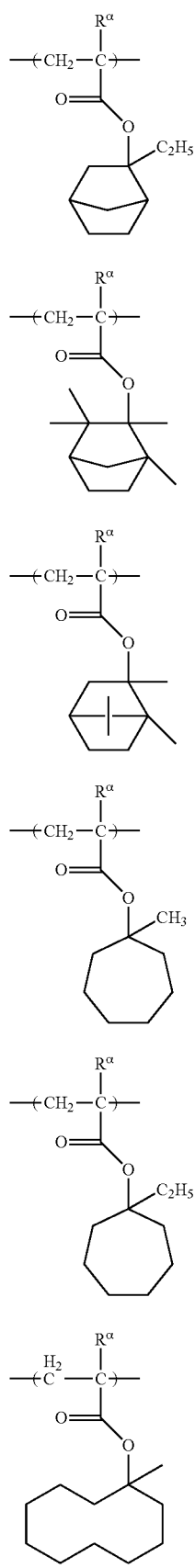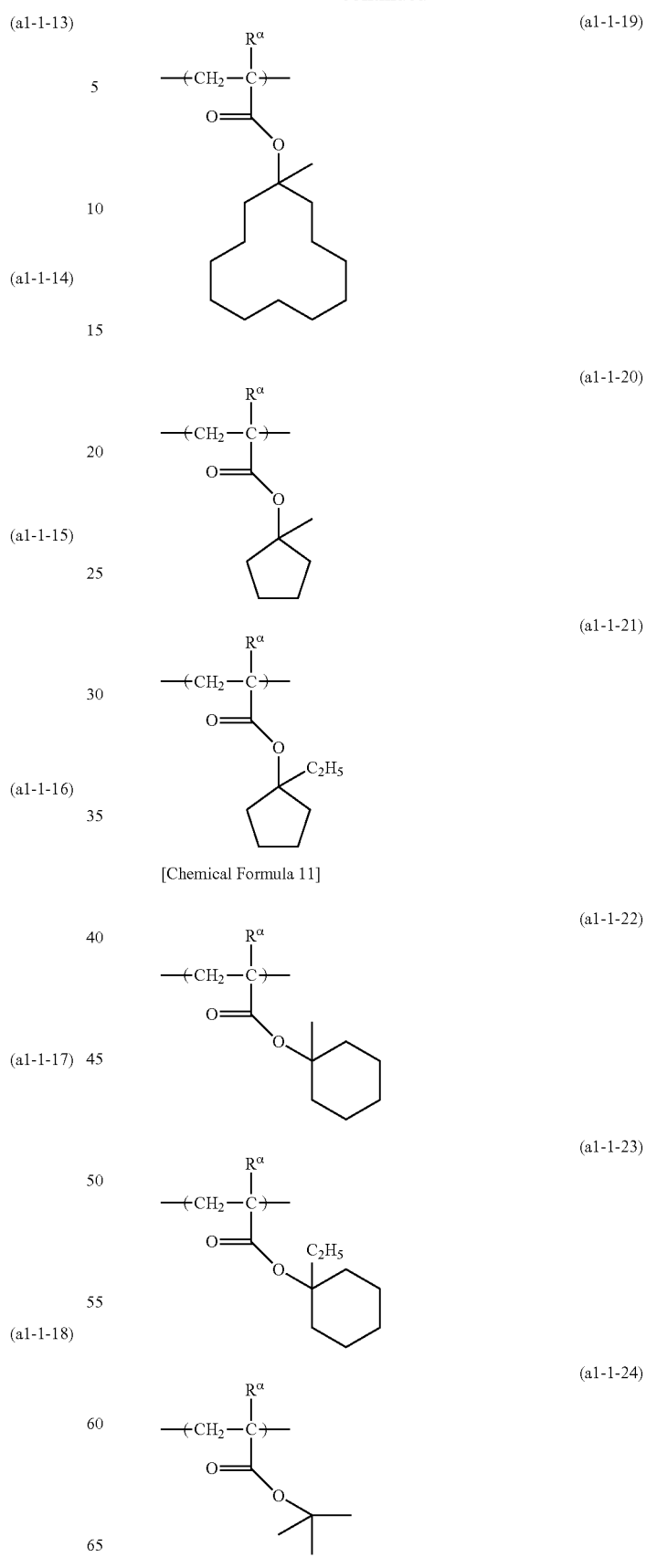

(a1-1-25) 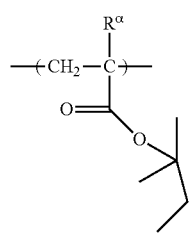
(a1-1-26) 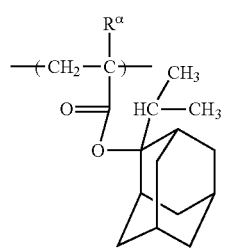
(a1-1-27) 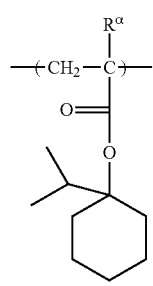
(a1-1-28) 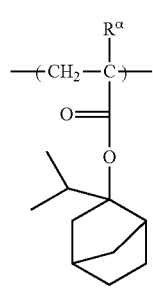
(a1-1-29) 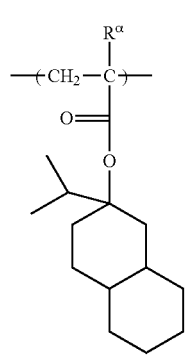
(a1-1-30) 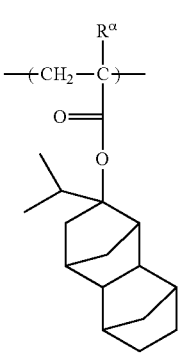
(a1-1-31)
(a1-1-32)
[Chemical Formula 12]
(a1-2-1) 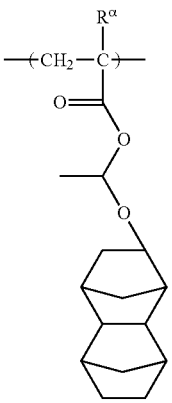

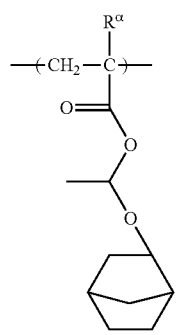 (a1-2-2)
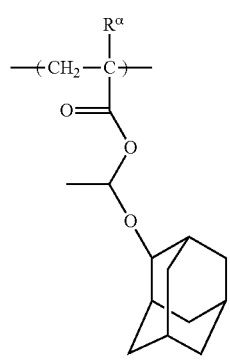 (a1-2-3)
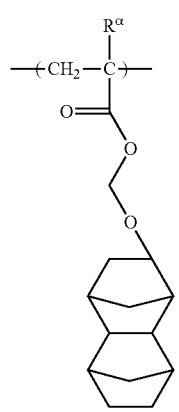 (a1-2-4)
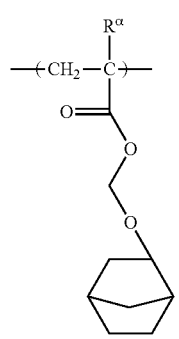 (a1-2-5)
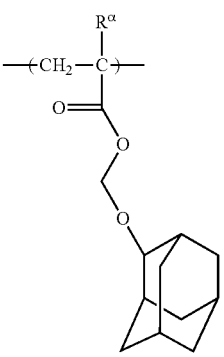 (a1-2-6)
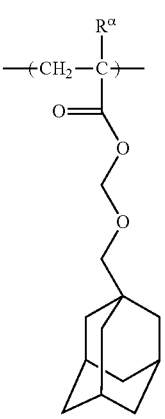 (a1-2-7)
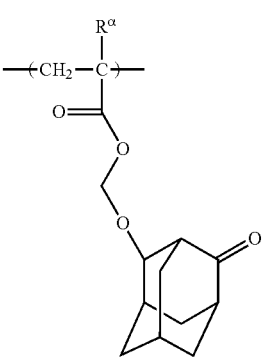 (a1-2-8)
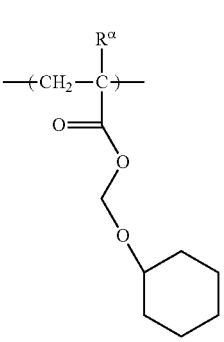 (a1-2-9)

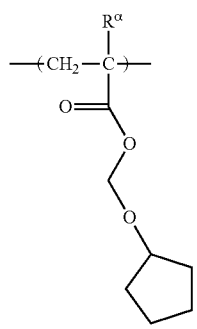
(a1-2-10)
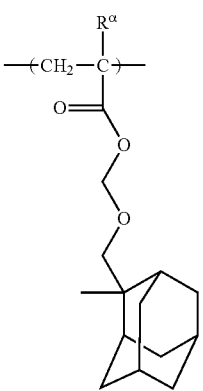
(a1-2-14)
(a1-2-11)
(a1-2-15)
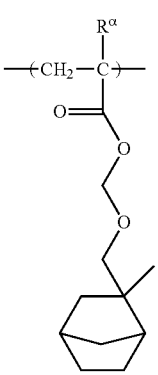
(a1-2-12)
(a1-2-16)
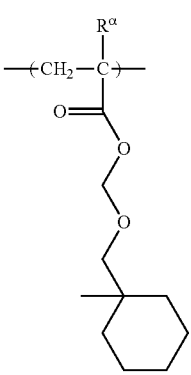
(a1-2-13)
(a1-2-17)
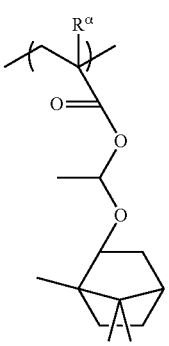

(a1-2-18)
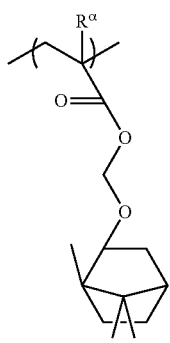
(a1-2-19)
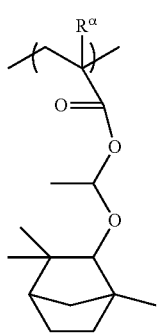
(a1-2-20)
(a1-2-21)
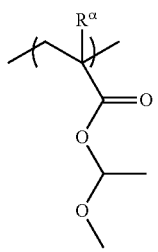
(a1-2-22)
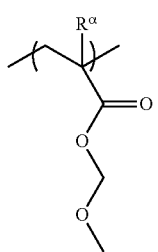
(a1-2-23)
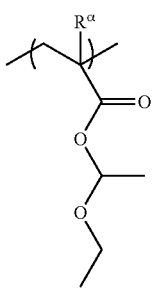
(a1-2-24)
[Chemical Formula 13]
(a1-3-1)

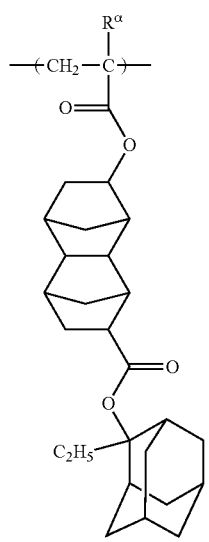 (a1-3-2)
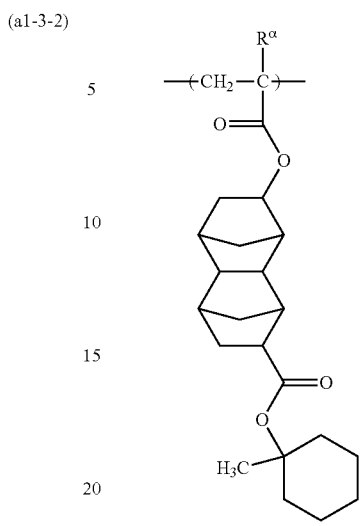
(a1-3-5)
(a1-3-3)
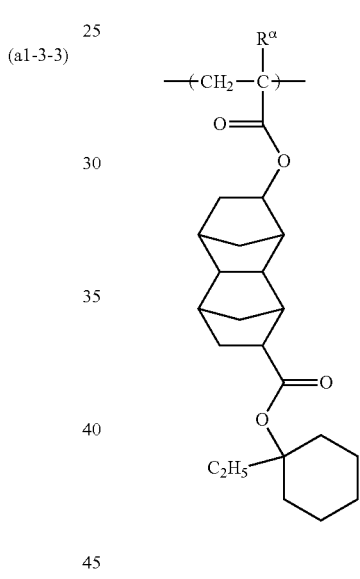
(a1-3-6)
(a1-3-4)
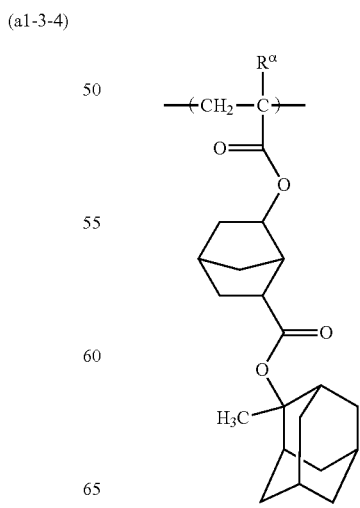
(a1-3-7)

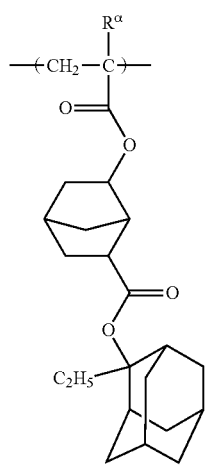
(a1-3-8)
(a1-3-9)
(a1-3-10)
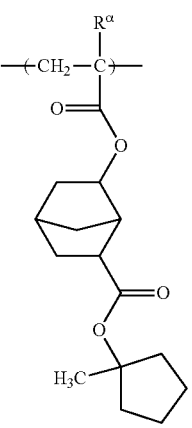
(a1-3-11)
(a1-3-12)
(a1-3-13)
(a1-3-14)

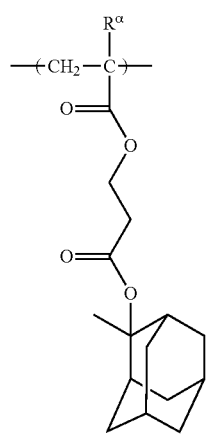 (a1-3-15)
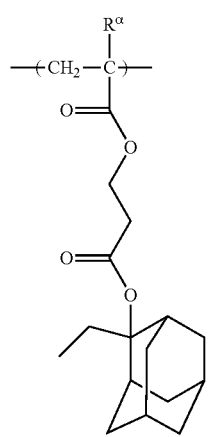 (a1-3-16)
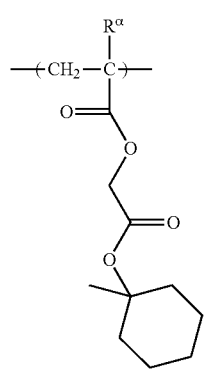 (a1-3-17)
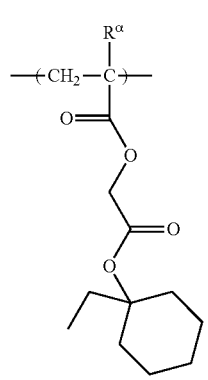 (a1-3-18)
[Chemical Formula 14]
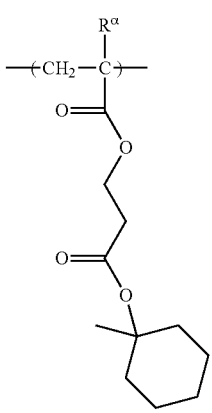 (a1-3-19)
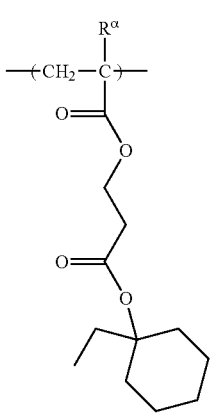 (a1-3-20)
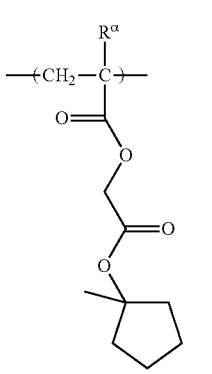 (a1-3-21)
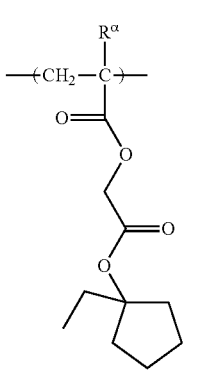 (a1-3-22)

(a1-3-23)
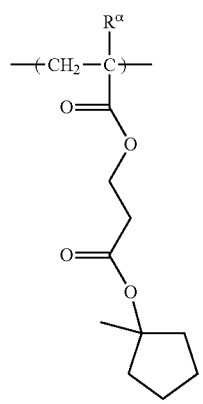
(a1-3-24)
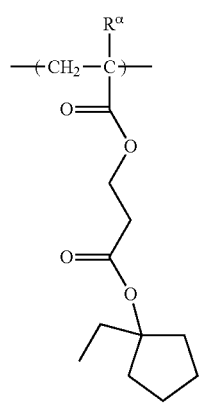
[Chemical Formula 15]
(a1-3-25)
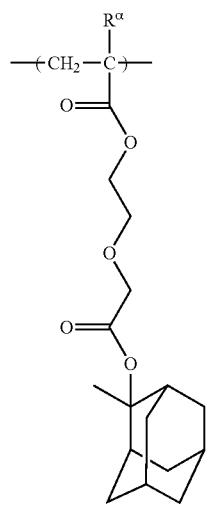
(a1-3-26)
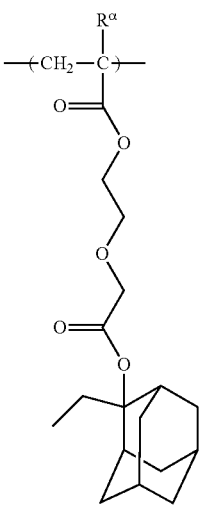
(a1-3-27)
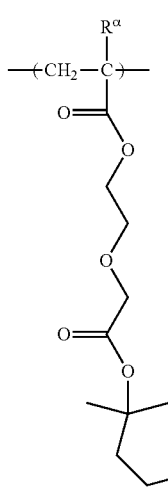
(a1-3-28)
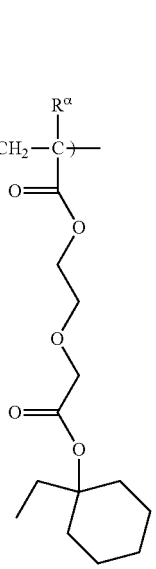

(a1-3-29)
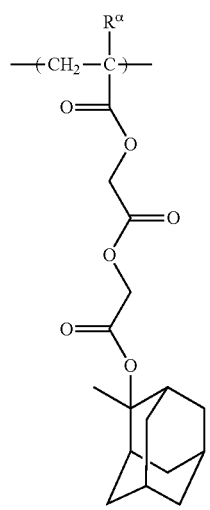
(a1-3-30)
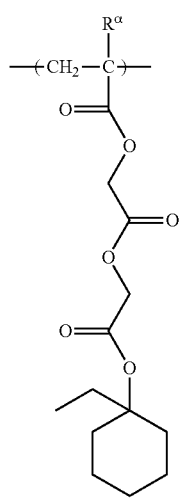
(a1-3-31)
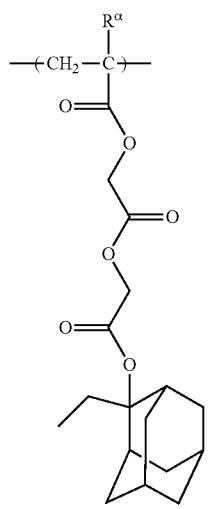
(a1-3-32)
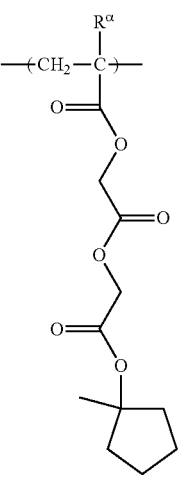
[Chemical Formula 16]
(a1-4-1)
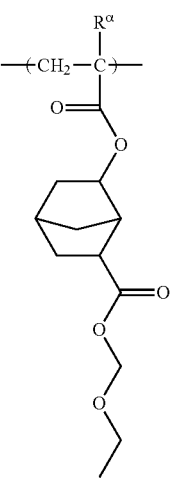
(a1-4-2)

(a1-4-3) 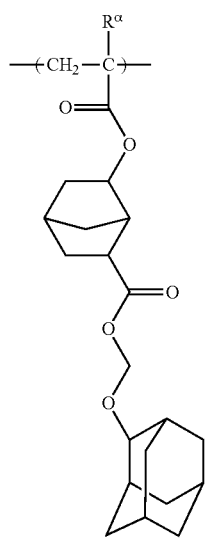
(a1-4-4) 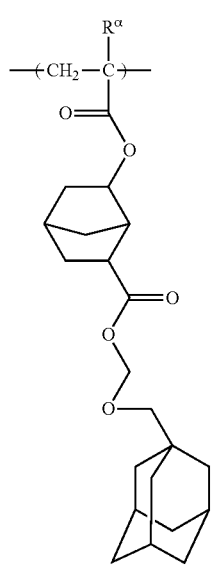
(a1-4-5) 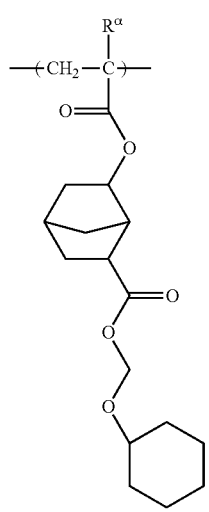
(a1-4-6) 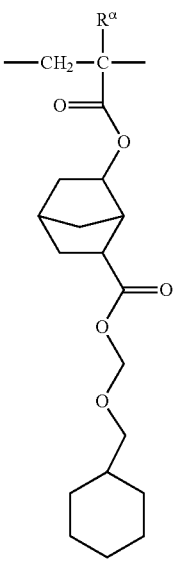
(a1-4-7) 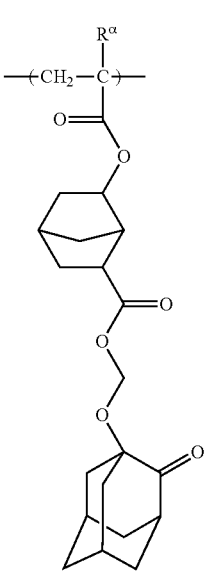
(a1-4-8) 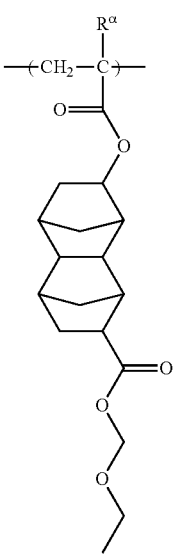

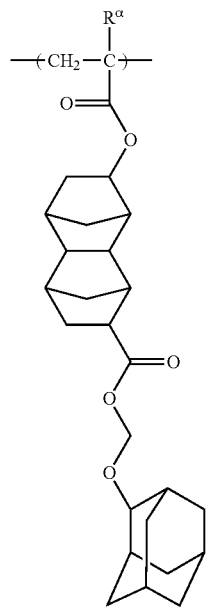
(a1-4-9)
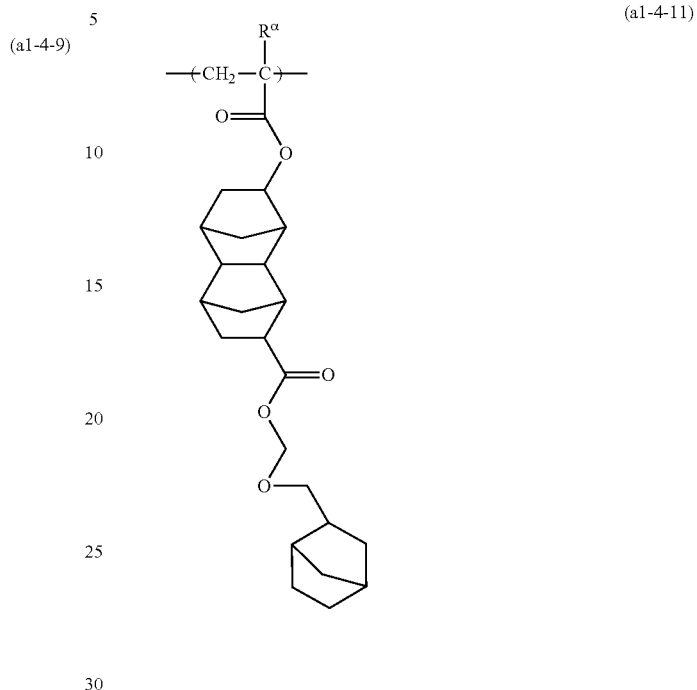
(a1-4-11)
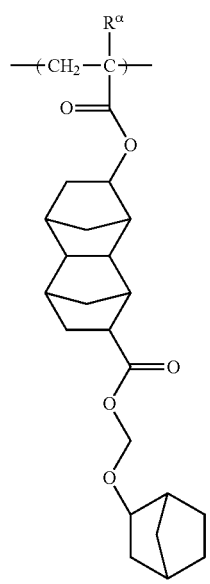
(a1-4-10)
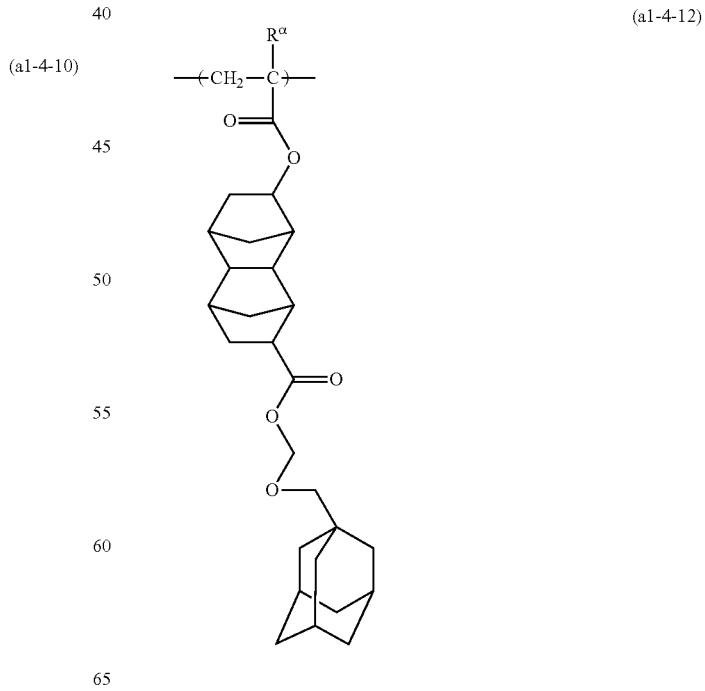
(a1-4-12)

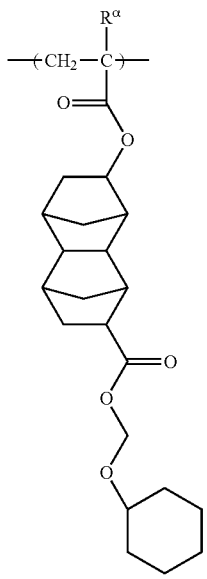

(a1-4-13)

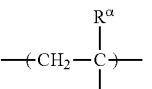

(a1-4-14)

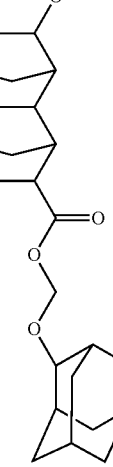

(a1-4-15)

As the structural unit (a1), one type of structural unit may be used alone, or two or more types of structural units may be used in combination.

Among these, structural units represented by general formula (a1-1), (a1-2) or (a1-3) are preferable. More specifically, at least one structural unit selected from the group consisting of structural units represented by formulas (a1-1-1) to (a-1-1-4), (a1-1-20) to (a1-1-23), (a1-2-1) to (a1-2-24) and (a1-3-25) to (a1-3-28) is more preferable. Further, as the structural unit (a1), structural units represented by general formula (a1-1-01) shown below which include the structural units represented by formulas (a1-1-1) to (a1-1-3) and (a1-1-26), structural units represented by general formula (a1-1-02) shown below which include the structural units represented by formulas (a1-1-16), (a1-1-17), (a1-1-20) to (a1-1-23), and (a1-1-32), structural units represented by general formula (a1-1-03) which include the structural units represented by formulas (a1-2-3) and (a1-2-6), structural units represented by general formula (a1-3-01) shown below which include the structural units represented by formulas (a1-3-25) and (a1-3-26), structural units represented by general formula (a1-3-02) shown below which include the structural units represented by formulas (a1-3-27) and (a1-3-28), and structural units represented by general formula (a1-3-03) shown below which include the structural units represented by formulas (a1-3-29) and (a1-3-30) are also preferable.

[Chemical Formula 17]

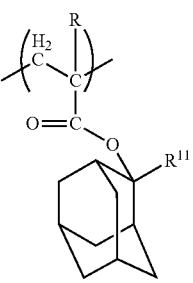

(a1-1-01)

-continued (a1-1-02)
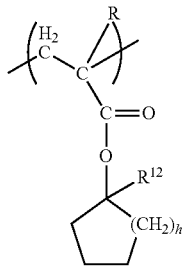

(a1-1-03)
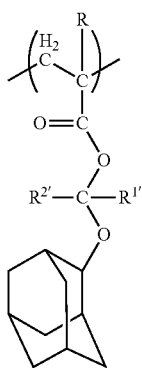

In the formulae, each R independently represents a hydrogen atom, an alkyl group of 1 to 5 carbon atoms or a halogenated alkyl group of 1 to 5 carbon atoms; $R^{11}$ represents an alkyl group of 1 to 5 carbon atoms; $R^{12}$ represents an alkyl group of 1 to 7 carbon atoms; and h represents an integer of 1 to 6; and $R^{1\prime}$ and $R^{2\prime}$ are the same as defined above.

In general formula (a1-1-01), R is the same as defined above. The alkyl group of 1 to 5 carbon atoms for $R^{11}$ is the same as defined for the alkyl group of 1 to 5 carbon atoms for R, and a methyl group, an ethyl group or an isopropyl group is preferable.

In general formula (a1-1-02), R is the same as defined above. The alkyl group of 1 to 5 carbon atoms for $R^{12}$ is the same as defined for the alkyl group of 1 to 5 carbon atoms for R, and a methyl group, an ethyl group or an isopropyl group is preferable. h is preferably 1 or 2, and most preferably 2.

In general formula (a1-1-03), R, $R^{1\prime}$ and $R^{2\prime}$ are the same as defined above.

[Chemical Formula 18]

(a1-3-01)
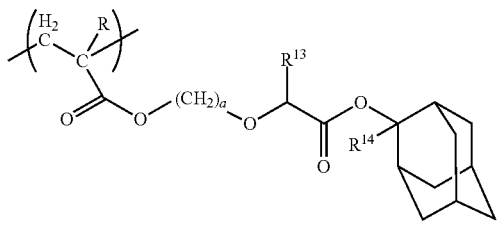

In the formula, R represents a hydrogen atom, an alkyl group of 1 to 5 carbon atoms or a halogenated alkyl group of 1 to 5 carbon atoms; $R^{14}$ is the same as defined above; $R^{13}$ represents a hydrogen atom or a methyl group; and a represents an integer of 1 to 10.

[Chemical Formula 19]

(a1-3-02)
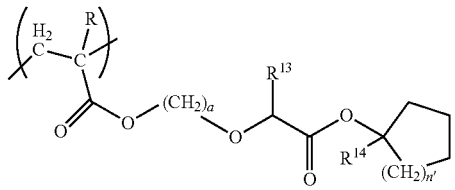

In the formula, R represents a hydrogen atom, an alkyl group of 1 to 5 carbon atoms or a halogenated alkyl group of 1 to 5 carbon atoms; $R^{14}$ is the same as defined above; $R^{13}$ represents a hydrogen atom or a methyl group; a represents an integer of 1 to 10; and n' represents an integer of 1 to 6.

[Chemical Formula 20]

(a1-3-03)
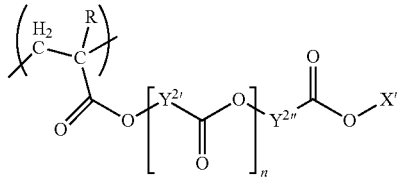

In the formula, R is the same as defined above; each of $Y^{2\prime}$ and $Y^{2\prime\prime}$ independently represents a divalent linking group; X' represents an acid dissociable group; and n represents an integer of 0 to 3.

In general formulas (a1-3-01) to (a1-3-03), R is the same as defined above.

$R^{13}$ is preferably a hydrogen atom.

n' is preferably 1 or 2, and most preferably 2.

a is preferably an integer of 1 to 8, more preferably 2 to 5, and most preferably 2.

As the divalent linking group for $Y^{2\prime}$ and $Y^{2\prime\prime}$, the same groups as those described above for $Y^2$ in the general formula (a1-0-2) can be used.

As $Y^{2\prime}$, a divalent hydrocarbon group which may have a substituent is preferable, a linear aliphatic hydrocarbon group is more preferable, and a linear alkylene group is still more preferable. Among linear alkylene groups, a linear alkylene group of 1 to 5 carbon atoms is preferable, and a methylene group or an ethylene group is particularly desirable.

As $Y^{2\prime\prime}$, a divalent hydrocarbon group which may have a substituent is preferable, a linear aliphatic hydrocarbon group is more preferable, and a linear alkylene group is still more preferable. Among linear alkylene groups, a linear alkylene group of 1 to 5 carbon atoms is preferable, and a methylene group or an ethylene group is particularly desirable.

As the acid dissociable group for X', the same groups as those described above can be used. X' is preferably a tertiary alkyl ester-type acid dissociable group, more preferably the aforementioned group which has a tertiary carbon atom on the ring structure of a cyclic alkyl group. Among the aforementioned groups, a group represented by the aforementioned general formula (1-1) is preferable.

n represents an integer of 0 to 3, preferably an integer of 0 to 2, more preferably 0 or 1, and most preferably 1.

Furthermore, as the structural unit (a1), a structural unit (a11) represented by general formula (a11) shown below is also preferable.

[Chemical Formula 21]

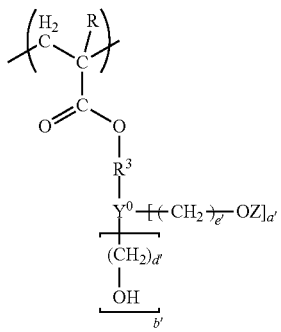

(a11)

In the formula, R represents a hydrogen atom, an alkyl group of 1 to 5 carbon atoms or a halogenated alkyl group of 1 to 5 carbon atoms; $R^3$ represents a single bond or a divalent linking group; $Y^0$ represents an aliphatic hydrocarbon group which may have a substituent; OZ represents an acid decomposable group; a' represents an integer of 1 to 3 and b' represents an integer of 0 to 2, provided that a'+b'=1 to 3; and each of d' and e' independently represents an integer of 0 to 3.

In formula (a11), R is the same as defined above. As R, a hydrogen atom or a methyl group is preferable.

In formula (a11), $R^3$ represents a single bond or a divalent linking group. Examples of the divalent linking group for $R^3$ include the same divalent linking groups as those described above for $Y^2$ in the aforementioned formula (a1-0-2).

In formula (a11), $Y^0$ represents an aliphatic cyclic group. The term "aliphatic cyclic group" refers to a monocyclic group or polycyclic group that has no aromaticity.

The "aliphatic cyclic group" within the structural unit (a11) may or may not have a substituent. Examples of the substituent include an alkyl group of 1 to 5 carbon atoms, a fluorine atom, a fluorinated alkyl group of 1 to 5 carbon atoms, and an oxygen atom (=O).

The basic ring of the "aliphatic cyclic group" exclusive of substituents (aliphatic ring) is not limited to be constituted from only carbon and hydrogen (not limited to hydrocarbon rings), and the ring (aliphatic ring) may contain an oxygen atom in the structure thereof. Further, the "hydrocarbon ring" may be either saturated or unsaturated, but is preferably saturated.

The aliphatic cyclic group may be either a polycyclic group or a monocyclic group. Examples of aliphatic cyclic groups include groups in which two or more hydrogen atoms have been removed from a monocycloalkane or a polycycloalkane such as a bicycloalkane, tricycloalkane or tetracycloalkane which may or may not be substituted with an alkyl group of 1 to 5 carbon atoms, a fluorine atom or a fluorinated alkyl group. Specific examples include groups in which two or more hydrogen atoms have been removed from a monocycloalkane such as cyclopentane or cyclohexane; and groups in which two or more hydrogen atoms have been removed from a polycycloalkane such as adamantane, norbornane, isobornane, tricyclodecane or tetracyclododecane.

Further examples of the aliphatic cyclic group include groups in which two or more hydrogen atoms have been removed from tetrahydrofuran or tetrahydropyran which may or may not be substituted with an alkyl group of 1 to 5 carbon atoms, a fluorine atom or a fluorinated alkyl group.

The aliphatic cyclic group within the structural unit (a11) is preferably a polycyclic group, and a group in which two or more hydrogen atoms have been removed from adamantane is particularly desirable.

In the aforementioned formula (a11), OZ represents an acid decomposable group. As the acid decomposable group for OZ, an acid decomposable group which is decomposed to form a hydroxy group (—OH) is preferable, and examples thereof include (1) a group in which a hydroxy group is protected with an acetal-type acid dissociable group Z, and (2) a group in which Z has a tertiary ester-type acid dissociable group within the structure thereof, and is further decomposed by a decarboxylation reaction after the acid dissociation.

The acetal-type acid dissociable group for Z within (1) "a group in which a hydroxy group is protected with an acetal-type acid dissociable group" is the same as defined above. As Z for the group (1), a 1-n-butoxyethyl group (—CH(CH$_3$)—O—C$_4$H$_9$) or an n-butoxymethyl group (—CH$_2$—O—C$_4$H$_9$) is particularly desirable.

The oxygen atom within OZ is derived from the hydroxy group protected with the acetal-type acid dissociable group, and by the action of an acid, the bond between the oxygen atom and the acetal-type acid dissociable group is broken, so as to form a hydroxy group (—OH) which is a polar group on the terminal of the structural unit.

In the (2) "group in which Z has a tertiary ester-type acid dissociable group within the structure thereof, and is further decomposed by a decarboxylation reaction after the acid dissociation", the tertiary ester-type acid dissociable group is as described above, and the tertiary ester-type acid dissociable group is eliminated and carbon dioxide is generated, so as to form a hydroxy group (—OH) which is a polar group on the terminal of the structural unit.

The alkyl group within the tertiary ester-type acid dissociable group for Z in OZ may be either an alkyl group which does not have a ring structure (chain-like structure), or an alkyl group having a ring structure.

In the case of a chain-like alkyl group, as Z for OZ, a chain-like tertiary alkyloxycarbonyl group represented by general formula (II) shown below can be mentioned.

In formula (II), each of $R^{21}$ to $R^{23}$ independently represents a linear or branched alkyl group. The number of carbon atoms within the alkyl group is preferably from 1 to 5, and more preferably from 1 to 3.

Further, in the group represented by —C($R^{21}$)($R^{22}$)($R^{23}$) in general formula (II), the total number of carbon atoms is preferably from 4 to 7, more preferably from 4 to 6, and most preferably 4 or 5.

Preferable examples of the group represented by —C($R^{21}$)($R^{22}$)($R^{23}$) in general formula (II) include a tert-butyl group and a tert-pentyl group, and a tert-butyl group is more preferable. That is, in such a case, as Z, a tert-butyloxycarbonyl group (t-boc) and a tert-pentyloxycarbonyl group are preferable.

[Chemical Formula 22]

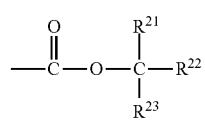

(II)

Furthermore, in the case where the acid decomposable group OZ is (3) a group which does not form a hydroxy group (—OH) after being decomposed (e.g., a group which forms a carboxy group), as Z for OZ, a tertiary alkyloxycarbonylalkyl group represented by general formula (III) shown below is preferable.

In general formula (III), $R^{21}$ to $R^{23}$ are the same as defined for $R^{21}$ to $R^{23}$ in general formula (II).

f represents an integer of 1 to 3, and is preferably 1 or 2.

As the chain-like tertiary alkyloxycarbonylalkyl group, a tert-butyl oxycarbonylmethyl group and a tert-butyloxycarbonyl ethyl group are preferable.

Among these, as the tertiary alkyl group-containing group which does not have a ring structure, a tertiary alkyloxycarbonyl group or a tertiary alkyloxycarbonylalkyl group is preferable, a tertiary alkyloxycarbonyl group is more preferable, and a tert-butyloxycarbonyl group (t-boc) is most preferable.

[Chemical Formula 23]

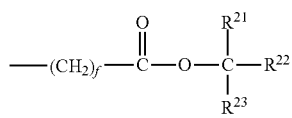

(III)

In the case where Z is a group having in the structure thereof a tertiary alkyl ester-type acid dissociable group containing a ring structure, as examples of Z for OZ, groups in which the terminal oxygen atom of —C(C=O)—O— or —(CH$_2$)$_1$—C(C=O)—O— (f is the same as defined for f in formula (III)) has bonded to a group represented by any of the aforementioned formulae (1-1) to (1-9) and (2-1) to (2-6) can be given.

Among the above examples, as OZ, a group (1) or (2) which forms a hydroxy group (—OH) after being decomposed is preferable, a group in which Z is a group represented by the aforementioned general formula (II) is more preferable, and a group in which Z represents a tert-butyloxycarbonyl group (t-boc) or a 1,1-dimethylpropoxycarbonyl group is most preferable.

In general formula (a11), a' represents an integer of 1 to 3, and b' represents an integer of 0 to 2, provided that a'+b'=1 to 3.

a' is preferably 1 or 2, and more preferably 1.

b' is preferably 0.

a'+b' is preferably 1 or 2, and more preferably 1.

d' represents an integer of 0 to 3, preferably 0 or 1, and more preferably 0.

e' represents an integer of 0 to 3, preferably 0 or 1, and more preferably 0.

When b' is 1 or more, the structural unit (a11) falls under the definition of the structural unit (a3) described later. However, a structural unit represented by general formula (a11) is regarded as a structural unit (a11), and not as a structural unit (a3).

In particular, as the structural unit (a11), a structural unit represented by general formula (a11-1-1), (a11-1-2) or (a11-2) shown below is preferable, and a structural unit represented by general formula (a11-1-1) is more preferable.

[Chemical Formula 24]

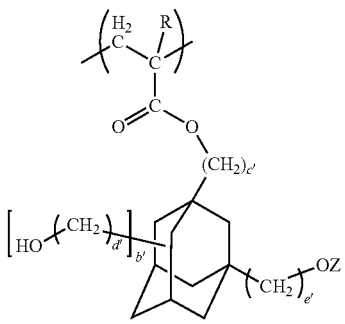

(a11-1-1)

In the formula, R, OZ, b', c', d' and e' are the same as defined above.

[Chemical Formula 25]

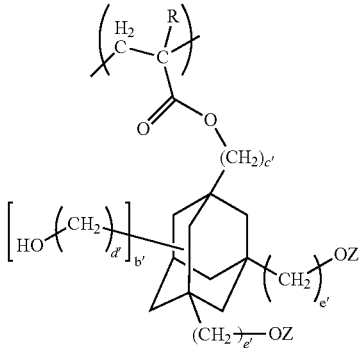

(a11-1-2)

In the formula, R, OZ, b', c', d' and e' are the same as defined above, and the plurality of e' and OZ may be the same or different from each other.

[Chemical Formula 26]

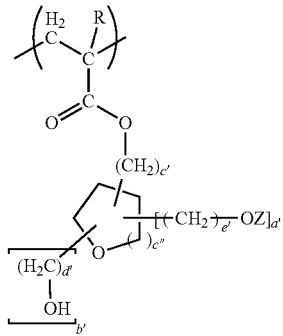

(a11-2)

In the formula, R, OZ, a', b', c', d' and e' are the same as defined above; and c" represents an integer of 1 to 3.

In formula (a11-2), c" represents an integer of 1 to 3, preferably 1 or 2, and still more preferably 1.

When c' represents 0 in formula (a11-2), the oxygen atom on the terminal of the carbonyloxy group (—C(C=O)—O—) within the acrylate ester is preferably not bonded to the carbon atom which is bonded to the oxygen atom within the cyclic group. That is, when c' represents 0, it is preferable that there are at least two carbon atoms present between the terminal oxygen atom and the oxygen atom within the cyclic group (excluding the case where the number of such carbon atom is one (i.e., the case where an acetal bond is formed)).

A monomer for deriving the structural unit (a11) can be synthesized, for example, by protecting part or all of the hydroxyl groups within a compound represented by general formula (a11-0) shown below (namely, an acrylate ester containing an aliphatic cyclic group having 1 to 3 alcoholic hydroxyl groups) with alkoxyalkyl groups the aforementioned Z by a conventional method.

[Chemical Formula 27]

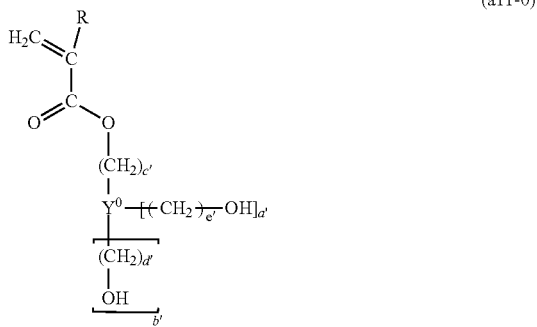

(a11-0)

In the formula, R, $Y^0$, a', b', c', d' and e' are the same as defined above.

In the component (A1), the amount of the structural unit (a1) based on the combined total of all structural units constituting the component (A1) is preferably 20 to 80 mol %, more preferably 20 to 75 mol %, and still more preferably 25 to 70 mol %. When the amount of the structural unit (a1) is at least as large as the lower limit of the above-mentioned range, a pattern can be easily formed using a solvent developing negative-tone resist composition prepared from the component (A1) (in the case, the solubility in an alkali developing solution is decreased). On the other hand, when the amount of the structural unit (a1) is no more than the upper limit of the above-mentioned range, a good balance can be achieved with the other structural units.

(Structural Unit (a2))

The structural unit (a2) is at least one structural unit selected from the group consisting of a structural unit derived from an acrylate ester containing a 4- to 12-membered lactone-containing cyclic group and which may have the hydrogen atom bonded to the carbon atom on the α-position substituted with a substituent (hereafter, referred to as "structural unit (a21)"), a structural unit derived from an acrylate ester containing a 3- to 7-membered ether-containing cyclic group and which may have the hydrogen atom bonded to the carbon atom on the α-position substituted with a substituent (hereafter, referred to as structural unit (a22)"), and a structural unit derived from an acrylate ester containing a 5- to 7-membered carbonate-containing cyclic group and which may have the hydrogen atom bonded to the carbon atom on the α-position substituted with a substituent (hereafter, referred to as structural unit (a23")).

These cyclic compounds is subjected to ring-opening polymerization by using a specific photo acid generator described later. By conducting ring-opening polymerization, a resist pattern having an excellent lithography properties can be formed, regardless of the presence of a cross-linker.

Further, as in the third aspect described later, in the case of forming a resist pattern which is formed by using the resist composition and is usable in a phase separation of a layer containing a block copolymer having a plurality of polymers bonded formed on a substrate, by containing the aforementioned cyclic compound capable of ring-opening polymerization, a guide pattern exhibiting excellent heat resistance and solvent resistance can be formed.

Structural Unit (a21)

The structural unit (a21) is a structural unit derived from an acrylate ester containing a 4- to 12-membered lactone-containing cyclic group and may have the hydrogen atom bonded to the carbon atom on the α-position substituted with a substituent. The term "lactone-containing cyclic group" refers to a cyclic group including one ring containing a —O—C(O)— structure (lactone ring). The term "lactone ring" refers to a single ring containing a —O—C(C=O)— structure, and this ring is counted as the first ring. A lactone-containing cyclic group in which the only ring structure is the lactone ring is referred to as a monocyclic group, and groups containing other ring structures are described as polycyclic groups regardless of the structure of the other rings.

As the structural unit (a21), there is no particular limitation, and an arbitrary structural unit may be used.

Specific examples of lactone-containing monocyclic groups include a group in which one hydrogen atom has been removed from a 4- to 6-membered lactone ring, such as a group in which one hydrogen atom has been removed from β-propionolactone, a group in which one hydrogen atom has been removed from γ-butyrolactone, and a group in which one hydrogen atom has been removed from δ-valerolactone. Further, specific examples of lactone-containing polycyclic groups include groups in which one hydrogen atom has been removed from a lactone ring-containing bicycloalkane of 7 to 12 carbon atoms, tricycloalkane of 7 to 12 carbon atoms or tetracycloalkane of 7 to 12 carbon atoms.

More specifically, examples of the structural unit (a21) include structural units represented by general formulas (a21-1) to (a21-5) shown below.

[Chemical Formula 28]

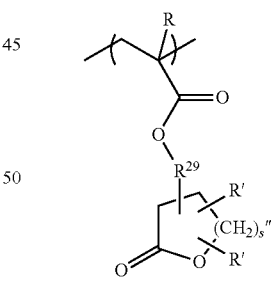

(a21-1)

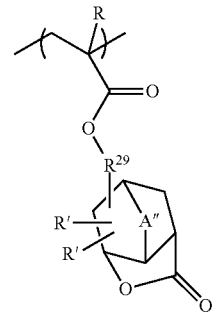

(a21-2)

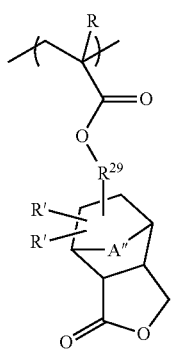

(a21-3)

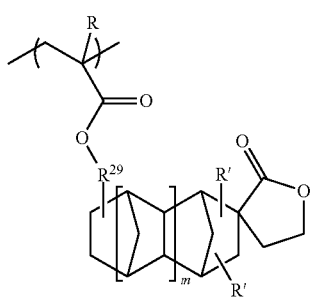

(a21-4)

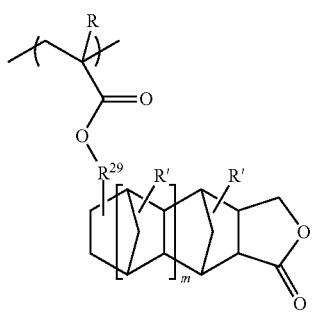

(a21-5)

In the formulae, R is the same as defined above; R' represents a hydrogen atom, an alkyl group of 1 to 5 carbon atoms, a halogenated alkyl group of 1 to 5 carbon atoms, a cyano group, a hydroxy group, an alkoxy group of 1 to 5 carbon atoms or —COOR"; $R^{29}$ represents a single bond or a divalent linking group; s" represents an integer of 0 to 2; A" represents an oxygen atom, a sulfur atom or an alkylene group of 1 to 5 carbon atoms which may contain an oxygen atom or a sulfur atom; and m represents an integer of 0 or 1.

In general formulas (a21-1) to (a21-5), R is the same as R in the structural unit (a1).

Examples of the alkyl group of 1 to 5 carbon atoms for R' include a methyl group, an ethyl group, a propyl group, an n-butyl group and a tert-butyl group.

Examples of the alkoxy group of 1 to 5 carbon atoms for R' include a methoxy group, an ethoxy group, an n-propoxy group, an iso-propoxy group, an n-butoxy group and a tert-butoxy group.

Examples of the halogenated alkyl group of 1 to 5 carbon atoms for R' include groups in which part or all of the hydrogen atoms of the aforementioned alkyl groups of 1 to 5 carbon atoms have been substituted with halogen atoms. Examples of the halogen atom include a fluorine atom, a chlorine atom, a bromine atom and an iodine atom, and a fluorine atom is particularly desirable.

In the —COOR" group, R" represents a hydrogen atom or a linear, branched or cyclic alkyl group of 1 to 15 carbon atoms.

When R" represents a linear or branched alkyl group, it is preferably an alkyl group of 1 to 10 carbon atoms, more preferably an alkyl group of 1 to 5 carbon atoms, and most preferably a methyl group or an ethyl group.

When R" is a cyclic alkyl group (cycloalkyl group), it preferably has 3 to 15 carbon atoms, more preferably 4 to 12 carbon atoms, and most preferably 5 to 10 carbon atoms. As examples of the cycloalkyl group, groups in which one or more hydrogen atoms have been removed from a monocycloalkane or a polycycloalkane such as a bicycloalkane, tricycloalkane or tetracycloalkane, which may or may not be substituted with a fluorine atom or a fluorinated alkyl group, may be used. Specific examples include groups in which one or more hydrogen atoms have been removed from a monocycloalkane such as cyclopentane and cyclohexane; and groups in which one or more hydrogen atoms have been removed from a polycycloalkane such as adamantane, norbornane, isobornane, tricyclodecane or tetracyclododecane.

As A", an alkylene group of 1 to 5 carbon atoms or —O— is preferable, more preferably an alkylene group of 1 to 5 carbon atoms, and most preferably a methylene group.

$R^{29}$ represents a single bond or a divalent linking group. Examples of divalent linking groups include the same divalent linking groups as those described above for $Y^2$ in general formula (a1-0-2). Among these, an alkylene group, an ester bond (—C(C=O)—O—) or a combination thereof is preferable. The alkylene group as a divalent linking group for $R^{29}$ is preferably a linear or branched alkylene group. Specific examples include the same linear alkylene groups and branched alkylene groups as those described above for the aliphatic hydrocarbon group for A in $Y^2$.

s" is preferably an integer of 1 or 2.

Specific examples of structural units represented by general formulas (a21-1) to (a21-5) are shown below. In the formulas shown below, $R^{\alpha}$ represents a hydrogen atom, a methyl group or a trifluoromethyl group.

[Chemical Formula 29]

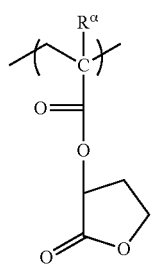

(a2-1-1)

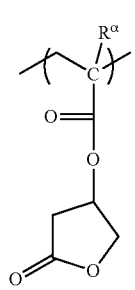

(a2-1-2)

(a2-1-3) 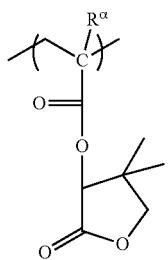
(a2-1-4) 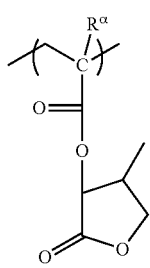
(a2-1-5) 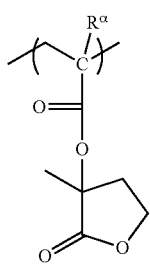
(a2-1-6) 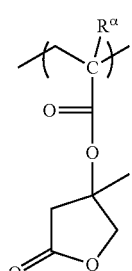
(a2-1-7) 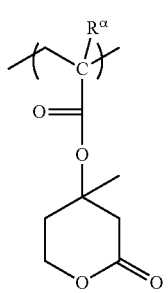
(a2-1-8) 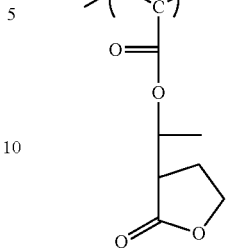
(a2-1-9) 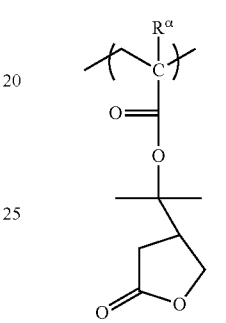
(a2-1-10) 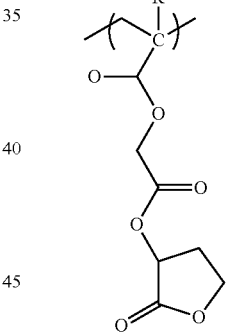
(a2-1-11) 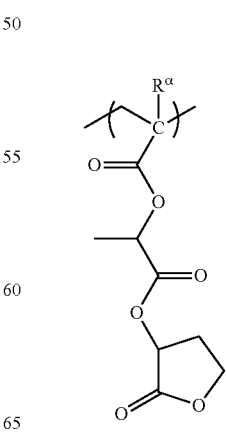

(a2-1-12)
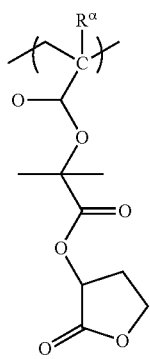
(a2-1-13)
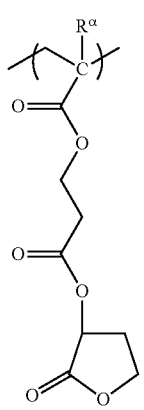
[Chemical Formula 30]
(a2-2-1)
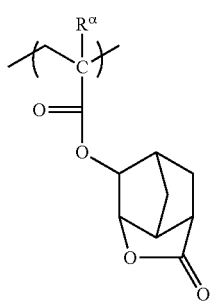
(a2-2-2)
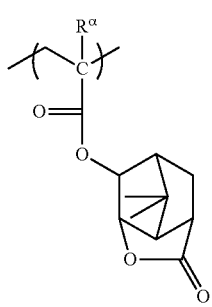
(a2-2-3)
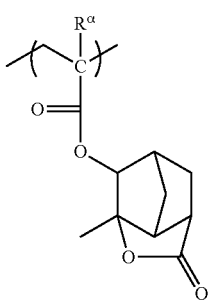
(a2-2-4)
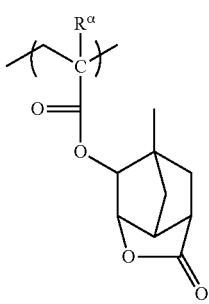
(a2-2-5)
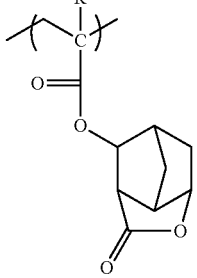
(a2-2-6)
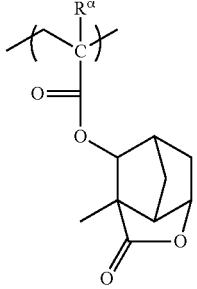
(a2-2-7)
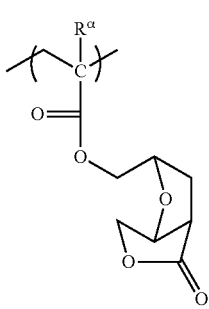

(a2-2-8) 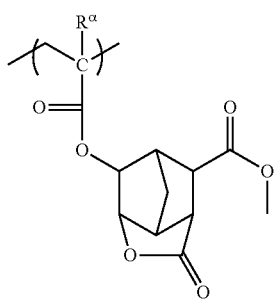
(a2-2-9) 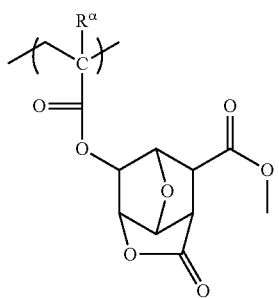
(a2-2-10) 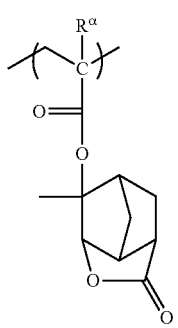
(a2-2-11) 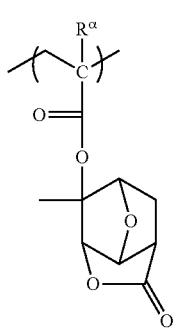
(a2-2-12) 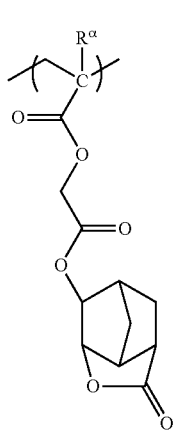
(a2-2-13) 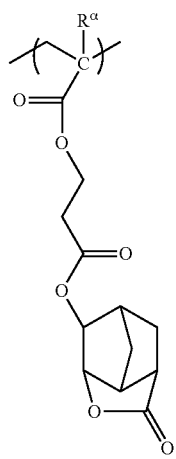
(a2-2-14) 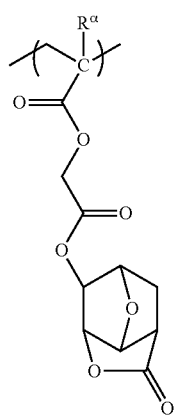
(a2-2-15) 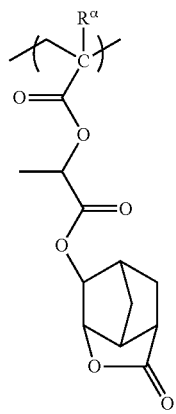

(a2-2-16)
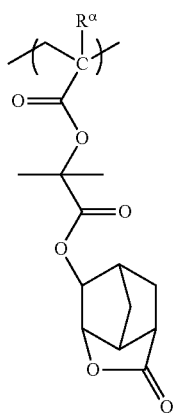
(a2-2-17)
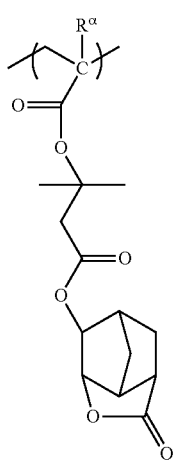
[Chemical Formula 31]
(a2-3-1)
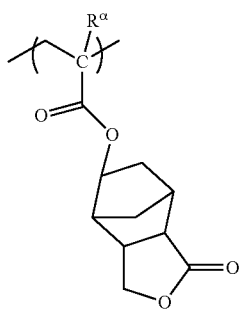
(a2-3-2)
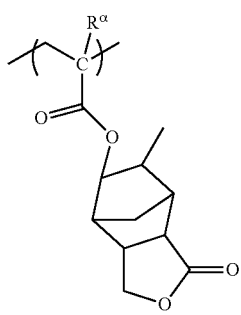
(a2-3-3)
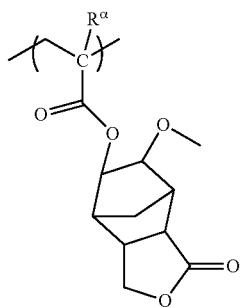
(a2-3-4)
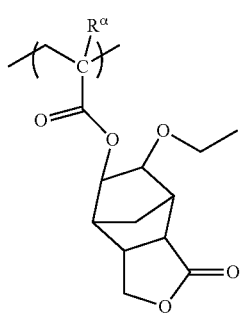
(a2-3-5)
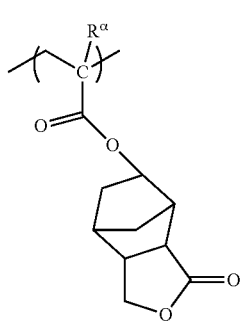
[Chemical Formula 32]
(a2-4-1)
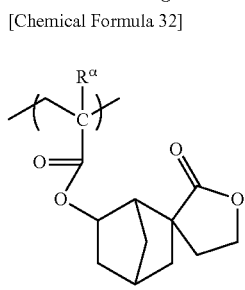
(a2-4-2)
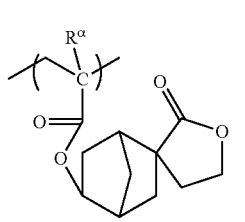
(a2-4-3)
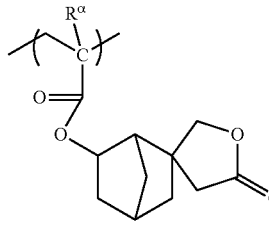

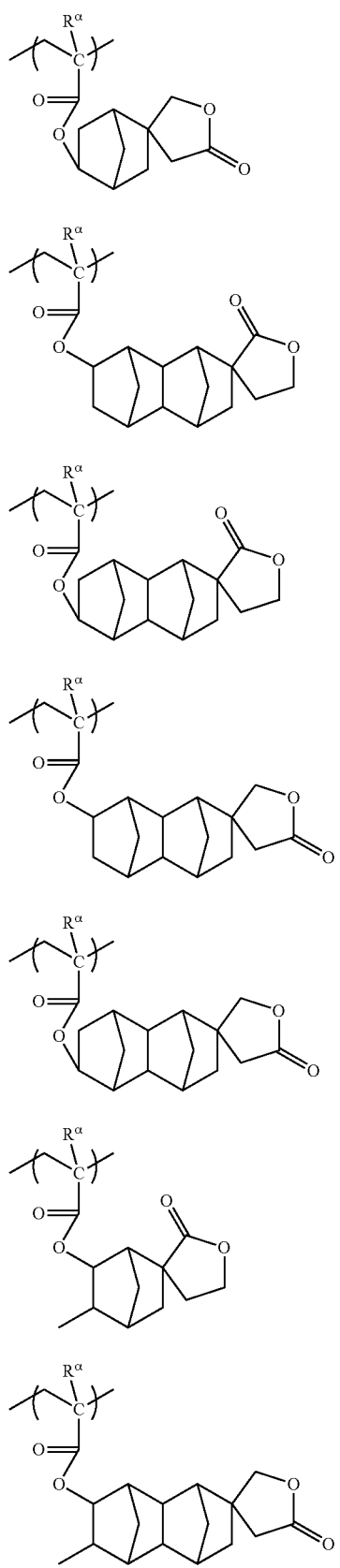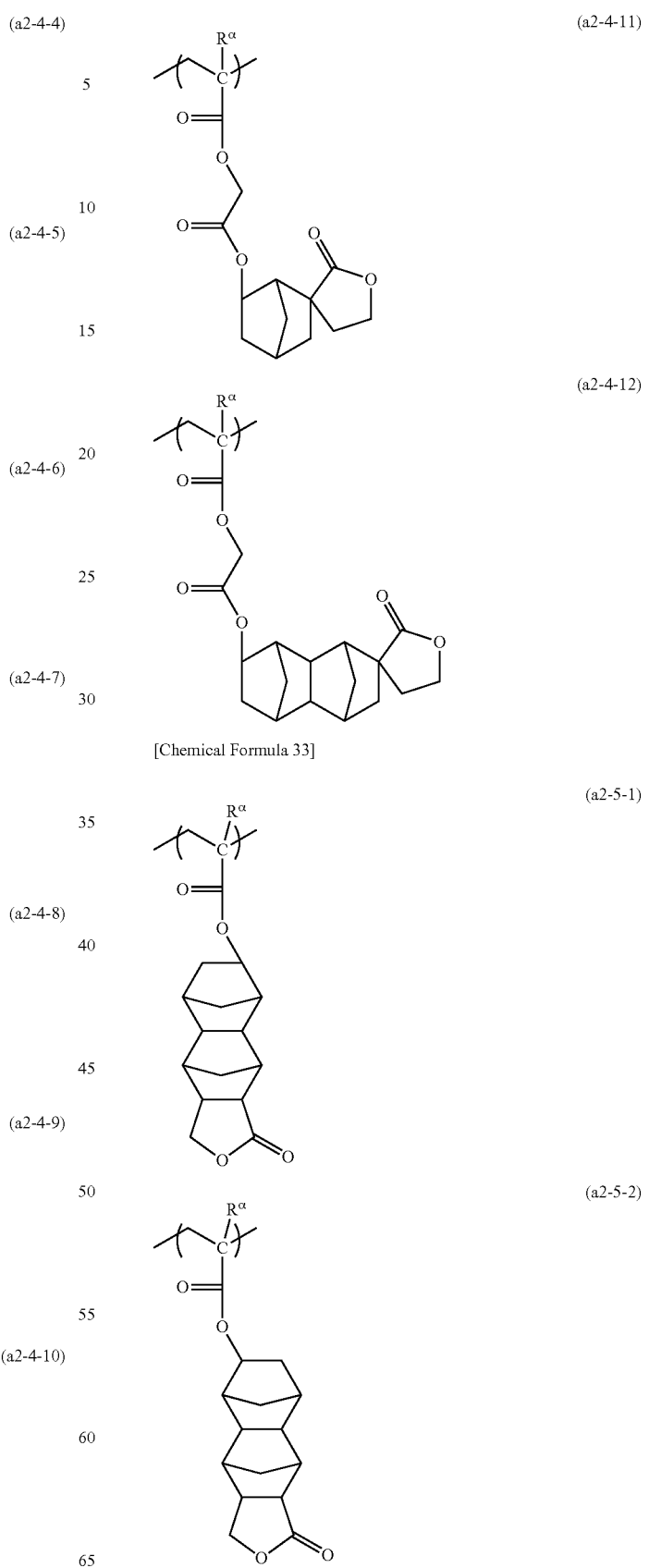

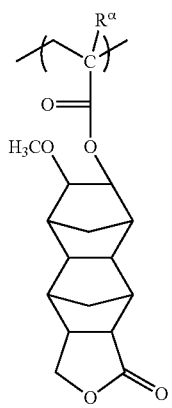
(a2-5-3)
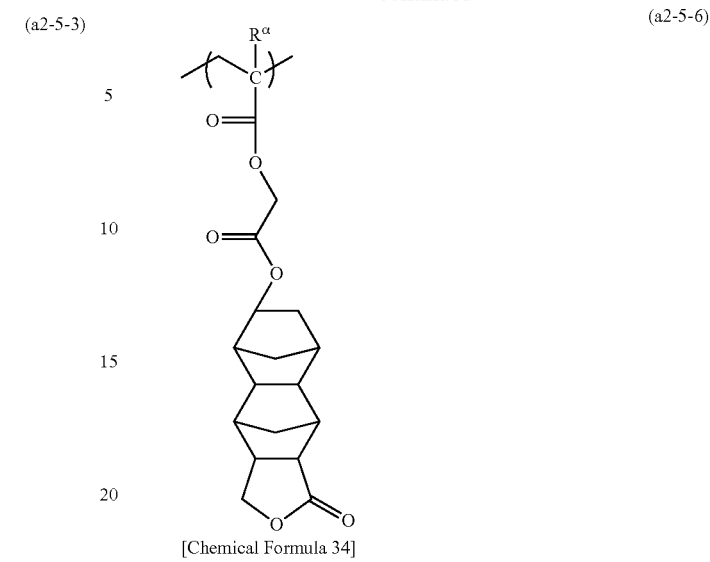
(a2-5-6)
[Chemical Formula 34]
(a2-6-3)
(a2-6-4)
(a2-6-5)
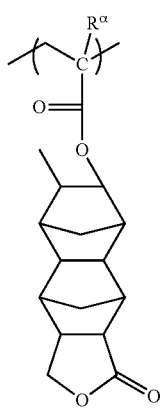
(a2-5-4)
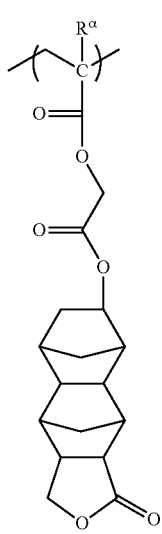
(a2-5-5)
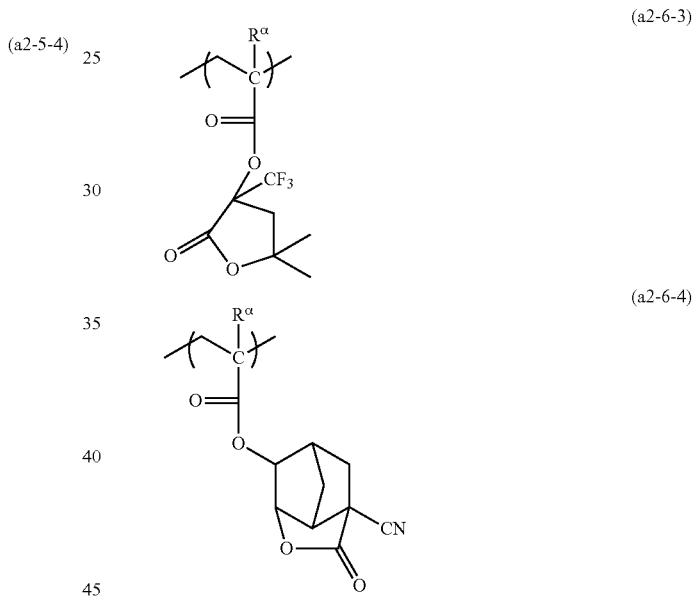
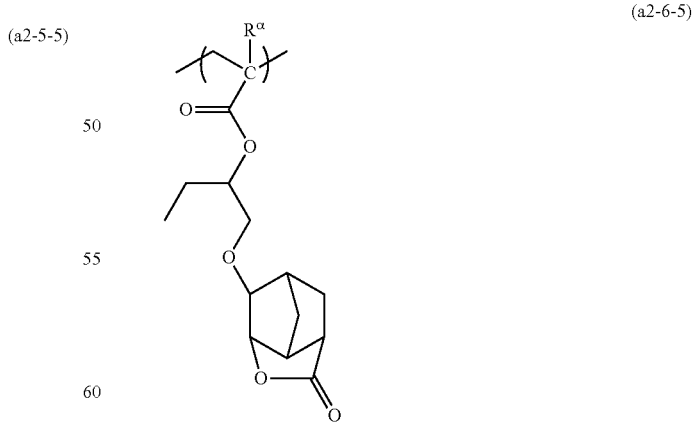
Structural Unit (a22)
The structural unit (a22) is a structural unit derived from an acrylate ester containing a 3- to 7-membered ether-containing cyclic group and may have the hydrogen atom bonded to the carbon atom on the α-position substituted with a substituent. Here, the "ether-containing cyclic group" refers to a cyclic group including a structure in which a carbon atom within the cyclic hydrocarbon group has been replaced with an oxygen atom (cyclic ether). The term "cyclic ether" refers to a single ring containing an ether structure, and this ring is counted as the first ring. An ether-containing cyclic group in which the only ring structure is the cyclic ether is referred to as a monocyclic group, and groups containing other ring structures are described as polycyclic groups regardless of the structure of the other rings.

As the structural unit (a22), there is no particular limitation, and an arbitrary structural unit may be used.

Specific examples of ether-containing cyclic groups include a group in which one hydrogen atom has been removed from a 3- to 7-membered cyclic ether, such as a group in which one hydrogen atom has been removed from epoxyethane, a group in which one hydrogen atom has been removed from oxetane, a group in which one hydrogen atom has been removed from tetrahydrofuran, and a group in which one hydrogen atom has been removed from tetrahydropyran. Further, specific examples of ether-containing polycyclic groups include groups in which one hydrogen atom has been removed from an ether ring-containing bicycloalkane, tricycloalkane or tetracycloalkane.

More specifically, examples of the structural unit (a22) include structural units represented by general formulas (a22-1) to (a22-5) shown below.

[Chemical Formula 35]

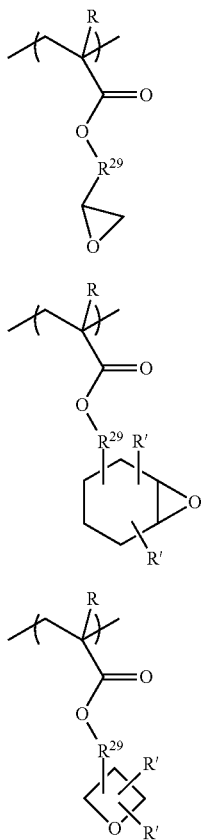

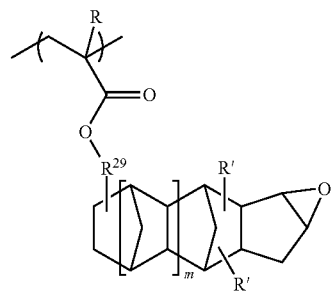

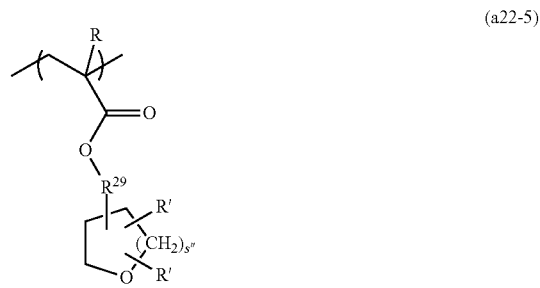

In the formulae, R, R', $R^{29}$, and m are the same as defined above.

In general formulas (a22-1) to (a22-5), R, R', $R^{29}$, s" and m are the same as defined above in general formulae (a21-1) to (a21-5).

Specific examples of structural units represented by general formulas (a22-1) to (a22-5) are shown below. In the formulas shown below, $R^\alpha$ represents a hydrogen atom, a methyl group or a trifluoromethyl group.

[Chemical Formula 36]

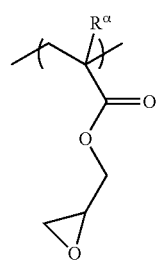

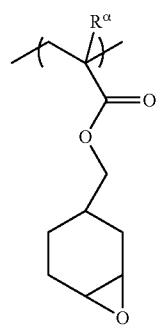

(a22-1-3)
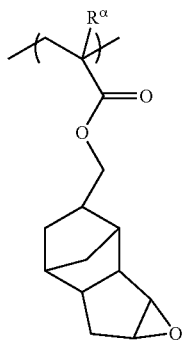

(a22-1-4)
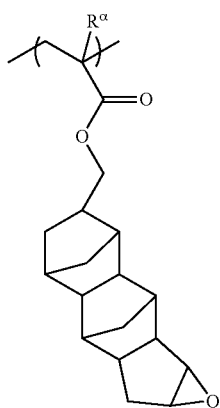

(a22-1-5)
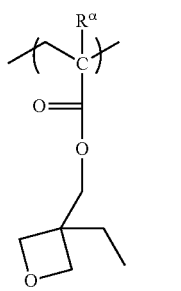

(a22-1-6)
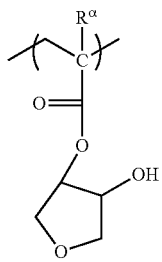

(a22-1-7)
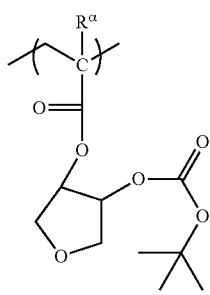

Structural Unit (a23)

The structural unit (a23) is a structural unit derived from an acrylate ester containing a 5- to 7-membered carbonate-containing cyclic group. The term "carbonate-containing cyclic group" refers to a cyclic group including one ring containing a —O—C(=O)—O— structure (cyclic carbonate).

As an example of the structural unit (a23), a structural unit represented by general formula (a23-1) shown below can be given.

[Chemical Formula 37]

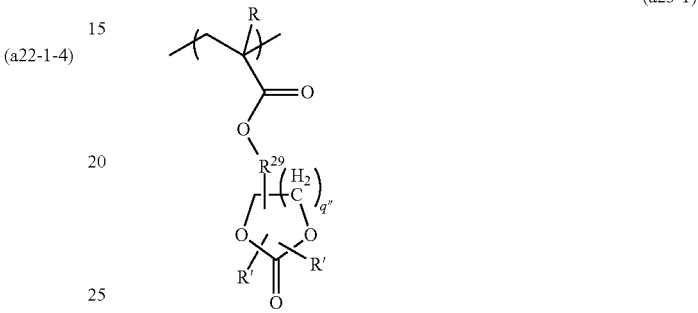

(a23-1)

In the formula, R, R' and $R^{29}$ are the same as defined above; and q" represents an integer of 1 to 3.

In general formula (a23-1), R, R' and $R^{29}$ are the same as defined above in general formulae (a21-1) to (a21-5).

q" is an integer of 1 to 3, is preferably 1 or 2, and is more preferably 1.

Specific examples of structural units represented by general formulas (a23-1) are shown below. In the formulas shown below, $R^{\alpha}$ represents a hydrogen atom, a methyl group or a trifluoromethyl group.

[Chemical Formula 38]

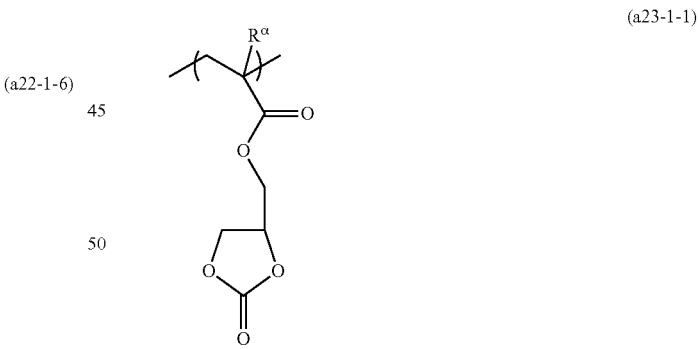

(a23-1-1)

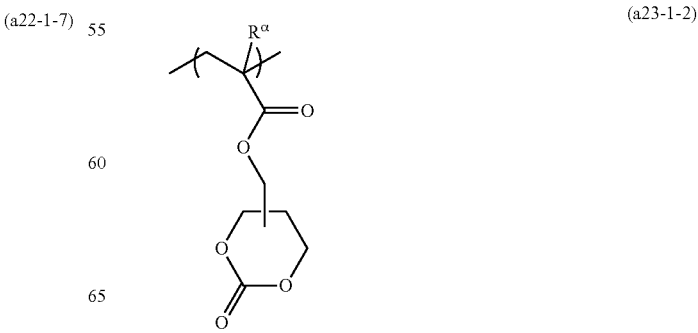

(a23-1-2)

(a23-1-3)

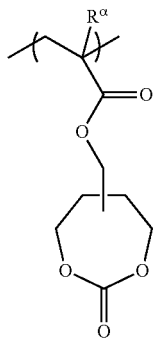

(a23-1-4)

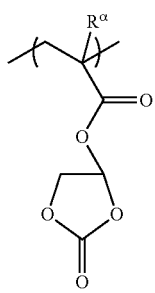

(a23-1-5)

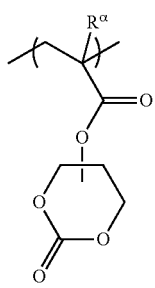

(a23-1-6)

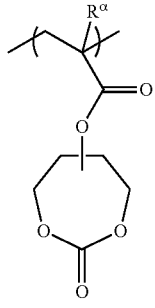

In the present invention, as a structural unit (a2), it is preferable to use at least one structural unit selected from the group consisting of formulae (a21-1) to (a21-3), (a22-1) to (a22-3) and (a23-1). Specifically, it is particularly desirable to use at least one structural unit selected from the group consisting of formulae (a2-1-1), (a2-2-1), (a2-3-1), (a22-1-1), (a22-1-2), (a22-1-5) and (a23-1-1).

In the component (A1), as the structural unit (a2), one type of structural unit may be used, or two or more types may be used in combination. When two or more types of the structural unit (a2) are used in combination, it is preferable to use a combination of the structural units (a21) and (a22); or a combination of the structural units (a22) and (a23).

In the component (A1), the amount of the structural unit (a2) based on the combined total of all structural units constituting the component (A1) is preferably 5 to 80 mol %, more preferably 5 to 70 mol %, and still more preferably 10 to 60 mol %. When the amount of the structural unit (a2) is at least as large as the lower limit of the above-mentioned range, the effect of using the structural unit (a2) can be satisfactorily achieved. On the other hand, when the amount of the structural unit (a2) is no more than the upper limit of the above-mentioned range, a good balance can be achieved with the other structural units.

When the solvent developing negative-tone resist composition of the present invention is used in the method of forming a resist pattern of the third aspect described later, the amount of the structural unit (a2) based on the combined total of all structural units constituting the component (A1) is preferably 20 to 80 mol %, more preferably 20 to 70 mol %, and still more preferably 25 to 60 mol %. When the amount of the structural unit (a2) is at least as large as the lower limit of the above-mentioned range, a satisfactory solvent resistance and heat resistance can be imparted, so as to endure applying a block copolymer dissolved in an organic solvent on the resist pattern, or an anneal treatment at a high temperature required for phase separation of a block copolymer.

(Structural Unit (a0))

The structural unit (a0) is a structural unit derived from an acrylate ester containing an —$SO_2$— containing cyclic group and which may have the hydrogen atom bonded to the carbon atom on the α-position substituted with a substituent.

Here, an "—$SO_2$— containing cyclic group" refers to a cyclic group having a ring containing —$SO_2$— within the ring structure thereof, i.e., a cyclic group in which the sulfur atom (S) within —$SO_2$— forms part of the ring skeleton of the cyclic group. The ring containing —$SO_2$— within the ring skeleton thereof is counted as the first ring. A cyclic group in which the only ring structure is the ring that contains —$SO_2$— in the ring skeleton thereof is referred to as a monocyclic group, and a group containing other ring structures is described as a polycyclic group regardless of the structure of the other rings. The —$SO_2$— containing cyclic group may be either a monocyclic group or a polycyclic group.

As the —$SO_2$— containing cyclic group, a cyclic group containing —O—$SO_2$— within the ring skeleton thereof, i.e., a cyclic group containing a sultone ring in which —O—S- within the —O—$SO_2$— group forms part of the ring skeleton thereof is particularly desirable.

The —$SO_2$— containing cyclic group preferably has 3 to 30 carbon atoms, more preferably 4 to 20, still more preferably 4 to 15, and most preferably 4 to 12. Herein, the number of carbon atoms refers to the number of carbon atoms constituting the ring skeleton, excluding the number of carbon atoms within a substituent.

The —$SO_2$— containing cyclic group may be either a —$SO_2$— containing aliphatic cyclic group or a —$SO_2$— containing aromatic cyclic group. A —$SO_2$— containing aliphatic cyclic group is preferable.

Examples of the —$SO_2$— containing aliphatic cyclic group include aliphatic cyclic groups in which part of the carbon atoms constituting the ring skeleton has been substituted with a —$SO_2$— group or a —O—$SO_2$— group and has at least one hydrogen atom removed from the aliphatic hydrocarbon ring. Specific examples include an aliphatic hydrocarbon ring in which a —$CH_2$— group constituting the ring skeleton thereof has been substituted with a —$SO_2$— group and has at least one hydrogen atom removed therefrom; and an aliphatic hydrocarbon ring in which a —$CH_2$—$CH_2$— group constituting the ring skeleton has been substituted with a —O—$SO_2$— group and has at least one hydrogen atom removed therefrom.

The alicyclic hydrocarbon group preferably has 3 to 20 carbon atoms, and more preferably 3 to 12 carbon atoms.

The alicyclic hydrocarbon group may be either a monocyclic group or a polycyclic group. As the monocyclic group, a group in which two hydrogen atoms have been removed from a monocycloalkane of 3 to 6 carbon atoms is preferable. Examples of the monocycloalkane include cyclopentane and cyclohexane. As the polycyclic alicyclic hydrocarbon group, a group in which two hydrogen atoms have been removed from a polycycloalkane of 7 to 12 carbon atoms is preferable. Examples of the polycycloalkane include adamantane, norbornane, isobornane, tricyclodecane and tetracyclododecane.

The —$SO_2$— containing cyclic group may have a substituent. Examples of substituents include an alkyl group, an alkoxy group, a halogen atom, a halogenated alkyl group, a hydroxy group, an oxygen atom (=O), —COOR", —OC(=O)R", a hydroxyalkyl group and a cyano group.

The alkyl group for the substituent is preferably an alkyl group of 1 to 6 carbon atoms. Further, the alkyl group is preferably a linear alkyl group or a branched alkyl group. Specific examples include a methyl group, an ethyl group, a propyl group, an isopropyl group, an n-butyl group, an isobutyl group, a tert-butyl group, a pentyl group, an isopentyl group, a neopentyl group and a hexyl group. Among these, a methyl group or an ethyl group is preferable, and a methyl group is particularly desirable.

As the alkoxy group for the substituent, an alkoxy group of 1 to 6 carbon atoms is preferable. Further, the alkoxy group is preferably a linear or branched alkoxy group. Specific examples of the alkoxy groups include the aforementioned alkyl groups for the substituent having an oxygen atom (—O—) bonded thereto.

Examples of the halogen atom for the substituent include a fluorine atom, a chlorine atom, a bromine atom and an iodine atom, and a fluorine atom is preferable.

Examples of the halogenated alkyl group for the substituent include groups in which part or all of the hydrogen atoms within the aforementioned alkyl groups has been substituted with the aforementioned halogen atoms.

As examples of the halogenated alkyl group for the substituent, groups in which part or all of the hydrogen atoms of the aforementioned alkyl groups for the substituent have been substituted with the aforementioned halogen atoms can be given. As the halogenated alkyl group, a fluorinated alkyl group is preferable, and a perfluoroalkyl group is particularly desirable.

In the —COOR" group and the —OC(=O)R" group, R" represents a hydrogen atom or a linear, branched or cyclic alkyl group of 1 to 15 carbon atoms.

When R" represents a linear or branched alkyl group, it is preferably an alkyl group of 1 to 10 carbon atoms, more preferably an alkyl group of 1 to 5 carbon atoms, and most preferably a methyl group or an ethyl group.

When R" is a cyclic alkyl group (cycloalkyl group), it preferably has 3 to 15 carbon atoms, more preferably 4 to 12 carbon atoms, and most preferably 5 to 10 carbon atoms. As examples of the cycloalkyl group, groups in which one or more hydrogen atoms have been removed from a monocycloalkane or a polycycloalkane such as a bicycloalkane, tricycloalkane or tetracycloalkane, which may or may not be substituted with a fluorine atom or a fluorinated alkyl group, may be used. Specific examples include groups in which one or more hydrogen atoms have been removed from a monocycloalkane such as cyclopentane and cyclohexane; and groups in which one or more hydrogen atoms have been removed from a polycycloalkane such as adamantane, norbornane, isobornane, tricyclodecane or tetracyclododecane.

The hydroxyalkyl group for the substituent preferably has 1 to 6 carbon atoms, and specific examples thereof include the aforementioned alkyl groups for the substituent in which at least one hydrogen atom has been substituted with a hydroxy group.

More specific examples of the —$SO_2$— containing cyclic group include groups represented by general formulas (3-1) to (3-4) shown below.

[Chemical Formula 39]

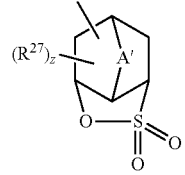

(3-1)

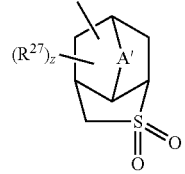

(3-2)

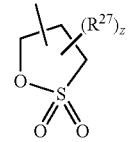

(3-3)

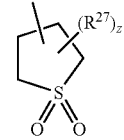

(3-4)

In the formulae, A' represents an oxygen atom, a sulfur atom or an alkylene group of 1 to 5 carbon atoms which may contain an oxygen atom or a sulfur atom; z represents an integer of 0 to 2; and $R^{27}$ represents an alkyl group, an alkoxy group, a halogenated alkyl group, a hydroxyl group, —COOR", —OC(=O)R", a hydroxyalkyl group or a cyano group, wherein R" represents a hydrogen atom or an alkyl group.

In general formulas (3-1) to (3-4) above, A' represents an oxygen atom (—O—), sulfur atom (—S—) or an alkylene group of 1 to 5 carbon atoms which may contain an oxygen atom or a sulfur atom.

As the alkylene group of 1 to 5 carbon atoms for A', a linear or branched alkylene group is preferable, and examples thereof include a methylene group, an ethylene group, an n-propylene group and an isopropylene group.

Examples of alkylene groups that contain an oxygen atom or a sulfur atom include the aforementioned alkylene groups in which —O— or —S— is bonded to the terminal of the alkylene group or present between the carbon atoms of the alkylene group. Specific examples of such alkylene groups include —O—$CH_2$—, —$CH_2$—O—$CH_2$—, —S—$CH_2$— and —$CH_2$—S—$CH_2$—.

As A', an alkylene group of 1 to 5 carbon atoms or —O— is preferable, more preferably an alkylene group of 1 to 5 carbon atoms, and most preferably a methylene group.

z represents an integer of 0 to 2, and is most preferably 0.

If there are two of the R$^{27}$ group, as indicated by the value z, then the two of the R$^{27}$ group may be the same or different from each other.

As the alkyl group, alkoxy group, halogenated alkyl group, —COOR″, —OC(=O)R″ and hydroxyalkyl group for R$^{27}$, the same alkyl groups, alkoxy groups, halogenated alkyl groups, —COOR″, —OC(=O)R″ and hydroxyalkyl groups as those described above as the substituent for the —SO$_2$— containing cyclic group can be mentioned.

Specific examples of the cyclic groups represented by general formulas (3-1) to (3-4) are shown below. In the formulas shown below, "Ac" represents an acetyl group.

[Chemical Formula 40]

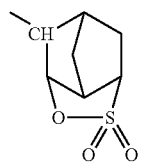 (3-1-1)

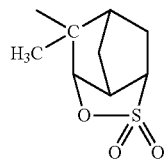 (3-1-2)

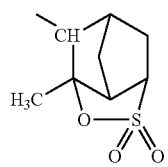 (3-1-3)

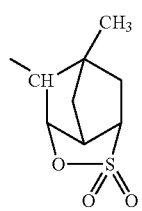 (3-1-4)

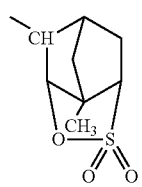 (3-1-5)

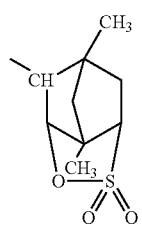 (3-1-6)

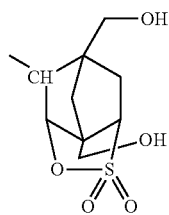 (3-1-7)

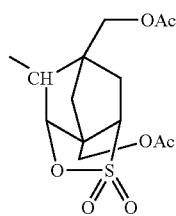 (3-1-8)

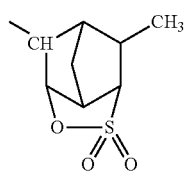 (3-1-9)

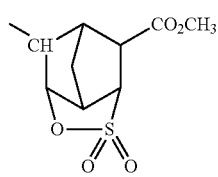 (3-1-10)

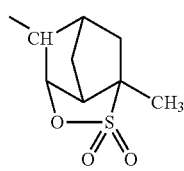 (3-1-11)

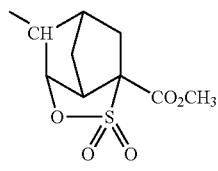 (3-1-12)

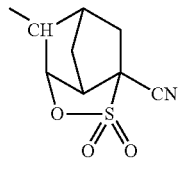 (3-1-13)

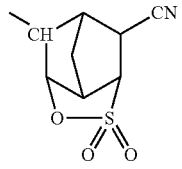 (3-1-14)

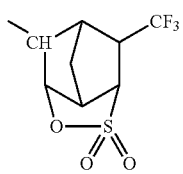 (3-1-15)
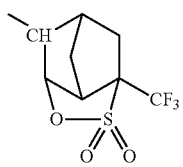 (3-1-16)
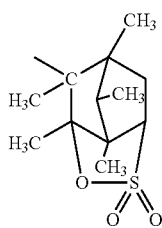 (3-1-17)
[Chemical Formula 41]
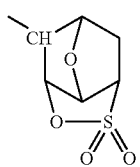 (3-1-18)
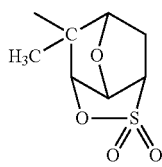 (3-1-19)
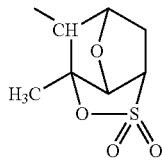 (3-1-20)
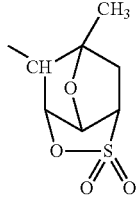 (3-1-21)
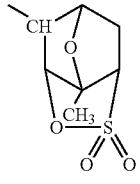 (3-1-22)
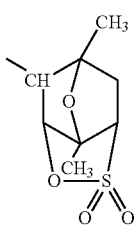 (3-1-23)
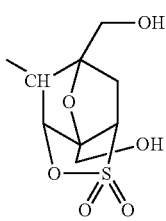 (3-1-24)
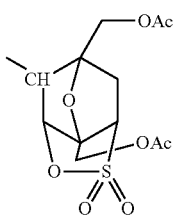 (3-1-25)
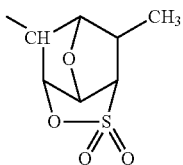 (3-1-26)
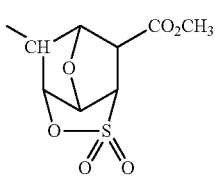 (3-1-27)
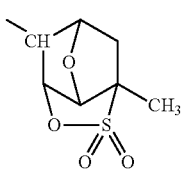 (3-1-28)
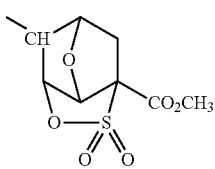 (3-1-29)
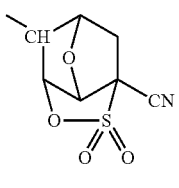 (3-1-30)

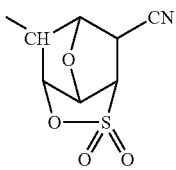
(3-1-31)

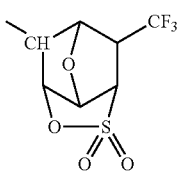
(3-1-32)

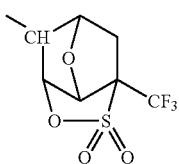
(3-1-33)

[Chemical Formula 42]

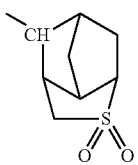
(3-2-1)

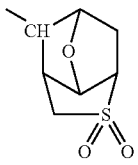
(3-2-2)

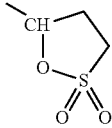
(3-3-1)

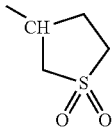
(3-4-1)

As the —$SO_2$— containing cyclic group, a group represented by the aforementioned general formula (3-1) is preferable, at least one member selected from the group consisting of groups represented by the aforementioned chemical formulas (3-1-1), (3-1-18), (3-3-1) and (3-4-1) is more preferable, and a group represented by chemical formula (3-1-1) is most preferable.

More specifically, examples of the structural unit (a0) include structural units represented by general formula (a0-0) shown below.

[Chemical Formula 43]

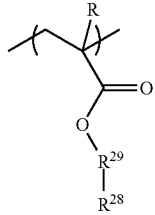
(a0-0)

In the formula, R represents a hydrogen atom, an alkyl group of 1 to 5 carbon atoms or a halogenated alkyl group of 1 to 5 carbon atoms; $R^{28}$ represents a —$SO_2$-containing cyclic group; and $R^{29}$ is the same as defined above.

In genera formula (a0-0), R is the same as defined above.

$R^{28}$ is the same as defined for the aforementioned —$SO_2$— containing group.

The structural unit (a0) is preferably a structural unit represented by general formula (a0-0-1) shown below.

[Chemical Formula 44]

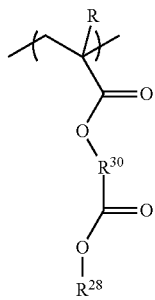
(a0-0-1)

In the formula, R and $R^{28}$ are the same as defined above; and $R^{30}$ represents a divalent linking group.

$R^{30}$ is not particularly limited. For example, the same divalent linking groups as those described for $Y^2$ in general formula (a1-0-2) explained above in relation to the structural unit (a1) can be mentioned.

As the divalent linking group for $R^{30}$, a linear or branched alkylene group, a divalent alicyclic hydrocarbon group or a divalent linking group containing a hetero atom is preferable.

As the linear or branched alkylene group, the divalent alicyclic hydrocarbon group and the divalent linking group containing a hetero atom, the same linear or branched alkylene group, divalent alicyclic hydrocarbon group and divalent linking group containing a hetero atom as those described above as preferable examples of $Y^2$ can be mentioned.

Among these, a linear or branched alkylene group, or a divalent linking group containing an oxygen atom as a hetero atom is more preferable.

As the linear alkylene group, a methylene group or an ethylene group is preferable, and a methylene group is particularly desirable.

As the branched alkylene group, an alkylmethylene group or an alkylethylene group is preferable, and —CH($CH_3$)—, —C($CH_3$)$_2$— or —C($CH_3$)$_2$$CH_2$— is particularly desirable.

As the divalent linking group containing a hetero atom, a divalent linking group containing an ether bond or an ester bond is preferable, and a group represented by the aforementioned formula -A-O—B—, -[A-C(=O)—O]$_m$—B— or -A-O—C(C=O)—B— is more preferable. m represents an integer of 1 to 3.

Among these, a group represented by the formula -A-O—C(C=O)—B— is preferable, and a group represented by the formula: —(CH$_2$)$_c$—C(=O)—O—(CH$_2$)$_d$— is particularly desirable. c represents an integer of 1 to 5, and preferably 1 or 2. d represents an integer of 1 to 5, and preferably 1 or 2.

In particular, as the structural unit (a0), a structural unit represented by general formula (a0-1-11) or (a0-1-12) shown below is preferable, and a structural unit represented by general formula (a0-1-12) is more preferable.

[Chemical Formula 45]

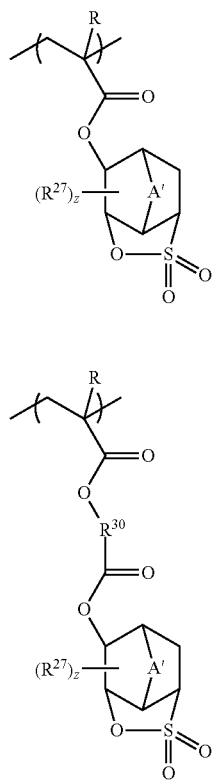

(a0-1-11)

(a0-1-12)

In the formulae, R, A', R$^{27}$, z and R$^{30}$ are the same as defined above.

In general formula (a0-1-11), A' is preferably a methylene group, an oxygen atom (—O—) or a sulfur atom (—S—).

As R$^{30}$, a linear or branched alkylene group or a divalent linking group containing an oxygen atom is preferable. As the linear or branched alkylene group and the divalent linking group containing an oxygen atom represented by R$^{30}$, the same linear or branched alkylene groups and the divalent linking groups containing an oxygen atom as those described above can be mentioned.

As the structural unit represented by general formula (a0-1-12), a structural unit represented by general formula (a0-1-12a) or (a0-1-12b) shown below is particularly desirable.

[Chemical Formula 46]

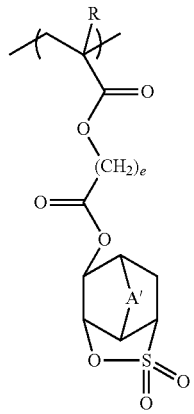

(a0-1-12a)

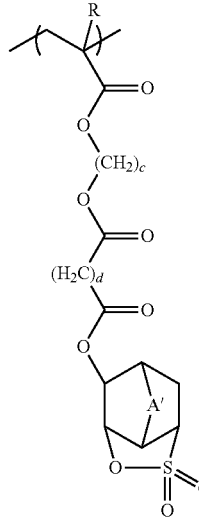

(a0-1-12b)

In the formulas, R and A' are the same as defined above; and each of c to e independently represents an integer of 1 to 3.

In the component (A1), the amount of the structural unit (a0) based on the combined total of all structural units constituting the component (A1) is preferably 1 to 80 mol %, more preferably 10 to 70 mol %, still more preferably 10 to 65 mol %, and particularly preferably 10 to 60 mol %. When the amount of the structural unit (a0) is at least as large as the lower limit of the above-mentioned range, the effect of using the structural unit (a0) can be satisfactorily achieved. On the other hand, when the amount of the structural unit (a0) is no more than the upper limit of the above-mentioned range, a good balance can be achieved with the other structural units, and various lithography properties such as DOF and CDU and pattern shape can be improved.

(Structural Unit (a3))

The structural unit (a3) is a structural unit derived from an acrylate ester containing a polar group-containing aliphatic hydrocarbon group and may have the hydrogen atom bonded to the carbon atom on the α-position substituted with a substituent.

When the component (A1) includes the structural unit (a3), the hydrophilicity of the component (A) is improved, and hence, the compatibility of the component (A) with the developing solution is improved. As a result, the alkali solubility of the exposed portions improves, which contributes to favorable improvements in the resolution.

Examples of the polar group include a hydroxyl group, a cyano group, a carboxyl group, an oxo group or a hydroxyalkyl group in which part of the hydrogen atoms of the alkyl group have been substituted with fluorine atoms, although a hydroxyl group is particularly desirable.

Examples of the aliphatic hydrocarbon group include linear or branched hydrocarbon groups (preferably alkylene groups) of 1 to 10 carbon atoms, and polycyclic aliphatic hydrocarbon groups (polycyclic groups). These polycyclic groups can be selected appropriately from the multitude of groups that have been proposed for the resins of resist compositions designed for use with ArF excimer lasers. The polycyclic group preferably has 7 to 30 carbon atoms.

Of the various possibilities, structural units derived from an acrylate ester that includes an aliphatic polycyclic group that contains a hydroxyl group, a cyano group, a carboxyl group, an oxo group or a hydroxyalkyl group in which part of the hydrogen atoms of the alkyl group have been substituted with fluorine atoms are particularly desirable. Examples of the polycyclic group include groups in which two or more hydrogen atoms have been removed from a bicycloalkane, tricycloalkane, tetracycloalkane or the like. Specific examples include groups in which two or more hydrogen atoms have been removed from a polycycloalkane such as adamantane, norbornane, isobornane, tricyclodecane or tetracyclododecane. Of these polycyclic groups, a group in which two or more hydrogen atoms have been removed from adamantane, a group in which two or more hydrogen atoms have been removed from norbornane or a group in which two or more hydrogen atoms have been removed from tetracyclododecane are preferred industrially.

When the aliphatic hydrocarbon group within the polar group-containing aliphatic hydrocarbon group is a linear or branched hydrocarbon group of 1 to 10 carbon atoms, the structural unit (a3) is preferably a structural unit derived from a hydroxyethyl ester of acrylic acid. On the other hand, when the hydrocarbon group is a polycyclic group, structural units represented by formulae (a3-1) to (a3-9) shown below are preferable.

[Chemical Formula 47]

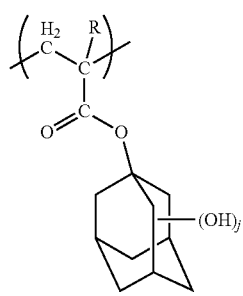

(a3-1)

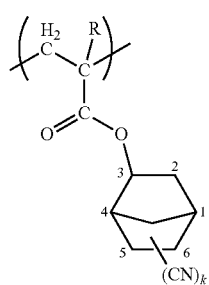

(a3-2)

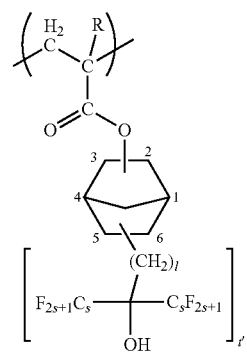

(a3-3)

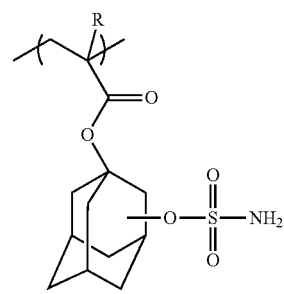

(a3-4)

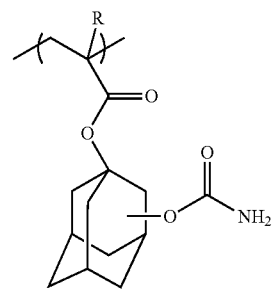

(a3-5)

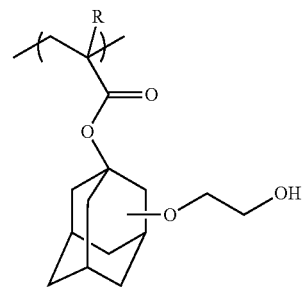

(a3-6)

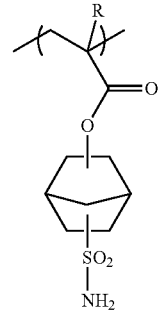

(a3-7)

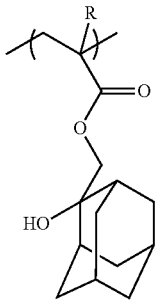

(a3-8)

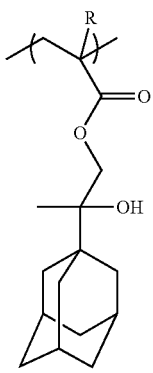

(a3-9)

In the formulae, R is the same as defined above; j represents an integer of 1 to 3; k represents an integer of 1 to 3; t' represents an integer of 1 to 3; l represents an integer of 1 to 5; and s represents an integer of 1 to 3.

In formula (a3-1), j is preferably 1 or 2, and more preferably 1. When j is 2, it is preferable that the hydroxyl groups be bonded to the 3rd and 5th positions of the adamantyl group. When j is 1, it is preferable that the hydroxyl group be bonded to the 3rd position of the adamantyl group.

In formula (a3-2), k is preferably 1. The cyano group is preferably bonded to the 5th or 6th position of the norbornyl group.

In formula (a3-3), t' is preferably 1. l is preferably 1. s is preferably 1. Further, in formula (a3-3), it is preferable that a 2-norbonyl group or 3-norbonyl group be bonded to the terminal of the carboxy group of the acrylic acid. The fluorinated alkyl alcohol is preferably bonded to the 5th or 6th position of the norbornyl group.

In the component (A1), as the structural unit (a3), one type of structural unit may be used, or two or more types may be used in combination.

In the component (A1), the amount of the structural unit (a3) based on the combined total of all structural units constituting the component (A1) is preferably 5 to 50 mol %, more preferably 5 to 40 mol %, and still more preferably 5 to 25 mol %. When the amount of the structural unit (a3) is at least as large as the lower limit of the above-mentioned range, the effect of using the structural unit (a3) can be satisfactorily achieved. On the other hand, when the amount of the structural unit (a3) is no more than the upper limit of the above-mentioned range, a good balance can be achieved with the other structural units.

(Structural Unit (a4))

The component (A1) may also have a structural unit (a4) which is other than the above-mentioned structural units (a0) to (a3), as long as the effects of the present invention are not impaired.

As the structural unit (a4), any other structural unit which cannot be classified as one of the above structural units (A) to (a3) can be used without any particular limitation, and any of the multitude of conventional structural units used within resist resins for ArF excimer lasers or KrF excimer lasers (and particularly for ArF excimer lasers) can be used.

As the structural unit (a4), a structural unit which contains a non-acid-dissociable aliphatic polycyclic group, and is also derived from an acrylate ester is preferable. Examples of this polycyclic group include the same groups as those described above in relation to the aforementioned structural unit (a1), and any of the multitude of conventional polycyclic groups used within the resin component of resist compositions for ArF excimer lasers or KrF excimer lasers (and particularly for ArF excimer lasers) can be used.

In consideration of industrial availability and the like, at least one polycyclic group selected from amongst a tricyclodecyl group, adamantyl group, tetracyclododecyl group, isobornyl group, and norbornyl group is particularly desirable. These polycyclic groups may be substituted with a linear or branched alkyl group of 1 to 5 carbon atoms. Further, as the structural unit (a4), a structural unit derived from an acrylate ester which contains a non-acid-dissociable aromatic group, a structural unit derived from a styrene and a structural unit derived from a hydroxystyrene are also preferably used.

Specific examples of the structural unit (a4) include structural units with structures represented by general formulas (a4-1) to (a4-9) shown below, vinyl(hydroxy)naphthalene, (hydroxy)naphthyl(meth)acrylate, and (hydroxy)benzyl (meth)acrylate.

[Chemical Formula 48]

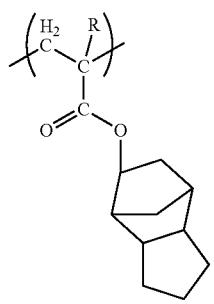

(a4-1)

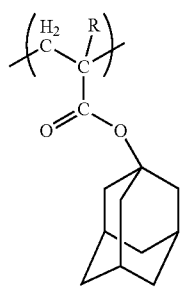

(a4-2)

(a4-3)

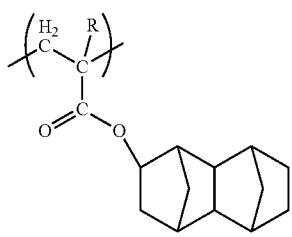

(a4-4)

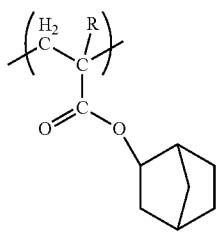

(a4-5)

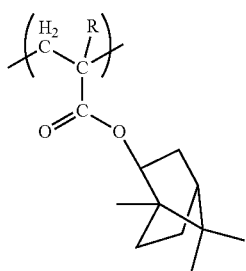

(a4-6)

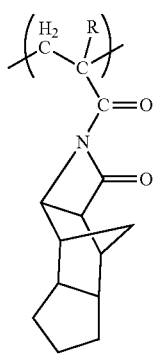

(a4-7)

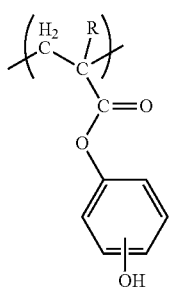

(a4-8)

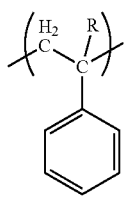

(a4-9)

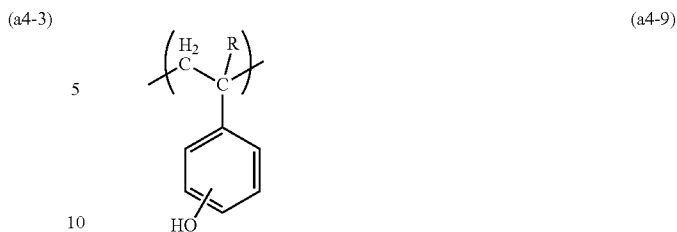

In the formulas, R is the same as defined above; in the formulae (a4-7) and (a4-9), the bonding position of the hydroxy group is at an arbitrary position of the benzene ring.

When the structural unit (a4) is included in the component (A1), the amount of the structural unit (a4) based on the combined total of all the structural units that constitute the component (A1) is preferably within the range from 1 to 30 mol %, and more preferably from 10 to 20 mol %.

In the resist composition of the present invention, the component (A1) is a copolymer including the structural units (a1) and (a2). Examples of the copolymer include a copolymer having the structural units (a1), (a2) and (a0); a copolymer having the structural units (a1), (a2) and (a3); a copolymer having the structural units (a1), (a2) and (a4); a copolymer having the structural units (a1), (a2), (a0) and (a3); and a copolymer having the structural units (a1), (a2), (a0) and (a4).

In the present invention, as the component (A1), a copolymer that includes a combination of structural units represented by formulae (A1-11) to (A1-26) shown below is particularly desirable. In general formulae shown below, R, $R^{29}$, s'', R', $R^{12}$, h, j, $R^{11}$, e, A', A'', q'', $R^{1t}$ and $R^{2t}$ are the as defined above, and the plurality of R, $R^{29}$ and R' may be the same or different.

[Chemical Formula 49]

(A1-11)

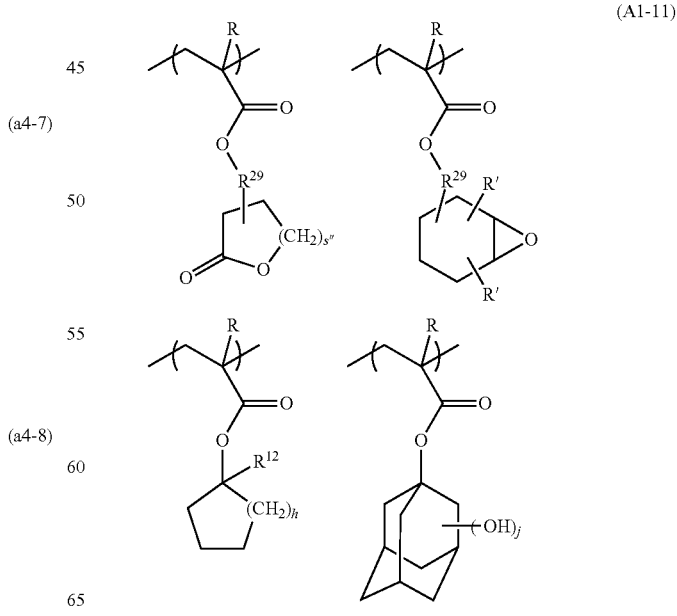

-continued
(A1-13)
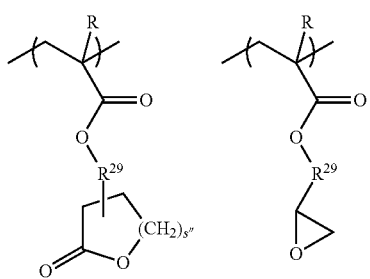
[Chemical Formula 50]
(A1-14)
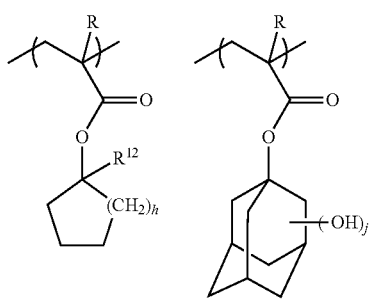
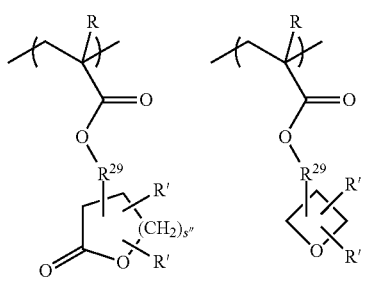
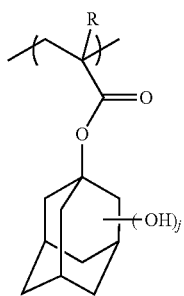
(A1-15)
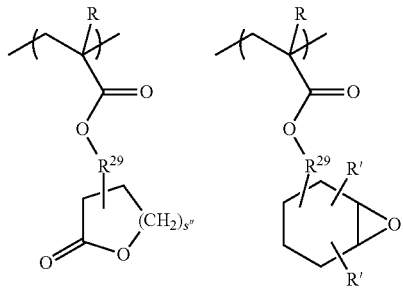
(A1-16)
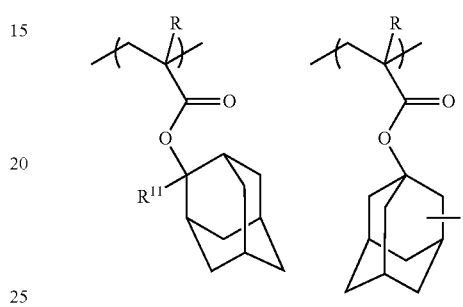
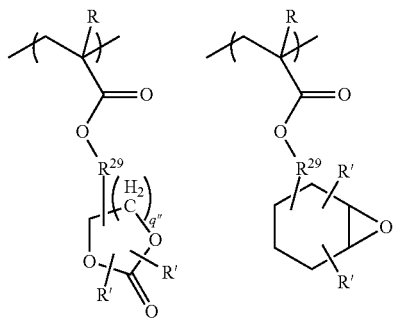
[Chemical Formula 51]
(A1-17)
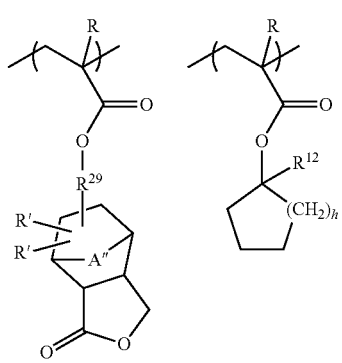
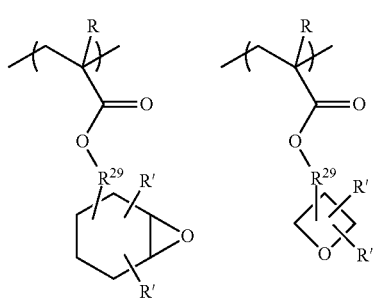

-continued
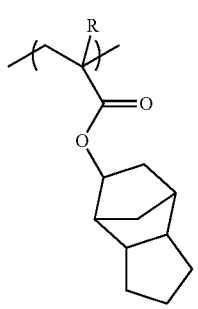 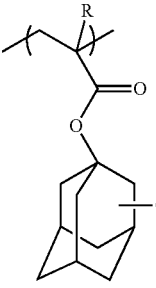
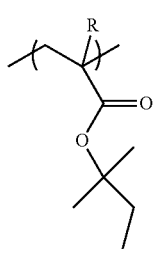
(A1-18)
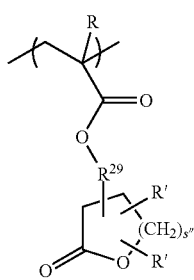 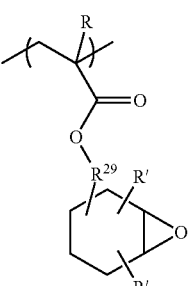
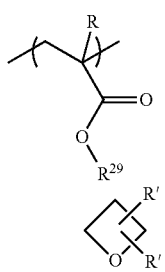 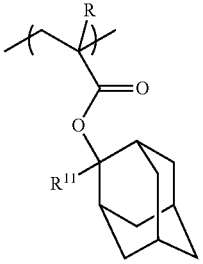
(A1-19)
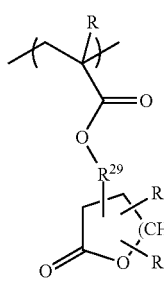 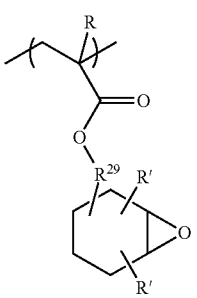
-continued
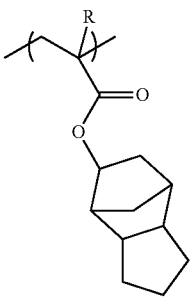 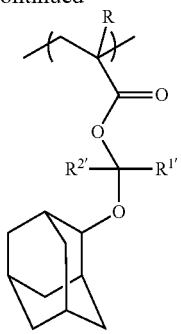
[Chemical Formula 52]
(A1-20)
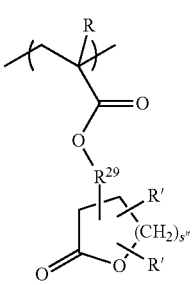 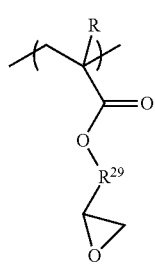
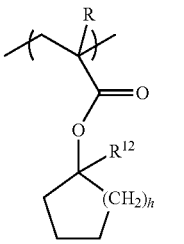 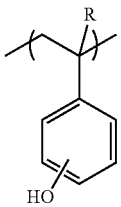
(A1-21)
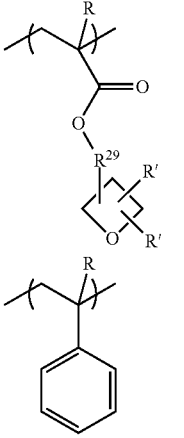 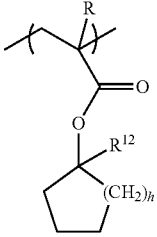
(A1-22)
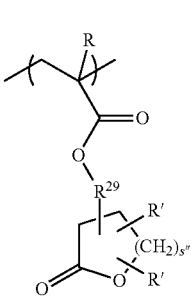 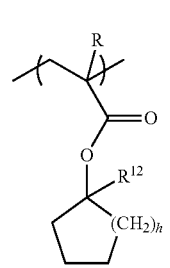

[Chemical Formula 53]

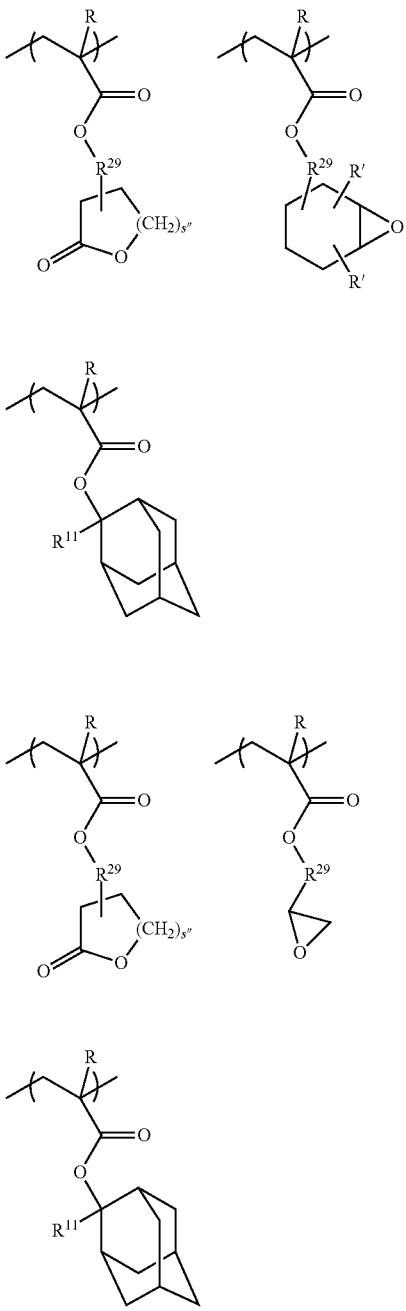

(A1-23)

(A1-24)

[Chemical Formula 54]

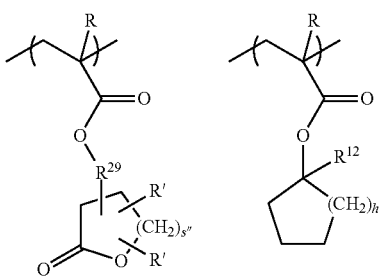

(A1-25)

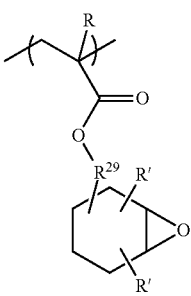

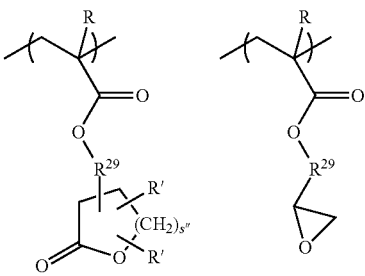

(A1-26)

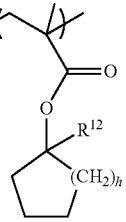

The component (A1) can be obtained, for example, by a conventional radical polymerization or the like of the monomers corresponding with each of the structural units, using a radical polymerization initiator such as azobisisobutyronitrile (AIBN) or dimethyl 2,2'-azobis(isobutyrate).

Furthermore, in the component (A1), by using a chain transfer agent such as HS—$CH_2$—$CH_2$—$CH_2$—$C(CF_3)_2$—OH, a —$C(CF_3)_2$—OH group can be introduced at the terminals of the component (A1). Such a copolymer having introduced a hydroxyalkyl group in which some of the hydrogen atoms of the alkyl group are substituted with fluorine atoms is effective in reducing developing defects and LER (line edge roughness: unevenness of the side walls of a line pattern).

The weight average molecular weight (Mw) (the polystyrene equivalent value determined by gel permeation chromatography) of the component (A1) is not particularly limited, but is preferably 1,000 to 50,000, more preferably 1,500 to 30,000, and most preferably 2,500 to 20,000. When the weight average molecular weight is no more than the upper limit of the above-mentioned range, the resist composition exhibits a satisfactory solubility in a resist solvent. On the other hand, when the weight average molecular weight is at least as large as the lower limit of the above-mentioned range, dry etching resistance and the cross-sectional shape of the resist pattern becomes satisfactory. Further, the dispersity (Mw/Mn) of the component (A1) is not particularly limited, but is preferably 1.0 to 5.0, more preferably 1.0 to 3.0, and most preferably 1.2 to 2.5.

Here, Mn is the number average molecular weight.

In the component (A), as the component (A1), one type may be used, or two or more types of compounds may be used in combination.

In the component (A), the amount of the component (A1) based on the total weight of the component (A) is preferably 25% by weight or more, more preferably 50% by weight or more, still more preferably 75% by weight or more, and may be even 100% by weight. When the amount of the component (A1) is 25% by weight or more, various lithography properties are improved.

[Component (A2)]

In the resist composition of the present invention, the component (A) may contain "a base component which exhibits increased polarity under action of acid and then exhibits decreased solubility in a developing solution containing an organic solvent" other than the component (A1) (hereafter, referred to as "component (A2)").

The component (A2) is not particularly limited, and any of the multitude of conventional base components used within chemically amplified resist compositions (e.g., base resins used within chemically amplified resist compositions for ArF excimer lasers or KrF excimer lasers, preferably ArF excimer lasers) can be used. For example, as a base resin for ArF excimer laser, a base resin having the aforementioned structural unit (a1) as an essential component, and optionally the aforementioned structural units (a0), (a2) to (a4) can be used.

As the component (A2), one type of base component may be used, or two or more types of base components may be used in combination.

In the resist composition of the present invention, as the component (A), one type may be used, or two or more types may be used in combination.

In the resist composition of the present invention, the amount of the component (A) can be appropriately adjusted depending on the thickness of the resist film to be formed, and the like.

<Component (B)>

[Component (B1)]

In the resist composition of the present invention, the component (B) includes an acid generator (B1) containing a compound which generates a sulfonic acid upon exposure (hereafter, this acid generator (B1) is referred to as "component (B1)").

As the component (B1), there is no particular limitation as long as it is a compound which generates a sulfonic acid upon exposure, and any of the known acid generators used in conventional chemically amplified resist compositions can be used.

Specific examples of the component (B1) include onium salt-based acid generators containing a sulfonate anion, oxime sulfonate-based acid generators, sulfonyl diazomethane-based acid generators, imidesulfonate-based acid generators and nitrobenzylsulfonate-based acid generators.

(Onium Salt-Based Acid Generator Containing Sulfonate Anion)

As an onium salt acid generator containing a sulfonate anion, a compound represented by general formula (b0) shown below can be used.

[Chemical Formula 55]

(b0)

In the formula, $R^{4\prime\prime\prime}$ represents an alkyl group, a halogenated alkyl group, an aryl group or an alkenyl group which may have a substituent; and $Z^+$ represents an organic cation.

In formula (b0), $R^{4\prime\prime\prime}$ represents an alkyl group, a halogenated alkyl group, an aryl group or an alkenyl group which may have a substituent.

The alkyl group for $R^{4\prime\prime\prime}$ may be any of linear, branched or cyclic.

The linear or branched alkyl group preferably has 1 to 10 carbon atoms, more preferably 1 to 8 carbon atoms, and most preferably 1 to 4 carbon atoms.

The cyclic alkyl group preferably has 4 to 15 carbon atoms, more preferably 4 to 10 carbon atoms, and most preferably 6 to 10 carbon atoms.

As an example of the halogenated alkyl group for $R^{4\prime\prime\prime}$, a group in which part of or all of the hydrogen atoms of the aforementioned linear, branched or cyclic alkyl group have been substituted with halogen atoms can be given. Examples of the aforementioned halogen atom include a fluorine atom, a chlorine atom, a bromine atom and an iodine atom, and a fluorine atom is preferable.

In the halogenated alkyl group, the percentage of the number of halogen atoms based on the total number of halogen atoms and hydrogen atoms (halogenation ratio (%)) is preferably 10 to 100%, more preferably 50 to 100%, and most preferably 100%. Higher halogenation ratio is preferable because the acid strength increases.

Examples of the anions in which $R^{4\prime\prime\prime}$ represents a fluorinated alkyl group include trifluoromethanesulfonate, nonafluorobutanesulfonate and heptafluoropropanesulfonate.

The aryl group for $R^{4\prime\prime\prime}$ is preferably an aryl group of 6 to 20 carbon atoms.

The alkenyl group for $R^{4\prime\prime\prime}$ is preferably an alkenyl group of 2 to 10 carbon atoms.

With respect to $R^{4\prime\prime\prime}$, the expression "may have a substituent" means that part of or all of the hydrogen atoms within the aforementioned linear, branched or cyclic alkyl group, halogenated alkyl group, aryl group or alkenyl group may be substituted with substituents (atoms other than hydrogen atoms, or groups).

$R^{4\prime\prime\prime}$ may have one substituent, or two or more substituents.

Examples of the substituent include a halogen atom, a hetero atom, an alkyl group, and a group represented by the formula X-$Q^1$- (in the formula, X represents a hydrocarbon group of 3 to 30 carbon atoms which may have a substituent; and $Q^1$ represents a divalent linking group containing an oxygen atom).

Examples of halogen atoms and alkyl groups as substituents include the same halogen atoms and alkyl groups as those described above with respect to the halogenated alkyl group for $R^{4\prime\prime\prime}$.

Examples of hetero atoms include an oxygen atom, a nitrogen atom, and a sulfur atom.

Among these, as $R^{4\prime\prime\prime}$, a fluorinated alkyl group having an X-$Q^1$- group as a substituent is preferable. As a component (B1), a compound represented by general formula (b1) shown below is particularly preferable. $Z^+$ in the formula (b0) is described later.

[Chemical Formula 56]

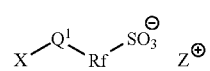

(b1)

In the formula, X, $Q^1$ and $Z^+$ are the same as defined above; Rf represents a fluorinated alkylene group of 1 to 4 carbon atoms which may have a substituent.

In general formula (b1) above, X represents a hydrocarbon group of 3 to 30 carbon atoms.

The hydrocarbon group for X may be either an aromatic hydrocarbon group or an aliphatic hydrocarbon group.

The aromatic hydrocarbon group is a hydrocarbon group having an aromatic ring. The aromatic hydrocarbon group preferably has 3 to 30 carbon atoms, more preferably 5 to 30, still more preferably 5 to 20, still more preferably 6 to 15, and most preferably 6 to 12. Here, the number of carbon atoms within a substituent(s) is not included in the number of carbon atoms of the aromatic hydrocarbon group.

Specific examples of aromatic hydrocarbon groups include an aryl group which is an aromatic hydrocarbon ring having one hydrogen atom removed therefrom, such as a phenyl group, a biphenyl group, a fluorenyl group, a naphthyl group, an anthryl group or a phenanthryl group; and an alkylaryl group such as a benzyl group, a phenethyl group, a 1-naphthylmethyl group, a 2-naphthylmethyl group, a 1-naphthylethyl group, or a 2-naphthylethyl group. The alkyl chain within the arylalkyl group preferably has 1 to 4 carbon atom, more preferably 1 or 2, and most preferably 1.

The aromatic hydrocarbon group may have a substituent. For example, part of the carbon atoms constituting the aromatic ring within the aromatic hydrocarbon group may be substituted with a hetero atom, or a hydrogen atom bonded to the aromatic ring within the aromatic hydrocarbon group may be substituted with a substituent.

In the former example, a heteroaryl group in which part of the carbon atoms constituting the ring within the aforementioned aryl group has been substituted with a hetero atom such as an oxygen atom, a sulfur atom or a nitrogen atom, and a heteroarylalkyl group in which part of the carbon atoms constituting the aromatic hydrocarbon ring within the aforementioned arylalkyl group has been substituted with the aforementioned hetero atom can be used.

In the latter example, as the substituent for the aromatic hydrocarbon group, an alkyl group, an alkoxy group, a halogen atom, a halogenated alkyl group, a hydroxyl group, an oxygen atom (=O) or the like can be used.

The alkyl group as the substituent for the aromatic hydrocarbon group is preferably an alkyl group of 1 to 5 carbon atoms, and a methyl group, an ethyl group, a propyl group, an n-butyl group or a tert-butyl group is particularly desirable.

The alkoxy group as the substituent for the aromatic hydrocarbon group is preferably an alkoxy group having 1 to 5 carbon atoms, more preferably a methoxy group, an ethoxy group, an n-propoxy group, an iso-propoxy group, an n-butoxy group or a tert-butoxy group, and most preferably a methoxy group or an ethoxy group.

Examples of the halogen atom as the substituent for the aromatic hydrocarbon group include a fluorine atom, a chlorine atom, a bromine atom and an iodine atom, and a fluorine atom is preferable.

Example of the halogenated alkyl group as the substituent for the aromatic hydrocarbon group includes a group in which part or all of the hydrogen atoms within the aforementioned alkyl group have been substituted with the aforementioned halogen atoms.

The aliphatic hydrocarbon group for X may be either a saturated aliphatic hydrocarbon group, or an unsaturated aliphatic hydrocarbon group. Further, the aliphatic hydrocarbon group may be linear, branched or cyclic.

In the aliphatic hydrocarbon group for X, part of the carbon atoms constituting the aliphatic hydrocarbon group may be substituted with a substituent group containing a hetero atom, or part or all of the hydrogen atoms constituting the aliphatic hydrocarbon group may be substituted with a substituent group containing a hetero atom.

As the "hetero atom" for X, there is no particular limitation as long as it is an atom other than carbon and hydrogen. Examples of hetero atoms include a halogen atom, an oxygen atom, a sulfur atom and a nitrogen atom. Examples of the halogen atom include a fluorine atom, a chlorine atom, an iodine atom and a bromine atom.

The substituent group containing a hetero atom may consist of a hetero atom, or may be a group containing a group or atom other than a hetero atom.

Specific examples of the substituent group for substituting a part of the carbon atoms include —O—, —C(C=O)—O—, —C(C=O)—, —O—C(C=O)—O—, —C(C=O)—NH—, —NH— (the H may be substituted with a substituent such as an alkyl group or an acyl group), —S—, —S(=O)$_2$— and —S(=O)$_2$—O—. When the aliphatic hydrocarbon group is cyclic, the aliphatic hydrocarbon group may contain any of these substituent groups in the ring structure.

Examples of the substituent group for substituting part or all of the hydrogen atoms include an alkoxy group, a halogen atom, a halogenated alkyl group, a hydroxyl group, an oxygen atom (=O) and a cyano group.

The aforementioned alkoxy group is preferably an alkoxy group having 1 to 5 carbon atoms, more preferably a methoxy group, an ethoxy group, an n-propoxy group, an iso-propoxy group, an n-butoxy group or a tert-butoxy group, and most preferably a methoxy group or an ethoxy group.

Examples of the aforementioned halogen atom include a fluorine atom, a chlorine atom, a bromine atom and an iodine atom, and a fluorine atom is preferable.

Example of the aforementioned halogenated alkyl group includes a group in which a part or all of the hydrogen atoms within an alkyl group of 1 to 5 carbon atoms (e.g., a methyl group, an ethyl group, a propyl group, an n-butyl group or a tert-butyl group) have been substituted with the aforementioned halogen atoms.

As the aliphatic hydrocarbon group, a linear or branched saturated hydrocarbon group, a linear or branched monovalent unsaturated hydrocarbon group, or a cyclic aliphatic hydrocarbon group (aliphatic cyclic group) is preferable.

The linear saturated hydrocarbon group (alkyl group) preferably has 1 to 20 carbon atoms, more preferably 1 to 15, and most preferably 1 to 10. Specific examples include a methyl group, an ethyl group, a propyl group, a butyl group, a pentyl group, a hexyl group, a heptyl group, an octyl group, a nonyl group, a decyl group, an undecyl group, a dodecyl group, a tridecyl group, an isotridecyl group, a tetradecyl group, a pentadecyl group, a hexadecyl group, an isohexadecyl group, a heptadecyl group, an octadecyl group, a nonadecyl group, an icosyl group, a henicosyl group and a docosyl group.

The branched saturated hydrocarbon group (alkyl group) preferably has 3 to 20 carbon atoms, more preferably 3 to 15, and most preferably 3 to 10. Specific examples include a 1-methylethyl group, a 1-methylpropyl group, a 2-methylpropyl group, a 1-methylbutyl group, a 2-methylbutyl group, a 3-methylbutyl group, a 1-ethylbutyl group, a 2-ethylbutyl group, a 1-methylpentyl group, a 2-methylpentyl group, a 3-methylpentyl group and a 4-methylpentyl group.

The unsaturated hydrocarbon group preferably has 2 to 10 carbon atoms, more preferably 2 to 5, still more preferably 2 to 4, and particularly preferably 3. Examples of linear monovalent unsaturated hydrocarbon groups include a vinyl group, a propenyl group (an allyl group) and a butynyl group. Examples of branched monovalent unsaturated hydrocarbon groups include a 1-methylpropenyl group and a 2-methylpropenyl group.

Among the above-mentioned examples, as the unsaturated hydrocarbon group, a propenyl group is particularly desirable.

The aliphatic cyclic group may be either a monocyclic group or a polycyclic group. The aliphatic cyclic group preferably has 3 to 30 carbon atoms, more preferably 5 to 30, still more preferably 5 to 20, particularly preferably 6 to 15, and most preferably 6 to 12. As the aliphatic cyclic group, a group in which one or more hydrogen atoms have been removed from a monocycloalkane or a polycycloalkane such as a bicycloalkane, tricycloalkane or tetracycloalkane can be used. Specific examples include groups in which one or more hydrogen atoms have been removed from a monocycloalkane such as cyclopentane or cyclohexane; and groups in which one or more hydrogen atoms have been removed from a polycycloalkane such as adamantane, norbornane, isobornane, tricyclodecane or tetracyclododecane.

When the aliphatic cyclic group does not contain a hetero atom-containing substituent group in the ring structure thereof, the aliphatic cyclic group is preferably a polycyclic group, more preferably a group in which one or more hydrogen atoms have been removed from a polycycloalkane, and a group in which one or more hydrogen atoms have been removed from adamantane is particularly desirable.

When the aliphatic cyclic group contains a hetero atom-containing substituent group in the ring structure thereof, the hetero atom-containing substituent group is preferably —O—, —C(C=O)—O—, —S—, —S(=O)$_2$— or —S(=O)$_2$—O—. Specific examples of such aliphatic cyclic groups include groups represented by formulas (L1) to (L6) and (S1) to (S4) shown below.

[Chemical Formula 57]

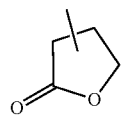

(L1)

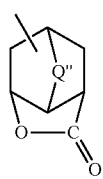

(L2)

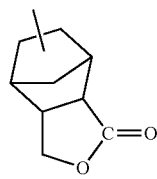

(L3)

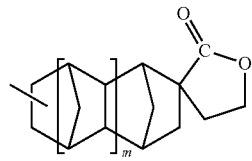

(L4)

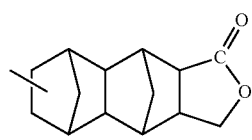

(L5)

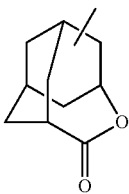

(L6)

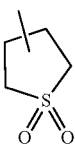

(S1)

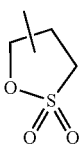

(S2)

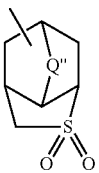

(S3)

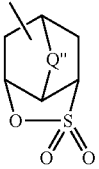

(S4)

In the formulas, Q" represents an alkylene group of 1 to 5 carbon atoms, —O—, —S—, —O—R$^{94}$— or —S—R$^{95}$— (R$^{94}$ and R$^{95}$ each independently represent an alkylene group of 1 to 5 carbon atoms); and m represents an integer of 0 or 1.

In the formulae, as the alkylene group for Q", R$^{94}$ and R$^{95}$, the same alkylene groups as those described above for R$^{91}$ to R$^{93}$ can be used.

In these aliphatic cyclic groups, part of the hydrogen atoms bonded to the carbon atoms constituting the ring structure may be substituted with a substituent. Examples of substituents include an alkyl group, an alkoxy group, a halogen atom, a halogenated alkyl group, a hydroxyl group and an oxygen atom (=O).

As the alkyl group, an alkyl group of 1 to 5 carbon atoms is preferable, and a methyl group, an ethyl group, a propyl group, an n-butyl group or a tert-butyl group is particularly desirable.

As the alkoxy group and the halogen atom, the same groups as the substituent groups for substituting part or all of the hydrogen atoms of an aliphatic hydrocarbon group when X is an aliphatic hydrocarbon group can be used.

In the present invention, as X, a cyclic group which may have a substituent is preferable. The cyclic group may be either an aromatic hydrocarbon group which may have a substituent, or an aliphatic cyclic group which may have a substituent, and an aliphatic cyclic group which may have a substituent is preferable.

As the aromatic hydrocarbon group, a naphthyl group which may have a substituent, or a phenyl group which may have a substituent is preferable. As the aliphatic cyclic group which may have a substituent, an aliphatic polycyclic group which may have a substituent is preferable. As the aliphatic polycyclic group, the aforementioned group in which one or more hydrogen atoms have been removed from a polycycloalkane, and groups represented by the aforementioned formulas (L2) to (L6), (S3) and (S4) are preferable.

In general formula (b1) above, $Q^1$ represents a divalent linkage group containing an oxygen atom.

$Q^1$ may contain an atom other than an oxygen atom. Examples of atoms other than oxygen include a carbon atom, a hydrogen atom, a sulfur atom and a nitrogen atom. Examples of divalent linkage groups containing an oxygen atom include non-hydrocarbon, oxygen atom-containing linkage groups such as an oxygen atom (an ether bond; —O—), an ester bond (—C(C=O)—O—), an amido bond (—C(C=O)—NH—), a carbonyl group (—C(=O)—) and a carbonate group (—O—C(C=O)—O—); and a combination of any of the aforementioned non-hydrocarbon, oxygen atom-containing linkage groups with an alkylene group.

Specific examples of the combinations of the aforementioned non-hydrocarbon, oxygen atom-containing linkage groups with anlkylene groups include —$R^{91}$—O—, —$R^{92}$—O—C(=O)— and —C(=O)—O—$R^{93}$—O—C(C=O)— (in the formulas, $R^{91}$ to $R^{93}$ each independently represent an alkylene group.)

The alkylene group for $R^{91}$ to $R^{93}$ is preferably a linear or branched alkylene group, and preferably has 1 to 12 carbon atoms, more preferably 1 to 5, and particularly preferably 1 to 3.

Specific examples of the alkylene group include a methylene group [—CH$_2$—]; alkylmethylene groups such as —CH(CH$_3$)—, —CH(CH$_2$CH$_3$)—, —C(CH$_3$)$_2$—, —C(CH$_3$)(CH$_2$CH$_3$)—, —C(CH$_3$)(CH$_2$CH$_2$CH$_3$)— and —C(CH$_2$CH$_3$)$_2$—; an ethylene group [—CH$_2$CH$_2$—]; alkylethylene groups such as —CH(CH$_3$)CH$_2$—, —CH(CH$_3$)CH(CH$_3$)—, —C(CH$_3$)$_2$CH$_2$— and —CH(CH$_2$CH$_3$)CH$_2$—; a trimethylene group (n-propylene group) [—CH$_2$CH$_2$CH$_2$—]; alkyltrimethylene groups such as —CH(CH$_3$)CH$_2$CH$_2$— and —CH$_2$CH(CH$_3$)CH$_2$—; a tetramethylene group [—CH$_2$CH$_2$CH$_2$CH$_2$—]; alkyltetramethylene groups such as —CH(CH$_3$)CH$_2$CH$_2$CH$_2$— and —CH$_2$CH(CH$_3$)CH$_2$CH$_2$—; and a pentamethylene group [—CH$_2$CH$_2$CH$_2$CH$_2$CH$_2$—].

As $Q^1$, a divalent linking group containing an ester bond or an ether bond is preferable, and —$R^{91}$—O—, —$R^{92}$—O—C(C=O)— or —C(=O)—O—$R^{93}$—O—C(C=O)— is more preferable.

In general formula (b1), Rf represents a fluorinated alkylene group of 1 to 4 carbon atoms which may have a substituent.

As the fluorinated alkylene group for Rf, the aforementioned alkylene group of 1 to 4 carbon atom, in which part or all of the hydrogen atoms has been substituted with fluorine atoms can be used.

Specific examples of Rf include —CF$_2$—, —CF$_2$CF$_2$—, —CF$_2$CF$_2$CF$_2$—, —CF(CF$_3$)CF$_2$—, —CF(CF$_2$CF$_3$)—, —C(CF$_3$)$_2$—, —CF$_2$CF$_2$CF$_2$CF$_2$—, —CF(CF$_3$)CF$_2$CF$_2$—, —CF$_2$CF(CF$_3$)CF$_2$—, —CF(CF$_3$)CF(CF$_3$)—, —C(CF$_3$)$_2$CF$_2$—, —CF(CF$_2$CF$_3$)CF$_2$—, —CF(CF$_2$CF$_2$CF$_3$)—, —C(CF$_3$)(CF$_2$CF$_3$)—; —CHF—, —CH$_2$CF$_2$—, —CH$_2$CH$_2$CF$_2$—, —CH$_2$CF$_2$CF$_2$—, —CH(CF$_3$)CH$_2$—, —CH(CF$_2$CF$_3$)—, —C(CH$_3$)(CF$_3$)—, —CH$_2$CH$_2$CH$_2$CF$_2$—, —CH$_2$CH$_2$CF$_2$CF$_2$—, —CH(CF$_3$)CH$_2$CH$_2$—, —CH$_2$CH(CF$_3$)CH$_2$—, —CH(CF$_3$)CH(CF$_3$)—, and —C(CF$_3$)$_2$CH$_2$—.

Among these, as Rf, a fluorinated hydrocarbon group in which a carbon atom bonded to the adjacent sulfur atom has been fluorinated is preferable, and —CF$_2$—, —CF$_2$CF$_2$—, —CF$_2$CF$_2$CF$_2$—, or —CH$_2$CF$_2$CF$_2$— (the terminal CF$_2$ is bonded to SO$_3^-$ and the terminal —CH$_2$ is bonded to Q$^1$) is more preferable, —CF$_2$—, —CF$_2$CF$_2$— or —CF$_2$CF$_2$CF$_2$— is still more preferable, and —CF$_2$— is particularly preferable.

The fluorinated alkylene group may have a substituent. When the fluorinated alkylene group "has a substituent", it means that part or all of the hydrogen atoms and/or fluorine atoms within the fluorinated alkylene group has been substituted with atoms or groups other than a hydrogen atom or a fluorine atom.

Examples of substituents which the fluorinated alkylene group may have include an alkyl group of 1 to 4 carbon atoms, an alkoxy group of 1 to 4 carbon atoms and a hydroxyl group.

Specific examples of the anion moiety in the formula (b1) are shown below.

[Chemical Formula 58]

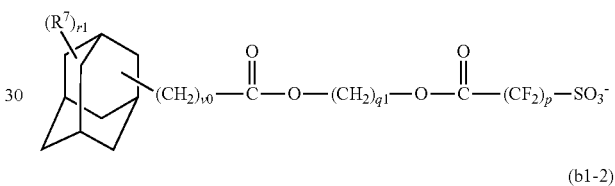

(b1-1)

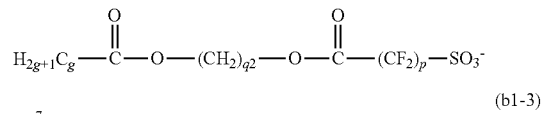

(b1-2)

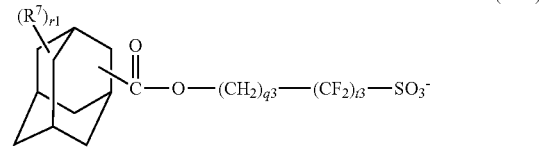

(b1-3)

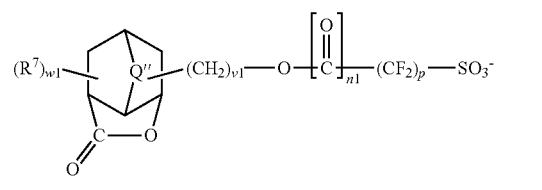

(b1-4)

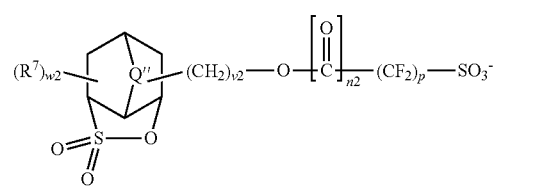

(b1-5)

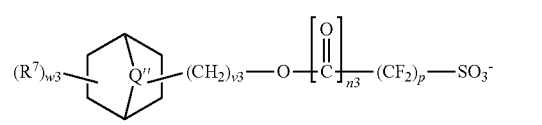

(b1-6)

-continued

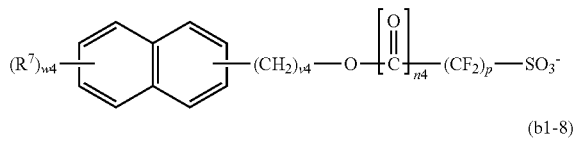
(b1-7)

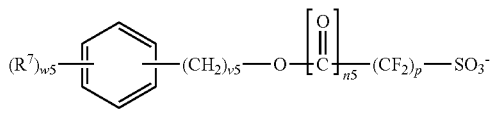
(b1-8)

In the formulas, p represents an integer of 1 to 3; each of q1 and q2 independently represents an integer of 1 to 5; q3 represents an integer of 1 to 12; t3 represents an integer of 1 to 3; each of r1 and r2 independently represents an integer of 0 to 3; g represents an integer of 1 to 20; $R^7$ represents a substituent; each of n1 to n5 independently represents 0 or 1; each of v0 to v5 independently represents an integer of 0 to 3; each of w1 to w5 independently represents an integer of 0 to 3; and Q" is the same as defined above.

As the substituent for $R^7$, the same groups as those which the aforementioned aliphatic hydrocarbon group or aromatic hydrocarbon group for X may have as a substituent can be used.

If there are two or more of the $R^7$ group, as indicated by the values r1, r2, and w1 to w5, then the two or more of the $R^7$ groups may be the same or different from each other.

Further, in the formulae (b1-7) and (b1-8), part of the carbon atoms constituting the aromatic ring may be substituted with a hetero atom. As the hetero atom, a nitrogen atom (N) is preferable.

In formulae (b0) and (b1), $Z^+$ represents an organic cation.

The organic cation for $Z^+$ is not particularly limited, and any of the known organic cations of onium salt-based acid generators used in conventional chemically amplified resists can be used.

As the organic cation for $Z^+$, a sulfonium or iodonium cation represented by general formula (b-1') or (b-2') shown below can be used.

[Chemical Formula 59]

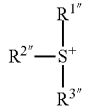
(b-1')

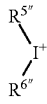
(b-2')

In the formulas, each of $R^{1''}$ to $R^{3''}$, $R^{5''}$ and $R^{6''}$ independently represents an aryl group or an alkyl group; two of $R^{1''}$ to $R^{3''}$ in formula (b-1') may be mutually bonded to form a ring with the sulfur atom; at least one of $R^{1''}$ to $R^{3''}$ represents an aryl group, and at least one of $R^{5''}$ and $R^{6''}$ represents an aryl group.

In formula (b-1'), $R^{1''}$ to $R^{3''}$ each independently represents an aryl group or an alkyl group. In formula (b-1'), two of $R^{1''}$ to $R^{3''}$ may be bonded to each other to form a ring with the sulfur atom.

It is preferable that at least one of $R^{1''}$ to $R^{3''}$ is an aryl group, it is more preferable that two or more of $R^{1''}$ to $R^{3''}$ are aryl groups, and it is most preferable that all of $R^{1''}$ to $R^{3''}$ are aryl groups.

The aryl group for $R^{1''}$ to $R^{3''}$ is not particularly limited. For example, an aryl group having 6 to 20 carbon atoms may be used in which part or all of the hydrogen atoms of the aryl group may or may not be substituted with alkyl groups, alkoxy groups, halogen atoms or hydroxyl groups.

The aryl group is preferably an aryl group having 6 to 10 carbon atoms because it can be synthesized at a low cost. Specific examples thereof include a phenyl group and a naphthyl group.

The alkyl group, with which hydrogen atoms of the aryl group may be substituted, is preferably an alkyl group having 1 to 5 carbon atoms, and most preferably a methyl group, an ethyl group, a propyl group, an n-butyl group, or a tert-butyl group.

The alkoxy group, with which hydrogen atoms of the aryl group may be substituted, is preferably an alkoxy group having 1 to 5 carbon atoms, more preferably a methoxy group, an ethoxy group, an n-propoxy group, an iso-propoxy group, an n-butoxy group or a tert-butoxy group, and most preferably a methoxy group or an ethoxy group.

The halogen atom, with which hydrogen atoms of the aryl group may be substituted, is preferably a fluorine atom.

The alkyl group for $R^{1''}$ to $R^{3''}$ is not particularly limited and includes, for example, a linear, branched or cyclic alkyl group having 1 to 10 carbon atoms. In terms of achieving excellent resolution, the alkyl group preferably has 1 to 5 carbon atoms. Specific examples thereof include a methyl group, an ethyl group, an n-propyl group, an isopropyl group, an n-butyl group, an isobutyl group, an n-pentyl group, a cyclopentyl group, a hexyl group, a cyclohexyl group, a nonyl group, and a decyl group, and a methyl group is most preferable because it is excellent in resolution and can be synthesized at a low cost.

When two of $R^{1''}$ to $R^{3''}$ in formula (b-1') are bonded to each other to form a ring with the sulfur atom, it is preferable that the two of $R^{1''}$ to $R^{3''}$ form a 3 to 10-membered ring including the sulfur atom, and it is particularly desirable that the two of $R^{1''}$ to $R^{3''}$ form a 5 to 7-membered ring including the sulfur atom.

When two of $R^{1''}$ to $R^{3''}$ in formula (b-1') are bonded to each other to form a ring with the sulfur atom, the remaining one of $R^{1''}$ to $R^{3''}$ is preferably an aryl group.

As examples of the aryl group, the same aryl groups as those described above for $R^{1''}$ to $R^{3''}$ can be used.

As preferable examples of the cation moiety represented by general formula (b-1'), those represented by formulae (I-1-1) to (I-1-11) shown below can be given. Among these, a cation moiety having a triphenylmethane skeleton, such as a cation moiety represented by any one of formulae (I-1-1) to (I-1-8) and (I-1-11) shown below is particularly desirable.

In formulas (I-1-9) and (I-1-10), each of $R^9$ and R independently represents a phenyl group or naphthyl group which may have a substituent, an alkyl group of 1 to 5 carbon atoms, an alkoxy group or a hydroxy group.

u is an integer of 1 to 3, and most preferably 1 or 2.

In formula (I-1-11), g2 represents a recurring number, and represents an integer of 0 to 20.

[Chemical Formula 60]
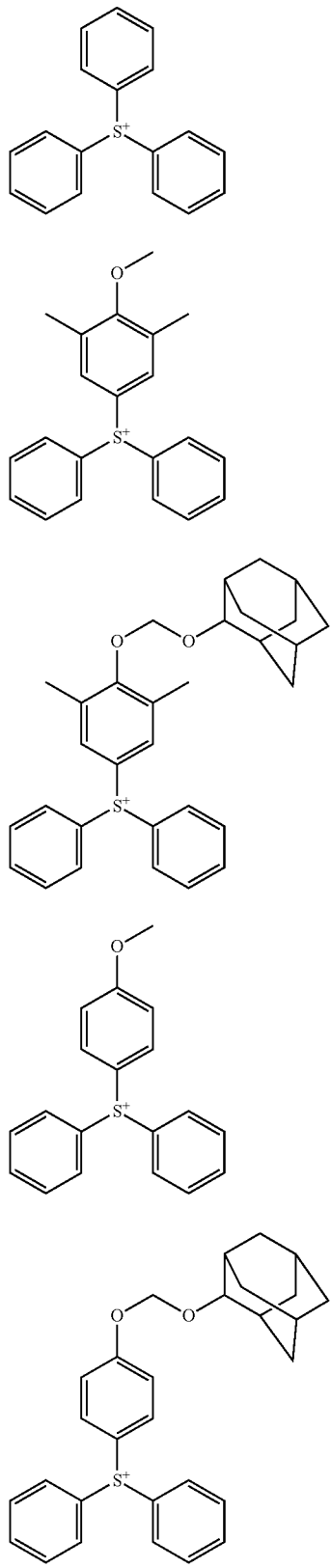
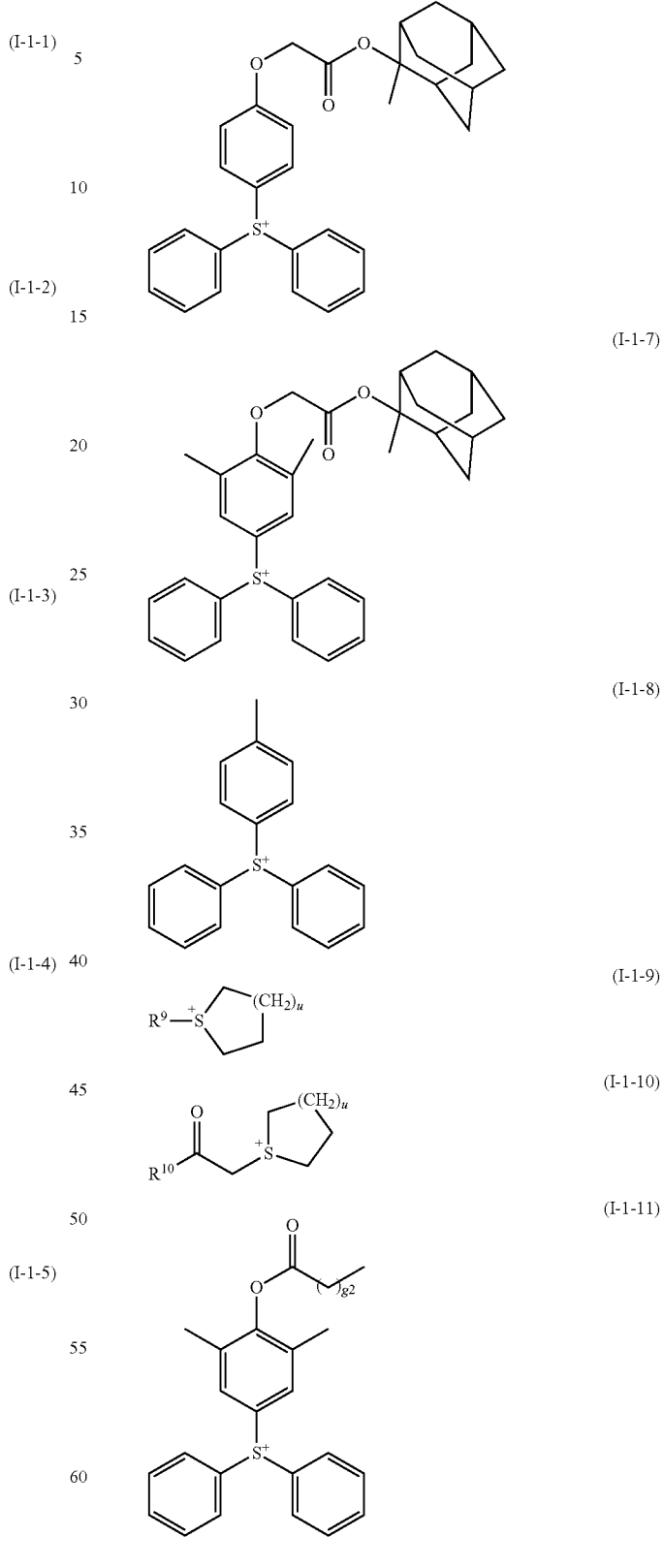
Further, as preferable examples of the cation moiety represented by general formula (b-1'), those represented by formulae (b-5) and (b-6) shown below can be also given.

[Chemical Formula 61]

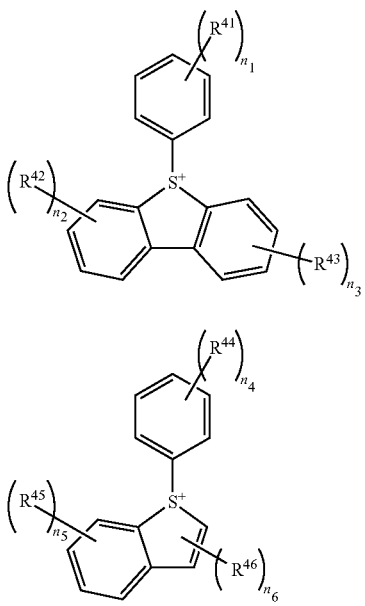

In the formulae, each of $R^{41}$ to $R^{46}$ independently represents an alkyl group, an acetyl group, an alkoxy group, a carboxy group, a hydroxyl group, a halogen atom, a halogenated alkyl group or a hydroxyalkyl group; each of $n_1$ to $n_5$ independently represents an integer of 0 to 3; and $n_6$ represents an integer of 0 to 2.

With respect to $R^{41}$ to $R^{46}$, the alkyl group is preferably an alkyl group of 1 to 5 carbon atoms, more preferably a linear or branched alkyl group, and most preferably a methyl group, ethyl group, propyl group, isopropyl group, n-butyl group or tert-butyl group.

The alkoxy group is preferably an alkoxy group of 1 to 5 carbon atoms, more preferably a linear or branched alkoxy group, and most preferably a methoxy group or an ethoxy group.

As the halogen atom, a fluorine atom is preferable.

The halogenated alkyl group is preferably a group in which one or more hydrogen atoms of the aforementioned alkyl group has been substituted with a halogen atom. As the halogen atom, a fluorine atom is preferable.

The hydroxyalkyl group is preferably the aforementioned alkyl group in which one or more hydrogen atoms have been substituted with hydroxy groups, and examples thereof include a hydroxymethyl group, hydroxyethyl group and hydroxypropyl group.

If there are two or more of an individual $R^{41}$ to $R^{46}$ group, as indicated by the corresponding value of $n_1$ to $n_6$, then the two or more of the individual $R^{41}$ to $R^{46}$ group may be the same or different from each other.

$n_1$ is preferably 0 to 2, more preferably 0 or 1, and still more preferably 0.

It is preferable that each of $n_2$ and $n_3$ independently represent 0 or 1, and more preferably 0.

$n_4$ is preferably 0 to 2, and more preferably 0 or 1.

$n_5$ is preferably 0 or 1, and more preferably 0.

$n_6$ is preferably 0 or 1, and more preferably 1.

In formula (b-2'), $R^{5'''}$ to $R^{6'''}$ each independently represent an aryl group or alkyl group. At least one of $R^{5'''}$ and $R^{6'''}$ represents an aryl group. It is preferable that both of $R^{5'''}$ and $R^{6'''}$ represent an aryl group.

As the aryl group for $R^{5'''}$ and $R^{6'''}$, the same aryl groups as those described above for $R^{1'''}$ to $R^{3'''}$ can be used.

As the alkyl group for $R^{5'''}$ and $R^{6'''}$, the same alkyl groups as those described above for $R^{1'''}$ to $R^{3'''}$ can be used.

It is particularly desirable that both of $R^{5'''}$ and $R^{6'''}$ represents a phenyl group.

(Oxime Sulfonate-Based Acid Generator)

In the present description, an oximesulfonate-based acid generator is a compound having at least one group represented by general formula (B-1) shown below, and has a feature of generating acid by irradiation. Such oximesulfonate-based acid generators are widely used for a chemically amplified resist composition, and can be appropriately selected.

[Chemical Formula 62]

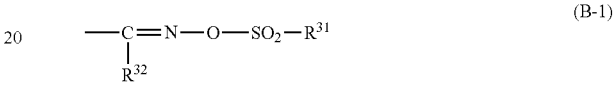

(B-1)

In the formula (B-1), $R^{31}$ and $R^{32}$ each independently represent an organic group.

The organic group for $R^{31}$ and $R^{32}$ refers to a group containing a carbon atom, and may include atoms other than carbon atoms (e.g., a hydrogen atom, an oxygen atom, a nitrogen atom, a sulfur atom, a halogen atom (such as a fluorine atom and a chlorine atom) and the like).

As the organic group for $R^{31}$, a linear, branched, or cyclic alkyl group or aryl group is preferable. The alkyl group or the aryl group may have a substituent. The substituent is not particularly limited, and examples thereof include a fluorine atom and a linear, branched, or cyclic alkyl group having 1 to 6 carbon atoms. The alkyl group or the aryl group "has a substituent" means that part or all of the hydrogen atoms of the alkyl group or the aryl group is substituted with a substituent.

The alkyl group preferably has 1 to 20 carbon atoms, more preferably 1 to 10 carbon atoms, still more preferably 1 to 8 carbon atoms, particularly preferably 1 to 6 carbon atoms, and most preferably 1 to 4 carbon atoms. As the alkyl group, a partially or completely halogenated alkyl group (hereinafter, sometimes referred to as a "halogenated alkyl group") is particularly desirable. The "partially halogenated alkyl group" refers to an alkyl group in which part of the hydrogen atoms are substituted with halogen atoms and the "completely halogenated alkyl group" refers to an alkyl group in which all of the hydrogen atoms are substituted with halogen atoms. Examples of halogen atoms include fluorine atoms, chlorine atoms, bromine atoms and iodine atoms, and fluorine atoms are particularly desirable. In other words, the halogenated alkyl group is preferably a fluorinated alkyl group.

The aryl group preferably has 4 to 20 carbon atoms, more preferably 4 to 10 carbon atoms, and most preferably 6 to 10 carbon atoms. As the aryl group, partially or completely halogenated aryl group is particularly desirable. The "partially halogenated aryl group" refers to an aryl group in which some of the hydrogen atoms are substituted with halogen atoms and the "completely halogenated aryl group" refers to an aryl group in which all of hydrogen atoms are substituted with halogen atoms.

As $R^{31}$, an alkyl group of 1 to 4 carbon atoms which has no substituent or a fluorinated alkyl group of 1 to 4 carbon atoms is particularly desirable.

As the organic group for $R^{32}$, a linear, branched, or cyclic alkyl group, aryl group, or cyano group is preferable. As the alkyl group or the aryl group for $R^{32}$, the same alkyl groups or aryl groups as those described above for $R^{31}$ can be used.

As $R^{32}$, a cyano group, an alkyl group of 1 to 8 carbon atoms having no substituent or a fluorinated alkyl group of 1 to 8 carbon atoms is particularly desirable.

Preferable examples of the oxime sulfonate-based acid generator include compounds represented by general formula (B-2) or (B-3) shown below.

[Chemical Formula 63]

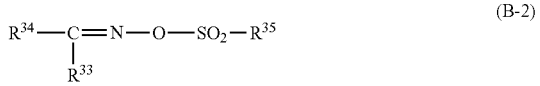

(B-2)

In the formula (B-2), $R^{33}$ represents a cyano group, an alkyl group having no substituent or a halogenated alkyl group; $R^{34}$ represents an aryl group; and $R^{35}$ represents an alkyl group having no substituent or a halogenated alkyl group.

[Chemical Formula 64]

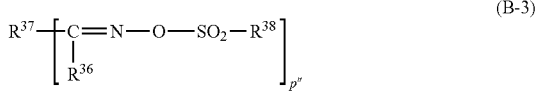

(B-3)

In the formula (B-3), $R^{36}$ represents a cyano group, an alkyl group having no substituent or a halogenated alkyl group; $R^{37}$ represents a divalent or trivalent aromatic hydrocarbon group; $R^{38}$ represents an alkyl group having no substituent or a halogenated alkyl group; and p" represents 2 or 3.

In general formula (B-2), the alkyl group having no substituent or the halogenated alkyl group for $R^{33}$ preferably has 1 to 10 carbon atoms, more preferably 1 to 8 carbon atoms, and most preferably 1 to 6 carbon atoms.

As $R^{33}$, a halogenated alkyl group is preferable, and a fluorinated alkyl group is more preferable.

The fluorinated alkyl group for $R^{33}$ preferably has 50% or more of the hydrogen atoms thereof fluorinated, more preferably 70% or more, and most preferably 90% or more.

Examples of the aryl group for $R^{34}$ include groups in which one hydrogen atom has been removed from an aromatic hydrocarbon ring, such as a phenyl group, a biphenyl group, a fluorenyl group, a naphthyl group, an anthryl group, and a phenantryl group, and heteroaryl groups in which some of the carbon atoms constituting the ring(s) of these groups are substituted with hetero atoms such as an oxygen atom, a sulfur atom, and a nitrogen atom. Of these, a fluorenyl group is preferable.

The aryl group for $R^{34}$ may have a substituent such as an alkyl group of 1 to 10 carbon atoms, a halogenated alkyl group, or an alkoxy group. The alkyl group and halogenated alkyl group as the substituent preferably has 1 to 8 carbon atoms, and more preferably 1 to 4 carbon atoms. Further, the halogenated alkyl group is preferably a fluorinated alkyl group.

The alkyl group having no substituent or the halogenated alkyl group for $R^{35}$ preferably has 1 to 10 carbon atoms, more preferably 1 to 8 carbon atoms, and most preferably 1 to 6 carbon atoms.

As $R^{35}$, a halogenated alkyl group is preferable, and a fluorinated alkyl group is more preferable.

In terms of enhancing the strength of the acid generated, the fluorinated alkyl group for $R^{35}$ preferably has 50% or more of the hydrogen atoms fluorinated, more preferably 70% or more, still more preferably 90% or more. A completely fluorinated alkyl group in which 100% of the hydrogen atoms are substituted with fluorine atoms is particularly desirable.

In general formula (B-3), as the alkyl group having no substituent and the halogenated alkyl group for $R^{36}$, the same alkyl group having no substituent and the halogenated alkyl group described above for $R^{33}$ can be used.

Examples of the divalent or trivalent aromatic hydrocarbon group for $R^{37}$ include groups in which one or two hydrogen atoms have been removed from the aryl group for $R^{34}$.

As the alkyl group having no substituent or the halogenated alkyl group for $R^{38}$, the same one as the alkyl group having no substituent or the halogenated alkyl group for $R^{35}$ can be used.

p" is preferably 2.

Specific examples of suitable oxime sulfonate-based acid generators include α-(p-toluenesulfonyloxyimino)-benzyl cyanide, α-(p-chlorobenzenesulfonyloxyimino)-benzyl cyanide, α-(4-nitrobenzenesulfonyloxyimino)-benzyl cyanide, α-(4-nitro-2-trifluoromethylbenzenesulfonyloxyimino)-benzyl cyanide, α-(benzenesulfonyloxyimino)-4-chlorobenzyl cyanide, α-(benzenesulfonyloxyimino)-2,4-dichlorobenzyl cyanide, α-(benzenesulfonyloxyimino)-2,6-dichlorobenzyl cyanide, α-(benzenesulfonyloxyimino)-4-methoxybenzyl cyanide, α-(2-chlorobenzenesulfonyloxyimino)-4-methoxybenzyl cyanide, α-(benzenesulfonyloxyimino)-thien-2-yl acetonitrile, α-(4-dodecylbenzenesulfonyloxyimino)benzyl cyanide, α-[(p-toluenesulfonyloxyimino)-4-methoxyphenyl]acetonitrile, α-[(dodecylbenzenesulfonyloxyimino)-4-methoxyphenyl]acetonitrile, α-(tosyloxyimino)-4-thienyl cyanide, α-(methylsulfonyloxyimino)-1-cyclopentenyl acetonitrile, α-(methylsulfonyloxyimino)-1-cyclohexenyl acetonitrile, (methylsulfonyloxyimino)-1-cycloheptenyl acetonitrile, α-(methylsulfonyloxyimino)-1-cyclooctenyl acetonitrile, α-(trifluoromethylsulfonyloxyimino)-1-cyclopentenyl acetonitrile, α-(trifluoromethylsulfonyloxyimino)-cyclohexyl acetonitrile, α-(ethylsulfonyloxyimino)-ethyl acetonitrile, α-(propylsulfonyloxyimino)-propyl acetonitrile, α-(cyclohexylsulfonyloxyimino)-cyclopentyl acetonitrile, α-(cyclohexyl sulfonyloxyimino)-cyclohexyl acetonitrile, α-(cyclohexyl sulfonyloxyimino)-1-cyclopentenyl acetonitrile, α-(ethylsulfonyloxyimino)-1-cyclopentenyl acetonitrile, α-(isopropylsulfonyloxyimino)-1-cyclopentenyl acetonitrile, α-(n-butylsulfonyloxyimino)-1-cyclopentenyl acetonitrile, α-(ethylsulfonyloxyimino)-1-cyclohexenyl acetonitrile, α-(isopropylsulfonyloxyimino)-1-cyclohexenyl acetonitrile, α-(n-butylsulfonyloxyimino)-1-cyclohexenyl acetonitrile, α-(methylsulfonyloxyimino)-phenyl acetonitrile, α-(methylsulfonyloxyimino)-p-methoxyphenyl acetonitrile, α-(trifluoromethylsulfonyloxyimino)-phenyl acetonitrile, α-(trifluoromethylsulfonyloxyimino)-p-methoxyphenyl acetonitrile, α-(ethylsulfonyloxyimino)-p-methoxyphenyl acetonitrile, α-(propylsulfonyloxyimino)-p-methylphenyl acetonitrile, and α-(methylsulfonyloxyimino)-p-bromophenyl acetonitrile.

Further, oxime sulfonate-based acid generators disclosed in Japanese Unexamined Patent Application, First Publication No. Hei 9-208554 (Chemical Formulas 18 and 19 shown in paragraphs [0012] to [0014]) and oxime sulfonate-based acid generators disclosed in WO 2004/074242A2 (Examples 1 to 40 described at pages 65 to 86) may be preferably used.

Furthermore, as preferable examples, the following can be used.

[Chemical Formula 65]

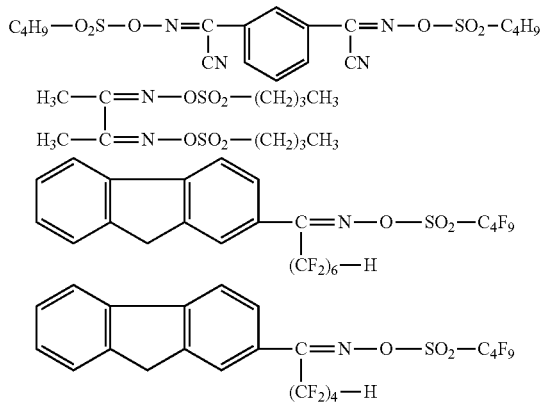

(Sulfonyl Diazomethane-Based Acid Generator)

Of the aforementioned sulfonyl diazomethane-based acid generators, specific examples of suitable bisalkyl or bisaryl sulfonyl diazomethanes include bis(isopropylsulfonyl)diazomethane, bis(p-toluenesulfonyl)diazomethane, bis(1,1-dimethylethylsulfonyl)diazomethane, bis(cyclohexylsulfonyl)diazomethane, and bis(2,4-dimethylphenylsulfonyl)diazomethane.

Further, sulfonyl diazomethane-based acid generators disclosed in Japanese Unexamined Patent Application, First Publication No. Hei 11-035551, Japanese Unexamined Patent Application, First Publication No. Hei 11-035552 and Japanese Unexamined Patent Application, First Publication No. Hei 11-035573 may be preferably used.

Furthermore, as poly(bis-sulfonyl)diazomethanes, those disclosed in Japanese Unexamined Patent Application, First Publication No. Hei 11-322707, including 1,3-bis(phenylsulfonyldiazomethylsulfonyl)propane, 1,4-bis(phenylsulfonyldiazomethylsulfonyl)butane, 1,6-bis(phenylsulfonyldiazomethylsulfonyl)hexane, 1,10-bis(phenylsulfonyldiazomethylsulfonyl)decane, 1,2-bis(cyclohexylsulfonyldiazomethylsulfonyl)ethane, 1,3-bis(cyclohexylsulfonyldiazomethylsulfonyl)propane, 1,6-bis(cyclohexylsulfonyldiazomethylsulfonyl)hexane, and 1,10-bis(cyclohexylsulfonyldiazomethylsulfonyl)decane, may be mentioned.

(Imidosulfonate-Based Acid Generator)

There are no particular limitations on the imidosulfonate-based acid generator, and suitable examples include norbornenedicarboximide perfluoroalkanesulfonate and the like.

(Nitrobenzylsulfonate-Based Acid Generator)

There are no particular limitations on the nitrobenzylsulfonate-based acid generator, and suitable examples include 2,4-dinitrobenzylsulfonate, 2-nitrobenzylsulfonate, 2,6-dinitrobenzylsulfonate and the like.

Among these, as the component (B1) of the present invention, an onium salt-based acid generator containing a sulfonate anion represented by the formula (b0) is preferable, the acid generator represented by the formula (b1) is more preferable, and the acid generators represented by the formulae (b1-1) to (b1-8) are particularly preferable.

As the component (B1), one type of acid generator may be used alone, or two or more types may be used in combination.

In the resist composition of the present invention, the amount of the component (B1) within the component (B) is preferably 40% by weight or more, still more preferably 70% by weight or more, and may be even 100% by weight. When the amount of the component (B1) is at least as large as the lower limit of the above-mentioned range, the lithography properties and the resist pattern shape become excellent.

[Component (B2)]

In the resist composition of the present invention, if desired, the component (B) may further include an acid generator component which cannot be classified as the component (B1) (hereafter, referred to as "component (B2)"), in addition to the component (B1).

The component (B2) is not particularly limited as long it does not fall under the definition of the component (B1), and any of the known acid generators used in conventional chemically amplified resist compositions can be used.

As the component (B2), an onium salt-based acid generator having an anion moiety represented by general formula (b-3) or (b-4) shown below can be used. In the onium salt-based acid generator, as a cation moiety, the same as those for $Z^+$ in the component (B1) can be used.

[Chemical Formula 66]

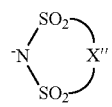
(b-3)

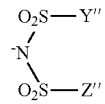
(b-4)

In the formulas, X" represents an alkylene group of 2 to 6 carbon atoms in which at least one hydrogen atom has been substituted with a fluorine atom; and Y" and Z" each independently represents an alkyl group of 1 to 10 carbon atoms in which at least one hydrogen atom has been substituted with a fluorine atom.

X" represents a linear or branched alkylene group in which at least one hydrogen atom has been substituted with a fluorine atom, and the alkylene group has 2 to 6 carbon atoms, preferably 3 to 5 carbon atoms, and most preferably 3 carbon atoms.

Each of Y" and Z" independently represents a linear or branched alkyl group in which at least one hydrogen atom has been substituted with a fluorine atom, and the alkyl group has 1 to 10 carbon atoms, preferably 1 to 7 carbon atoms, and most preferably 1 to 3 carbon atoms.

The smaller the number of carbon atoms of the alkylene group for X" or those of the alkyl group for Y" and Z" within the above-mentioned range of the number of carbon atoms, the more the solubility in a resist solvent is improved.

Further, in the alkylene group for X" or the alkyl group for Y" and Z", it is preferable that the number of hydrogen atoms substituted with fluorine atoms is as large as possible because the acid strength increases and the transparency to high energy radiation of 200 nm or less or electron beam is improved. The fluorination ratio of the alkylene group or alkyl group is preferably from 70 to 100%, more preferably from 90 to 100%, and it is particularly desirable that the alkylene group or alkyl group be a perfluoroalkylene group or perfluoroalkyl group in which all hydrogen atoms are substituted with fluorine atoms.

As the component (B2), one type of acid generator may be used, or two or more types may be used in combination.

In the resist composition of the present invention, when the component (B) includes the component (B2), the amount of the (B2) within the component (B) is preferably in the range of 0.5 to 40% by weight, more preferably 0.5 to 15% by weight, and still more preferably 0.5 to 8% by weight.

In the resist composition of the present invention, the amount of the component (B) relative to 100 parts by weight of the component (A) is preferably 1 to 70 parts by weight, more preferably 3 to 60 parts by weight, still more preferably 5 to 50 parts by weight, and most preferably 10 to 30 parts by weight. When the amount of the component (B) is within the above-mentioned range, the resolution during pattern formation becomes excellent. Further, by virtue of the above-mentioned range, a uniform solution can be obtained and the storage stability becomes satisfactory.

<Optional Component—Component (D)>

The resist composition of the present invention may contain a basic compound component (D) (hereafter referred to as the component (D)) as an optional component. In the present invention, the component (D) functions as an acid diffusion control agent, i.e., a quencher which traps the acid generated from the component (B) upon exposure. In the present invention, a "basic compound" refers to a compound which is basic relative to the component (B).

In the present invention, the component (D) may be a basic compound (D1) (hereafter, referred to as "component (D1)") which has a cation moiety and an anion moiety, or a basic compound (D2) (hereafter, referred to as "component (D2)") which does not fall under the definition of component (D1).

[Component (D1)]

In the present invention, as the component (D1), at least one member selected from the group consisting of a compound (d1-1) represented by general formula (d1-1) shown below (hereafter, referred to as "component (d1-1)"), a compound (d1-2) represented by general formula (d1-2) shown below (hereafter, referred to as "component (d1-2)") and a compound (d1-3) represented by general formula (d1-3) shown below (hereafter, referred to as "component (d1-3)").

[Chemical Formula 67]

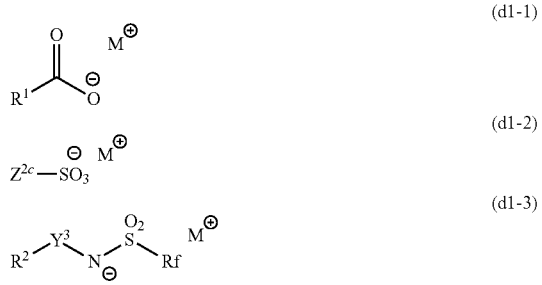

In the formulae, $R^1$ represents a hydrocarbon group which may have a substituent; $Z^{2c}$ represents a hydrocarbon group of 1 to 30 carbon atoms which may have a substituent (provided that the carbon adjacent to S has no fluorine atom as a substituent); $R^2$ represents an organic group; $Y^3$ represents a linear, branched or cyclic alkylene group or an arylene group; Rf represents a hydrocarbon group containing a fluorine atom; and each $M^+$ independently represents an organic cation.

[Component (d1-1)]

Anion Moiety

In formula (d1-1), $R^1$ represents a hydrocarbon group which may have a substituent.

The hydrocarbon group for $R^1$ which may have a substituent may be either an aliphatic hydrocarbon group or an aromatic hydrocarbon group, and the same aliphatic hydrocarbon groups and aromatic hydrocarbon groups as those described above for the aforementioned X in the component (B) can be used.

Among these, as the hydrocarbon group for $R^1$ which may have a substituent, an aromatic hydrocarbon group which may have a substituent or an aliphatic cyclic group which may have a substituent is preferable, and a phenyl group or a naphthyl group which may have a substituent, or a group in which one or more hydrogen atoms have been removed from a polycycloalkane such as adamantane, norbornane, isobornane, tricyclodecane or tetracyclododecane is more preferable.

As the hydrocarbon group for $R^1$ which may have a substituent, a linear, branched or alicyclic alkyl group or a fluorinated alkyl group is also preferable.

The linear, branched or alicyclic alkyl group for $R^1$ preferably has 1 to 10 carbon atoms, and specific examples thereof include a linear alkyl group such as a methyl group, an ethyl group, a propyl group, a butyl group, a pentyl group, a hexyl group, a heptyl group, an octyl group, a nonyl or a decyl group; a branched alkyl group such as a 1-methylethyl group, a 1-methylpropyl group, a 2-methylpropyl group, a 1-methylbutyl group, a 2-methylbutyl group, a 3-methylbutyl group, a 1-ethylbutyl group, a 2-ethylbutyl group, a 1-methylpentyl group, a 2-methylpentyl group, a 3-methylpentyl group or a 4-methylpentyl group; and an alicyclicalkyl group such as a norbornyl group and an adamantyl group.

The fluorinated alkyl group for $R^1$ may be either chain-like or cyclic, but is preferably linear or branched.

The fluorinated alkyl group preferably has 1 to 11 carbon atoms, more preferably 1 to 8, and still more preferably 1 to 4. Specific examples include a group in which part or all of the hydrogen atoms constituting a linear alkyl group (such as a methyl group, an ethyl group, a propyl group, a butyl group, a pentyl group, a hexyl group, a heptyl group, an octyl group, a nonyl group or a decyl group) have been substituted with fluorine atom(s), and a group in which part or all of the hydrogen atoms constituting a branched alkyl group (such as a 1-methylethyl group, a 1-methylpropyl group, a 2-methylpropyl group, a 1-methylbutyl group, a 2-methylbutyl group or a 3-methylbutyl group) have been substituted with fluorine atom(s).

The fluorinated alkyl group for $R^1$ may contain an atom other than fluorine. Examples of the atom other than fluorine include an oxygen atom, a carbon atom, a hydrogen atom, an oxygen atom, a sulfur atom and a nitrogen atom.

Among these, as the fluorinated alkyl group for $R^1$, a group in which part or all of the hydrogen atoms constituting a linear alkyl group have been substituted with fluorine atom(s) is preferable, and a group in which all of the hydrogen atoms constituting a linear alkyl group have been substituted with fluorine atoms (i.e., a perfluoroalkyl group) is more preferable.

Specific examples of preferable anion moieties for the component (d1-1) are shown below.

[Chemical Formula 68]

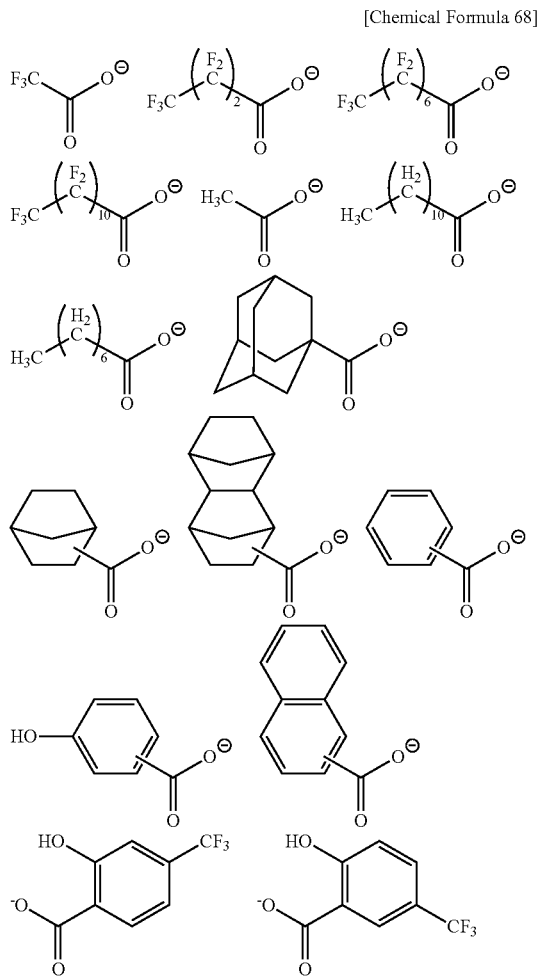

Cation Moiety

In formula (d1-1), M⁺ represents an organic cation.

The organic cation for M⁺ is not particularly limited, and examples thereof include the same cation moieties represented by the aforementioned formula (b-1') or (b-2').

As the component (d1-1), one type of compound may be used, or two or more types of compounds may be used in combination.

[Component (d1-2)]
Anion Moiety

In formula (d1-2), $Z^{2c}$ represents a hydrocarbon group of 1 to 30 carbon atoms which may have a substituent.

The hydrocarbon group of 1 to 30 carbon atoms for $Z^{2c}$ which may have a substituent may be either an aliphatic hydrocarbon group or an aromatic hydrocarbon group, and is the same aliphatic hydrocarbon group and aromatic hydrocarbon group as those defined for X in the aforementioned formula (b1).

Among these, as the hydrocarbon group for $Z^{2c}$ which may have a substituent, an aliphatic cyclic group which may have a substituent is preferable, and a group in which one or more hydrogen atoms have been removed from adamantane, norbornane, isobornane, tricyclodecane, tetracyclododecane or camphor (which may have a substituent) is more preferable.

The hydrocarbon group for $Z^{2c}$ may have a substituent, and the same substituents as those described above for X in the aforementioned component (B) can be used. However, in $Z^{2c}$, the carbon adjacent to the S atom within $SO_3^-$ has no fluorine atom as a substituent. By virtue of $SO_3^-$ having no fluorine atom adjacent thereto, the anion of the component (d1-2) becomes an appropriately weak acid anion, thereby improving the quenching ability of the component (D).

Specific examples of preferable anion moieties for the component (d1-2) are shown below.

[Chemical Formula 69]

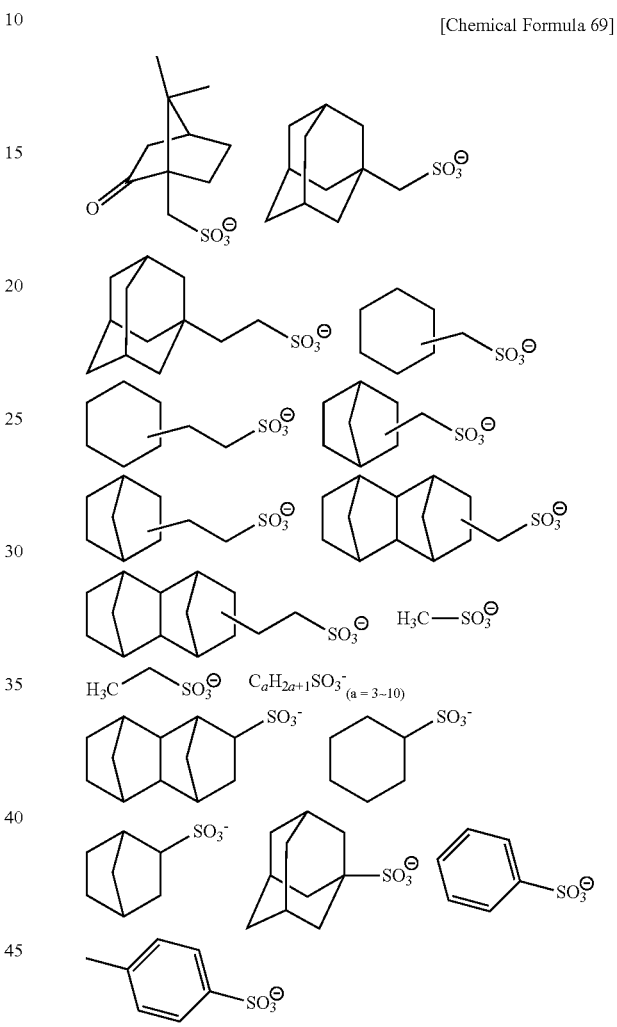

Cation Moiety

In formula (d1-2), M⁺ is the same as defined for M⁺ in the aforementioned formula (d1-1).

As the component (d1-2), one type of compound may be used, or two or more types of compounds may be used in combination.

[Component (d1-3)]
Anion Moiety

In formula (d1-3), $R^2$ represents an organic group.

The organic group for $R^2$ is not particularly limited, and examples thereof include an alkyl group, an alkoxy group, —O—C(=O)—C($R^{C2}$)=CH₂ ($R^{C2}$ represents a hydrogen atom, an alkyl group of 1 to 5 carbon atoms or a halogenated alkyl group of 1 to 5 carbon atoms) and —O—C(C=O)—$R^{C3}$ ($R^{C3}$ represents a hydrocarbon group).

The alkyl group for $R^2$ is preferably a linear or branched alkyl group of 1 to 5 carbon atoms, and specific examples include a methyl group, an ethyl group, a propyl group, an isopropyl group, an n-butyl group, an isobutyl group, a tert-butyl group, a pentyl group, an isopentyl group, and a neopentyl group. Part of the hydrogen atoms within the alkyl group for $R^2$ may be substituted with a hydroxy group, a cyano group or the like.

The alkoxy group for $R^2$ is preferably an alkoxy group of 1 to 5 carbon atoms, and specific examples thereof include a methoxy group, an ethoxy group, an n-propoxy group, an iso-propoxy group, an n-butoxy group and a tert-butoxy group. Among these, a methoxy group and an ethoxy group are particularly desirable.

When $R^2$ is —O—C(=O)—C($R^{C2}$)=CH$_2$, $R^{C2}$ represents a hydrogen atom, an alkyl group of 1 to 5 carbon atoms or a halogenated alkyl group of 1 to 5 carbon atoms.

The alkyl group of 1 to 5 carbon atoms for $R^{C2}$ is preferably a linear or branched alkyl group of 1 to 5 carbon atoms, and specific examples thereof include a methyl group, an ethyl group, a propyl group, an isopropyl group, an n-butyl group, an isobutyl group, a tert-butyl group, a pentyl group, an isopentyl group and a neopentyl group.

The halogenated alkyl group for $R^{C2}$ is a group in which part or all of the hydrogen atoms of the aforementioned alkyl group of 1 to 5 carbon atoms has been substituted with halogen atoms. Examples of the halogen atom include a fluorine atom, a chlorine atom, a bromine atom and an iodine atom, and a fluorine atom is particularly desirable.

As $R^{C2}$, a hydrogen atom, an alkyl group of 1 to 3 carbon atoms or a fluorinated alkyl group of 1 to 3 carbon atoms is preferable, and a hydrogen atom or a methyl group is particularly desirable in terms of industrial availability.

When $R^2$ is —O—C(=O)—$R^{C3}$, $R^{C3}$ represents a hydrocarbon group.

The hydrocarbon group for $R^{C3}$ may be either an aromatic hydrocarbon group or an aliphatic hydrocarbon group. Specific examples of the hydrocarbon group for $R^{C3}$ include the same hydrocarbon groups as those described for X in the component (B).

Among these, as the hydrocarbon group for $R^{C3}$, an alicyclic group (e.g., a group in which one or more hydrogen atoms have been removed from a cycloalkane such as cyclopentane, cyclohexane, adamantane, norbornane, isobornane, tricyclodecane or tetracyclododecane) or an aromatic group (e.g., a phenyl group or a naphthyl group) is preferable. When $R^{C3}$ is an alicyclic group, the resist composition can be satisfactorily dissolved in an organic solvent, thereby improving the lithography properties. Alternatively, when $R^{C3}$ is an aromatic group, the resist composition exhibits an excellent photoabsorption efficiency in a lithography process using EUV or the like as the exposure source, thereby resulting in the improvement of the sensitivity and the lithography properties.

Among these, as $R^2$, —O—C(=O)—C($R^{C2}$)=CH$_2$ ($R^{C2}$ represents a hydrogen atom or a methyl group) or —O—C(C=O)—$R^{C3'}$ ($R^{C3'}$ represents an aliphatic cyclic group) is preferable.

In formula (d1-3), $Y^3$ represents a linear, branched or cyclic alkylene group or an arylene group.

Examples of the linear, branched or cyclic alkylene group or the arylene group for $Y^3$ include the "linear or branched aliphatic hydrocarbon group", "cyclic aliphatic hydrocarbon group" and "aromatic hydrocarbon group" described above as the divalent linking group for $Y^2$ in the aforementioned formula (a1-0-2).

Among these, as $Y^3$, an alkylene group is preferable, a linear or branched alkylene group is more preferable, and a methylene group or an ethylene group is still more preferable.

In formula (d1-3), Rf represents a hydrocarbon group containing a fluorine atom.

The hydrocarbon group containing a fluorine atom for Rf is preferably a fluorinated alkyl group, and more preferably the same fluorinated alkyl groups as those described above for $R^1$.

Specific examples of preferable anion moieties for the component (d1-3) are shown below.

[Chemical Formula 70]

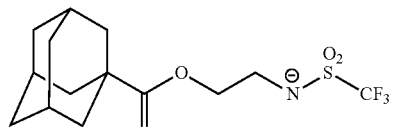

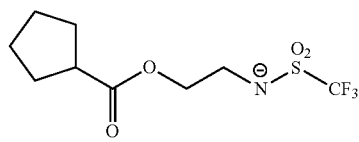

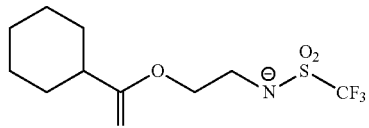

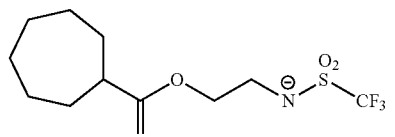

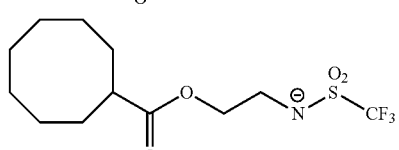

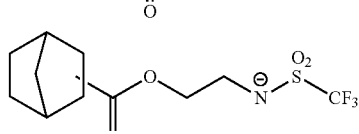

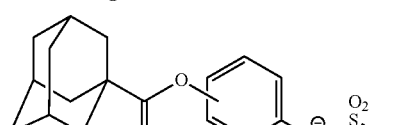

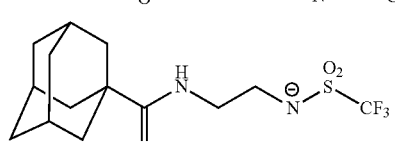

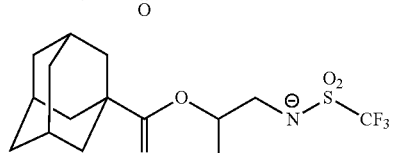

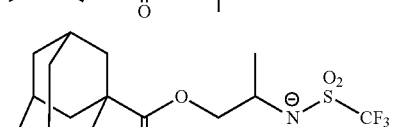

-continued

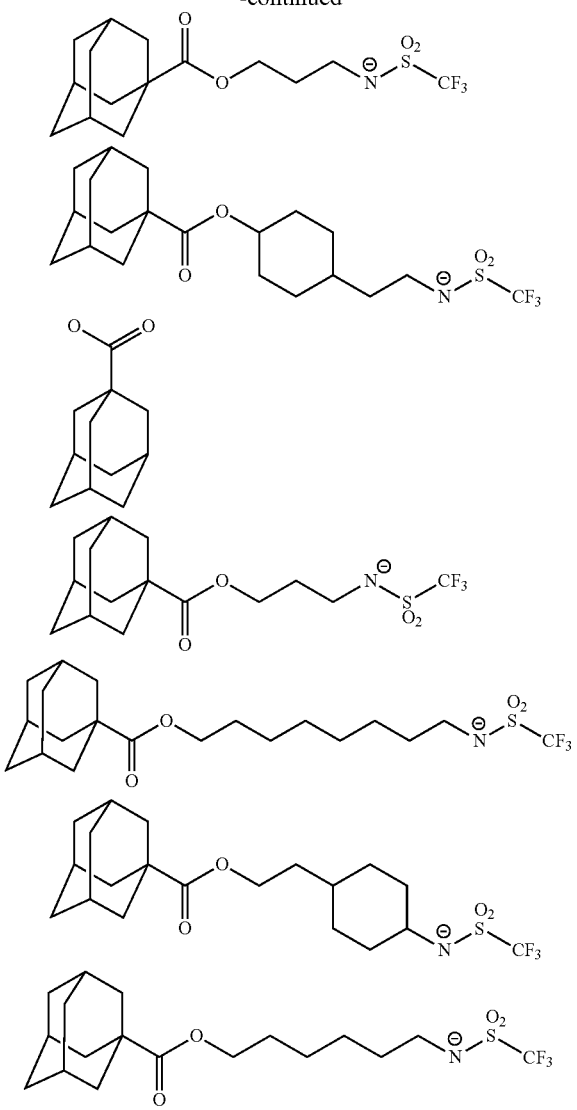

[Chemical Formula 71]

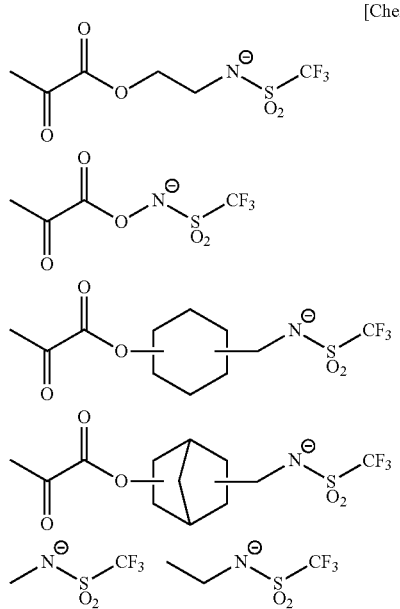

-continued

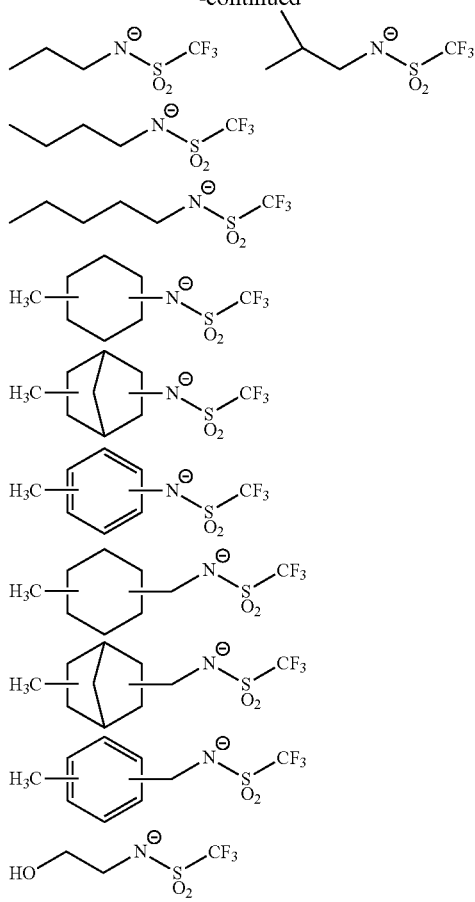

Cation Moiety

In formula (d1-3), $M^+$ is the same as defined for $M^+$ in the aforementioned formula (d1-1).

As the component (d1-3), one type of compound may be used, or two or more types of compounds may be used in combination.

The component (D1) may contain one of the aforementioned components (d-1) to (d-3), or at least two of the aforementioned components (d1-1) to (d1-3).

The total amount of the components (d1-1) to (d1-3) relative to 100 parts by weight of the component (A) is preferably within a range from 0.5 to 10.0 parts by weight, more preferably from 0.5 to 8.0 parts by weight, and still more preferably from 1.0 to 8.0 parts by weight. When the amount is at least as large as the lower limit of the above-mentioned range, excellent lithography properties and excellent resist pattern shape can be obtained. On the other hand, when the amount is no more than the upper limit of the above-mentioned range, sensitivity can be maintained at a satisfactory level, and through-put becomes excellent.

(Production Method of Components (D1))

In the present invention, the production methods of the components (d1-1) and (d1-2) are not particularly limited, and the components (d1-1) and (d1-2) can be produced by conventional methods.

The production method of the component (d1-3) is not particularly limited. For example, in the case where $R^2$ in formula (d1-3) is a group having an oxygen atom on the terminal thereof which is bonded to $Y^3$, the compound (d1-3) represented by general formula (d1-3) can be produced by reacting a compound (i-1) represented by general formula (i-1) shown below with a compound (i-2) represented by general formula (i-2) shown below to obtain a compound (i-3) represented by general formula (i-3), and reacting the compound (i-3) with a compound $Z^-M^+$ (i-4) having the desired cation $M^+$, thereby obtaining the compound (d1-3).

[Chemical Formula 72]

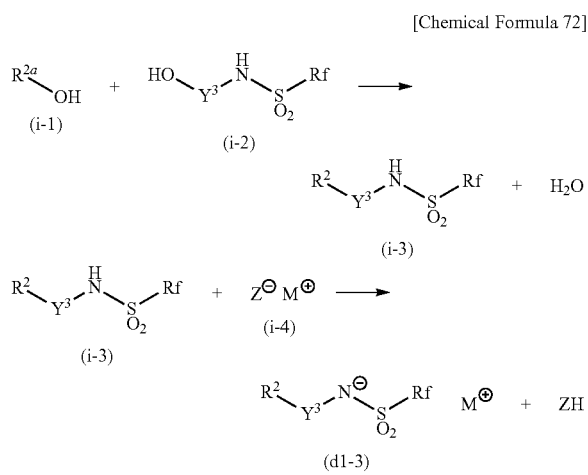

In the formulae, $R^2$, $Y^3$, Rf and $M^+$ are respectively the same as defined for $R^2$, $Y^3$ and Rf, $M^+$ in the aforementioned general formula (d1-3); $R^{2a}$ represents a group in which the terminal oxygen atom has been removed from $R^2$; and $Z^-$ represents a counteranion.

Firstly, the compound (i-1) is reacted with the compound (i-2), thereby obtaining the compound (i-3).

In formula (i-1), $R^2$ is the same as defined above, and $R^{2a}$ represents a group in which the terminal oxygen atom has been removed from $R^2$. In formula (i-2), $Y^3$ and Rf are the same as defined above.

As the compound (i-1) and the compound (i-2), commercially available compounds may be used, or the compounds may be synthesized.

The method for reacting the compound (i-1) with the compound (i-2) to obtain the compound (i-3) is not particularly limited, but can be performed, for example, by reacting the compound (i-1) with the compound (i-2) in an organic solvent in the presence of an appropriate acidic catalyst, followed by washing and recovering the reaction mixture.

The acidic catalyst used in the above reaction is not particularly limited, and examples thereof include toluenesulfonic acid and the like. The amount of the acidic catalyst is preferably 0.05 to 5 moles, per 1 mole of the compound (i-2).

As the organic solvent used in the above reaction, any organic solvent which is capable of dissolving the raw materials, i.e., the compound (i-1) and the compound (i-2) can be used, and specific examples thereof include toluene and the like. The amount of the organic solvent is preferably 0.5 to 100 parts by weight, more preferably 0.5 to 20 parts by weight, relative to the amount of the compound (i-1). As the solvent, one type may be used alone, or two or more types may be used in combination.

In general, the amount of the compound (i-2) used in the above reaction is preferably 0.5 to 5 moles per 1 mole of the compound (i-1), and more preferably 0.8 to 4 moles per 1 mole of the compound (i-1).

The reaction time depends on the reactivity of the compounds (i-1) and (i-2), the reaction temperature or the like. However, in general, the reaction time is preferably 1 to 80 hours, and more preferably 3 to 60 hours.

The reaction temperature in the above reaction is preferably 20 to 200° C., and more preferably 20 to 150° C.

Next, the obtained compound (i-3) is reacted with the compound (i-4), thereby obtaining the compound (d1-3).

In formula (i-4), $M^+$ is the same as defined above, and $Z^-$ represents a counteranion.

The method for reacting the compound (i-3) with the compound (i-4) to obtain the compound (d1-3) is not particularly limited, but can be performed, for example, by dissolving the compound (i-3) in an appropriate organic solvent and water in the presence of an appropriate alkali metal hydroxide, followed by addition of the compound (i-4) and stirring.

The alkali metal hydroxide used in the above reaction is not particularly limited, and examples thereof include sodium hydroxide, potassium hydroxide and the like. The amount of the alkali metal hydroxide is preferably 0.3 to 3 moles, per 1 mole of the compound (i-3).

Examples of the organic solvent used in the above reaction include dichloromethane, chloroform, ethyl acetate and the like. The amount of the organic solvent is preferably 0.5 to 100 parts by weight, and more preferably 0.5 to 20 parts by weight, relative to the amount of the compound (i-3). As the solvent, one type may be used alone, or two or more types may be used in combination.

In general, the amount of the compound (i-4) used in the above reaction is preferably 0.5 to 5 moles per 1 mole of the compound (i-3), and more preferably 0.8 to 4 moles per 1 mole of the compound (i-3).

The reaction time depends on the reactivity of the compounds (i-3) and (i-4), the reaction temperature or the like. However, in general, the reaction time is preferably 1 to 80 hours, and more preferably 3 to 60 hours.

The reaction temperature in the above reaction is preferably 20 to 200° C., and more preferably 20 to 150° C.

After the reaction, the compound (d1-3) contained in the reaction mixture may be separated and purified. The separation and purification can be conducted by a conventional method. For example, any one of concentration, solvent extraction, distillation, crystallization, recrystallization and chromatography can be used alone, or two or more of these methods may be used in combination.

The structure of the compound (d1-3) obtained in the above-described manner can be confirmed by a general organic analysis method such as $^1$H-nuclear magnetic resonance (NMR) spectrometry, $^{13}$C-NMR spectrometry, $^{19}$F-NMR spectrometry, infrared absorption (IR) spectrometry, mass spectrometry (MS), elementary analysis and X-ray diffraction analysis.

[Component (D2)]

The component (D2) is not particularly limited, as long as it is a compound which is basic relative to the component (B), so as to functions as an acid diffusion inhibitor, and does not fall under the definition of the component (D1). As the component (D2), any of the conventionally known compounds may be selected for use. Among these, an aliphatic amine, particularly a secondary aliphatic amine or tertiary aliphatic amine is preferable.

An aliphatic amine is an amine having one or more aliphatic groups, and the aliphatic groups preferably have 1 to 12 carbon atoms.

Examples of these aliphatic amines include amines in which at least one hydrogen atom of ammonia ($NH_3$) has been substituted with an alkyl group or hydroxyalkyl group of no more than 12 carbon atoms (i.e., alkylamines or alkylalcoholamines), and cyclic amines.

Specific examples of alkylamines and alkylalcoholamines include monoalkylamines such as n-hexylamine, n-heptylamine, n-octylamine, n-nonylamine, and n-decylamine; dialkylamines such as diethylamine, di-n-propylamine, di-n-heptylamine, di-n-octylamine, and dicyclohexylamine; trialkylamines such as trimethylamine, triethylamine, tri-n-propylamine, tri-n-butylamine, tri-n-hexylamine, tri-n-pentylamine, tri-n-heptylamine, tri-n-octylamine, tri-n-nonylamine, tri-n-decylamine, and tri-n-dodecylamine; and alkylalcoholamines such as diethanolamine, triethanolamine, diisopropanolamine, triisopropanolamine, di-n-octanolamine, and tri-n-octanolamine. Among these, trialkylamines of 5 to 10 carbon atoms are preferable, and tri-n-pentylamine and tri-n-octylamine are particularly desirable.

Examples of the cyclic amine include heterocyclic compounds containing a nitrogen atom as a hetero atom. The heterocyclic compound may be a monocyclic compound (aliphatic monocyclic amine), or a polycyclic compound (aliphatic polycyclic amine).

Specific examples of the aliphatic monocyclic amine include piperidine, and piperazine.

The aliphatic polycyclic amine preferably has 6 to 10 carbon atoms, and specific examples thereof include 1,5-diazabicyclo[4.3.0]-5-nonene, 1,8-diazabicyclo[5.4.0]-7-undecene, hexamethylenetetramine, and 1,4-diazabicyclo[2.2.2]octane.

Examples of other aliphatic amines include tris(2-methoxymethoxyethyl)amine, tris{2-(2-methoxyethoxy)ethyl}amine, tris{2-(2-methoxyethoxymethoxy)ethyl}amine, tris {2-(1-methoxyethoxy)ethyl}amine, tris {2-(1-ethoxyethoxy)ethyl}amine, tris{2-(1-ethoxypropoxy)ethyl}amine, tris[2-{2-(2-hydroxyethoxy)ethoxy}ethyl]amine and triethanolamine triacetate, and triethanolamine triacetate is preferable.

Further, as the component (D2), an aromatic amine may be used.

Examples of aromatic amines include aniline, pyridine, 4-dimethylaminopyridine, pyrrole, indole, pyrazole, imidazole and derivatives thereof, as well as diphenylamine, triphenylamine, tribenzylamine, 2,6-diisopropylaniline and N-tert-butoxycarbonylpyrrolidine.

As the component (D2), one type of compound may be used alone, or two or more types may be used in combination.

The component (D2) is typically used in an amount within a range from 0.01 to 5.0 parts by weight, relative to 100 parts by weight of the component (A). When the amount of the component (D2) is within the above-mentioned range, the shape of the resist pattern and the post exposure stability of the latent image formed by the pattern-wise exposure of the resist layer are improved.

As the component (D), one type of compound may be used, or two or more types of compounds may be used in combination.

When the resist composition of the present invention contains the component (D), the amount of the component (D) relative to 100 parts by weight of the component (A) is preferably within a range from 0.1 to 15 parts by weight, more preferably from 0.3 to 12 parts by weight, and still more preferably from 0.5 to 12 parts by weight. When the amount of the component (D) is at least as large as the lower limit of the above-mentioned range, various lithography properties (such as roughness) of the resist composition are improved.

Further, a resist pattern having an excellent shape can be obtained. On the other hand, when the amount of the component (D) is no more than the upper limit of the above-mentioned range, sensitivity can be maintained at a satisfactory level, and throughput becomes excellent.

Furthermore, in the resist composition of the present invention, for preventing any deterioration in sensitivity, and improving the resist pattern shape and the post exposure stability of the latent image formed by the pattern-wise exposure of the resist layer, at least one compound (E) (hereafter referred to as the component (E)) selected from the group consisting of an organic carboxylic acid, or a phosphorus oxo acid or derivative thereof can be added.

Examples of suitable organic carboxylic acids include acetic acid, malonic acid, citric acid, malic acid, succinic acid, benzoic acid, and salicylic acid.

Examples of phosphorus oxo acids include phosphoric acid, phosphonic acid and phosphinic acid. Among these, phosphonic acid is particularly desirable.

Examples of phosphorous oxo acid derivatives include esters in which a hydrogen atom within the above-mentioned phosphorous oxo acids is substituted with a hydrocarbon group. Examples of the hydrocarbon group include an alkyl group of 1 to 5 carbon atoms and an aryl group of 6 to 15 carbon atoms.

Examples of phosphoric acid derivatives include phosphoric acid esters such as di-n-butyl phosphate and diphenyl phosphate.

Examples of phosphonic acid derivatives include phosphonic acid esters such as dimethyl phosphonate, di-n-butyl phosphonate, phenyl phosphonate, diphenyl phosphonate and dibenzyl phosphonate.

Examples of phosphinic acid derivatives include phenylphosphinic acid and phosphinic acid esters.

As the component (E), one type may be used alone, or two or more types may be used in combination.

The component (E) is typically used in an amount within a range from 0.01 to 5.0 parts by weight, relative to 100 parts by weight of the component (A).

In the present invention, the resist composition may further include a fluorine additive (hereafter, referred to as "component (F)") for imparting water repellency to the resist film.

As the component (F), for example, a fluorine-containing polymeric compound described in Japanese Unexamined Patent Application, First Publication No. 2010-002870.

Specific examples of the component (F) include polymers having a structural unit (f1) represented by general formula (f1-1) shown below. As such polymer, a polymer (homopolymer) consisting of a structural unit (f1); a copolymer of a structural unit represented by formula (f1-1) shown below and the aforementioned structural unit (a1); and a copolymer of a structural unit represented by the formula (f1-1) shown below, a structural unit derived from acrylic acid or methacrylic acid and the aforementioned structural unit (a1) are preferable. As the structural unit (a1)) to be copolymerized with a structural unit represented by formula (f1-1) shown below, a structural unit represented by the aforementioned formula (a1-0-1) is preferable, and a structural unit represented by the aforementioned formula (a1-1-32) is particularly desirable.

[Chemical Formula 73]

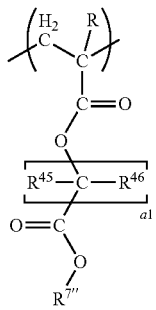

(f1-1)

In the formula, R is the same as defined above; $R^{45}$ and $R^{46}$ each independently represents a hydrogen atom, a halogen atom, an alkyl group of 1 to 5 carbon atoms or a halogenated alkyl group of 1 to 5 carbon atoms, provided that the plurality of $R^{45}$ and $R^{46}$ may be the same or different; a1 represents an integer of 1 to 5; and $R^{7''}$ represents an organic group containing a fluorine atom.

In formula (f1-1), R is the same as defined above. As R, a hydrogen atom or a methyl group is preferable.

In formula (f1-1), examples of the halogen atom for $R^{45}$ and $R^{46}$ include a fluorine atom, a chlorine atom, a bromine atom and an iodine atom, and a fluorine atom is particularly desirable. Examples of the alkyl group of 1 to 5 carbon atoms for $R^{45}$ and $R^{46}$ include the same alkyl group of 1 to 5 carbon atoms for R defined above, and a methyl group or an ethyl group is preferable. Specific examples of the halogenated alkyl group of 1 to 5 carbon atoms represented by $R^{45}$ or $R^{46}$ include groups in which part or all of the hydrogen atoms of the aforementioned alkyl groups of 1 to 5 carbon atoms have been substituted with halogen atoms. Examples of the halogen atom include a fluorine atom, a chlorine atom, a bromine atom and an iodine atom, and a fluorine atom is particularly desirable. Among these, as $R^{45}$ and $R^{46}$, a hydrogen atom, a fluorine atom or an alkyl group of 1 to 5 carbon atoms is preferable, and a hydrogen atom, a fluorine atom, a methyl group or an ethyl group is more preferable.

In formula (f1-1), a1 represents an integer of 1 to 5, preferably an integer of 1 to 3, and more preferably 1 or 2.

In formula (f1-1), $R^{7''}$ represents an organic group containing a fluorine atom, and is preferably a hydrocarbon group containing a fluorine atom.

The hydrocarbon group containing a fluorine atom may be linear, branched or cyclic, and preferably has 1 to 20 carbon atoms, more preferably 1 to 15 carbon atoms, and most preferably 1 to 10 carbon atoms.

It is preferable that the hydrocarbon group having a fluorine atom has 25% or more of the hydrogen atoms within the hydrocarbon group fluorinated, more preferably 50% or more, and most preferably 60% or more, as the hydrophobicity of the resist film during immersion exposure is enhanced.

Among these, as $R^{7''}$, a fluorinated hydrocarbon group of 1 to 5 carbon atoms is particularly preferable, and a methyl group, $-CH_2-CF_3$, $-CH_2-CF_2-CF_3$, $-CH(CF_3)_2$, $-CH_2-CH_2-CF_3$, and $-CH_2-CH_2-CF_2-CF_2-CF_3$ are most preferable.

The weight average molecular weight (Mw) (the polystyrene equivalent value determined by gel permeation chromatography) of the component (F) is preferably 1,000 to 50,000, more preferably 5,000 to 40,000, and most preferably 10,000 to 30,000. When the weight average molecular weight is no more than the upper limit of the above-mentioned range, the resist composition exhibits a satisfactory solubility in a resist solvent. On the other hand, when the weight average molecular weight is at least as large as the lower limit of the above-mentioned range, dry etching resistance and the cross-sectional shape of the resist pattern becomes satisfactory.

Further, the dispersity (Mw/Mn) of the component (F) is preferably 1.0 to 5.0, more preferably 1.0 to 3.0, and most preferably 1.2 to 2.5.

As the component (F), one type may be used alone, or two or more types may be used in combination.

The component (F) is typically used in an amount within a range from 0.5 to 10 parts by weight, relative to 100 parts by weight of the component (A).

In the present invention, the resist composition may contain a cross-linker (hereafter, frequently referred to as "component (G)"). By using the component (G), the heat resistance and the chemical agent resistance of the obtained resist pattern can be improved.

There are no particular limitations on the component (G), which may be selected appropriately from the various cross-linkers used within conventional chemically amplified negative-tone resist compositions.

Specific examples of the component (G) include compounds produced by reacting an amino group-containing compound such as melamine, acetoguanamine, benzoguanamine, urea, ethylene urea, propylene urea or glycoluril with either formaldehyde or a combination of formaldehyde and a lower alcohol, thereby substituting the hydrogen atoms of the amino group with hydroxymethyl groups or lower alkoxymethyl groups; and compounds having an epoxy group.

Of these, compounds that use melamine are referred to as melamine-based cross-linkers, compounds that use urea are referred to as urea-based cross-linkers, compounds that use an alkylene urea such as ethylene urea or propylene urea are referred to as alkylene urea-based cross-linkers, compounds that use glycoluril are referred to as glycoluril-based cross-linkers, and compounds that use a compound having an epoxy group are referred to as epoxy-based cross-linkers.

As the cross-linkers, at least one type of cross-linker selected from the group consisting of melamine-based cross-linkers, urea-based cross-linkers, alkylene urea-based cross-linkers, glycoluril-based cross-linkers, epoxy-based cross-linkers, oxetane-based cross-linkers and ring-opening polymerization-type cross-linkers is preferred, and an epoxy-based cross-linker is particularly desirable.

Examples of the melamine-based cross-linkers include compounds obtained by reacting melamine with formaldehyde, thereby substituting the hydrogen atoms of the amino group with hydroxymethyl groups, and compounds obtained by reacting melamine with formaldehyde and a lower alcohol, thereby substituting the hydrogen atoms of the amino group with lower alkoxymethyl groups. Specific examples include hexamethoxymethylmelamine, hexaethoxymethylmelamine, hexapropoxymethylmelamine and hexabutoxybutylmelamine, and of these, hexamethoxymethylmelamine is preferred.

Examples of the urea-based cross-linkers include compounds obtained by reacting urea with formaldehyde, thereby substituting the hydrogen atoms of the amino group with hydroxymethyl groups, and compounds obtained by reacting urea with formaldehyde and a lower alcohol, thereby substituting the hydrogen atoms of the amino group with lower alkoxymethyl groups. Specific examples include bismethoxymethylurea, bisethoxymethylurea, bispropoxymethylurea and bisbutoxymethylurea, and of these, bismethoxymethylurea is preferred.

Examples of the urea-based cross-linkers include compounds represented by general formulae (G-1) to (G-3) shown below.

[Chemical Formula 74]

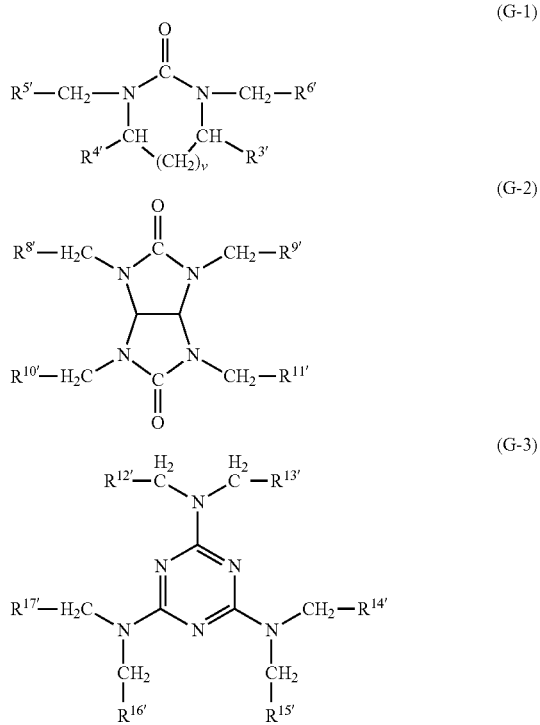

In the formulae, $R^{5'}$, $R^{6'}$ and $R^{8'}$ to $R^{17'}$ each independently represent a hydroxyl group or an alkoxy group of 1 to 5 carbon atoms; $R^{3'}$ and $R^{4'}$ each independently represents a hydrogen atom, a hydroxyl group or an alkoxy group of 1 to 5 carbon atoms, and v represents 0 or an integer of 1 to 2.

The alkoxy group of 1 to 5 carbon atoms for $R^{5'}$, $R^{6'}$, $R^{8'}$ to $R^{11'}$ and $R^{12'}$ to $R^{17'}$ may be either a linear or branched group, and is preferably an alkoxy group of 1 to 4 carbon atoms. $R^{5'}$, $R^{6'}$, $R^{8'}$ to $R^{11'}$ and $R^{12'}$ to $R^{17'}$ may be the same or different, and are preferably the same.

The alkoxy group of 1 to 5 carbon atoms for $R^{3'}$ to $R^{4'}$ may be either a linear or branched group, and is preferably an alkoxy group of 1 to 4 carbon atoms. $R^{3'}$ and $R^{4'}$ may be the same or different, and are preferably the same.

v is either 0 or an integer from 1 to 2, and is preferably 0 or 1.

As the alkylene urea-based cross-linker represented by the general formula (G-1), compounds in which v is 0 (ethylene urea-based cross-linkers) and/or compounds in which v is 1 (propylene urea-based cross-linkers) are preferred.

The alkylene urea-based cross-linkers represented by general formula (G-1) can be obtained by a condensation reaction between an alkylene urea and formalin, and by further reacting the resulting product with a lower alcohol.

Specific examples of the alkylene urea-based cross-linkers include ethylene urea-based cross-linkers such as mono- and/or di-hydroxymethylated ethylene urea, mono- and/or di-methoxymethylated ethylene urea, mono- and/or di-ethoxymethylated ethylene urea, mono- and/or di-propoxymethylated ethylene urea, and mono- and/or di-butoxymethylated ethylene urea; propylene urea-based cross-linkers such as mono- and/or di-hydroxymethylated propylene urea, mono- and/or di-methoxymethylated propylene urea, mono- and/or di-ethoxymethylated propylene urea, mono- and/or di-propoxymethylated propylene urea, and mono- and/or di-butoxymethylated propylene urea; as well as 1,3-di(methoxymethyl)-4,5-dihydroxy-2-imidazolidinone, and 1,3-di(methoxymethyl)-4,5-dimethoxy-2-imidazolidinone.

Examples of the glycoluril-based cross-linkers include glycoluril derivatives in which the N-position is substituted with one or both of a hydroxyalkyl group and an alkoxyalkyl group of 1 to 4 carbon atoms. These glycoluril derivatives can be obtained by a condensation reaction between glycoluril and formalin, and by further reacting the resulting product with a lower alcohol.

Specific examples of the glycoluril-based cross-linkers include mono-, di-, tri- and/or tetra-hydroxymethylated glycoluril, mono-, di-, tri- and/or tetra-methoxymethylated glycoluril, mono-, di-, tri- and/or tetra-ethoxymethylated glycoluril, mono-, di-, tri- and/or tetra-propoxymethylated glycoluril, and mono-, di-, tri- and/or tetra-butoxymethylated glycoluril.

There are no particular restrictions on the epoxy-based cross-linkers, and any cross-linker having an epoxy group may be used. Of such cross-linkers, those having two or more epoxy groups are preferred. Including two or more epoxy groups improves the cross-linking reaction.

The number of epoxy groups is preferably at least two, more preferably from 2 to 6, and is most preferably 4.

Preferred examples of the epoxy-based cross-linkers are shown below.

In the following formulae, n79 represents 0 or 1; n80 represents 3 or 4; $R^{85}$ and $R^{86}$ each independently represents a hydrogen atom or a methyl group, and the plurality of the $R^{85}$ groups and the $R^{86}$ groups may be the same or different from each other; n81 each independently represents 0 or 1; and n82 and n83 represent 0 or 1.

[Chemical Formula 75]

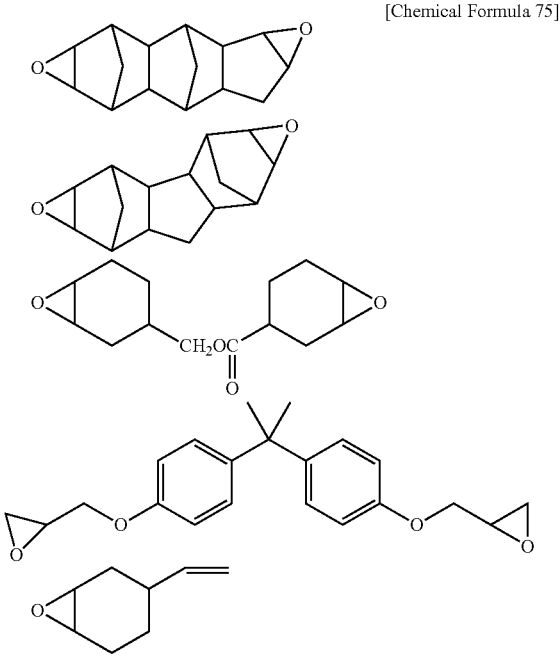

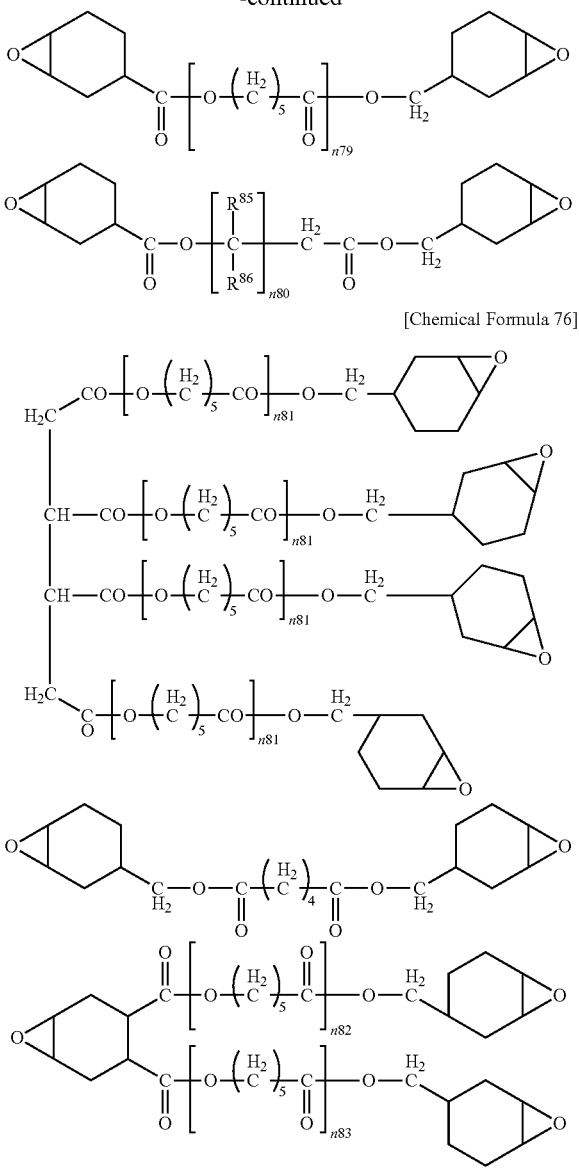

[Chemical Formula 77]

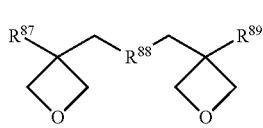

In the formula, $R^{87}$ and $R^{89}$ each independently represents a hydrogen atom, a linear, branched or cyclic alkyl group, an aryl group or an aromatic hydrocarbon group. The alkyl group and the aromatic hydrocarbon group are the same groups as those defined for X in the component (B).

There are no particular restrictions on the oxetane-based cross-linkers, and any cross-linker having an oxetane ring may be used. Of such cross-linkers, those having 2 to 4 oxetane rings are preferred.

Preferred examples of the oxetane-based cross-linkers are shown below.

In the formula, $R^{88}$ represents a divalent linking group, and examples thereof include the same divalent linking groups as those described above in the formula (a1-0-2).

Among these, as an oxetane-based cross-linker, a compound represented by following formula is particularly desirable. In the following formula, n10 represents an integer of 1 to 3.

[Chemical Formula 78]

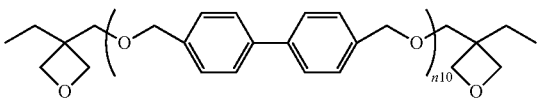

As the cross-linker, one type of solvent may be used, or two or more types may be used in combination.

When the resist composition contains the cross-linker, the amount of the cross-linker, relative to 100 parts by weight of the component (A) is preferably from 0.5 to 30 parts by weight, more preferably from 1 to 25 parts by weight, and still more preferably from 5 to 20 parts by weight. When the amount of the cross-linker is at least as large as the lower limit of the above-mentioned range, the effect of using the cross-linker can be satisfactorily achieved. On the other hand, when the amount of the cross-linker is no more than the upper limit of the above-mentioned range, the storage stability of the resist composition becomes excellent.

In the present invention, the resist composition may contain a photosensitizer (hereafter, frequently referred to as "component (H)"). There is not particular limitation on the component (H), as long as it can absorb exposure energy and transmit the energy to the other substances.

As the component (H), conventional photosensitizers can be used, and specific examples thereof include benzophenone-type photosensitizers, such as benzophenone and p,p'-tetramethyldiaminobenzophenone; carbazole-type photosensitizers; acetophen-type photosensitizers; naphthalene-type photosensitizers, such as 1,5-dihydroxynaphthalene; phenol-type photosensitizers; anthracene-type photosensitizers, such as 9-ethoxyanthracene; biacetyl; eosin; rose bengal; pyrene; phenothiazine; and anthrone.

Among these, as the component (H) of the present invention, a photosensitizer having a polar group or a photosensitizer of 6 to 18 carbon atoms is preferable, and benzophenone, pyrene or 1,5-dihydroxynaphthalene is particularly preferable.

As the component (H), one type may be used alone, or two or more types may be used in combination.

The amount of the component (H) relative to 100 parts by weight of the component (A) is preferably within a range from 0.5 to 20 parts by weight, more preferably from 2 to 12 parts by weight, and still more preferably from 4 to 8 parts by weight. By ensuring the above-mentioned range, a good balance of sensitivity, EL margin and MEF can be achieved.

In the present invention, the resist composition may contain a surfactant (hereafter, frequently referred to as "component (J)").

The component (J) is not particularly limited, and any surfactant typically used for resist compositions can be used. Among these, a fluorine surfactant (J1) (hereafter, referred to as "component (J1)") or a silicon-based surfactant (siloxane-based surfactant) (J2) (hereafter, referred to as "component (J2)") is preferable.

[Component (J1)]

As the component (J1), a fluorine surfactant having an alkylene oxide chain containing a group represented by general formula (j1-0) shown below can be used.

[Chemical Formula 79]

In the formula, $R^f$ represents a fluorinated alkyl group of 1 to 6 carbon atoms; and $R^4$ represents an alkylene group of 1 to 5 carbon atoms or a single bond.

In the formula (j1-0), $R^f$ represents a fluorinated alkyl group of 1 to 6 carbon atom. Since the number of carbon atoms is 6 or less, these surfactants do not fall under so-called PFOAs and PFOSs.

The fluorinated alkyl group preferably has 1 to 3 carbon atoms, and particularly preferably 1 or 2.

Further, the fluorination ratio of the fluorinated alkyl group (percentage of fluorine atoms within the alkyl group) is preferably from 10 to 100%, more preferably from 50 to 100%, and it is most desirable that all hydrogen atoms are substituted with fluorine atoms (namely, the fluorinated alkyl group is a perfluoroalkyl group).

$R^4$ represents an alkylene group of 1 to 5 carbon atoms or a single bond, and a methylene group, an ethylene group or a propylene group is preferable, and a methylene group is most desirable.

Examples of the component (J1) include compounds represented by general formula (j1-1) shown below.

[Chemical Formula 80]

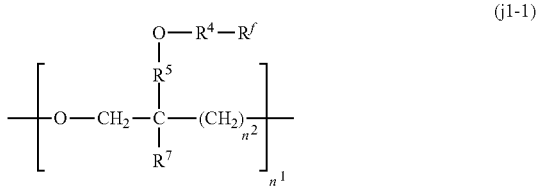

In the formula, $R^f$ represents a fluorinated alkyl group of 1 to 6 carbon atoms; $R^4$ and $R^5$ each independently represents an alkylene group of 1 to 5 carbon atoms or a single bond; $R^7$ represents a hydrogen atom or an alkyl group of 1 to 5 carbon atoms; $n^1$ represents 1 to 50; and $n^2$ represents 0 or 1.

In the formula (j1-1), $R^f$ and $R^4$ are respectively the same as defined for $R^f$ and $R^4$ in the aforementioned general formula (j1-0).

$R^5$ represents an alkylene group of 1 to 5 carbon atoms or a single bond, and a methylene group or an ethylene group is preferable, and a methylene group is most desirable.

$R^7$ represents a hydrogen atom or an alkyl group of 1 to 5 carbon atoms, preferably a hydrogen atom, a methyl group or an ethyl group, and most preferably a methyl group.

$n^1$ represents 1 to 50, preferably 1 to 40, and more preferably 3 to 35, in terms of improving the effects of the present invention.

$n^2$ is either 0 or 1, and is preferably 1.

Specific examples of the component (J1) include PolyFox series such as PF-636, PF-6320, PF-656 and PF-6520 (product names, manufactured by Omnova Solutions, Inc). Among these, PF-656 and PF-6320 are preferable, since the coatability for applying a resist composition to a substrate is excellent, the amount of liquid of the resist composition to be applied can be reduced, and the uniformity of the film thickness of the resist film can be improved.

[Component (J2)]

Examples of the component (J2) include a polyester-modified polydialkylsiloxane-based surfactant (J2-1) containing a repeating unit represented by general formula (j2-0) shown below and a repeating unit represented by general formula (j2-1) shown below (hereafter, referred to "(J2-1) component"). By including the component (J2-1) in the resist composition, generation of streaky defects when applying the resist composition is effectively prevented. Further, the uniformity of the film thickness can be improved.

By containing the component (J2-1), in the case where the resist composition is applied to a metal film having a high reflectivity, such as a metal film as a gate electrode formed on a transparent glass substrate, generation of wrinkle mark (i.e., wrinkled defects) can be efficiently suppressed, which is observed when the resist film formed on the substrate is observed from the upper side thereof after application.

[Chemical Formula 81]

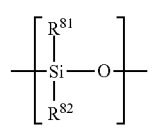

In the formula, $R^{81}$ represents a linear or branched alkyl group of 1 to 3 carbon atoms; and $R^{82}$ represents a linear or branched alkyl group of 1 to 15 carbon atoms.

[Chemical Formula 82]

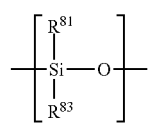

In the formula, $R^{81}$ represents a linear or branched alkyl group of 1 to 3 carbon atoms; and $R^{83}$ represents a polyester modified group.

The component (J2-1) is not particularly limited, as long as it is a siloxane-based surfactant containing a repeating unit represented by the aforementioned general formula, and a siloxane-based surfactant containing a repeating unit other than the repeating unit represented the aforementioned general formula may be used. In order to achieve the object of the present invention, it is preferable that the repeating units represented by the formulae (j2-0) to (j2-1) are included as a main component, and it is more preferable that the silicon atom at the terminal of the polymer is represented by general formula (j2-2) shown below.

[Chemical Formula 83]

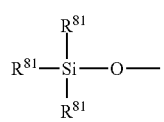

In the formula, $R^{81}$ is the same as defined above.

Among the repeating units constituting the component (J2-1), the amount of repeating units represented by the formulae (j2-0) and (j2-1) is preferably at least 10 mol %, and may be 100 mol %.

Specific examples of preferable component (J2-1) include BYK-310 and BYK-315 (product names, manufactured by BYK-Chemie, Inc.). Among these, BYK-310 is particularly preferable, since it can effectively suppress generation of wrinkled defects and streaky defects (i.e., streaky mark).

Specific examples of the component (J2) other than the component (J2-1) include an non-ionic fluoro-silicon based-surfactant having a perfluoroalkylester group, an alkylsiloxane group, an ethyleneoxy group and a propyleneoxy group (product names: MEGAFAC R-08 and MEGAFAC R-60, manufactured by DIC Corporation); and an non-ionic fluoro-silicon based-surfactant having a perfluoroalkyl group, an alkylsiloxane group and an alkyleneoxy group (product names: X-70-090, X-70-091, X-70-092 and X-70-093, manufactured by The Shin-etsu Chemical Industry Co., Ltd.)

As the component (J), one type may be used alone, or two or more types may be used in combination.

In the solvent developing negative-tone resist composition of the present invention, the amount of the component (J) relative to the total solid content is preferably 0.001 to 7 parts by weight, more preferably 0.001 to 3 parts by weight, and still more preferably 0.01 to 1 parts by weight.

When the amount of the component (J) is at least as large as the lower limit of the above-mentioned range, the coatability to apply a resist composition to a substrate can be improved. When the amount of the structural unit (J) is no more than the upper limit of the above-mentioned range, the compatibility with other components can be improved.

If desired, other miscible additives can also be added to the solvent developing negative-tone resist composition of the present invention. Examples of such miscible additives include additive resins for improving the performance of the resist film, dissolution inhibitors, plasticizers, stabilizers, colorants, halation prevention agents, and dyes.

The solvent developing negative-tone resist composition of the present invention can be prepared by dissolving the materials for the resist composition in an organic solvent (hereafter, frequently referred to as "component (S)").

The component (S) may be any organic solvent which can dissolve the respective components to give a uniform solution, and one or more kinds of any organic solvent can be appropriately selected from those which have been conventionally known as solvents for a chemically amplified resist.

Examples thereof include lactones such as γ-butyrolactone; ketones such as acetone, methyl ethyl ketone (MEK), cyclohexanone, methyl-n-pentyl ketone, methyl isopentyl ketone, and 2-heptanone; polyhydric alcohols, such as ethylene glycol, diethylene glycol, propylene glycol and dipropylene glycol; compounds having an ester bond, such as ethylene glycol monoacetate, diethylene glycol monoacetate, propylene glycol monoacetate, and dipropylene glycol monoacetate; polyhydric alcohol derivatives including compounds having an ether bond, such as a monoalkylether (e.g., monomethylether, monoethylether, monopropylether or monobutylether) or monophenylether of any of these polyhydric alcohols or compounds having an ester bond (among these, propylene glycol monomethyl ether acetate (PGMEA) and propylene glycol monomethyl ether (PGME) are preferable); cyclic ethers such as dioxane; esters such as methyl lactate, ethyl lactate (EL), methyl acetate, ethyl acetate, butyl acetate, methyl pyruvate, ethyl pyruvate, methyl methoxypropionate, and ethyl ethoxypropionate; aromatic organic solvents such as anisole, ethylbenzylether, cresylmethylether, diphenylether, dibenzylether, phenetole, butylphenylether, ethylbenzene, diethylbenzene, pentylbenzene, isopropylbenzene, toluene, xylene, cymene and mesitylene; and dimethylsulfoxide (DMSO).

These solvents can be used individually, or in combination as a mixed solvent.

Among these, PGMEA, PGME, γ-butyrolactone and EL are preferable.

Further, among the mixed solvents, a mixed solvent obtained by mixing PGMEA with a polar solvent is preferable. The mixing ratio (weight ratio) of the mixed solvent can be appropriately determined, taking into consideration the compatibility of the PGMEA with the polar solvent, but is preferably in the range of 1:9 to 9:1, more preferably from 2:8 to 8:2.

Specifically, when EL is mixed as the polar solvent, the PGMEA:EL weight ratio is preferably from 1:9 to 9:1, and more preferably from 2:8 to 8:2. Alternatively, when PGME is mixed as the polar solvent, the PGMEA:PGME is preferably from 1:9 to 9:1, more preferably from 2:8 to 8:2, and still more preferably 3:7 to 7:3.

Further, as the component (S), a mixed solvent of at least one of PGMEA and EL with γ-butyrolactone is also preferable. The mixing ratio (former:latter) of such a mixed solvent is preferably from 70:30 to 95:5.

The amount of the component (S) is not particularly limited, and is appropriately adjusted to a concentration which enables coating of a coating solution to a substrate. In general, the organic solvent is used in an amount such that the solid content of the resist composition becomes within the range from 1 to 20% by weight, and preferably from 2 to 15% by weight.

According to the resist composition of the present invention, a resist pattern with excellent lithography properties such as LWR and pattern shape can be formed with reduced thickness loss which occurs during formation of a pattern.

The reasons why the above-mentioned effects can be achieved have not been elucidated yet. However, one of the reasons is presumed that, by virtue of the structural unit (a2), the structural unit (a2) acts as a cross-linker capable of ring-opening polymerization in the resist composition, and thickness loss at pattern portion caused by developing solution can be suppressed.

Further, it is presumed that, by including the structural unit (a2) containing a group having cross-linking ability in the base component, diffusion of the group having cross-linking ability in the resist film can be appropriately controlled, as compared to the case where a cross-linking agent component of a low-molecular compound is added separately from the base component, and pattern shape and lithography properties such as LWR can be improved.

<<Method of Forming a Resist Pattern>>

More specifically, the method for forming a resist pattern of the second aspect of the present invention can be performed, for example, as follows.

Firstly, a solvent developing negative-tone resist composition is applied to a substrate using a spinner or the like, and a bake treatment (post applied bake (PAB)) is conducted at a temperature of 80 to 150° C. for 40 to 120 seconds, preferably 60 to 90 seconds, to form a resist film. Following selective exposure of the thus formed resist film, either by exposure through a mask having a predetermined pattern formed thereon (mask pattern) using an exposure apparatus such as an ArF exposure apparatus, an electron beam lithography apparatus or an EUV exposure apparatus, or by patterning via direct irradiation with an electron beam without using a mask pattern, baking treatment (post exposure baking (PEB)) is conducted under temperature conditions of 80 to 150° C. for 40 to 120 seconds, and preferably 60 to 90 seconds. The resulting resist film is subjected to developing treatment using an organic developing solution, preferably followed by rinsing with a rinse liquid containing an organic solvent, and then drying is conducted.

After the developing treatment or the rinsing, the developing solution or the rinse liquid remaining on the pattern can be removed by a treatment using a supercritical fluid.

If necessary, after the developing treatment, the rinsing or the treatment with a supercritical fluid, a bake treatment (post bake) may be conducted to remove any remaining organic solvent.

The substrate is not specifically limited and a conventionally known substrate can be used. For example, substrates for electronic components, and such substrates having wiring patterns formed thereon can be used. Specific examples of the material of the substrate include metals such as silicon wafer, copper, chromium, iron and aluminum; and glass. Suitable materials for the wiring pattern include copper, aluminum, nickel, and gold.

Further, as the substrate, any one of the above-mentioned substrates provided with an inorganic and/or organic film on the surface thereof may be used. As the inorganic film, an inorganic anti-reflection film (inorganic BARC) can be used. As the organic film, an organic antireflection film (organic BARC) and an organic film such as a lower-layer organic film used in a multilayer resist method can be used.

Here, a "multilayer resist method" is method in which at least one layer of an organic film (lower-layer organic film) and at least one layer of a resist film (upper resist film) are provided on a substrate, and a resist pattern formed on the upper resist film is used as a mask to conduct patterning of the lower-layer organic film. This method is considered as being capable of forming a pattern with a high aspect ratio. More specifically, in the multilayer resist method, a desired thickness can be ensured by the lower-layer organic film, and as a result, the thickness of the resist film can be reduced, and an extremely fine pattern with a high aspect ratio can be formed.

The multilayer resist method is broadly classified into a method in which a double-layer structure consisting of an upper-layer resist film and a lower-layer organic film is formed (double-layer resist method), and a method in which a multilayer structure having at least three layers consisting of an upper-layer resist film, a lower-layer organic film and at least one intermediate layer (thin metal film or the like) provided between the upper-layer resist film and the lower-layer organic film is formed (triple-layer resist method).

The wavelength to be used for exposure is not particularly limited and the exposure can be conducted using radiations such as ArF excimer laser, KrF excimer laser, $F_2$ excimer laser, extreme ultraviolet rays (EUV), vacuum ultraviolet rays (VUV), electron beam (EB), X-rays, and soft X-rays. The resist composition of the present invention is effective to KrF excimer laser, ArF excimer laser, EB and EUV, and particularly effective to ArF excimer laser, EB and EUV.

The exposure of the resist film can be either a general exposure (dry exposure) conducted in air or an inert gas such as nitrogen, or immersion exposure (immersion lithography).

In immersion lithography, the region between the resist film and the lens at the lowermost point of the exposure apparatus is pre-filled with a solvent (immersion medium) that has a larger refractive index than the refractive index of air, and the exposure (immersion exposure) is conducted in this state.

The immersion medium preferably exhibits a refractive index larger than the refractive index of air but smaller than the refractive index of the resist film to be exposed. The refractive index of the immersion medium is not particularly limited as long as it satisfies the above-mentioned requirements.

Examples of this immersion medium which exhibits a refractive index that is larger than the refractive index of air but smaller than the refractive index of the resist film include water, fluorine-based inert liquids, silicon-based solvents and hydrocarbon-based solvents.

Specific examples of the fluorine-based inert liquids include liquids containing a fluorine-based compound such as $C_3HCl_2F_5$, $C_4F_9OCH_3$, $C_4F_9OC_2H_5$ or $C_5H_3F_7$ as the main component, which preferably have a boiling point within a range from 70 to 180° C. and more preferably from 80 to 160° C. A fluorine-based inert liquid having a boiling point within the above-mentioned range is advantageous in that the removal of the immersion medium after the exposure can be conducted by a simple method.

As a fluorine-based inert liquid, a perfluoroalkyl compound in which all of the hydrogen atoms of the alkyl group are substituted with fluorine atoms is particularly desirable. Examples of these perfluoroalkyl compounds include perfluoroalkylether compounds and perfluoroalkyl amine compounds.

Specifically, one example of a suitable perfluoroalkylether compound is perfluoro(2-butyl-tetrahydrofuran) (boiling point 102° C.), and an example of a suitable perfluoroalkylamine compound is perfluorotributylamine (boiling point 174° C.).

As the immersion medium, water is preferable in terms of cost, safety, environment and versatility.

As the organic solvent contained in the organic-based solvent used for developing, any of the conventional organic solvents can be used which are capable of dissolving the base component (A) (prior to exposure) can be appropriately selected. Specific examples of the organic solvent include polar solvents such as ketone solvents, ester solvents, alcohol solvents, amide solvents and ether solvents, and hydrocarbon solvents. Among these, ester solvents and ketone solvents are preferable. As an ester solvent, butyl acetate is preferable. As a ketone solvent, methyl amyl ketone (2-heptanone) is preferable.

A ketone solvent is an organic solvent containing C—C (C=O)—C within the structure thereof. An ester solvent is an organic solvent containing C—C(C=O)—O—C within the structure thereof. An alcohol solvent is an organic solvent containing an alcoholic hydroxy group within the structure thereof, and an "alcoholic hydroxy group" refers to a hydroxy group bonded to a carbon atom of an aliphatic hydrocarbon group. An amide solvent is an organic solvent containing an amide group within the structure thereof. An ether solvent is an organic solvent containing C—O—C within the structure thereof. Some organic solvents have a plurality of the functional groups which characterizes the aforementioned solvents within the structure thereof. In such a case, the organic solvent can be classified as any type of the solvent having the characteristic functional group. For example, diethyleneglycol monomethylether can be classified as either an alcohol solvent or an ether solvent. A hydrocarbon solvent consists of a hydrocarbon, and does not have any substituent (atom or group other than hydrogen and carbon).

Specific examples of ketone solvents include 1-octanone, 2-octanone, 1-nonanone, 2-nonanone, acetone, 4-heptanone, 1-hexanone, 2-hexanone, diisobutyl ketone, cyclohexanone, methylcyclohexanone, phenylacetone, methyl ethyl ketone, methyl isobutyl ketone, acetylacetone, acetonylacetone, ionone, diacetonylalcohol, acetyl carbinol, acetophenone, methyl naphthyl ketone, isophorone, propylenecarbonate, γ-butyrolactone and methyl amyl ketone (2-heptanone).

Examples of ester solvents include methyl acetate, butyl acetate, ethyl acetate, isopropyl acetate, amyl acetate, isoamyl acetate, ethyl methoxyacetate, ethyl ethoxyacetate, propylene glycol monomethyl ether acetate, ethylene glycol monoethyl ether acetate, ethylene glycol monopropyl ether acetate, ethylene glycol monobutyl ether acetate, ethylene glycol monophenyl ether acetate, diethylene glycol monomethyl ether acetate, diethylene glycol monopropyl ether acetate, diethylene glycol monoethyl ether acetate, diethylene glycol monophenyl ether acetate, diethylene glycol monobutyl ether acetate, diethylene glycol monoethyl ether acetate, 2-methoxybutyl acetate, 3-methoxybutyl acetate, 4-methoxybutyl acetate, 3-methyl-3-methoxybutyl acetate, 3-ethyl-3-methoxybutyl acetate, propylene glycol monomethyl ether acetate, propylene glycol monoethyl ether acetate, propylene glycol monopropyl ether acetate, 2-ethoxybutyl acetate, 4-ethoxybutyl acetate, 4-propoxybutyl acetate, 2-methoxypentyl acetate, 3-methoxypentyl acetate, 4-methoxypentyl acetate, 2-methyl-3-methoxypentyl acetate, 3-methyl-3-methoxypentyl acetate, 3-methyl-4-methoxypentyl acetate, 4-methyl-4-methoxypentyl acetate, propylene glycol diacetate, methyl formate, ethyl formate, butyl formate, propyl formate, ethyl lactate, butyl lactate, propyl lactate, ethyl carbonate, propyl carbonate, butyl carbonate, methyl pyruvate, ethyl pyruvate, propyl pyruvate, butyl pyruvate, methyl acetoacetate, ethyl acetoacetate, methyl propionate, ethyl propionate, propyl propionate, isopropyl propionate, methyl 2-hydroxypropionate, ethyl 2-hydroxypropionate, methyl-3-methoxypropionate, ethyl-3-methoxypropionate, ethyl-3-ethoxypropionate and propyl-3-methoxypropionate.

As the ester solvent, a solvent represented by general formula (1) described later or a solvent represented by general formula (2) described later is preferable, a solvent represented by general formula (1) is more preferable, an alkyl acetate is still more preferable, and butyl acetate is particularly desirable.

Examples of alcohol solvents include monohydric alcohols, such as methyl alcohol, ethyl alcohol, n-propyl alcohol, isopropyl alcohol, n-butyl alcohol, sec-butyl alcohol, tert-butyl alcohol, isobutyl alcohol, n-hexyl alcohol, n-heptyl alcohol, n-octyl alcohol, n-decanol and 3-methoxy-1-butanol; glycol solvents, such as ethylene glycol, diethylene glycol and triethylene glycol; and glycol ether solvents containing a hydroxy group, such as ethylene glycol monomethyl ether, propylene glycol monomethyl ether, diethylene glycol monomethyl ether, triethylene glycol monoethyl ether, methoxymethyl butanol, ethylene glycol monoethyl ether, ethylene glycol monopropyl ether, ethylene glycol monobutyl ether, propylene glycol monoethyl ether, propylene glycol monopropyl ether, propylene glycol monobutyl ether and propylene glycol monophenyl ether. Among these examples, a glycol ether solvent is preferable.

Examples of amide solvents include N-methyl-2-pyrrolidone, N,N-dimethylacetamide, N,N-dimethylformamide, hexamethylphosphoric amide and 1,3-dimethyl-2-imidazolidinone.

Examples of ether solvents include the aforementioned glycol ether solvents containing a hydroxy group; glycol ether solvents containing no hydroxy group, such as propylene glycol dimethyl ether, propylene glycol diethyl ether, diethylene glycol dimethyl ether and diethylene glycol diethyl ether: dioxane; tetrahydrofuran; anisole; perfluoro-2-butyltetrahydrofuran, perfluorotetrahydrofuran and 1,4-dioxane. Among these, a glycol ether solvent containing a hydroxy group or a glycol ether solvent containing no hydroxy group is preferable.

Examples of hydrocarbon solvents include aliphatic hydrocarbon solvents, such as pentane, hexane, octane, decane, 2,2,4-trimethylpentane, 2,2,3-trimethylhexane, perfluorohexane and perfluoronpetane; and aromatic hydrocarbon solvents, such as toluene, xylene, ethylbenzene, propylbenzene, 1-methylpropylbenzene, 2-methylpropylbenzene, dimethylbenzene, diethylbenzene, ethylmethylbenzene, trimethylbenzene, ethyldimethylbenzene and dipropylbenzene. Among these examples, an aromatic hydrocarbon solvent is preferable.

These organic solvents can be used individually, or at least 2 solvents may be mixed together. Further, an organic solvent other than the aforementioned examples or water may be mixed together.

As the organic solvent for the organic developing solution, a solvent represented by general formula (1) or (2) shown below is preferable.

$$R^{00}\text{—}C(\text{=}O)\text{—}O\text{—}R^{01} \tag{1}$$

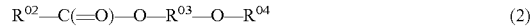

$$R^{02}\text{—}C(\text{=}O)\text{—}O\text{—}R^{03}\text{—}O\text{—}R^{04} \tag{2}$$

In formula (1), each of $R^{00}$ and $R^{01}$ independently represents a hydrogen atom, an alkyl group, an alkoxy group, an alkoxycarbonyl group, a carboxy group, a hydroxy group, a cyano group or a halogen atom, provided that $R^{00}$ and $R^{01}$ may be mutually bonded to form a ring. In formula (2), each of $R^{02}$ and $R^{04}$ independently represents a hydrogen atom, an alkyl group, an alkoxy group, an alkoxycarbonyl group, a carboxy group, a hydroxy group, a cyano group or a halogen atom, provided that $R^{02}$ and $R^{04}$ may be mutually bonded to form a ring; and $R^{03}$ represents an alkylene group.

In formula (1), the alkyl group for $R^{00}$ and $R^{01}$ may be linear, branched or cyclic, preferably linear or branched, and preferably has 1 to 5 carbon atoms. The alkyl group may have a substituent. Examples of the substituent include a hydroxy group, a carboxy group and a cyano group.

As the alkyl group within the alkoxy group and the alkoxycarbonyl group, the same alkyl groups as those described above can be used.

Examples of the halogen atom include a fluorine atom, a chlorine atom, a bromine atom and an iodine atom, and a fluorine atom is preferable.

It is preferable that $R^{00}$ and $R^{01}$ each independently represents a hydrogen atom or an alkyl group.

Specific example of the solvent represented by formula (1) include methyl acetate, butyl acetate, ethyl acetate, isopropyl acetate, pentyl acetate, isopentyl acetate, methyl formate, ethyl formate, butyl formate, propyl formate, ethyl lactate, butyl lactate, propyl lactate, ethyl carbonate, propyl carbonate, butyl carbonate, methyl pyruvate, ethyl pyruvate, propyl pyruvate, butyl pyruvate, methyl acetoacetate, ethyl acetoacetate, methyl propionate, ethyl propionate, propyl propionate, isopropyl propionate, methyl 2-hydroxypropionate and ethyl 2-hydroxypropionate.

Among the aforementioned examples, as the solvent represented by formula (1), those in which $R^{00}$ and $R^{01}$ both represent an unsubstituted alkyl group is preferable, an alkyl acetate is more preferable, and butyl acetate is particularly desirable.

In formula (2), $R^{02}$ and $R^{04}$ are the same as defined for $R^{00}$ and $R^{01}$ described above.

The alkylene group for $R^{03}$ may be linear, branched or cyclic, preferably linear or branched, and preferably has 1 to 5 carbon atoms. The alkylene group may have a substituent.

Examples of the substituent include a hydroxy group, a carboxy group and a cyano group. When the alkylene group has 2 or more carbon atoms, an oxygen atom (—O—) may be present between the carbon atoms within the alkylene group.

Specific example of the solvent represented by formula (2) include ethylene glycol monoethyl ether acetate, ethylene glycol monopropyl ether acetate, ethylene glycol monobutyl ether acetate, ethylene glycol monophenyl ether acetate, diethylene glycol monomethyl ether acetate, diethylene glycol monopropyl ether acetate, diethylene glycol monophenyl ether acetate, diethylene glycol monobutyl ether acetate, diethylene glycol monoethyl ether acetate, propylene glycol monomethyl ether acetate, propylene glycol monoethyl ether acetate, propylene glycol monopropyl ether acetate, methyl-3-methoxypropionate, ethyl-3-methoxypropionate, ethyl-3-ethoxypropionate, propyl-3-methoxypropionate, ethyl methoxyacetate, ethyl ethoxyacetate, 2-methoxybutyl acetate, 3-methoxybutyl acetate, 4-methoxybutyl acetate, 3-methyl-3-methoxybutyl acetate, 3-ethyl-3-methoxybutyl acetate, 2-ethoxybutyl acetate, 4-ethoxybutyl acetate, 4-propoxybutyl acetate, 2-methoxypentyl acetate, 3-methoxypentyl acetate, 4-methoxypentyl acetate, 2-methyl-3-methoxypentyl acetate, 3-methyl-3-methoxypentyl acetate, 3-methyl-4-methoxypentyl acetate and 4-methyl-4-methoxypentyl acetate.

The solvent represented by formula (1) and/or (2) can be used individually, or at least 2 types of solvents may be mixed together. Further, another solvent may be mixed together.

The other solvent is not particularly limited as long as it can be mixed with the solvent represented by formula (1) or (2) without being separated, and can be appropriately selected from the aforementioned ester solvents, ketone solvents, alcohol solvents, amide solvents, ether solvents and hydrocarbon solvents.

In terms of reducing the cost, it is preferable to use an organic solvent containing no halogen atom as the organic developing solution. The amount of the organic solvent containing no halogen atom, based on the total weight of the organic developing solvent is preferably 60% by weight or more, more preferably 80% by weight or more, still more preferably 90% by weight or more, and may be even 100% by weight.

The boiling point of the organic solvent used as the organic developing solution is preferably 50° C. to lower than 250° C.

The ignition point of the organic solvent used as the organic developing solution is preferably 200° C. or higher.

If desired, the organic developing solution may have a conventional additive blended. Examples of the additive include surfactants. The surfactant is not particularly limited, and for example, an ionic or non-ionic fluorine and/or silicon surfactant can be used.

Examples of commercially available surfactants include fluorine surfactants or silicon surfactants such as F Top EF301, EF303 (produced by Shinakita Kasei K.K.), Florad FC430, FC431 (produced by Sumitomo 3M), Megafac F171, F173, F176, F189, R08 (produced by DIC Corporation), Surflon S-382, SC101, SC102, SC103, SC104, SC105, SC106 (Asahi Glass Co., Ltd.) and Troysol S-366 (troy chemical corporation). Further, polysiloxane polymer KP-341 (produced by The Shin-etsu Chemical Industry Co., Ltd.) can be used as a silicon surfactant.

Further, other than the aforementioned conventional surfactants, there can be used a surfactant containing a polymer having a fluoroaliphatic group derived from a fluoroaliphatic compound produced by a telomerization method (telomer method) or an oligomerization method (oligomer method).

The fluoroaliphatic compound can be produced by a method described in Japanese Unexamined Patent Application, First Publication No. 2002-90991.

As the polymer containing a fluoroaliphatic group, a copolymer of a monomer containing a fluoroaliphatic group and a (poly(oxyalkylene)) acrylate and/or (poly(oxyalkylene)) methacrylate is preferable. The copolymer may be either a random copolymer or a block copolymer. Examples of the poly(oxyalkylene) group include a poly(oxyethylene) group a poly(oxypropylene) group and a poly(oxybutylene) group. Alternatively, a unit in which alkylene chains having different chain length exist within one chain may be used, such as a poly(block linkage of oxyethylene, oxypropylene and oxyethylene) or a poly(block linkage of oxyethylene and oxypropylene). Furthermore, the copolymer of a monomer having a fluoroaliphatic group and a (poly(oxyalkylene)) acrylate (or methacrylate) may not only be a bipolymer, but may be a terpolymer or more in which 2 or more types of monomers having a fluoroaliphatic group or 2 or more types of (poly(oxyalkylene))acrylate (or methacrylate) have been copolymerized together.

Examples of such surfactants which are commercially available include Megafac F178, Megafac F-470, Megafac F-473, Megafac F-475, Megafac F-476 and Megafac F-472 (produced by DIC Corporation). Further examples include a copolymer of an acrylate (or a methacrylate) having a $C_6F_{13}$ group and a (poly(oxyalkylene)) acrylate (or methacrylate), a copolymer of an acrylate (or a methacrylate) having a $C_6F_{13}$ group, a (poly(oxyethylene)) acrylate (or methacrylate) and a (poly(oxypropylene)) acrylate (or methacrylate), a copolymer of an acrylate (or a methacrylate) having a $C_8F_{17}$ group and a (poly(oxyalkylene)) acrylate (or methacrylate), and a copolymer of an acrylate (or a methacrylate) having a $C_3F_{17}$ group, a (poly(oxyethylene)) acrylate (or methacrylate) and a (poly(oxypropylene)) acrylate (or methacrylate).

As the surfactant, a non-ionic surfactant is preferable, and a fluorine surfactant or a silicon surfactant is more preferable.

When a surfactant is added, the amount thereof based on the total amount of the organic developing solution is generally 0.001 to 5% by weight, preferably 0.005 to 2% by weight, and more preferably 0.01 to 0.5% by weight.

The development treatment using the organic developing solution can be performed by a conventional developing method. Examples thereof include a method in which the substrate is immersed in the developing solution for a predetermined time (a dip method), a method in which the developing solution is cast up on the surface of the substrate by surface tension and maintained for a predetermined period (a paddle method), a method in which the developing solution is sprayed onto the surface of the substrate (spray method), and a method in which the developing solution is continuously ejected from a developing solution ejecting nozzle while scanning at a constant rate to apply the developing solution to the substrate while rotating the substrate at a constant rate (dynamic dispense method).

After the developing treatment and before drying, a rinse treatment may be performed using a rinse liquid containing an organic solvent. By performing a rinse treatment, an excellent pattern can be formed.

As the organic solvent used for the rinse liquid, any of the aforementioned organic solvents for the organic developing solution can be used which hardly dissolve the pattern. In general, at least one solvent selected from the group consisting of hydrocarbon solvents, ketone solvents, ester solvents, alcohol solvents, amide solvents and ether solvents is used. Among these, at least one solvent selected from the group consisting of hydrocarbon solvents, ketone solvents, ester solvents, alcohol solvents and amide solvents is preferable, more preferably at least one solvent selected from the group consisting of alcohol solvents and ester solvents, and an alcohol solvent is particularly desirable.

The alcohol solvent used for the rinse liquid is preferably a monohydric alcohol of 6 to 8 carbon atoms, and the monohydric alcohol may be linear, branched or cyclic. Specific examples thereof include 1-hexanol, 1-heptanol, 1-octanol, 2-hexanol, 2-heptanol, 2-octanol, 3-hexanol, 3-heptanol, 3-octanol, 4-octanol and benzyl alcohol. Among these, 1-hexanol, 2-heptanol and 2-hexanol are preferable, and 1-hexanol and 2-hexanol are more preferable.

These organic solvents can be used individually, or at least 2 solvents may be mixed together. Further, an organic solvent other than the aforementioned examples or water may be mixed together. However, in consideration of the development characteristics, the amount of water within the rinse liquid, based on the total amount of the rinse liquid is preferably 30% by weight or less, more preferably 10% by weight or less, still more preferably 5% by weight or less, and most preferably 3% by weight or less.

If desired, the organic developing solution may have a conventional additive blended. Examples of the additive include surfactants. As the surfactant, the same surfactants as those described above can be mentioned, and a non-ionic surfactant is preferable, and a fluorine surfactant or a silicon surfactant is more preferable.

When a surfactant is added, the amount thereof based on the total amount of the rinse liquid is generally 0.001 to 5% by weight, preferably 0.005 to 2% by weight, and more preferably 0.01 to 0.5% by weight.

The rinse treatment (washing treatment) using the rinse liquid can be performed by a conventional rinse method. Examples thereof include a method in which the rinse liquid is continuously applied to the substrate while rotating it at a constant rate (rotational coating method), a method in which the substrate is immersed in the rinse liquid for a predetermined time (dip method), and a method in which the rinse liquid is sprayed onto the surface of the substrate (spray method).

<<Method of Forming Pattern of Layer Containing Block Copolymer>>

A method of forming a pattern of a layer containing a block copolymer of the third aspect of the invention will be explained with reference to FIG. 1.

As shown in FIG. 1, a method of forming a pattern of a layer containing a block copolymer of the present invention is characterized by including: a step in which an undercoat agent is applied to a substrate 11 to form a layer 12 containing the undercoat agent; a step in which a resist film is formed on a surface of the layer 12 containing the undercoat agent by using the solvent developing negative-tone resist composition; a step in which the resist film is subjected to exposure; a step in which the resist film is subjected to developing using a developing solution containing an organic solvent to form a resist pattern 14; a step in which a layer 13 containing a block copolymer having a plurality of polymers bonded is formed on a surface of the layer 12 containing the undercoat agent having the resist pattern formed thereon, followed by a phase separation of the layer 13 containing the block copolymer; and a step in which a phase 13a containing at least one polymer of the plurality of polymers constituting the block copolymer is selectively removed from the layer 13 containing the block copolymer.

The positioning and the orientation of the structure formed on the surface of the substrate 11 are determined by the positioning and the orientation of the phase selectively removed from the phase-separated structure of the layer 13 containing the block copolymer. In other words, by appropriately adjusting the positioning and the orientation of the phase-separated structure to be formed on the surface of the substrate 11, a nanostructure having the desired positioning and orientation thereof can be formed on the surface of the substrate. In particular, by using a phase-separated structure capable of forming a finer pattern than conventional resist patterns as a template, it becomes possible to form a substrate provided with a nanostructure having an extremely minute shape.

Hereafter, each of the steps and the materials used will be explained in detail.

<Block Copolymer>

A block copolymer is a polymeric material in which plurality of polymers are bonded. As the polymers constituting the block copolymer, 2 types of polymers may be used, or 3 or more types of polymers may be used.

In the present invention, the plurality of polymers constituting the block copolymer are not particularly limited, as long as they are combinations capable of causing phase separation. However, it is preferable to use a combination of polymers which are mutually incompatible. Further, it is preferable to use a combination in which a phase of at least one polymer amongst the plurality of polymers constituting the block copolymer can be easily subjected to selective removal as compared to the phases of other polymers.

Examples of the block copolymer include a block copolymer having a polymer containing a structural unit derived from styrene or a derivative thereof bonded to a polymer containing a structural unit derived from a (meth)acrylate ester, a block copolymer having a polymer containing a structural unit derived from styrene or a derivative thereof bonded to a polymer containing a structural unit derived from a siloxane or a derivative thereof, and a block copolymer having a polymer containing a structural unit derived from an alkylene oxide bonded to a polymer containing a structural unit derived from a (meth)acrylate ester.

As the (meth)acrylate ester, for example, (meth)acrylic acid having a substituent such as an alkyl group or a hydroxyalkyl group bonded to the carbon atom of the (meth)acrylic acid can be used. Examples of the alkyl group as the substituent include linear, branched or cyclic alkyl groups of 1 to 10 carbon atoms. Specific examples of the (meth)acrylate ester include methyl(meth)acrylate, ethyl(meth)acrylate, propyl (meth)acrylate, cyclohexyl(meth)acrylate, octyl(meth)acrylate, nonyl(meth)acrylate, hydroxyethyl(meth)acrylate, hydroxypropyl(meth)acrylate, benzyl(meth)acrylate, anthracenyl(meth)acrylate, glycidyl(meth)acrylate, 3,4-epoxycyclohexylmethyl(meth)acrylate, and trimethoxysilylpropyl (meth)acrylate.

Examples of the styrene derivative include 2-methylstyrene, 3-methylstyrene, 4-methylstyrene, 4-t-butylstyrene, 4-n-octylstyrene, 2,4,6-trimethylstyrene, 4-methoxystyrene, 4-t-butoxystyrene, 4-hydroxystyrene, 4-nitrostyrene, 3-nitrostyrene, 4-chlorostyrene, 4-fluorostyrene, 4-acetoxyvinylstyrene, vinylcyclohexane, 4-vinylbenzylchloride, 1-vinylnaphthalene, 4-vinylbiphenyl, 1-vinyl-2-pyrolidone, 9-vinylanthracene, and vinylpyridine.

Examples of the siloxane derivative include dimethylsiloxane, diethylsiloxane, diphenylsiloxane, and methylphenylsiloxane.

Examples of the alkylene oxide include ethylene oxide, propylene oxide, isopropylene oxide and butylene oxide.

In the present invention, it is preferable to use a block copolymer having a polymer which contains a structural unit derived from styrene or a derivative thereof bonded to a polymer which contains a structural unit derived from a (meth)acrylate ester. Specific examples thereof include a styrene-polymethyl methacrylate (PS-PMMA) block copolymer, a styrene-polyethyl methacrylate block copolymer, a styrene-(poly-t-butyl methacrylate) block copolymer, a styrene-polymethacrylic acid block copolymer, a styrene-polymethyl acrylate block copolymer, a styrene-polyethyl acrylate block copolymer, a styrene-(poly-t-butyl acrylate) block copolymer, and a styrene-polyacrylic acid block copolymer. In the present invention, it is particularly preferable to use a PS-PMMA block copolymer.

The weight average molecular weight (Mw) (the polystyrene equivalent value determined by gel permeation chromatography) of each polymer constituting the block copolymer is not particularly limited as long as it is large enough to cause phase separation. The weight average molecular weight is preferably 5,000 to 500,000, more preferably 10,000 to 400,000, and still more preferably 20,000 to 300,000.

The polydispersity (Mw/Mn) of the block copolymer is preferably 1.0 to 3.0, more preferably 1.0 to 1.5, and still more preferably 1.0 to 1.2. Here, Mn is the number average molecular weight.

Hereafter, among the polymers constituting the block copolymer, a polymer which is not selectively removed in the later step is referred to as "polymer $P_A$", and a polymer to be selectively removed is referred to as "polymer $P_B$". For example, after the phase separation of a layer containing a PS-PMMA block copolymer, by subjecting the layer to an oxygen plasma treatment or a hydrogen plasma treatment, the phase of PMMA is selectively removed. In such a case, PS is the polymer $P_A$, and PMMA is the polymer $P_B$.

In the present invention, the shape and size of the phase to be selectively removed (i.e., the phase 13*a* of polymer $P_B$) is determined by the compositional ratio of the respective polymers constituting the block copolymer and the molecular weight of the block copolymer. For example, by making the compositional ratio per volume of the polymer $P_B$ within the block copolymer relatively small, a cylinder structure in which the phase 13*a* of the polymer $P_B$ is present within the phase 13*b* of the polymer $P_A$ in the form of a cylinder can be formed. On the other hand, by making the compositional ratio per volume of the polymer $P_B$ within the block copolymer about the same as that of the polymer $P_A$, a lamellar structure in which the phase 13*b* of the polymer $P_A$ and the phase 13*a* of the polymer $P_B$ are alternately laminated can be formed. Further, by increasing the molecular weight of the block copolymer, the size of each phase can be increased.

<Formation of Layer of Undercoat Agent>

There are no particular limitations on the substrate 11 used in the present invention, provided that the substrate is not dissolved or mixed when the undercoat agent or the block copolymer is applied, and specific examples thereof include metal substrates formed from metal such as silicon wafer, copper, chromium, iron or aluminum or the like, metal oxide substrates formed from a metal oxide, such as glass substrates, and polymer films (such as polyethylene, polyethylene terephthalate, polyimide and benzocyclobutene). Further, the size and the shape of the substrate 11 is not particularly limited as long as it is a flat plate, and can be appropriately selected.

Before forming a layer 12 of an undercoat agent on the substrate 11, the surface of the substrate may be washed. Further, an anti-reflection film may be formed on the substrate 11. By washing the surface of the substrate 11, the formation of a layer 12 of an undercoat agent may be satisfactorily performed.

As the washing treatment, a conventional method may be used, and examples thereof include an oxygen plasma treatment, an ozone oxidation treatment, an acid alkali treatment, and a chemical modification treatment. For example, the washing treatment can be conducted by immersing the substrate 11 in an acidic solution such as a sulfuric acid/hydrogen peroxide aqueous solution, followed by washing with water and drying.

By forming a layer 12 of an undercoat agent on the surface of the substrate 11, the surface of the substrate can be modified so as to proceed subsequent steps satisfactorily. As a layer 12 of an undercoat agent, it is preferable that, by forming a layer 12 of an undercoat agent on the surface of the substrate 11, the surface of the substrate 11 can be modified so as to have affinity for all polymers constituting the block copolymer. By forming a thin layer (i.e., neutralization film) of an undercoat agent on the surface of the substrate 11 so as to have affinity for all polymers constituting the block copolymer, it becomes possible to prevent only phases of specific polymers from coming into contact with the surface of the substrate 11 by phase separation, and it becomes possible to form a cylinder structure, dot structure or gyroid structure which is freely oriented on the surface of the substrate 11 by phase separation.

As the undercoat agent, a material formed from a resin composition can be used. The resin composition used as the undercoat agent can be appropriately selected from conventional resin compositions used for forming a thin film, depending on the type of polymers constituting the block copolymer. The resin composition may be a heat-polymerizable resin composition, or a photosensitive resin composition such as a positive-tone resist composition or a negative-tone resist composition.

Alternatively, the neutralization film may be a non-polymerizable film. For example, a siloxane organic monomolecular film such as phenethyltrichlorosilane, octadecyltrichlorosilane or hexamethyldisilazane may be preferably used as a neutralization film.

The neutralization film formed from such undercoat agents can be formed by a conventional method.

Among these, preferable examples of the undercoat agent include a material which includes a resin composition containing all structural units of the polymers constituting the block copolymer, and a resin composition containing all structural units having high affinity for the polymers constituting the block copolymer.

For example, when a PS-PMMA block copolymer is used, as the undercoat agent, it is preferable to use a resin composition containing both PS and PMMA as the structural units, or a compound or a composition containing both a portion having a high affinity for PS such as an aromatic ring and a portion having a high affinity for PMMA such as a functional group with high polarity.

Examples of the resin composition containing both PS and PMMA as the structural units include a random copolymer of PS and PMMA, and an alternating polymer of PS and PMMA (a copolymer in which the respective monomers are alternately copolymerized).

Examples of the composition containing both a portion having a high affinity for PS and a portion having a high affinity for PMMA include a resin composition obtained by polymerizing at least a monomer having an aromatic ring and a monomer having a functional group with high polarity. Examples of the monomer having an aromatic ring include a monomer having a group in which one hydrogen atom has been removed from the ring of an aromatic hydrocarbon, such as a phenyl group, a biphenyl group, a fluorenyl group, a naphthyl group, an anthryl group or a phenanthryl group, or a monomer having a hetero aryl group such as the aforementioned group in which part of the carbon atoms constituting the ring of the group has been substituted with a hetero atom such as an oxygen atom, a sulfur atom or a nitrogen atom. Examples of the monomer having a functional group with high polarity include a monomer having a trimethoxysilyl group, a trichlorosilyl group, a carboxy group, a hydroxy group, a cyano group or a hydroxyalkyl group in which part of the hydrogen atoms of the alkyl group has been substituted with fluorine atoms.

Examples of the compound containing both a portion having a high affinity for PS and a portion having a high affinity for PMMA include a compound having both an aryl group and a functional group with high polarity, such as a phenethyltrichlorosilane.

<Formation of Resist Pattern (Graphoepitaxy)>

In the present invention, as shown in FIG. 1, after a step in which the undercoat agent is applied to a substrate 11 to form a layer 12 containing the undercoat agent (neutralization treatment), a resist pattern 14 is formed on the surface of the layer 12 (neutralization film) containing the undercoat agent. As a result, it becomes possible to control the arrangement of the phase separation structure, depending on the shape and surface properties of the resist pattern 14, after formation of a layer 13 containing a block copolymer. Such a resist pattern 14 acts as a guide pattern.

Further, the resist composition of the first aspect of the present invention, which is used in the method of forming a pattern of a layer containing a block copolymer, is a solvent developing negative-tone resist composition. Therefore, pattern portions 14 become exposed portions during formation of a resist pattern. In the pattern portions 14, polar groups are generated upon exposure during formation of a resist pattern 14 as described later. By virtue of the polar group exhibiting high affinity for PMMA (13a) constituting the block copolymer, a phase separation structure having a lamellar structure arranged in the perpendicular direction of the surface of the substrate 11 can be more reliably formed.

The formation of a resist pattern 14 can be performed by the method containing: using a solvent developing negative-tone resist composition of the first aspect to form a resist film on a layer 12 of an undercoat agent; conducting exposure of the resist film; and developing the resist film using a developing solution containing the organic solvent to form a resist pattern.

The method of forming a resist pattern 14 is the same as the above-mentioned method of forming a resist pattern according to the second aspect.

<Formation of Phase Separation Structure of the Layer Containing the Block Copolymer>

Firstly, a layer 13 containing the block copolymer is formed on the surface of the substrate. More specifically, the block copolymer dissolved in a suitable organic solvent is applied to the surface of the substrate 11 having the layer 12 of the undercoat agent formed thereon using a spinner or the like.

As the organic solvent for dissolving the block copolymer, any organic solvent which is capable of dissolving the block copolymer to be used and forming a uniform solution can be used, and an organic solvent having high compatibility with all of the polymers constituting the block copolymer can be used. As the organic solvent, one type of solvent can be used, or two or more types may be used in combination.

Examples of the organic solvent for dissolving the block copolymer include lactones such as γ-butyrolactone;

ketones such as acetone, methyl ethyl ketone, cyclohexanone, methyl-n-pentyl ketone, methyl isopentyl ketone, and 2-heptanone;

polyhydric alcohols, such as ethylene glycol, diethylene glycol, propylene glycol and dipropylene glycol;

compounds having an ester bond, such as ethylene glycol monoacetate, diethylene glycol monoacetate, propylene glycol monoacetate, and dipropylene glycol monoacetate; polyhydric alcohol derivatives including compounds having an ether bond, such as a monoalkylether (e.g., monomethylether, monoethylether, monopropylether or monobutylether) or monophenylether of any of these polyhydric alcohols or compounds having an ester bond (among these, propylene glycol monomethyl ether acetate (PGMEA) and propylene glycol monomethyl ether (PGME) are preferable);

cyclic ethers such as dioxane; esters such as methyl lactate, ethyl lactate (EL), methyl acetate, ethyl acetate, butyl acetate, methyl pyruvate, ethyl pyruvate, methyl methoxypropionate, and ethyl ethoxypropionate;

and aromatic organic solvents such as anisole, ethylbenzylether, cresylmethylether, diphenyl ether, dibenzylether, phenetole, butylphenylether, ethylbenzene, diethylbenzene, pentylbenzene, isopropylbenzene, toluene, xylene, cymene and mesitylene.

For example, when a PS-PMMA block copolymer is used as the block copolymer, it is preferable to dissolve the block copolymer in an aromatic organic solvent such as toluene.

The thickness of the layer 13 containing the block copolymer which is formed on the surface of the substrate depends on the molecular weight of the block copolymer (i.e., period of the polymer), and in general, the block copolymer is applied within the range of 0.5 to 4.0 times the period of the polymer.

In the present invention, the lower limit of the thickness of the layer 13 containing the block copolymer is not particularly limited, as long as it is sufficient for causing phase separation. In consideration of the strength of the nanostructure and the uniformity of the substrate having the nanostructure formed thereon, the thickness of the layer is preferably 3 nm or more, and more preferably 5 nm or more.

The substrate having the layer 13 containing the block copolymer formed thereon in the above-described manner is subjected to a heat treatment, and a phase separation structure in which at least a part of the surface of the substrate is exposed is formed by a selective removal of the block copolymer in a later step. The heat treatment is preferably conducted at a temperature at least as high as the glass transition temperature of the block copolymer used and lower than the heat decomposition temperature. Further, the heat treatment is preferably conducted in a low reactive gas such as nitrogen.

<Selective Removal of Phase of Polymer $P_B$ in Phase Separation Structure>

Subsequently, after the formation of the phase separation structure, the phase of polymer $P_B$ exposed (13a in FIG. 1) is selectively removed from the layer 13 containing the block copolymer formed on the substrate. As a result, only the phase of the polymer $P_A$ (13b in FIG. 1) remains on the exposed surface of the substrate. Further, the phase of the polymer $P_B$ which was continuously formed from the surface of the substrate to the surface of the layer containing the block copolymer is removed, so that the surface of the substrate is exposed.

The selective removal treatment is not particularly limited, as long as it is a treatment capable of decomposing and removing the polymer $P_B$ without affecting the polymer $P_A$. The selective removal treatment can be appropriately selected from any methods for removing a resin film, depending on the types of the polymer $P_A$ and the polymer $P_B$. Further, when a neutralization film is formed on the surface of the substrate in advance, the neutralization film is removed together with the phase of the polymer $P_B$. Furthermore, when a guide pattern is formed on the surface of the substrate in advance, it is preferable that the guide pattern is not removed, like the polymer $P_A$. Examples of the removal treatment include an oxygen plasma treatment, an ozone treatment, a UV irradiation treatment, a heat decomposition treatment and a chemical decomposition treatment.

In the pattern formation method for a layer containing a block copolymer according to the third aspect of the present invention, by using phase separation of a block copolymer, a substrate provided with a nanostructure on the surface thereof can be produced, wherein the nanostructure is designed more freely with respect to the positioning and the orientation. The reason why these effects can be achieved has not been elucidated yet, but the following is presumed.

In the method of forming a pattern of a layer containing a block copolymer of the third aspect of the invention, a solvent developing negative-tone resist composition for forming a guide pattern contains a structural unit (a2). The structural unit (a2) has a cyclic group capable of ring-opening polymerization, and therefore, a guide pattern to be obtained exhibits excellent heat resistance and solvent resistance. It is presumed that, by using such a guide pattern, dissolution of the guide pattern which occurs during formation of a layer containing a block copolymer on the guide pattern due to an organic solvent in which a block copolymer is dissolved can be prevented, and heat flow which occurs during an annealing treatment at a high temperature to perform a phase separation of the block copolymer can be prevented, and therefore, the above effects can be achieved.

EXAMPLES

As follows is a description of examples of the present invention, although the scope of the present invention is in no way limited by these examples.

[Production of Polymeric Compounds 1 to 66]

Polymeric compounds 1 to 66 were produced by a conventional method using the following monomers (1) to (30) which derive the structural units constituting each polymeric compound with a molar ratio indicated in Tables 1 to 6. The molecular weight (Mw(k)) and the molecular weight distribution (Mw/Mn) of the obtained polymeric compounds are shown in Tables 1 to 6.

[Chemical Formula 84]

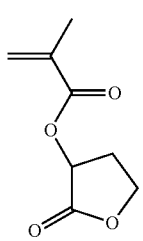
(1)

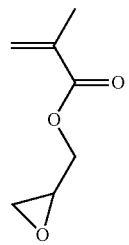
(3)

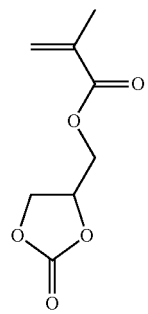
(4)

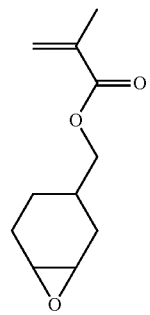
(5)

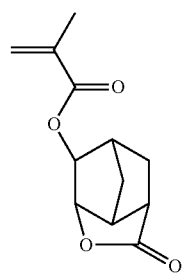
(6)

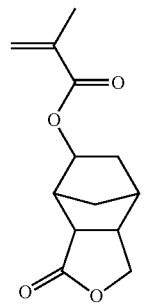
(7)

-continued
(8)
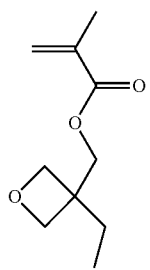
(9)
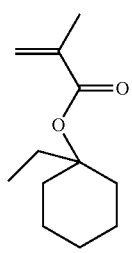
(10)
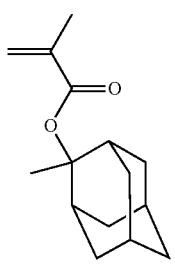
(11)
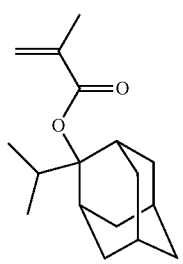
(12)
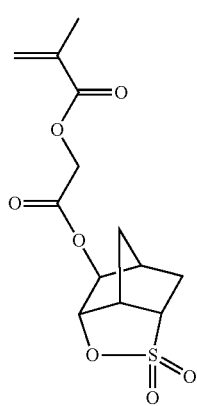
-continued
(13)
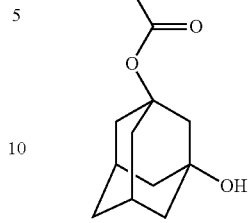
(14)
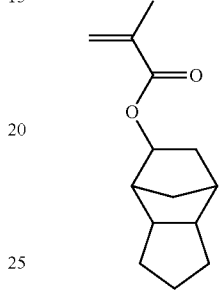
(15)
[Chemical Formula 85]
(16)
(17)
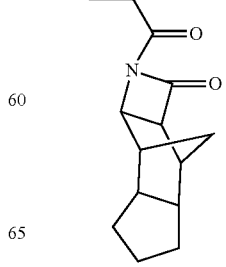

(18) 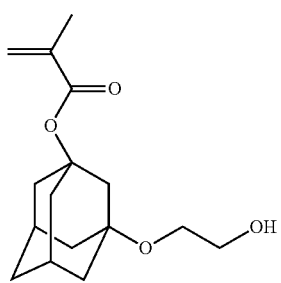
(19) 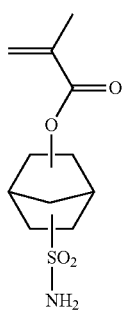
(20) 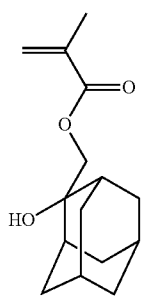
(21) 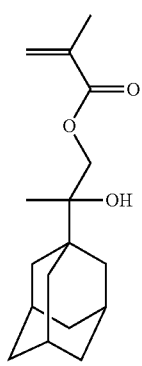
(22) 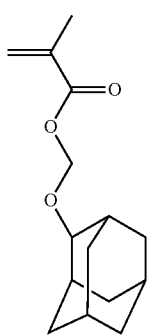
(23) 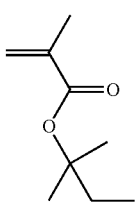
(24) 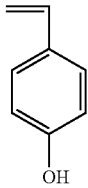
(25) 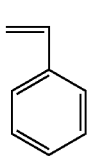
(26) 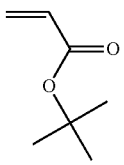
(27) 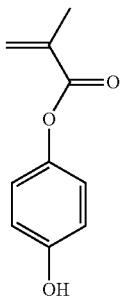
(28) 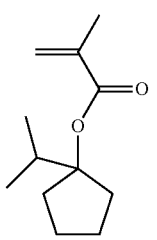
(29) 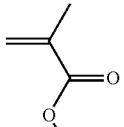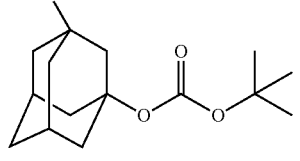

-continued
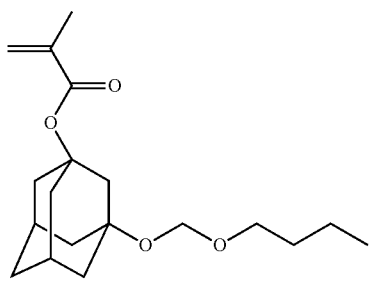
(30)
5
10
TABLE 1
| | | POLYMERIC COMPOUND | | | | | | | | | | | |
|---|---|---|---|---|---|---|---|---|---|---|---|---|---|
| | | 1 | 2 | 4 | 5 | 6 | 7 | 8 | 9 | 10 | 11 | 12 | 13 |
| MONOMER | (1) | 20 | | 20 | | | 20 | | | | | | |
| | (3) | | 30 | 20 | | 20 | | | 80 | | | | |
| | (4) | | | | 20 | | | | | | | | |
| | (5) | 20 | | | 30 | | | 50 | | | | 50 | |
| | (6) | | | | | | | | | | | | |
| | (7) | | | | | 30 | | | | | | | |
| | (8) | | | | | | 20 | | | | | | |
| | (9) | 50 | | 40 | 50 | | | | | | 50 | | |
| | (10) | | 50 | | | 40 | 40 | 50 | | 100 | | | |
| | (11) | | | | | | | | | | | | |
| | (12) | | 10 | | | | 10 | | 10 | | 30 | 30 | |
| | (13) | 10 | | 20 | | | 10 | | 10 | | 20 | 10 | 100 |
| | (14) | | 10 | | | 10 | | | | | | 10 | |
| Mw (k) | | 10 | 10 | 10 | 10 | 10 | 10 | 10 | 10 | 10 | 10 | 10 | 10 |
| Mw/Mn | | 1.75 | 1.80 | 1.78 | 1.80 | 1.80 | 1.75 | 1.80 | 1.78 | 1.82 | 1.75 | 1.78 | 1.80 |
TABLE 2
| | | POLYMERIC COMPOUND | | | | | | | | |
|---|---|---|---|---|---|---|---|---|---|---|
| | | 14 | 15 | 16 | 17 | 18 | 19 | 20 | 21 | 22 |
| MONOMER | (1) | 20 | 20 | 20 | 20 | 20 | 20 | 20 | 20 | 20 |
| | (3) | | | | | | | | | |
| | (4) | | | | | | | | | |
| | (5) | 20 | 20 | 20 | 20 | 20 | 20 | 20 | 20 | 20 |
| | (6) | | | | | | | | | |
| | (7) | | | | | | | | | |
| | (8) | | | | | | | | | |
| | (9) | | | | | 20 | | | 20 | |
| | (10) | 40 | 40 | 40 | 40 | 20 | 20 | 40 | 20 | 40 |
| | (11) | | | | | | 20 | | | |
| | (12) | | | | | | | | | 10 |
| | (13) | | | | | | | | | |
| | (14) | | | | | | | | 10 | |
| | (15) | 20 | | | | | | | | |
| | (16) | | 20 | | | | | | | |
| | (17) | | | 20 | | | | | | |
| | (18) | | | | 20 | | | | | |
| | (19) | | | | | 20 | | | 10 | 10 |
| | (20) | | | | | | 20 | | | |
| | (21) | | | | | | | 20 | | |
| Mw (k) | | 10 | 10 | 10 | 10 | 10 | 10 | 10 | 10 | 10 |
| Mw/Mn | | 1.78 | 1.80 | 1.78 | 1.80 | 1.80 | 1.82 | 1.80 | 1.80 | 1.82 |
TABLE 3
| | | POLYMERIC COMPOUND | | | | | | | | | | | |
|---|---|---|---|---|---|---|---|---|---|---|---|---|---|
| | | 23 | 24 | 26 | 27 | 28 | 29 | 30 | 31 | 32 | 33 | 34 | 35 |
| MONOMER | (1) | 20 | | 20 | | | 20 | | 20 | 20 | 20 | | |
| | (3) | | 30 | 20 | | | | | | | | 15 | 15 |

TABLE 3-continued

| | | 23 | 24 | 26 | 27 | 28 | 29 | 30 | 31 | 32 | 33 | 34 | 35 |
|---|---|---|---|---|---|---|---|---|---|---|---|---|---|
| | (4) | | | | 20 | | | | | | | | |
| | (5) | 20 | | | 20 | 10 | | 50 | | | | | |
| | (6) | | | | | | | | | | | | |
| | (7) | | | | 10 | | | | | | | | |
| | (8) | | | | | | 20 | | 20 | 20 | 20 | 25 | 25 |
| | (9) | 40 | | 40 | 50 | | | | | | | | |
| | (10) | | 50 | | | 50 | 40 | 50 | 40 | 40 | 40 | 40 | 40 |
| | (11) | | | | | | | | | | | | |
| | (12) | | 10 | | | | 10 | | | | | | |
| | (13) | | | | | 20 | | | 10 | 10 | 10 | | |
| | (14) | | | | | 20 | | | 10 | 10 | 10 | | |
| | (15) | | | 20 | | | 10 | | | | | | |
| | (16) | | | | | | | | | | | | |
| | (17) | | | | | | | | | | | | |
| | (18) | | | | | | | | | | | | |
| | (19) | | | | | | | | | | | | |
| | (20) | 20 | | | | | | | | | | 20 | |
| | (21) | | 10 | | | | | | | | | | 20 |
| | (22) | | | | | | | | | | | | |
| | (23) | | | | | | | | | | | | |
| Mw(k) | | 10 | 10 | 10 | 10 | 10 | 10 | 10 | 6.2 | 14.5 | 20 | 6.2 | 6.2 |
| Mw/Mn | | 1.78 | 1.80 | 1.67 | 1.78 | 1.78 | 1.83 | 1.72 | 1.68 | 1.75 | 1.80 | 1.77 | 1.75 |

TABLE 4

| | | 36 | 37 | 38 | 39 | 40 | 41 | 42 | 43 | 44 | 45 | 46 | 47 |
|---|---|---|---|---|---|---|---|---|---|---|---|---|---|
| MONOMER | (1) | 20 | | | | | 20 | 20 | 20 | 20 | | | |
| | (3) | | | 20 | 15 | | | | | | | | |
| | (4) | | | | | | | | | | | | |
| | (5) | | 20 | 20 | | | 20 | 20 | 20 | 20 | | | |
| | (6) | | | | | | | | | | | | |
| | (7) | | | | | | | | | | | | |
| | (8) | 20 | 20 | | | 10 | 20 | | | | | | |
| | (9) | 30 | | 20 | 40 | 40 | | 40 | | | 50 | | |
| | (10) | | | | | | 40 | | | | | 50 | 50 |
| | (11) | | | | | | | | | | | | |
| | (12) | | | | | 30 | | | | | 10 | | 10 |
| | (13) | | | | | | | | | | 20 | | |
| | (14) | 10 | 15 | | 15 | | | 20 | 20 | 20 | 20 | 25 | 20 |
| | (15) | 20 | | | | | | | | | | 25 | |
| | (16) | | 20 | | | | | | | | | | |
| | (17) | | | 20 | | | | | | | | | |
| | (18) | | | | 20 | | | | | | | | |
| | (19) | | | | | 20 | | | | | | | |
| | (20) | | | | | | | | | | | | |
| | (21) | | | | 10 | | | | | | | | 20 |
| | (22) | | | | | | | | 40 | | | | |
| | (23) | | 25 | 20 | | | | | | 40 | | | |
| Mw(k) | | 15 | 15 | 10 | 10 | 10 | 4 | 4 | 8.5 | 8.5 | 10 | 10 | 10 |
| Mw/Mn | | 1.77 | 1.82 | 1.82 | 1.80 | 1.85 | 1.76 | 1.80 | 1.77 | 1.82 | 1.84 | 1.82 | 1.80 |

TABLE 5

| | | 48 | 49 | 50 | 51 | 52 | 53 | 54 | 55 |
|---|---|---|---|---|---|---|---|---|---|
| MONO-MER | (1) | 30 | 20 | | | 30 | | | |
| | (3) | 30 | 20 | | | | | | |
| | (4) | | | | | | | | |
| | (5) | | | 30 | | | | | |
| | (6) | | | | | | | | |
| | (7) | | | | | | | | |
| | (8) | | | | | 20 | | | |
| | (9) | 30 | 40 | | | 40 | 40 | | |
| | (10) | | | 50 | | | | | |
| | (11) | | | | | | | | |
| | (12) | | | | | | | | |
| | (13) | | | | | | | | |
| | (14) | | | | | | | | |
| | (15) | 10 | | | | | | | |
| | (16) | | | | | | | | |
| | (17) | | | | | | | | |
| | (18) | | | | | | | | |
| | (19) | | | | | | | | |

TABLE 5-continued

| | POLYMERIC COMPOUND | | | | | | | |
|---|---|---|---|---|---|---|---|---|
| | | 48 | 49 | 50 | 51 | 52 | 53 | 54 | 55 |
| (20) | | | | | | | | | |
| (21) | | | | | | | | | |
| (22) | | | | | | | | | |
| (23) | | | | | | | | | |
| (24) | | 20 | | 20 | | 70 | 85 | 85 |
| (25) | | | | | 20 | 15 | 15 | 15 |
| (26) | | | 20 | | | | 15 | | |
| (27) | | | | | 30 | | | | |
| Mw(k) | | 10 | 6.5 | 10 | 20 | 15 | 5 | 2.5 | 6.5 |
| Mw/Mn | | 1.74 | 1.76 | 1.84 | 1.75 | 1.75 | 1.84 | 1.80 | 1.76 |

TABLE 6

| | | POLYMERIC COMPOUND | | | | | | | | | | |
|---|---|---|---|---|---|---|---|---|---|---|---|
| | | 56 | 57 | 58 | 59 | 60 | 61 | 62 | 63 | 64 | 65 | 66 |
| MONOMER | (1) | 20 | | | | | | | | | | |
| | (3) | 20 | 20 | 20 | 20 | 20 | 20 | 20 | 20 | 20 | | |
| | (5) | | | | | | | | | | 20 | |
| | (8) | | | | | | | | | | | 20 |
| | (11) | 30 | 30 | 30 | | 30 | 30 | 30 | 30 | 30 | 30 | 30 |
| | (12) | | 20 | 20 | 20 | 20 | 20 | 20 | 20 | 20 | 20 | 20 |
| | (13) | 20 | 20 | 20 | 20 | | | | | | | |
| | (14) | | | | | | | | | | | |
| | (15) | | | | | 20 | | | | | | |
| | (16) | | | | | | 20 | | | | | |
| | (19) | | | | | | | 20 | | | | |
| | (20) | | | | | | | | 20 | | | |
| | (21) | | | | | | | | | 20 | | |
| | (28) | | | | 30 | | | | | | | |
| | (29) | | | 10 | 10 | | | | | | | |
| | (30) | 10 | 10 | | | 10 | 10 | 10 | 10 | 10 | 10 | 10 |
| Mw(k) | | 10 | 10 | 10 | 10 | 10 | 10 | 10 | 10 | 10 | 10 | 10 |
| Mw/Mn | | 1.75 | 1.78 | 1.72 | 1.72 | 1.75 | 1.80 | 1.75 | 1.74 | 1.82 | 1.75 | 1.72 |

Examples 1 to 19, Comparative Examples 1 to 7

The components shown in Tables 7 and 8 were mixed together and dissolved to obtain solvent developing negative-tone resist compositions.

TABLE 7

| | COMPONENT (A) | COMPONENT (B) | COMPONENT (D) | COMPONENT (E) | COMPONENT (S) | SOLVENT RESISTANCE | CRITICAL RESOLUTION (nm) | HEAT RESISTANCE | VERTICAL LAMELLAR |
|---|---|---|---|---|---|---|---|---|---|
| EXAMPLE 1 | (A)-1 [100] | (B)-1 [10] | (D)-1 [1.2] | (E)-1 [2] | (S)-1 [2500] | A | 130 | A | A |
| EXAMPLE 2 | (A)-1 [100] | (B)-2 [10] | (D)-1 [1.2] | (E)-1 [2] | (S)-1 [2500] | A | 130 | A | A |
| EXAMPLE 3 | (A)-1 [100] | (B)-4 [10] | (D)-1 [1.2] | (E)-1 [2] | (S)-1 [2500] | A | 140 | A | A |
| EXAMPLE 4 | (A)-2 [100] | (B)-3 [10] | (D)-1 [1.2] | (E)-1 [2] | (S)-1 [2500] | A | 130 | A | A |
| EXAMPLE 6 | (A)-4 [100] | (B)-1 [5] | (D)-1 [1.2] | (E)-1 [2] | (S)-1 [2500] | A | 150 | A | A |
| EXAMPLE 7 | (A)-5 [100] | (B)-1 [10] | (D)-1 [1.2] | (E)-1 [2] | (S)-1 [2500] | A | 130 | A | A |
| EXAMPLE 8 | (A)-6 [100] | (B)-1 [10] | (D)-1 [1.2] | (E)-1 [2] | (S)-1 [2500] | A | 130 | A | A |
| EXAMPLE 9 | (A)-7 [100] | (B)-1 [10] | (D)-1 [1.2] | (E)-1 [2] | (S)-1 [2500] | A | 130 | A | A |
| EXAMPLE 10 | (A)-8 [100] | (B)-1 [10] | (D)-1 [1.2] | (E)-1 [2] | (S)-1 [2500] | A | 130 | A | A |
| EXAMPLE 11 | (A)-14 [100] | (B)-1 [10] | (D)-1 [1.2] | (E)-1 [2] | (S)-1 [2500] | A | 130 | A | A |
| EXAMPLE 12 | (A)-15 [100] | (B)-1 [10] | (D)-1 [1.2] | (E)-1 [2] | (S)-1 [2500] | A | 130 | A | A |
| EXAMPLE 13 | (A)-16 [100] | (B)-2 [10] | (D)-1 [1.2] | (E)-1 [2] | (S)-1 [2500] | A | 130 | A | A |
| EXAMPLE 14 | (A)-17 [100] | (B)-2 [10] | (D)-1 [1.2] | (E)-1 [2] | (S)-1 [2500] | A | 130 | A | A |
| EXAMPLE 15 | (A)-18 [100] | (B)-1 [10] | (D)-1 [1.2] | (E)-1 [2] | (S)-1 [2500] | A | 130 | A | A |

TABLE 7-continued

| | COMPONENT (A) | COMPONENT (B) | COMPONENT (D) | COMPONENT (E) | COMPONENT (S) | SOLVENT RESISTANCE | CRITICAL RESOLUTION (nm) | HEAT RESISTANCE | VERTICAL LAMELLAR |
|---|---|---|---|---|---|---|---|---|---|
| EXAMPLE 16 | (A)-19 [100] | (B)-1 [10] | (D)-1 [1.2] | (E)-1 [2] | (S)-1 [2500] | A | 130 | A | A |
| EXAMPLE 17 | (A)-20 [100] | (B)-1 [10] | (D)-1 [1.2] | (E)-1 [2] | (S)-1 [2500] | A | 130 | A | A |
| EXAMPLE 18 | (A)-21 [100] | (B)-1 [10] | (D)-1 [1.2] | (E)-1 [2] | (S)-1 [2500] | A | 130 | A | A |
| EXAMPLE 19 | (A)-22 [100] | (B)-1 [10] | (D)-1 [1.2] | (E)-1 [2] | (S)-1 [2500] | A | 130 | A | A |

TABLE 8

| | COMPONENT (A) | COMPONENT (B) | COMPONENT (D) | COMPONENT (E) | COMPONENT (S) | SOLVENT RESISTANCE | CRITICAL RESOLUTION (nm) | HEAT RESISTANCE | VERTICAL LAMELLAR |
|---|---|---|---|---|---|---|---|---|---|
| COMPARATIVE EXAMPLE 1 | (A)-1 [100] | (B)-6 [10] | (D)-1 [1.2] | (E)-1 [2] | (S)-1 [2500] | A | 180 | A | A |
| COMPARATIVE EXAMPLE 2 | (A)-1 [100] | (B)-7 [10] | (D)-1 [1.2] | (E)-1 [2] | (S)-1 [2500] | A | 190 | A | A |
| COMPARATIVE EXAMPLE 3 | (A)-9 [100] | (B)-1 [10] | (D)-1 [1.2] | (E)-1 [2] | (S)-1 [2500] | — | — | — | — |
| COMPARATIVE EXAMPLE 4 | (A)-10 [100] | (B)-1 [10] | (D)-1 [1.2] | (E)-1 [2] | (S)-1 [2500] | — | — | — | — |
| COMPARATIVE EXAMPLE 5 | (A)-11 [100] | (B)-1 [10] | (D)-1 [1.2] | (E)-1 [2] | (S)-1 [2500] | B | 150 | B | B |
| COMPARATIVE EXAMPLE 6 | (A)-12 [100] | (B)-1 [10] | (D)-1 [1.2] | (E)-1 [2] | (S)-1 [2500] | A | 200 | A | B |
| COMPARATIVE EXAMPLE 7 | (A)-13 [100] | (B)-1 [10] | (D)-1 [1.2] | (E)-1 [2] | (S)-1 [2500] | — | — | — | — |

In Tables 7 and 8, the reference characters indicate the following. Further, the values in brackets [ ] indicate the amount (in terms of parts by weight) of the component added.

(A)-1 to (A)-22: the aforementioned polymeric compounds 1 to 22

(B)-1: compound (B)-1 shown below (B)-2: compound (B)-2 shown below (B)-3: compound (B)-3 shown below (B)-4: compound (B)-4 shown below (B)-5: compound (B)-5 shown below (B)-6: 4-(2-chloro-4-benzoylphenylthio)phenylbis(4-fluorophenyl)sulfonium hexafluoroantimonate (B)-7: triphenylsulfonium tris[(trifluoromethyl)sulfonyl]methane (D)-1: tri-n-pentylamine (E)-1: salicylic acid (S)-1: a mixed solvent of PGMEA/PGME=6/4 (weight ratio)

[Chemical Formula 86]

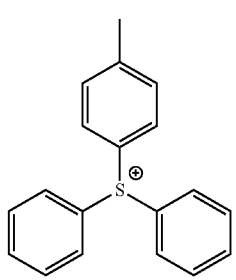
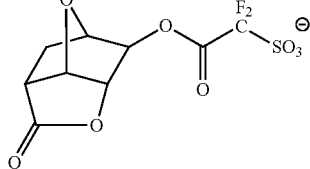

(B)-1

-continued (B)-2

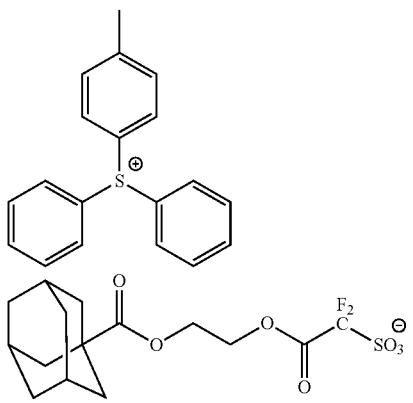

(B)-3

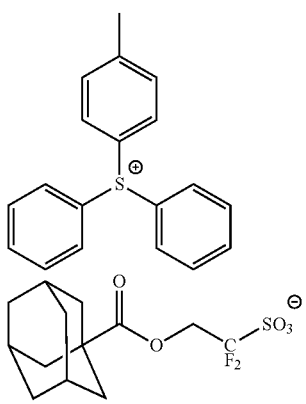

(B)-4

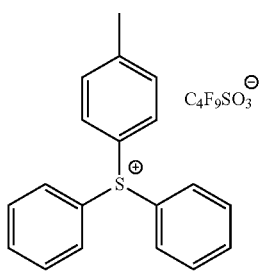

(B)-5

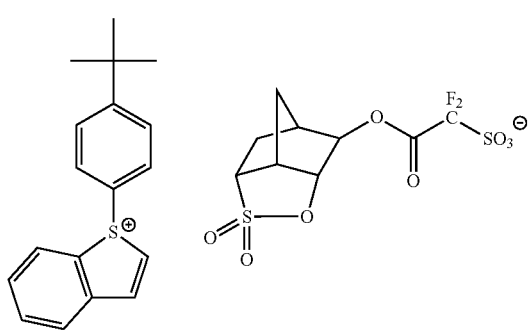

[Formation of Guide Pattern]

An organic anti-reflection film composition (product name: ARC29A, manufactured by Brewer Science Ltd.) was applied to an 8-inch silicon wafer using a spinner, and the composition was then baked on a hot plate at 205° C. for 60 seconds and dried, thereby forming an organic anti-reflection film having a film thickness of 82 nm. Next, as an undercoat agent, a resin composition (a copolymer composed of styrene/3,4-epoxycyclohexylmethyl methacrylate/trimethoxysilylpropyl methacrylate=35/60/5 and having a molecular weight of 40,000) adjusted to a concentration within the range of 0.5 to 1.0% by weight using PGMEA was applied to the organic anti-reflection film using a spinner, and the composition was then baked and dried at 250° C. for 10 minutes, thereby forming a layer composed of the undercoat agent having a thickness of 20 nm.

Then, the resist composition of each example was applied to the layer of undercoat agent using a spinner, and was then prebaked (PAB) on a hotplate at 85° C. for 60 seconds and dried, thereby forming a resist film having a film thickness of 100 nm.

Subsequently, the resist film was selectively irradiated with an ArF excimer laser through a mask pattern, using an ArF immersion exposure apparatus NSR-S302 (manufactured by Nikon Corporation, NA (numerical aperture)=0.60, ⅔ annular illumination). Next, PEB was conducted at 125° C. for 60 seconds, and paddle development treatment was performed at 23° C. for 16 seconds using butyl acetate, followed by drying by shaking.

Further, a post bake was conducted on a hot plate at 200° C. for 5 minutes.

As a result, in Examples 1 to 19, Comparative Examples 1, 2, 5 and 6, a 1:1 line and space pattern (LS pattern) having a line width of 200 nm and a pitch of 400 nm was formed on the resist film. With respect to the 1:1 LS pattern having a line width of 200 nm, the evaluations were performed as follows. In Tables 7 and 8, the case where the evaluation was not performed is indicated as "–".

[Evaluation of Solvent Resistance]

The 1:1 LS pattern having a line width of 200 nm was subjected to a paddle treatment using PGMEA solution for 60 seconds. When a dissolution of the pattern was not observed, the solvent resistance was evaluated as "A", and when a dissolution of the pattern was observed, the solvent resistance was evaluated as "B". The results are shown in Tables 7 and 8.

[Evaluation of Resolution]

The critical resolution (nm) with the Eop with which the 1:1 LS pattern having a line width of 200 nm was formed, was determined using a scanning electron microscope (product name: S-9220, manufactured by Hitachi, Ltd.). The results are indicated under "critical resolution (nm)" in Tables 7 and 8.

[Evaluation of Heat Resistance]

The 1:1 LS pattern having a line width of 200 nm was allowed to stand on a hot plate at 200° C. for 5 minutes. When a flow of the pattern was not observed, the heat resistance was evaluated as "A", and when a flow of the pattern was observed, the heat resistance was evaluated as "B". The results are shown in Tables 7 and 8.

[Evaluation of Vertical Lamellar-Forming Ability]

Using a spinner (number of revolution: 1,000 rpm, 60 seconds), 1.9% by weight PGMEA solution of PS-PMMA block polymer 1 (manufactured by Polymer Source Inc.; molecular weight of PS: 18,000; molecular weight of PMMA: 18,000; dispersity (Poly dispersity index: PDI): 1.07) was applied to the substrate having the 1:1 LS pattern having a line width of 200 nm formed thereon, and the solution was then baked and dried on a hotplate at 110° C. for 60 seconds, thereby forming a layer containing a block copolymer.

Then, the substrate having the layer containing a block copolymer formed thereon was heated at 240° C. for 1 hour while flowing nitrogen, thereby forming a phase separation structure.

Thereafter, using TCA-3822 (product name; manufactured by Tokyo Ohka Kogyo Co., Ltd.), the substrate was subjected to an oxygen plasma treatment (200 sccm, 40 Pa, 200 W, 30 seconds), thereby selectively removing the phase constituted of PMMA.

The surface of the obtained substrate was observed using a scanning electron microscope SU8000 (manufactured by Hitachi High-Technologies Corporation). When a vertical lamellar could be observed, the vertical lamellar-forming ability was evaluated as "A", and when a vertical lamellar could not be observed, the vertical lamellar-forming ability was evaluated as "B". The results are shown in Tables 7 and 8.

From the results shown above, it was confirmed that the resist compositions of Examples 1 to 19 according to the present invention exhibited excellent solvent resistance, resolution and heat resistance as compared to the resist compositions of Comparative Examples 1 to 7. Further, it was confirmed that, by using the resist compositions of Examples 1 to 19, the layer containing the block copolymer could be satisfactorily subjected to phase separation, and the resist composition was an excellent solvent developing negative-tone resist composition for forming a guide pattern.

Examples 20 to 53, Comparative Examples 8 to 10

The components shown in Tables 9 and 10 were mixed together and dissolved to obtain solvent developing negative-tone resist compositions.

TABLE 9

| | COMPONENT (A) | COMPONENT (B) | COMPONENT (D) | | COMPONENT (E) | COMPONENT (G) | COMPONENT (S) | DEVELOPING SOLUTION | RINSE LIQUID |
|---|---|---|---|---|---|---|---|---|---|
| EXAMPLE 20 | (A)-23 [100] | (B)-1 [10] | (D)-1 [1.2] | | (E)-1 [2] | | (S)-1 [2500] | (I)-1 | |
| EXAMPLE 21 | (A)-23 [100] | (B)-2 [10] | (D)-1 [1.2] | | (E)-1 [2] | | (S)-1 [2500] | (I)-1 | (II)-8 |
| EXAMPLE 22 | (A)-23 [100] | (B)-2 [10] | (D)-1 [1.2] | | (E)-1 [2] | | (S)-1 [2500] | (I)-2 | |
| EXAMPLE 23 | (A)-23 [100] | (B)-4 [10] | (D)-1 [1.2] | | (E)-1 [2] | | (S)-1 [2500] | (I)-2 | (II)-9 |
| EXAMPLE 24 | (A)-24 [100] | (B)-3 [10] | (D)-1 [1.2] | (D)-2 [3] | (E)-1 [2] | | (S)-1 [2500] | (I)-3 | |
| EXAMPLE 25 | (A)-24 [100] | (B)-3 [10] | (D)-1 [1.2] | (D)-3 [3] | (E)-1 [2] | | (S)-1 [2500] | (I)-3 | |
| EXAMPLE 28 | (A)-26 [100] | (B)-1 [10] | (D)-1 [1.2] | | (E)-1 [2] | | (S)-1 [2500] | (I)-1 | (II)-10 |
| EXAMPLE 29 | (A)-26 [100] | (B)-2 [10] | (D)-1 [1.2] | | (E)-1 [2] | (G)-1 [15] | (S)-1 [2500] | (I)-1 | |
| EXAMPLE 30 | (A)-26 [100] | (B)-2 [10] | | | | (G)-2 [15] | (S)-1 [2500] | (I)-1 | |
| EXAMPLE 31 | (A)-26 [100] | (B)-2 [10] | | | | (G)-3 [15] | (S)-1 [2500] | (I)-1 | |
| EXAMPLE 32 | (A)-27 [100] | (B)-1 [10] | (D)-1 [1.2] | (D)-4 [3] | (E)-1 [2] | | (S)-1 [2500] | (I)-1 | |
| EXAMPLE 33 | (A)-27 [100] | (B)-1 [10] | (D)-1 [1.2] | (D)-4 [3] | (E)-1 [2] | | (S)-1 [2500] | (I)-5 | |
| EXAMPLE 34 | (A)-27 [100] | (B)-1 [10] | (D)-1 [1.2] | (D)-4 [3] | (E)-1 [2] | | (S)-1 [2500] | (I)-5 | |
| EXAMPLE 35 | (A)-28 [100] | (B)-1 [10] | (D)-1 [1.2] | | (E)-1 [2] | | (S)-1 [2500] | (I)-6 | |
| EXAMPLE 36 | (A)-29 [100] | (B)-1 [10] | (D)-1 [1.2] | | (E)-1 [2] | | (S)-1 [2500] | (I)-7 | (II)-11 |
| EXAMPLE 37 | (A)-30 [100] | (B)-1 [10] | (D)-1 [1.2] | | (E)-1 [2] | | (S)-1 [2500] | (I)-1 | |
| EXAMPLE 38 | (A)-31 [100] | (B)-1 [10] | (D)-1 [1.2] | | (E)-1 [2] | | (S)-1 [2500] | (I)-1 | |

TABLE 10

| | COMPONENT (A) | COMPONENT (B) | | COMPONENT (D) | | COMPONENT (E) | COMPONENT (S) | DEVELOPING SOLUTION | RINSE LIQUID |
|---|---|---|---|---|---|---|---|---|---|
| EXAMPLE 39 | (A)-32 [100] | (B)-1 [10] | | (D)-1 [1.2] | | (E)-1 [2] | (S)-1 [2500] | (I)-1 | |
| EXAMPLE 40 | (A)-33 [100] | (B)-1 [10] | | (D)-1 [1.2] | | (E)-1 [2] | (S)-1 [2500] | (I)-1 | (II)-8 |
| EXAMPLE 41 | (A)-34 [100] | (B)-1 [5] | (B)-2 [5] | (D)-1 [1.2] | | (E)-1 [2] | (S)-1 [2500] | (I)-1 | |
| EXAMPLE 42 | (A)-35 [100] | (B)-2 [10] | | (D)-1 [1.2] | (D)-4 [3] | (E)-1 [2] | (S)-1 [2500] | (I)-1 | (II)-9 |
| EXAMPLE 43 | (A)-35 [100] | (B)-1 [10] | | (D)-1 [1.2] | | (E)-1 [2] | (S)-1 [2500] | (I)-1 | (II)-10 |
| EXAMPLE 44 | (A)-36 [100] | (B)-3 [10] | | (D)-1 [1.2] | | (E)-1 [2] | (S)-1 [2500] | (I)-1 | |
| EXAMPLE 45 | (A)-37 [100] | (B)-3 [10] | | (D)-1 [1.2] | | (E)-1 [2] | (S)-1 [2500] | (I)-1 | |
| EXAMPLE 46 | (A)-37 [100] | (B)-2 [10] | | (D)-1 [1.2] | (D)-3 [3] | (E)-1 [2] | (S)-1 [2500] | (I)-1 | |
| EXAMPLE 47 | (A)-38 [100] | (B)-1 [10] | | (D)-1 [1.2] | | (E)-1 [2] | (S)-1 [2500] | (I)-1 | |

TABLE 10-continued

| | COMPONENT (A) | COMPO-NENT (B) | COMPO-NENT (D) | | COMPONENT (E) | COMPONENT (S) | DEVELOPING SOLUTION | RINSE LIQUID |
|---|---|---|---|---|---|---|---|---|
| EXAMPLE 48 | (A)-39 [100] | (B)-1 [10] | (D)-1 [1.2] | | (E)-1 [2] | (S)-1 [2500] | (I)-1 | |
| EXAMPLE 49 | (A)-40 [100] | (B)-2 [10] | (D)-1 [1.2] | | (E)-1 [2] | (S)-1 [2500] | (I)-1 | |
| EXAMPLE 50 | (A)-41 [100] | (B)-1 [10] | (D)-1 [1.2] | | (E)-1 [2] | (S)-1 [2500] | (I)-1 | |
| EXAMPLE 51 | (A)-42 [100] | (B)-1 [10] | (D)-1 [1.2] | | (E)-1 [2] | (S)-1 [2500] | (I)-1 | |
| EXAMPLE 52 | (A)-43 [100] | (B)-1 [10] | (D)-1 [1.2] | (D)-3 [3] | (E)-1 [2] | (S)-1 [2500] | (I)-1 | |
| EXAMPLE 53 | (A)-44 [100] | (B)-1 [10] | (D)-1 [1.2] | (D)-3 [3] | (E)-1 [2] | (S)-1 [2500] | (I)-1 | |
| COMPARATIVE EXAMPLE 8 | (A)-45 [100] | (B)-1 [10] | (D)-1 [1.2] | | (E)-1 [2] | (S)-1 [2500] | (I)-1 | |
| COMPARATIVE EXAMPLE 9 | (A)-46 [100] | (B)-1 [10] | (D)-1 [1.2] | | (E)-1 [2] | (S)-1 [2500] | (I)-1 | |
| COMPARATIVE EXAMPLE 10 | (A)-47 [100] | (B)-1 [10] | (D)-1 [1.2] | | (E)-1 [2] | (S)-1 [2500] | (I)-1 | |

In Tables 9 and 10, (B)-1 to 5, (D)-1, (E)-1 and (S)-1 are the same as defined above, and the other reference characters indicate the following. Further, the values in brackets [ ] indicate the amount (in terms of parts by weight) of the component added.

(A)-23 to (A)-47: the aforementioned polymeric compounds 23 to 47

(D)-2: compound (D)-2 shown below (D)-3: compound (D)-3 shown below (D)-4: compound (D)-4 shown below (G)-1: compound (G)-1 shown below (G)-2: compound (G)-2 shown below (in the formula, n10=1 to 3)

(G)-3: compound (G)-3 shown below (I)-1: butyl acetate (I)-2: PGMEA (I)-3: PGME (I)-4: ethyl lactate (I)-5: 2-heptanone (I)-6: cyclohexanone (I)-7: methyl isobutyl ketone (II)-8: isopropyl alcohol (II)-9: 1-hexanol (II)-10: decane (II)-11: dodecane

[Chemical Formula 87]

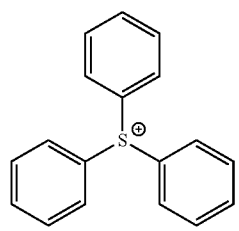

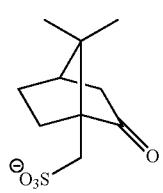

(D)-2

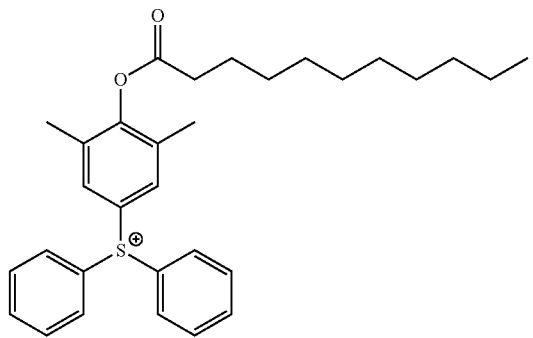

(D)-3

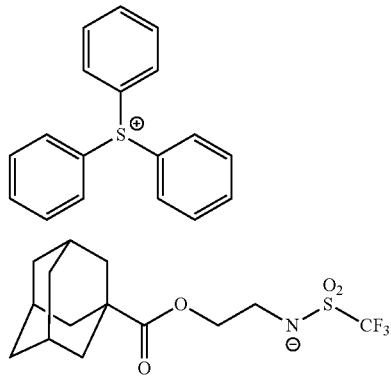

(D)-4

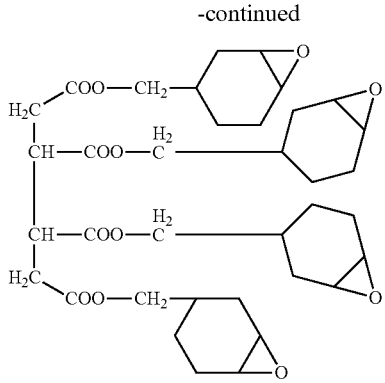

(G)-1

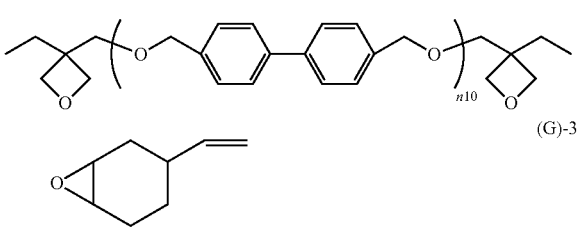

(G)-2

(G)-3

[Formation of Resist Pattern 1]

An organic anti-reflection film composition (product name: ARC29A, manufactured by Brewer Science Ltd.) was applied to an 8-inch silicon wafer using a spinner, and the composition was then baked on a hot plate at 205° C. for 60 seconds and dried, thereby forming an organic anti-reflection film having a film thickness of 82 nm.

Then, the resist composition of each example was applied to the organic anti-reflection film using a spinner, and was then prebaked (PAS) on a hotplate at 85° C. for 60 seconds and dried, thereby forming a resist film having a film thickness of 100 nm.

Subsequently, the resist film was selectively irradiated with an ArF excimer laser through a mask pattern, using an ArF immersion exposure apparatus NSR-S308F (manufactured by Nikon Corporation, NA (numerical aperture)=0.92, Crosspole (in/out=0.76/0.95) with Polano). Thereafter, a post exposure bake (PEB) treatment was conducted at 125° C. for 60 seconds, followed by paddle development treatment for 13 seconds at 23° C. using a developing solution indicated in Tables 9 and 10. Then, in Examples 21, 23, 28, 36, 40, 42 and 43, the resist film was rinsed with a rinse liquid indicated in Tables 9 and 10 for 20 seconds, followed by drying by shaking.

Further, a post bake was conducted on a hot plate at 100° C. for 40 seconds.

As a result, in each of the examples, a 1:1 space and line (SL) pattern having a space width of 65 nm and a pitch of 130 nm was formed on the resist film.

[Evaluation of Residual Film Ratio]

With respect to pattern portions of the 1:1 SL pattern having a space width of 65 nm and a pitch of 130 nm formed in the manner as described above, the residual film ratio following developing (unit: %, resist film thickness following developing/resist film thickness upon film formation (prior to exposure)×100) was evaluated. The results are shown in Table 11.

[Evaluation of Pattern Collapse Resistance (Collapse Margin)]

With respect to each of the SL patterns having a space width of 65 nm and a pitch of 130 nm formed with the above Eop, with which the 1:1 SL pattern having a space width of 65 nm could be formed, the resistance of the LS pattern to pattern collapse in the case of varying the exposure dose to a higher exposure dose than the Eop of each pattern, was observed using a scanning electron microscope (product name: SU-8000, manufactured by Hitachi High-Technologies Corporation), and the collapse resistance of the LS pattern was evaluated with the following criteria. The results are shown in Table 11.

A: Pattern collapse was not observed.
B: Pattern collapse was slightly observed.
C: Pattern collapse was observed.

[Evaluation of Line Width Roughness (LWR)]

With respect to each of the SL patterns having a space width of 65 nm and a pitch of 130 nm formed with the above optimum exposure dose Eop, with which the 1:1 SL pattern having a space width of 65 nm could be formed, the space width at 400 points in the lengthwise direction of the space were measured using a measuring scanning electron microscope (SEM) (product name: S-9380, manufactured by Hitachi High-Technologies Corporation; acceleration voltage: 300V). From the results, the value of 3 times the standard deviation s (i.e., 3s) was determined, and the average of the 3s values at 400 points was calculated as a yardstick of LWR. The results are shown in Table 11.

The smaller this 3s value is, the lower the level of roughness of the line width, indicating that a SL pattern with a uniform width was obtained.

TABLE 11

| | RESIDUAL FILM RATIO (%) | COLLAPSE MARGIN | LWR |
|---|---|---|---|
| EXAMPLE 20 | 86.7 | A | 5.72 |
| EXAMPLE 21 | 85.7 | A | 5.86 |
| EXAMPLE 22 | 85.7 | A | 6.02 |
| EXAMPLE 23 | 83.5 | A | 5.96 |
| EXAMPLE 24 | 84.8 | A | 6.05 |
| EXAMPLE 25 | 84.8 | A | 5.78 |
| EXAMPLE 28 | 84.6 | A | 6.20 |
| EXAMPLE 29 | 87.5 | A | 6.25 |
| EXAMPLE 30 | 87.8 | A | 6.22 |
| EXAMPLE 31 | 87.8 | A | 6.31 |
| EXAMPLE 32 | 85.1 | A | 5.96 |
| EXAMPLE 33 | 85.1 | A | 5.96 |
| EXAMPLE 34 | 85.1 | A | 5.96 |
| EXAMPLE 35 | 85.6 | A | 6.03 |
| EXAMPLE 36 | 84.2 | A | 5.88 |
| EXAMPLE 37 | 84.5 | A | 5.75 |
| EXAMPLE 38 | 85.6 | A | 6.02 |
| EXAMPLE 39 | 84.0 | A | 5.88 |
| EXAMPLE 40 | 85.8 | A | 5.92 |
| EXAMPLE 41 | 86.6 | A | 5.91 |
| EXAMPLE 42 | 84.7 | A | 6.10 |
| EXAMPLE 43 | 86.1 | A | 5.78 |
| EXAMPLE 44 | 84.2 | A | 6.02 |
| EXAMPLE 45 | 85.5 | A | 5.78 |
| EXAMPLE 46 | 86.1 | A | 5.89 |
| EXAMPLE 47 | 84.6 | A | 5.98 |
| EXAMPLE 48 | 86.7 | A | 5.77 |
| EXAMPLE 49 | 85.1 | A | 5.86 |
| EXAMPLE 50 | 82.4 | A | 6.35 |
| EXAMPLE 51 | 83.6 | A | 6.39 |
| EXAMPLE 52 | 85.4 | A | 5.71 |
| EXAMPLE 53 | 87.5 | A | 5.53 |
| COMPARATIVE EXAMPLE 8 | 76.2 | C | 7.65 |
| COMPARATIVE EXAMPLE 9 | 75.0 | C | 8.08 |
| COMPARATIVE EXAMPLE 10 | 75.5 | C | 7.26 |

From the results shown above, it was confirmed that the resist compositions of Examples 20 to 53 according to the present invention exhibited excellent residual film ratio, collapse margin, LWR and heat resistance as compared to the resist compositions of Comparative Examples 8 to 10.

Examples 54 to 71, Comparative Examples 11 to 14

The components shown in Table 12 were mixed together and dissolved to obtain solvent developing negative-tone resist compositions.

(E)-2: malonic acid (G)-4: compound (G)-4 shown below (G)-5: compound (G)-5 shown below (H)-1: benzophenone (J)-1: compound (J)-1 shown below (J)-2: polyester-modified dimethylsiloxane, "BYK-310" (product name, manufactured by BYK-Chemie, Inc.)

TABLE 12

| | COMPONENT (A) | COMPONENT (B) | COMPONENT (D) | COMPONENT (E) | COMPONENT (G) | COMPONENT (H) | COMPONENT (J) | COMPONENT (S) | DEVELOPING SOLUTION | RINSE LIQUID |
|---|---|---|---|---|---|---|---|---|---|---|
| EXAMPLE 54 | (A)-24 [100] | (B)-1 [3] | (D)-5 [0.33] | (E)-1 [0.26] | | | (J)-1 [0.05] | (S)-1 [1800] | (I)-1 | |
| EXAMPLE 55 | (A)-24 [100] | (B)-1 [3] | (D)-5 [0.33] | (E)-1 [0.26] | (G)-1 [15] | | (J)-1 [0.05] | (S)-1 [1800] | (I)-1 | |
| EXAMPLE 56 | (A)-24 [100] | (B)-1 [3] | (D)-5 [0.33] | (E)-1 [0.26] | (G)-2 [15] | | (J)-1 [0.05] | (S)-1 [1800] | (I)-1 | |
| EXAMPLE 57 | (A)-24 [100] | (B)-8 [2] | (D)-1 [0.35] | (E)-1 [0.26] | | (H)-1 [2] | (J)-1 [0.05] | (S)-1 [1800] | (I)-2 | |
| EXAMPLE 58 | (A)-24 [100] | (B)-1 [3] | (D)-5 [0.33] | (E)-1 [0.26] | | (H)-1 [3] | (J)-1 [0.05] | (S)-1 [1800] | (I)-5 | |
| EXAMPLE 59 | (A)-26 [100] | (B)-1 [3] | (D)-5 [0.33] | (E)-1 [0.26] | | | (J)-1 [0.05] | (S)-1 [1800] | (I)-1 | |
| EXAMPLE 60 | (A)-27 [100] | (B)-1 [3] | (D)-5 [0.33] | (E)-2 [0.22] | | | (J)-1 [0.05] | (S)-1 [1800] | (I)-1 | |
| EXAMPLE 61 | (A)-27 [100] | (B)-1 [3] | (D)-5 [0.33] | (E)-1 [0.26] | | | (J)-2 [0.1] | (S)-1 [1800] | (I)-1 | (II)-8 |
| EXAMPLE 62 | (A)-36 [100] | (B)-1 [3] | (D)-5 [0.33] | (E)-1 [0.26] | | | (J)-1 [0.05] | (S)-1 [1800] | (I)-1 | |
| EXAMPLE 63 | (A)-36 [100] | (B)-1 [3] | (D)-5 [0.33] | (E)-1 [0.26] | | | (J)-2 [0.1] | (S)-1 [1800] | (I)-2 | |
| EXAMPLE 64 | (A)-48 [100] | (B)-1 [3] | (D)-5 [0.33] | (E)-1 [0.26] | | | (J)-1 [0.05] | (S)-1 [1800] | (I)-1 | |
| EXAMPLE 65 | (A)-49 [100] | (B)-1 [3] | (D)-5 [0.33] | (E)-1 [0.26] | (G)-1 [15] | | (J)-1 [0.05] | (S)-1 [1800] | (I)-1 | |
| EXAMPLE 66 | (A)-49 [100] | (B)-1 [3] | (D)-1 [0.35] | (E)-1 [0.26] | (G)-4 [15] | | (J)-1 [0.05] | (S)-1 [1800] | (I)-1 | |
| EXAMPLE 67 | (A)-49 [100] | (B)-1 [3] | (D)-5 [0.33] | (E)-1 [0.26] | (G)-5 [15] | | (J)-1 [0.05] | (S)-1 [1800] | (I)-1 | |
| EXAMPLE 68 | (A)-50 [100] | (B)-1 [3] | (D)-5 [0.33] | (E)-1 [0.26] | | | (J)-1 [0.05] | (S)-1 [1800] | (I)-5 | (II)-10 |
| EXAMPLE 69 | (A)-51 [100] | (B)-1 [3] | (D)-5 [0.33] | (E)-1 [0.26] | | | (J)-1 [0.05] | (S)-1 [1800] | (I)-1 | |
| EXAMPLE 70 | (A)-51 [100] | (B)-1 [3] | (D)-5 [0.33] | (E)-1 [0.26] | (G)-4 [15] | | (J)-1 [0.05] | (S)-1 [1800] | (I)-4 | (II)-11 |
| EXAMPLE 71 | (A)-52 [100] | (B)-1 [3] | (D)-5 [0.33] | (E)-1 [0.26] | | | (J)-1 [0.05] | (S)-1 [1800] | (I)-1 | |
| COMPARATIVE EXAMPLE 11 | (A)-45 [100] | (B)-1 [3] | (D)-5 [0.33] | (E)-1 [0.26] | | | (J)-1 [0.05] | (S)-1 [1800] | (I)-1 | |
| COMPARATIVE EXAMPLE 12 | (A)-53 [100] | (B)-8 [3] | (D)-5 [0.33] | (E)-1 [0.26] | (G)-1 [15] | | (J)-1 [0.05] | (S)-1 [1800] | (I)-3 | |
| COMPARATIVE EXAMPLE 13 | (A)-54 [100] | (B)-1 [3] | (D)-5 [0.33] | (E)-1 [0.26] | (G)-4 [15] | | (J)-1 [0.05] | (S)-1 [1800] | (I)-1 | |
| COMPARATIVE EXAMPLE 14 | (A)-55 [100] | (B)-1 [3] | (D)-5 [0.33] | (E)-1 [0.26] | (G)-5 [15] | | (J)-1 [0.05] | (S)-1 [1800] | (I)-1 | |

In Table 12, (A)-24, 26, 27, 36, 45; (B)-1; (D)-1; (E)-1; (G)-1, 2; (S)-1; (I)-1 to 7; and (II)-8 to 11 are the same as defined above, and the other reference characters indicate the following. Further, the values in brackets [ ] indicate the amount (in terms of parts by weight) of the component added.

(A)-48 to (A)-56: the aforementioned polymeric compounds 48 to 56

(B)-8: compound (B)-8 shown below (D)-5: tri-n-ethanolamine

[Chemical Formula 88]

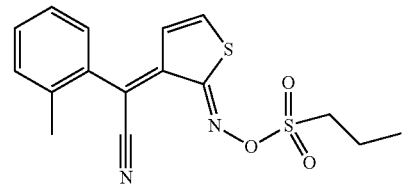

(B)-8

-continued

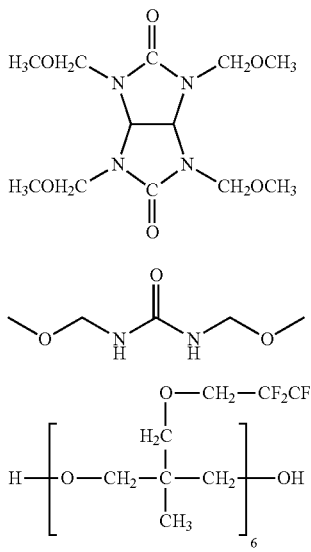

(G)-4

(G)-5

(J)-1

[Formation of Resist Pattern 2]

An organic anti-reflection film composition (product name: TBLC-100, manufactured by Tokyo Ohka Kogyo Co., Ltd.) was applied to an 8-inch silicon wafer using a spinner, and the composition was then baked on a hot plate at 230° C. for 90 seconds and dried, thereby forming an organic anti-reflection film having a film thickness of 455 nm. Then, the resist composition of each example was applied to the anti-reflection film using a spinner, and was then prebaked (PAB) on a hotplate at 85° C. for 60 seconds and dried, thereby forming a resist film having a film thickness of 150 nm.

Subsequently, the resist film was selectively irradiated with an KrF excimer laser (248 nm) through a mask pattern, using an KrF exposure apparatus NSR-S203B (manufactured by Nikon Corporation, NA (numerical aperture)=0.68, 6=0.60).

Thereafter, a post exposure bake (PES) treatment was conducted at 125° C. for 60 seconds, followed by paddle development treatment for 13 seconds at 23° C. using a developing solution indicated in Table 12. Then, in Examples 61, 68 and 70, the resist film was rinsed with a rinse liquid indicated in Table 12 for 20 seconds, followed by drying by shaking.

Further, a post bake was conducted on a hot plate at 100° C. for 60 seconds.

As a result, in each of the examples, a 1:1 SL pattern having a space width of 150 nm and a pitch of 300 nm was formed on the resist film.

With respect to the obtained resist pattern, the residual film ratio, the collapse margin and the LWR were evaluated in the same manner as described above. The results are shown in Table 13. In Comparative Examples 12 to 14, due to low pattern contrast, the evaluation of LWR could not be conducted. In Table 13, the results are indicated as "x".

TABLE 13

|  | RESIDUAL FILM RATIO (%) | COLLAPSE MARGIN | LWR |
|---|---|---|---|
| EXAMPLE 54 | 86.1 | A | 6.81 |
| EXAMPLE 55 | 87.4 | A | 7.12 |
| EXAMPLE 56 | 87.0 | A | 7.15 |
| EXAMPLE 57 | 84.5 | A | 6.72 |
| EXAMPLE 58 | 86.1 | A | 6.88 |
| EXAMPLE 59 | 85.2 | A | 6.76 |
| EXAMPLE 60 | 85.4 | A | 6.84 |
| EXAMPLE 61 | 85.4 | A | 6.91 |
| EXAMPLE 62 | 85.5 | A | 6.58 |
| EXAMPLE 63 | 84.3 | A | 6.70 |
| EXAMPLE 64 | 84.7 | A | 7.21 |
| EXAMPLE 65 | 86.3 | A | 7.45 |
| EXAMPLE 66 | 86.6 | A | 7.31 |
| EXAMPLE 67 | 86.7 | A | 7.41 |
| EXAMPLE 68 | 85.5 | A | 6.51 |
| EXAMPLE 69 | 86.1 | A | 6.85 |
| EXAMPLE 70 | 86.4 | A | 7.24 |
| EXAMPLE 71 | 85.2 | A | 6.68 |
| COMPARATIVE EXAMPLE 11 | 72.4 | C | 8.75 |
| COMPARATIVE EXAMPLE 12 | 47.0 | B | x |
| COMPARATIVE EXAMPLE 13 | 15.1 | C | x |
| COMPARATIVE EXAMPLE 14 | 12.8 | C | x |

From the results shown above, it was confirmed that the resist compositions of Examples 54 to 71 according to the present invention exhibited excellent residual film ratio, collapse margin, LWR and heat resistance as compared to the resist compositions of Comparative Examples 11 to 14.

Examples 72 to 89, Comparative Examples 15 to 18

The components shown in Tables 14 and 15 were mixed together and dissolved to obtain solvent developing negative-tone resist compositions.

TABLE 14

| | COMPONENT (A) | COMPONENT (B) | COMPONENT (D) | COMPONENT (E) | COMPONENT (G) | COMPONENT (H) | COMPONENT (J) | COMPONENT (S) |
|---|---|---|---|---|---|---|---|---|
| EXAMPLES 72 | (A)-24 [100] | (B)-9 [10] | | | | (H)-2 [10] | (J)-1 [0.05] | (S)-1 [1300] |
| EXAMPLE 73 | (A)-24 [100] | (B)-9 [10] | | | (G)-1 [15] | (H)-2 [10] | (J)-1 [0.05] | (S)-1 [1300] |
| EXAMPLE 74 | (A)-24 [100] | (B)-9 [10] | | | (G)-1 [50] | (H)-2 [10] | (J)-1 [0.05] | (S)-1 [1300] |
| EXAMPLE 75 | (A)-24 [100] | (B)-9 [10] | | | (G)-1 [100] | (H)-2 [10] | (J)-1 [0.05] | (S)-1 [1300] |
| EXAMPLE 76 | (A)-24 [100] | (B)-1 [1.5] | | | | | (J)-2 [0.1] | (S)-1 [1300] |
| EXAMPLE 77 | (A)-26 [100] | (B)-10 [10] | | | (G)-2 [15] | (H)-3 [10] | (J)-1 [0.05] | (S)-1 [1300] |
| EXAMPLE 78 | (A)-27 [100] | (B)-9 [10] | | | | (H)-2 [10] | (J)-1 [0.05] | (S)-1 [1300] |
| EXAMPLE 79 | (A)-27 [100] | (B)-10 [1] | (B)-11 [10] | | | (H)-3 [10] | (J)-1 [0.05] | (S)-1 [1300] |

TABLE 14-continued

| | COMPONENT (A) | COMPONENT (B) | | COMPONENT (D) | COMPONENT (E) | COMPONENT (G) | | COMPONENT (H) | COMPONENT (J) | COMPONENT (S) |
|---|---|---|---|---|---|---|---|---|---|---|
| EXAMPLE 80 | (A)-36 [100] | (B)-8 [1] | (B)-11 [10] | | | | | (H)-3 [10] | (J)-1 [0.05] | (S)-1 [1300] |
| EXAMPLE 81 | (A)-36 [100] | (B)-8 [1] | (B)-11 [10] | | | (G)-1 [10] | | | (J)-1 [0.05] | (S)-1 [1300] |
| EXAMPLE 82 | (A)-48 [100] | (B)-9 [10] | | | | | | (H)-2 [10] | (J)-1 [0.05] | (S)-1 [1300] |
| EXAMPLE 83 | (A)-49 [100] | (B)-9 [10] | | | | (G)-1 [25] | | (H)-2 [10] | (J)-1 [0.05] | (S)-1 [1300] |
| EXAMPLE 84 | (A)-49 [100] | (B)-8 [1.5] | (B)-9 [5] | (D)-5 [0.33] | (E)-1 [0.26] | (G)-1 [10] | (G)-4 [15] | (H)-2 [5] | (J)-1 [0.05] | (S)-1 [1300] |
| EXAMPLE 85 | (A)-49 [100] | (B)-8 [1.5] | | (D)-1 [0.33] | (E)-1 [0.26] | (G)-5 [25] | | | (J)-1 [0.05] | (S)-1 [1300] |
| EXAMPLE 86 | (A)-50 [100] | (B)-8 [1] | (B)-10 [10] | | | | | (H)-2 [10] | (J)-1 [0.05] | (S)-1 [1300] |
| EXAMPLE 87 | (A)-51 [100] | (B)-9 [10] | | | | | | (H)-2 [10] | (J)-1 [0.05] | (S)-1 [1300] |
| EXAMPLE 88 | (A)-51 [100] | (B)-8 [1.5] | | (D)-5 [0.33] | (E)-1 [0.26] | (G)-4 [15] | | | (J)-1 [0.05] | (S)-1 [1300] |
| EXAMPLE 89 | (A)-52 [100] | (B)-9 [1.5] | (B)-10 [5] | (D)-5 [0.33] | (E)-1 [0.26] | (G)-6 [15] | | | (J)-1 [0.05] | (S)-1 [1300] |

TABLE 15

| | COMPONENT (A) | COMPONENT (B) | COMPONENT (D) | COMPONENT (E) | COMPONENT (G) | COMPONENT (H) | COMPONENT (J) | COMPONENT (S) |
|---|---|---|---|---|---|---|---|---|
| COMPARATIVE EXAMPLE 15 | (A)-45 [100] | (B)-1 [10] | | | | (H)-2 [10] | (J)-1 [0.05] | (S)-1 [1300] |
| COMPARATIVE EXAMPLE 16 | (A)-53 [100] | (B)-9 [1.5] | | | (G)-1 [15] | | (J)-1 [0.05] | (S)-1 [1300] |
| COMPARATIVE EXAMPLE 17 | (A)-54 [100] | (B)-10 [10] | | | (G)-4 [15] | | (J)-1 [0.05] | (S)-1 [1300] |
| COMPARATIVE EXAMPLE 18 | (A)-55 [100] | (B)-9 [1.5] | (D)-5 [0.33] | (E)-1 [0.26] | (G)-6 [15] | | (J)-1 [0.05] | (S)-1 [1300] |

In Tables 14 and 15, (A)-24, 26, 27, 36, 48 to 55; (B)-1, 8; (D)-1, 5; (E)-1; (G)-1, 2, 4, 5; (J)-1, 2; and (S)-1 are the same as defined above, and the other reference characters indicate the following. The values in brackets [ ] indicate the amount (in terms of parts by weight) of the component added.

Further, in Table 15, (I)-1 to 7; and (II)-8 to 11 are the same as defined above.

(B)-9: compound (B)-9 shown below (B)-10: triphenylsulfonium trifluoromethanesulfonate (B)-11: compound (B)-11 shown below (G)-6: compound (G)-6 shown below (H)-2: pyrene (H)-3: 1,5-dihydroxynaphthalene

[Chemical Formula 89]

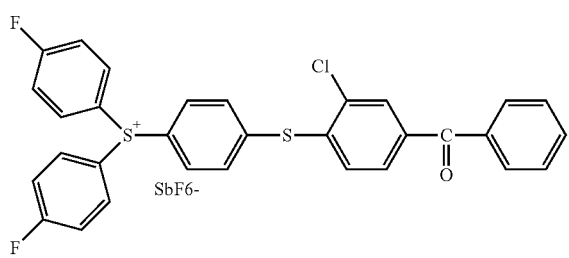

(B)-9

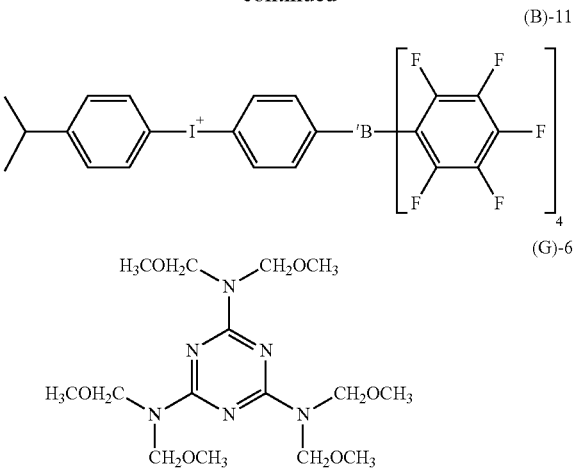

[Formation of Resist Pattern 3]

The resist composition was applied to an 8-inch silicon wafer using a spinner, and was then prebaked (PAB) on a hotplate at 85° C. for 60 seconds and dried, thereby forming a resist film having a film thickness of 350 nm.

Subsequently, the resist film was selectively irradiated with an i-line (365 nm) through a mask pattern, using an i-line exposure apparatus NSR-2205i14E (manufactured by Nikon Corporation, NA (numerical aperture)=0.57, σ=0.56).

Thereafter, a post exposure bake (PEB) treatment was conducted at 125° C. for 60 seconds, followed by paddle development treatment for 13 seconds at 23° C. using a developing solution indicated in Table 16. Then, in Examples 79, 86 and 88, the resist film was rinsed with a rinse liquid indicated in Table 16 for 20 seconds, followed by drying by shaking.

Further, a post bake was conducted on a hot plate at 100° C. for 40 seconds.

As a result, in each of the examples, a 1:1 SL pattern having a space width of 500 nm and a pitch of 1,000 nm was formed on the resist film.

With respect to the obtained resist pattern, the residual film ratio and the collapse margin were evaluated in the same manner as described above. The results are shown in Table 16.

[Evaluation of Pattern Shape]

With respect to the SL patterns having a space width of 500 nm and a pitch of 1,000 nm formed with the above optimum exposure dose Eop, with which the 1:1 SL pattern having a space width of 500 nm could be formed, the cross-sectional shape was observed using a scanning electron microscope (product name: SU-8000, manufactured by Hitachi High-Technologies Corporation), and the cross-sectional shape was evaluated with the following criteria. The results are shown in Table 16.

A: High rectangularity
B: Rectangularity was not maintained

TABLE 16

|  | DEVELOPING SOLUTION | RINSE LIQUID | RESIDUAL FILM RATIO (%) | COLLAPSE MARGIN | PATTERN SHAPE |
| --- | --- | --- | --- | --- | --- |
| EXAMPLE 72 | (I)-1 |  | 85.5 | A | A |
| EXAMPLE 73 | (I)-1 |  | 85.2 | A | A |
| EXAMPLE 74 | (I)-1 |  | 88.3 | A | A |
| EXAMPLE 75 | (I)-2 |  | 90.2 | A | A |
| EXAMPLE 76 | (I)-1 |  | 82.1 | A | A |
| EXAMPLE 77 | (I)-1 |  | 85.2 | A | A |
| EXAMPLE 78 | (I)-1 |  | 85.4 | A | A |
| EXAMPLE 79 | (I)-1 | (II)-8 | 85.4 | A | A |
| EXAMPLE 80 | (I)-1 |  | 85.5 | A | A |
| EXAMPLE 81 | (I)-2 |  | 84.3 | A | A |
| EXAMPLE 82 | (I)-1 |  | 84.7 | A | A |
| EXAMPLE 83 | (I)-1 |  | 86.3 | A | A |
| EXAMPLE 84 | (I)-1 |  | 86.6 | A | A |
| EXAMPLE 85 | (I)-1 |  | 86.7 | A | A |
| EXAMPLE 86 | (I)-5 | (II)-10 | 85.5 | A | A |
| EXAMPLE 87 | (I)-1 |  | 86.1 | A | A |
| EXAMPLE 88 | (I)-4 | (II)-11 | 86.4 | A | A |
| EXAMPLE 89 | (I)-1 |  | 85.2 | A | A |
| COMPARATIVE EXAMPLE 15 | (I)-1 |  | 75.6 | C | B |
| COMPARATIVE EXAMPLE 16 | (I)-3 |  | 48.5 | B | B |
| COMPARATIVE EXAMPLE 17 | (I)-3 |  | 40.5 | C | B |
| COMPARATIVE EXAMPLE 18 | (I)-1 |  | 10.6 | C | B |

From the results shown above, it was confirmed that the resist compositions of Examples 72 to 89 according to the present invention exhibited excellent residual film ratio, collapse margin and pattern shape as compared to the resist compositions of Comparative Examples 15 to 18.

Examples 90 to 103, Comparative Examples 19 to 22

The components shown in Table 17 were mixed together and dissolved to obtain solvent developing negative-tone resist compositions.

TABLE 17

|  | COMPONENT (A) | COMPONENT (B) | COMPONENT (D) |  | COMPONENT (E) | COMPONENT (G) | COMPONENT (J) | COMPONENT (S) | DEVELOPING SOLUTION | RINSE LIQUID |
| --- | --- | --- | --- | --- | --- | --- | --- | --- | --- | --- |
| EXAMPLE 90 | (A)-23 [100] | (B)-1 [10] | (D)-6 [0.7] |  | (E)-1 [0.3] |  | (J)-1 [0.05] | (S)-1 [1560] | (I)-1 |  |
| EXAMPLE 91 | (A)-23 [100] | (B)-1 [10] | (D)-6 [0.7] | (D)-2 [3] | (E)-1 [0.3] |  | (J)-1 [0.05] | (S)-1 [1560] | (I)-5 |  |
| EXAMPLE 92 | (A)-26 [100] | (B)-1 [10] | (D)-6 [0.7] | (D)-3 [3] | (E)-1 [0.3] |  | (J)-1 [0.05] | (S)-1 [1560] | (I)-1 |  |
| EXAMPLE 93 | (A)-26 [100] | (B)-8 [10] | (D)-6 [0.7] | (D)-3 [3] | (E)-1 [0.3] |  | (J)-1 [0.05] | (S)-1 [1560] | (I)-1 | (II)-8 |
| EXAMPLE 94 | (A)-26 [100] | (B)-8 [10] | (D)-6 [0.7] | (D)-2 [3] | (E)-1 [0.3] | (G)-1 [10] | (J)-1 [0.05] | (S)-1 [1560] | (I)-1 |  |
| EXAMPLE 95 | (A)-26 [100] | (B)-8 [10] | (D)-6 [0.7] | (D)-4 [3] | (E)-1 [0.3] | (G)-2 [10] | (J)-1 [0.05] | (S)-1 [1560] | (I)-2 |  |

TABLE 17-continued

| | COMPONENT (A) | COMPONENT (B) | COMPONENT (D) | COMPONENT (D) | COMPONENT (E) | COMPONENT (G) | COMPONENT (J) | COMPONENT (S) | DEVELOPING SOLUTION | RINSE LIQUID |
|---|---|---|---|---|---|---|---|---|---|---|
| EXAMPLE 96 | (A)-27 [100] | (B)-1 [10] | (D)-6 [0.7] | | (E)-1 [0.3] | | (J)-1 [0.05] | (S)-1 [1560] | (I)-1 | |
| EXAMPLE 97 | (A)-36 [100] | (B)-1 [10] | (D)-6 [0.7] | | (E)-1 [0.3] | | (J)-1 [0.05] | (S)-1 [1560] | (I)-1 | |
| EXAMPLE 98 | (A)-52 [100] | (B)-1 [10] | (D)-6 [0.7] | | (E)-1 [0.3] | | (J)-1 [0.05] | (S)-1 [1560] | (I)-5 | |
| EXAMPLE 99 | (A)-52 [100] | (B)-1 [10] | (D)-6 [0.7] | (D)-3 [3] | (E)-1 [0.3] | (G)-1 [10] | (J)-1 [0.05] | (S)-1 [1560] | (I)-1 | |
| EXAMPLE 100 | (A)-52 [100] | (B)-1 [10] | (D)-6 [0.7] | | (E)-1 [0.3] | (G)-4 [10] | (J)-1 [0.05] | (S)-1 [1560] | (I)-1 | (II)-10 |
| EXAMPLE 101 | (A)-52 [100] | (B)-1 [10] | (D)-6 [0.7] | (D)-2 [3] | (E)-1 [0.3] | (G)-5 [10] | (J)-1 [0.05] | (S)-1 [1560] | (I)-3 | (II)-11 |
| EXAMPLE 102 | (A)-43 [100] | (B)-1 [10] | (D)-6 [0.7] | (D)-2 [3] | (E)-1 [0.3] | | (J)-1 [0.05] | (S)-1 [1560] | (I)-1 | |
| EXAMPLE 103 | (A)-44 [100] | (B)-1 [10] | (D)-6 [0.7] | (D)-2 [3] | (E)-1 [0.3] | | (J)-1 [0.05] | (S)-1 [1560] | (I)-1 | |
| COMPARATIVE EXAMPLE 19 | (A)-45 [100] | (B)-1 [10] | (D)-6 [0.7] | | (E)-1 [0.3] | (G)-5 [10] | (J)-1 [0.05] | (S)-1 [1560] | (I)-1 | |
| COMPARATIVE EXAMPLE 20 | (A)-45 [100] | (B)-1 [10] | (D)-6 [0.7] | (D)-2 [3] | (E)-1 [0.3] | (G)-5 [20] | (J)-1 [0.05] | (S)-1 [1560] | (I)-1 | |
| COMPARATIVE EXAMPLE 21 | (A)-53 [100] | (B)-8 [10] | (D)-6 [0.7] | (D)-3 [3] | (E)-1 [0.3] | (G)-5 [10] | (J)-1 [0.05] | (S)-1 [1560] | (I)-1 | |
| COMPARATIVE EXAMPLE 22 | (A)-53 [100] | (B)-8 [10] | (D)-6 [0.7] | (D)-4 [3] | (E)-1 [0.3] | (G)-5 [20] | (J)-1 [0.05] | (S)-1 [1560] | (I)-1 | |

In Table 17, (A)-23, 26, 27, 36, 43, 44, 52, 53; (B)-1, 8; (D)-2 to 4; (E)-1; (G)-1, 2, 4, 5; (J)-1; (S)-1; (I)-1 to 7; and (II)-8 to 11 are the same as defined above, and (D)-6 is tri-n-octylamine. Further, the values in brackets [ ] indicate the amount (in terms of parts by weight) of the component added.

[Formation of Resist Pattern 4]

The resist composition was applied to an 8-inch silicon wafer using a spinner, and was then prebaked (PAB) on a hotplate at 85° C. for 60 seconds and dried, thereby forming a resist film having a film thickness of 300 nm.

Subsequently, the resist film was subjected to exposure using an electron beam lithography apparatus HL-800D (VSB) (manufactured by Hitachi, Ltd.) at an acceleration voltage of 70 kV, followed by PEB treatment at 125° C. for 60 seconds. Then, paddle development treatment was performed for 13 seconds at 23° C. using a developing solution indicated in Table 17. Then, in Examples 93, 100 and 101, the resist film was rinsed with a rinse liquid indicated in Table 17 for 20 seconds, followed by drying by shaking.

Further, a post bake was conducted on a hot plate at 100° C. for 40 seconds.

As a result, in each of the examples, a 1:1 LS pattern having a line width of 130 nm and a pitch of 260 nm was formed on the resist film.

With respect to the obtained resist pattern, the residual film ratio, the collapse margin and the LWR were evaluated in the same manner as described above. The results are shown in Table 18. In Comparative Examples 21 and 22, due to low pattern contrast, the evaluation of LWR could not be conducted. In Table 18, the results are indicated as "x".

TABLE 18

| | RESIDUAL FILM RATIO (%) | COLLAPSE MARGIN | LWR |
|---|---|---|---|
| EXAMPLE 90 | 86.5 | A | 7.14 |
| EXAMPLE 91 | 86.9 | A | 6.57 |
| EXAMPLE 92 | 84.5 | A | 6.73 |
| EXAMPLE 93 | 84.9 | A | 6.75 |
| EXAMPLE 94 | 87.2 | A | 6.68 |
| EXAMPLE 95 | 87.2 | A | 7.31 |
| EXAMPLE 96 | 83.5 | A | 6.47 |
| EXAMPLE 97 | 83.4 | A | 6.66 |
| EXAMPLE 98 | 85.1 | A | 6.87 |
| EXAMPLE 99 | 86.2 | A | 6.91 |
| EXAMPLE 100 | 87.1 | A | 7.25 |
| EXAMPLE 101 | 86.7 | A | 7.12 |
| EXAMPLE 102 | 87.1 | A | 6.50 |
| EXAMPLE 103 | 88.2 | A | 6.41 |
| COMPARATIVE EXAMPLE 19 | 69.4 | C | 10.50 |
| COMPARATIVE EXAMPLE 20 | 71.2 | C | 11.20 |
| COMPARATIVE EXAMPLE 21 | 14.1 | C | x |
| COMPARATIVE EXAMPLE 22 | 10.8 | C | x |

From the results shown above, it was confirmed that the resist compositions of Examples 90 to 103 according to the present invention exhibited excellent residual film ratio, collapse margin and LWR as compared to the resist compositions of Comparative Examples 19 to 22.

Examples 111 to 137, Comparative Examples 24 to 26

The components shown in Tables 19 and 20 were mixed together and dissolved to obtain solvent developing negative-tone resist compositions.

TABLE 19

| | COMPONENT (A) | COMPONENT (B) | COMPONENT (D) | | COMPONENT (E) | COMPONENT (F) | COMPONENT (S) |
|---|---|---|---|---|---|---|---|
| EXAMPLE 111 | (A)-1 [100] | (B)-1 [10] | (D)-1 [1.2] | | (E)-1 [2] | (F)-2 [4] | (S)-1 [2500] |
| EXAMPLE 112 | (A)-2 [100] | (B)-3 [10] | (D)-1 [1.2] | (D)-2 [3] | (E)-1 [2] | (F)-2 [4] | (S)-1 [2500] |
| EXAMPLE 114 | (A)-4 [100] | (B)-1 [10] | (D)-1 [1.2] | | (E)-1 [2] | (F)-2 [4] | (S)-1 [2500] |
| EXAMPLE 115 | (A)-5 [100] | (B)-1 [10] | (D)-1 [1.2] | (D)-4 [3] | (E)-1 [2] | (F)-2 [4] | (S)-1 [2500] |
| EXAMPLE 116 | (A)-6 [100] | (B)-1 [10] | (D)-1 [1.2] | | (E)-1 [2] | (F)-2 [4] | (S)-1 [2500] |
| EXAMPLE 117 | (A)-7 [100] | (B)-1 [10] | (D)-1 [1.2] | | (E)-1 [2] | (F)-2 [4] | (S)-1 [2500] |
| EXAMPLE 118 | (A)-8 [100] | (B)-1 [10] | (D)-1 [1.2] | | (E)-1 [1] | (F)-2 [4] | (S)-1 [2500] |
| EXAMPLE 119 | (A)-56 [100] | (B)-5 [15] | | (D)-5 [5] | (E)-1 [0.1] | (F)-2 [4] | (S)-1 [2500] |
| EXAMPLE 120 | (A)-56 [100] | (B)-1 [10] | (D)-1 [1.2] | | (E)-1 [2] | (F)-1 [2] | (S)-1 [2500] |
| EXAMPLE 121 | (A)-56 [100] | (B)-5 [15] | | D-4 [5] | | (F)-3 [4] | (S)-1 [2500] |
| EXAMPLE 122 | (A)-57 [100] | (B)-1 [10] | (D)-1 [1.2] | | (E)-1 [2] | (F)-1 [2] | (S)-1 [2500] |
| EXAMPLE 123 | (A)-57 [100] | (B)-5 [15] | | (D)-5 [5] | (E)-1 [0.1] | (F)-2 [4] | (S)-1 [2500] |
| EXAMPLE 124 | (A)-57 [100] | (B)-1 [10] | | (D)-5 [5] | (E)-1 [0.1] | (F)-4 [2] | (S)-1 [2500] |
| EXAMPLE 125 | (A)-57 [100] | (B)-5 [5] | (D)-1 [1.0] | | (E)-1 [1] | (F)-5 [4] | (S)-1 [2500] |
| EXAMPLE 126 | (A)-58 [100] | (B)-1 [10] | (D)-1 [1.2] | | (E)-1 [2] | (F)-2 [4] | (S)-1 [2500] |
| EXAMPLE 127 | (A)-59 [100] | (B)-1 [5] (B)-2 [5] | (D)-1 [1.2] | | (E)-1 [2] | (F)-2 [4] | (S)-1 [2500] |
| EXAMPLE 128 | (A)-60 [100] | (B)-2 [10] | (D)-1 [1.2] | (D)-4 [3] | (E)-1 [2] | (F)-2 [4] | (S)-1 [2500] |

TABLE 20

| | COMPONENT (A) | COMPONENT (B) | COMPONENT (D) | | COMPONENT (E) | COMPONENT (F) | COMPONENT (S) |
|---|---|---|---|---|---|---|---|
| EXAMPLE 129 | (A)-61 [100] | (B)-3 [10] | (D)-1 [1.2] | | (E)-1 [2] | (F)-2 [4] | (S)-1 [2500] |
| EXAMPLE 130 | (A)-62 [100] | (B)-3 [10] | (D)-1 [1.2] | | (E)-1 [2] | (F)-2 [4] | (S)-1 [2500] |
| EXAMPLE 131 | (A)-63 [100] | (B)-1 [10] | (D)-1 [1.2] | | (E)-1 [2] | (F)-2 [4] | (S)-1 [2500] |
| EXAMPLE 132 | (A)-64 [100] | (B)-1 [10] | (D)-1 [1.2] | | (E)-1 [2] | (F)-2 [4] | (S)-1 [2500] |
| EXAMPLE 133 | (A)-65 [100] | (B)-5 [15] | | (D)-4 [5] | (E)-1 [0.5] | (F)-1 [4] | (S)-1 [2500] |
| EXAMPLE 134 | (A)-65 [100] | (B)-5 [15] | | (D)-5 [5] | (E)-1 [0.5] | (F)-2 [4] | (S)-1 [2500] |
| EXAMPLE 135 | (A)-65 [100] | (B)-4 [5] (B)-5 [10] | (D)-1 [1.2] | | (E)-1 [2] | (F)-5 [4] | (S)-1 [2500] |
| EXAMPLE 136 | (A)-57 [100] | (B)-5 [15] | | (D)-5 [5] | (E)-1 [1] | | (S)-1 [2500] |
| EXAMPLE 137 | (A)-66 [100] | (B)-1 [10] | (D)-1 [1.2] | | (E)-1 [2] | (F)-2 [4] | (S)-1 [2500] |
| COMPARATIVE EXAMPLE 24 | (A)-45 [100] | (B)-4 [10] | (D)-1 [1.2] | | (E)-1 [2] | (F)-2 [4] | (S)-1 [2500] |
| COMPARATIVE EXAMPLE 25 | (A)-46 [100] | (B)-4 [10] | (D)-1 [1.2] | | (E)-1 [2] | (F)-2 [4] | (S)-1 [2500] |
| COMPARATIVE EXAMPLE 26 | (A)-47 [100] | (B)-4 [10] | (D)-1 [1.2] | | (E)-1 [2] | (F)-2 [4] | (S)-1 [2500] |

In Tables 19 and 20, (A)-1 to 8, (A)-45 to 47, (B)-1 to 5, (D)-1 to 4, (E)-1 and (S)-1 are the same as defined above, and the other reference characters indicate the following. Further, the values in brackets [ ] indicate the amount (in terms of parts by weight) of the component added.

(A)-56 to (A)-66: the aforementioned polymeric compounds 56 to 66

(D)-5: compound (D)-5 shown below (F)-1: polymeric compound (F)-1 shown below [Mw=25,000, Mw/Mn=1.5, l/m=80/20 (molar ratio)]

(F)-2: polymeric compound (F)-A shown below [Mw=28,000, Mw/Mn=2.0, l/m=30/70 (molar ratio)]

(F)-3: polymeric compound (F)-A shown below [Mw=50,000, Mw/Mn=2.0, l/m=50/50 (molar ratio)]

(F)-4: polymeric compound (F)-3 shown below [Mw=25,000, Mw/Mn=1.8, l/m=80/20 (molar ratio)]

(F)-5: polymeric compound (F)-4 shown below [Mw=30,000, Mw/Mn=2.0, l/m=30/70 (molar ratio)]

[Chemical Formula 90]

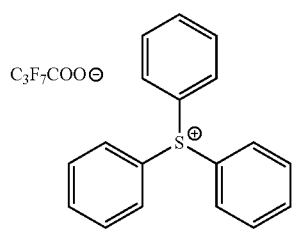

(D)-5

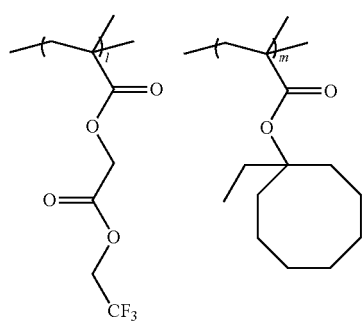

(F)-1

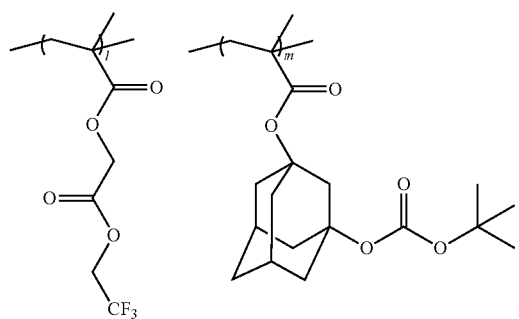

(F)-A

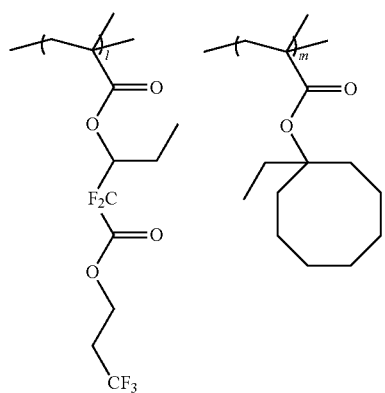

(F)-3

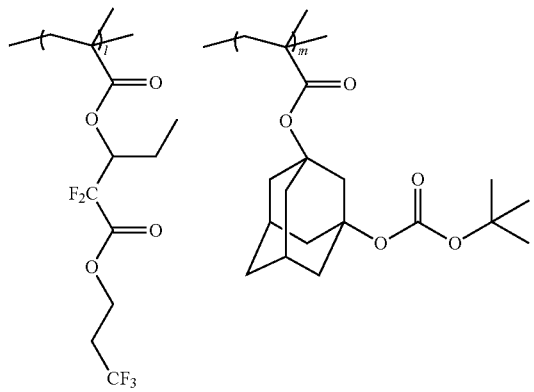

(F)-4

[Formation of Resist Pattern 6]

An organic anti-reflection film composition (product name: ARC29A, manufactured by Brewer Science Ltd.) was applied to an 12-inch silicon wafer using a spinner, and the composition was then baked and dried on a hotplate at 205° C. for 60 seconds, thereby forming an organic anti-reflection film having a film thickness of 89 nm.

Then, the resist composition of each example was applied to the organic anti-reflection film using a spinner, and was then prebaked (PAS) on a hotplate at 90° C. for 60 seconds and dried, thereby forming a resist film having a film thickness of 100 nm. Subsequently, in Example 136, a coating solution for forming a protection film (product name: TILC-323; manufactured by Tokyo Ohka Kogyo Co., Ltd.) was applied to the resist film using a spinner, and then heated at 90° C. for 60 seconds, thereby forming a top coat with a film thickness of 35 nm.

Subsequently, the resist film was selectively irradiated with an ArF excimer laser through a mask pattern, using an ArF immersion exposure apparatus NSR-S609 (manufactured by Nikon Corporation, NA (numerical aperture)=1.07, Crosspole (in/out=0.78/0.97) with Polano). Thereafter, a post exposure bake (PEB) treatment was conducted at 120° C. for 60 seconds, followed by paddle development treatment for 13 seconds at 23° C. using a developing solution indicated in Table 21. Then, in Examples 120, 121, 124 and 135, the resist film was rinsed with a rinse liquid indicated in Table 21 for 20 seconds, followed by drying by shaking. The reference characters of developing solutions and rinse liquid indicated in Table 21 are the same as defined above.

Further, a post bake was conducted on a hot plate at 100° C. for 40 seconds.

As a result, in each of the examples, a 1:1 space and line (SL) pattern having a space width of 65 nm and a pitch of 130 nm was formed on the resist film.

With respect to the obtained resist pattern, the residual film ratio, the collapse margin and the LWR were evaluated in the same manner as described above. The results are shown in Table 21.

TABLE 21

| | DEVELOPING SOLUTION | RINSE LIQUID | RESIDUAL FILM RATIO (%) | COLLAPSE MARGIN | LWR |
|---|---|---|---|---|---|
| EXAMPLE 111 | (I)-1 | | 86.2 | A | 6.26 |
| EXAMPLE 112 | (I)-3 | | 85.2 | A | 6.38 |
| EXAMPLE 114 | (I)-1 | | 84.3 | A | 6.40 |
| EXAMPLE 115 | (I)-1 | | 85.4 | A | 6.52 |
| EXAMPLE 116 | (I)-6 | | 83.2 | A | 6.48 |
| EXAMPLE 117 | (I)-7 | | 82.5 | A | 6.50 |
| EXAMPLE 118 | (I)-1 | | 84.1 | A | 6.28 |
| EXAMPLE 119 | (I)-1 | | 82.1 | A | 6.20 |
| EXAMPLE 120 | (I)-1 | (II)-8 | 85.1 | A | 6.42 |
| EXAMPLE 121 | (I)-1 | (II)-9 | 81.9 | A | 6.32 |
| EXAMPLE 122 | (I)-1 | | 84.6 | A | 6.47 |
| EXAMPLE 123 | (I)-1 | | 82.0 | A | 6.15 |
| EXAMPLE 124 | (I)-1 | (II)-9 | 83.6 | A | 6.22 |
| EXAMPLE 125 | (I)-1 | | 84.0 | A | 6.38 |
| EXAMPLE 126 | (I)-1 | | 85.0 | A | 6.43 |
| EXAMPLE 127 | (I)-1 | | 84.0 | A | 6.34 |
| EXAMPLE 128 | (I)-1 | | 86.2 | A | 6.35 |
| EXAMPLE 129 | (I)-1 | | 83.2 | A | 6.42 |
| EXAMPLE 130 | (I)-1 | | 84.2 | A | 6.42 |
| EXAMPLE 131 | (I)-1 | | 82.5 | A | 6.29 |
| EXAMPLE 132 | (I)-1 | | 86.4 | A | 6.51 |
| EXAMPLE 133 | (I)-1 | | 81.2 | A | 6.20 |
| EXAMPLE 134 | (I)-1 | | 81.5 | A | 6.10 |
| EXAMPLE 135 | (I)-1 | (II)-9 | 82.5 | A | 6.42 |
| EXAMPLE 136 | (I)-1 | | 81.8 | A | 6.51 |
| EXAMPLE 137 | (I)-1 | | 81.5 | A | 6.68 |
| COMPARATIVE EXAMPLE 24 | (I)-1 | | 76.2 | C | 7.82 |
| COMPARATIVE EXAMPLE 25 | (I)-1 | | 75.0 | C | 7.35 |
| COMPARATIVE EXAMPLE 26 | (I)-1 | | 75.5 | C | 7.38 |

From the results shown above, it was confirmed that the resist compositions of Examples 111 to 137 according to the present invention exhibited excellent residual film ratio, collapse margin, LWR and heat resistance as compared to the resist compositions of Comparative Examples 24 to 26.

INDUSTRIAL APPLICABILITY

According to the present invention, there are provided a solvent developing negative-tone resist composition capable of forming a resist pattern with excellent lithography properties, pattern shape, and reduced thickness loss, a method of forming a resist pattern using the solvent developing negative-tone resist composition, and a method of forming a pattern of a layer containing a block copolymer using the solvent developing negative-tone resist composition.

DESCRIPTION OF REFERENCE NUMERALS AND CHARACTERS

11: substrate, 12: layer of undercoat agent, 14: guide pattern, 13: layer containing block copolymer, 13a: phase of polymer $P_B$, 13b: phase of polymer $P_A$

What is claimed is:
1. A method of forming a resist pattern, comprising:
using a solvent developing negative-tone resist composition to form a resist film on a substrate,
conducting exposure of the resist film, and
developing the resist film using a developing solution containing an organic solvent to form a resist pattern,
the resist composition comprising a base component (A) which exhibits reduced solubility in an organic solvent under action of an acid and an acid generator component (B) which generates an acid upon exposure, conducting exposure of the resist film, and patterning the resist film by a negative tone development using a developing solution containing an organic solvent, the component (A) comprising a resin component (A1) comprising:

at least one structural unit (a2) selected from the group consisting of structural units represented by formulae (a22-1) to (a22-3) shown below;

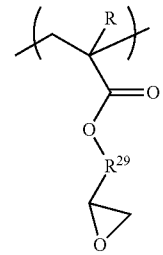

(a22-1)

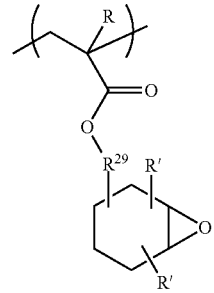

(a22-2)

-continued

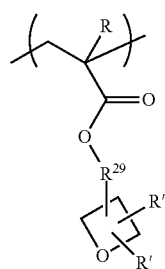

(a22-3)

wherein R represents a hydrogen atom, an alkyl group of 1 to 5 carbon atoms or a halogenated alkyl group of 1 to 5 carbon atoms; $R^{29}$ represents a single bond or a divalent linking group; R' represents a hydrogen of 1 to 5 carbon atoms, a halogenated alkyl group of 1 to 5 carbon atoms, a cyano group, a hydroxy group, an alkoxy group of 1 to 5 carbon atoms or —COOR"; R" represents a hydrogen atom or a linear, branched or cyclic alkyl group of 1 to 15 carbon atoms, and a structural unit (a1) that is derived from an acrylate ester containing an acid decomposable group which exhibited increased polarity by the action of acid and may have the hydrogen atom bonded to the carbon atom on the α-position substituted with a substituent; and the acid generator component (B) comprising an acid generator (B1) containing a compound which generates a sulfonic acid upon exposure.

2. A method of forming a pattern of a layer containing a block copolymer, the method comprising:

applying an undercoat agent to a substrate to form a layer containing the undercoat agent;

forming a resist film on a surface of the layer containing the undercoat agent using a solvent developing negative-tone resist;

exposing the resist film;

developing the resist film using a developing solution containing an organic solvent to form a resist pattern;

forming a layer containing a block copolymer having a plurality of polymers bonded on the surface of the layer containing the undercoat agent having the resist pattern formed thereon, followed by a phase separation of the layer containing the block copolymer; and selectively removing a phase containing at least one polymer of the plurality of polymers constituting the block copolymer from the layer containing the block copolymer, the resist composition comprising a base component (A) which exhibits reduced solubility in an organic solvent under action of an acid and an acid generator component (B) which generates an acid upon exposure, conducting exposure of the resist film, and patterning the resist film by a negative tone development using a developing solution containing an organic solvent, the component (A) comprising a resin component (A1) comprising:

at least one structural unit (a2) selected from the group consisting of structural units represented by formulae (a22-1) to (a22-3) shown below;

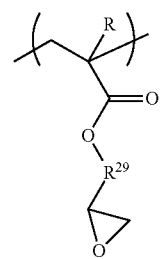

(a22-1)

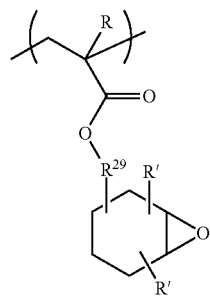

(a22-2)

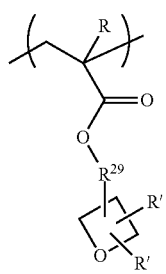

(a22-3)

wherein R represents a hydrogen atom, an alkyl group of 1 to 5 carbon atoms or a halogenated alkyl group of 1 to 5 carbon atoms; $R^{29}$ represents a single bond or a divalent linking group; R' represents a hydrogen of 1 to 5 carbon atoms, a halogenated alkyl group of 1 to 5 carbon atoms, a cyano group, a hydroxy group, an alkoxy group of 1 to 5 carbon atoms or —COOR"; R" represents a hydrogen atom or a linear, branched or cyclic alkyl group of 1 to 15 carbon atoms, and a structural unit (a1) that is derived from an acrylate ester containing an acid decomposable group which exhibited increased polarity by the action of acid and may have the hydrogen atom bonded to the carbon atom on the α-position substituted with a substituent, and the acid generator component (B) comprising an acid generator (B1) containing a compound which generates a sulfonic acid upon exposure.

3. The method according to claim 1, wherein the acid generator (B1) is a compound represented by general formula (b1) shown below:

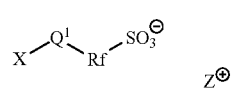

(b1)

wherein X represents a hydrocarbon group of 3 to 30 carbon atoms which may have a substituent; $Q^1$ represents a divalent linking group containing an oxygen atom; Rf represents a fluorinated alkylene group of 1 to 4 carbon atoms which may have a substituent; and $Z^+$ represents an organic cation.

4. The method according to claim 1, wherein the amount of the structural unit (a1) based on the combined total of all structural units constituting the base component (A) is 20 to 80 mol %.

5. The method according to claim 1, wherein the amount of the at least one structural unit (a2) based on the combined total of all structural units constituting the base component (A) is 20 to 80 mol %.

6. The method according to claim 1, wherein the resin component (A1) further comprises a structural unit (a0) derived from an acrylate ester containing an —$SO_2$— containing cyclic group and which may have the hydrogen atom bonded to the carbon atom on the α-position substituted with a substituent.

7. The method according to claim 1, wherein the resin component (A1) further comprises a structural unit (a3) derived from an acrylate ester containing a polar group-containing aliphatic hydrocarbon group and may have the hydrogen atom bonded to the carbon atom on the α-position substituted with a substituent.

8. The method according to claim 6, wherein the —$SO_2$-containing cyclic group is at least one group selected from the groups represented by general formulae (3-1) to (3-4) shown below:

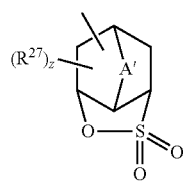

(3-1)

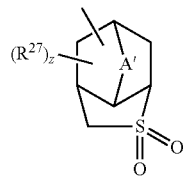

(3-2)

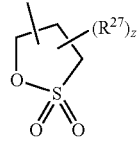

(3-3)

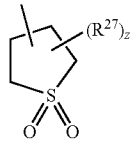

(3-4)

wherein A' represents an oxygen atom, a sulfur atom or an alkylene group of 1 to 5 carbon atoms which may contain an oxygen atom or a sulfur atom; z represents an integer of 0 to 2; and $R^{27}$ represents an alkyl group, an alkoxy group, a halogenated alkyl group, a hydroxyl group, —COOR", —OC(=O)R", a hydroxyalkyl group or a cyano group, wherein R" represents a hydrogen atom or an alkyl group.

9. The method according to claim 1, wherein the resin component (A1) comprises a combination of structural units represented by any one of formulae (A1-11), (A1-13) to (A1-21) and (A1-23) to (A1-26) shown below:

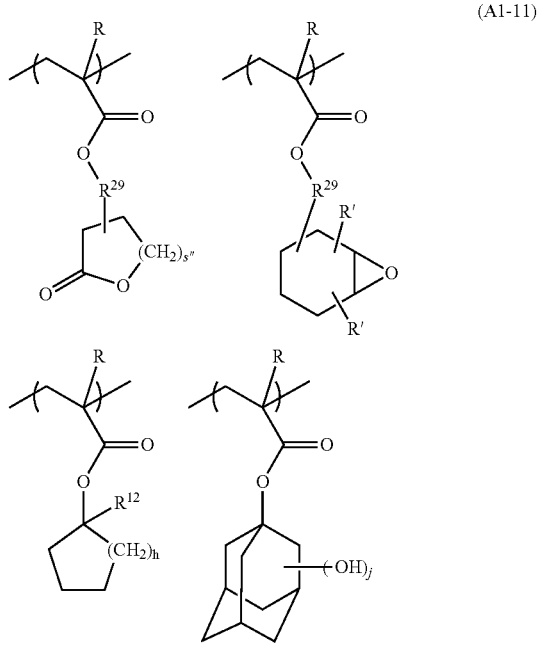

(A1-11)

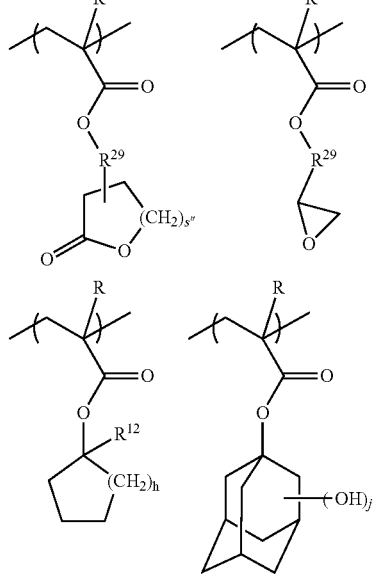

(A1-13)

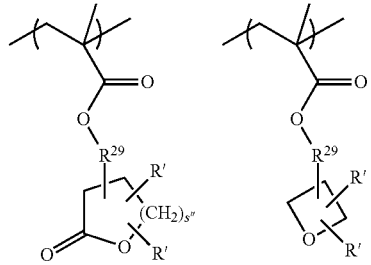

(A1-14)

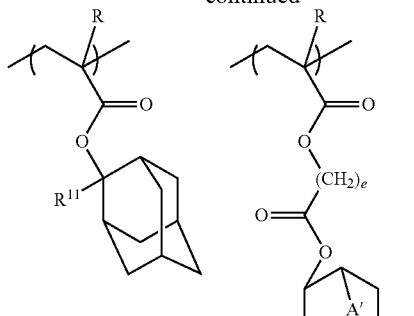
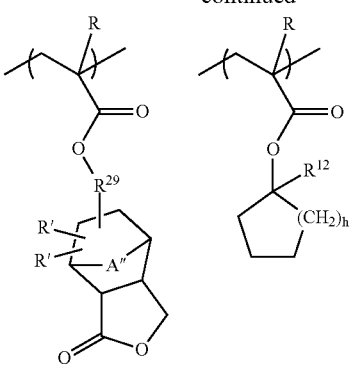
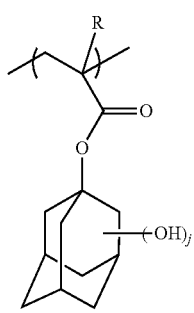
(A1-15)
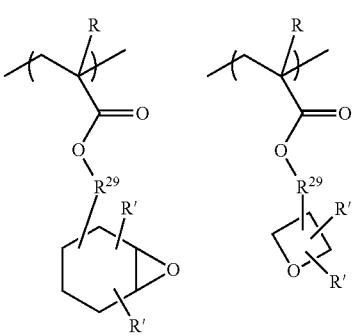
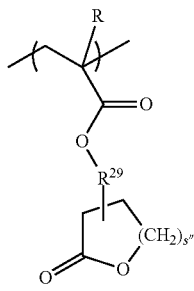
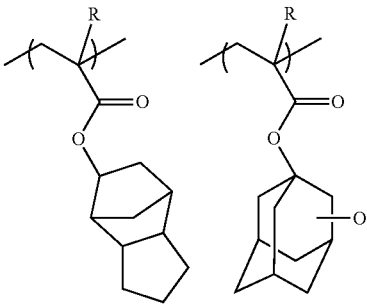
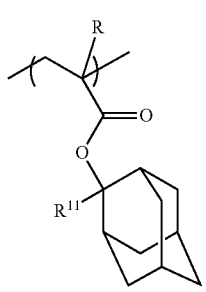
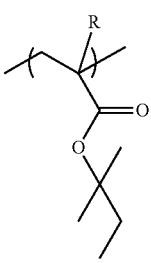
(A1-16)
(A1-18)
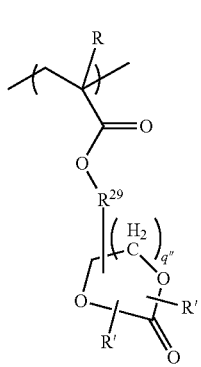
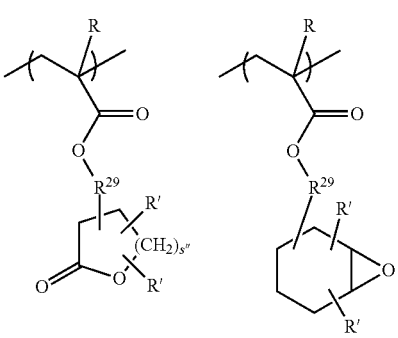

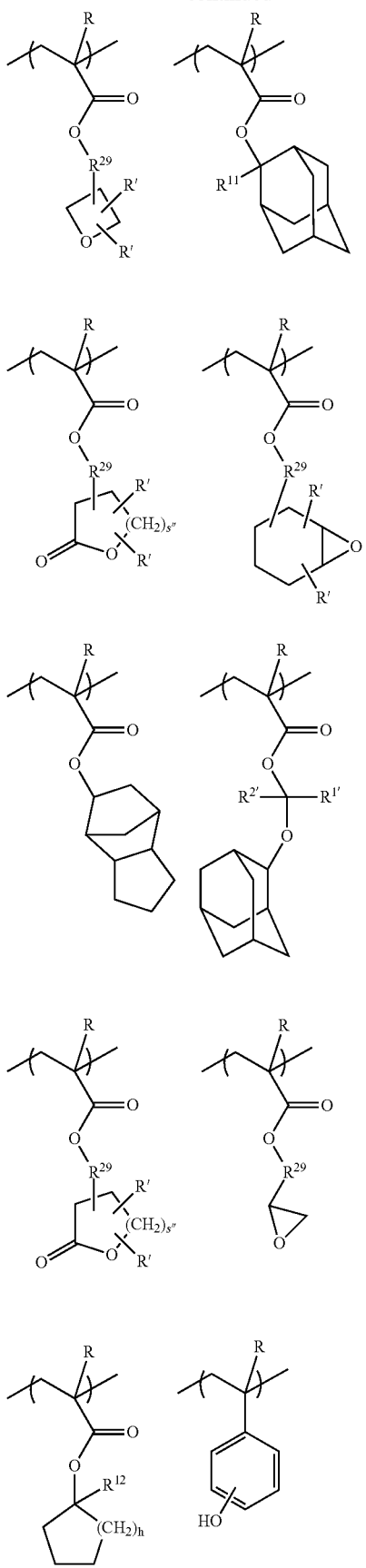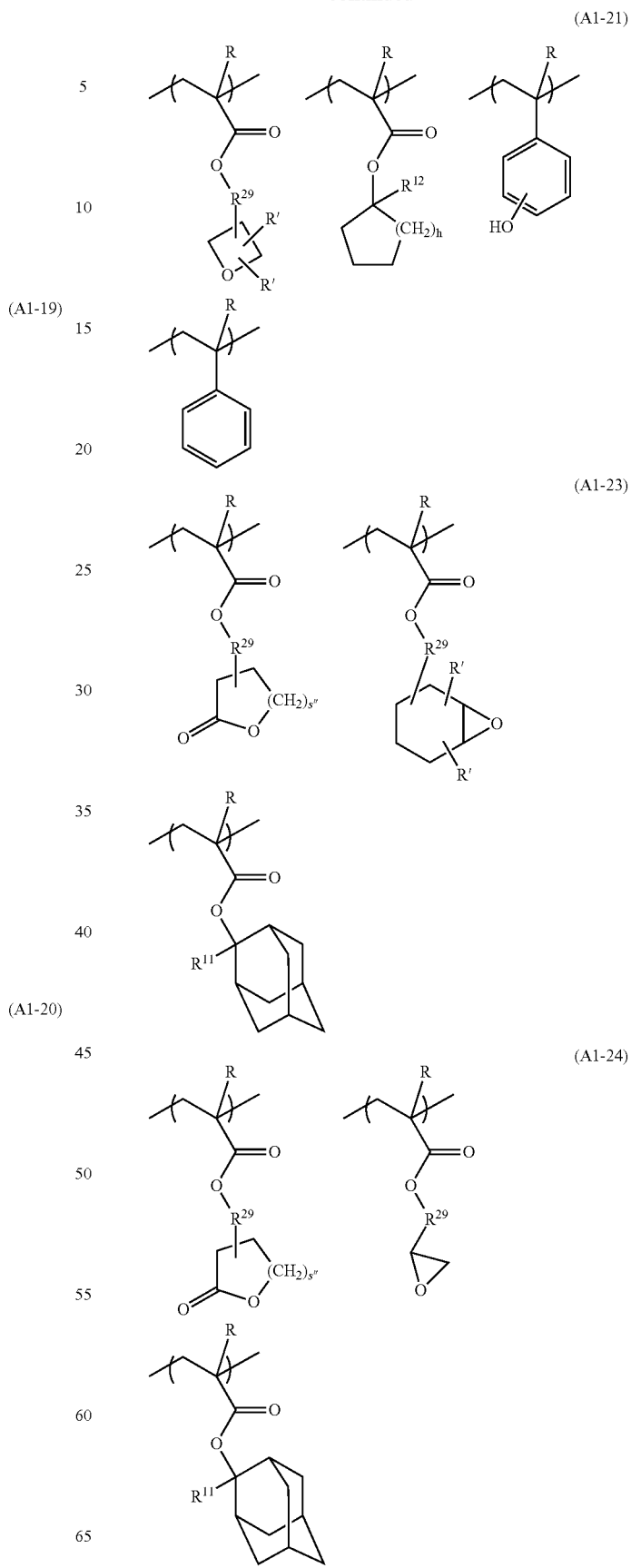

-continued

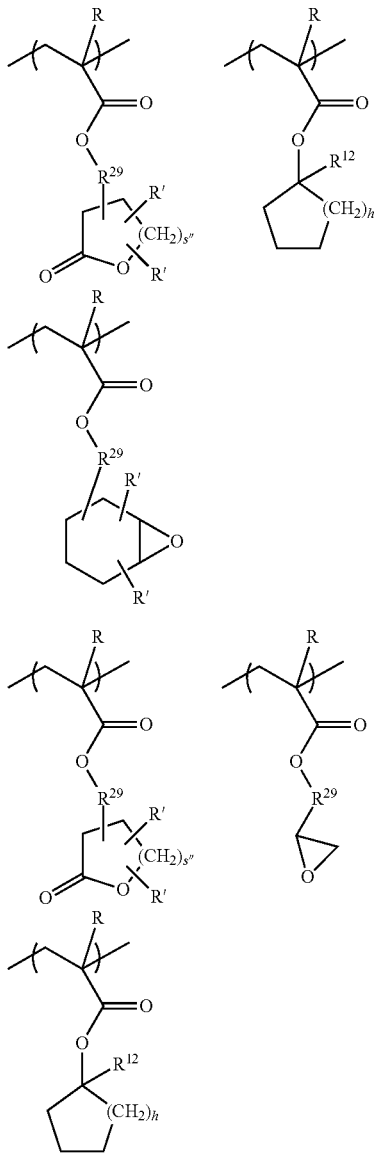

(A1-25)

(A1-26)

wherein R represents a hydrogen atom, an alkyl group of 1 to 5 carbon atoms or a halogenated alkyl group of 1 to 5 carbon atoms; $R^{29}$ represents a single bond or a divalent linking group; s" represents an integer of 0 to 2; R' represents a hydrogen atom, an alkyl group of 1 to 5 carbon atoms, a halogenated alkyl group of 1 to 5 carbon atoms, a cyano group, a hydroxy group, an alkoxy group of 1 to 5 carbon atoms or —COOR"; R" represents a hydrogen atom or a linear, branched or cyclic alkyl group of 1 to 15 carbon atoms; $R^{12}$ represents an alkyl group of 1 to 7 carbon atoms; and h represents an integer of 1 to 6; j represents an integer of 1 to 3; $R^{11}$ represents an alkyl group of 1 to 5 carbon atoms; e represents an integer of 1 to 3; A' represents an oxygen atom, a sulfur atom or an alkylene group of 1 to 5 carbon atoms which may contain an oxygen atom or a sulfur atom; A" represents an oxygen atom, a sulfur atom or an alkylene group of 1 to 5 carbon atoms which may contain an oxygen atom or a sulfur atom; q" represents an integer of 1 to 3; each of $R^{1\prime}$ and $R^{2\prime}$ independently represents a hydrogen atom or an alkyl group of 1 to 5 carbon atoms; and the plurality of R, $R^{29}$ and R' may be the same or different.

10. The method according to claim 3, wherein the X-$Q^1$-Rf-$SO_3^-$ in the formula (b1) is at least one anion moiety selected from the group consisting of anion moieties represented by formulae (b1-1) to (b1-8) shown below:

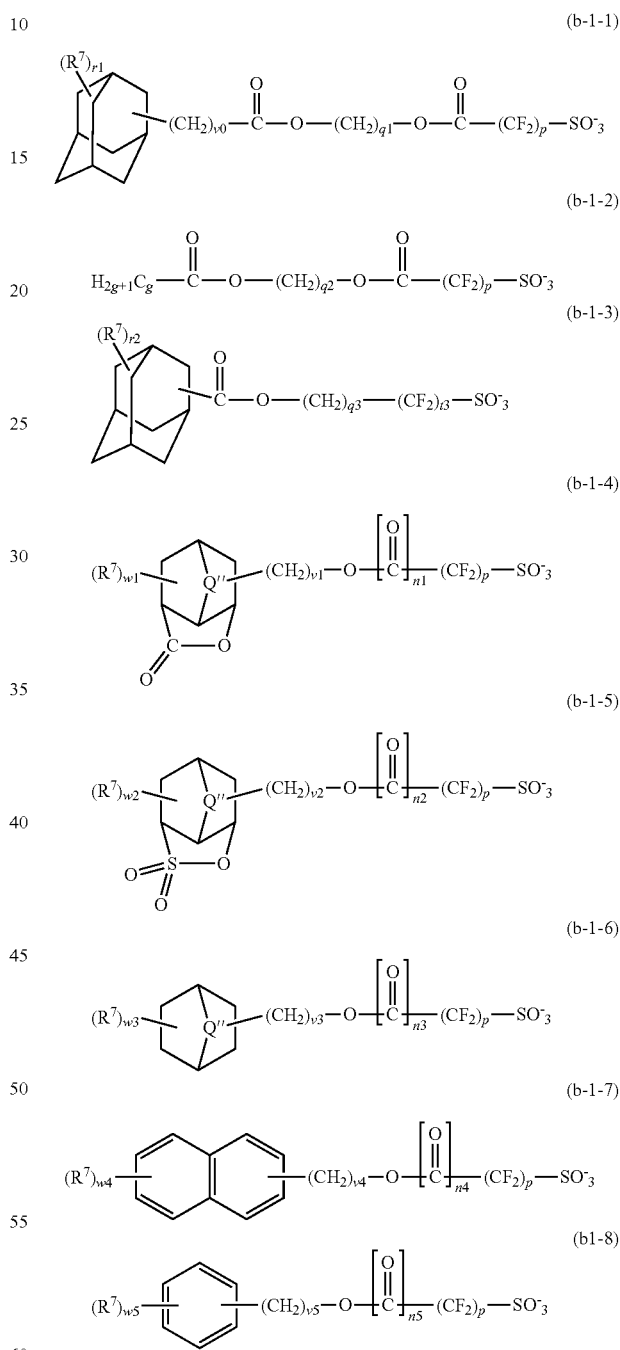

wherein p represents an integer of 1 to 3; each of q1 and q2 independently represents an integer of 1 to 5; q3 represents an integer of 1 to 12; t3 represents an integer of 1 to 3; each of r1 and r2 independently represents an integer of 0 to 3; g represents an integer of 1 to 20; $R^7$ represents a substituent; each of n1 to n5 independently represents 0 or 1; each of v0 to v5 independently represents an integer of 0 to 3; each of w1 to w5 independently represents an integer of 0 to 3; Q" represents an alkylene group of 1 to 5 carbon atoms, —O—, —S—, —O—$R^{94}$— or —S—$R^{95}$—; and $R^{94}$ and $R^{95}$ each independently represent an alkylene group of 1 to 5 carbon atoms.

11. The method according to claim 1, wherein the acid generator (B1) is a compound represented by general formula (b1) shown below:

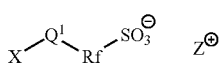
(b1)

wherein X represents a hydrocarbon group of 3 to 30 carbon atoms which may have a substituent; $Q^1$ represents a divalent linking group containing an oxygen atom; Rf represents a fluorinated alkylene group of 1 to 4 carbon atoms which may have a substituent; and $Z^+$ represents an organic cation.

12. The method according to claim 1, wherein the amount of the structural unit (a1) based on the combined total of all structural units constituting the base component (A) is 20 to 80 mol %.

13. The method according to claim 1, wherein the amount of the at least one structural unit (a2) based on the combined total of all structural units constituting the base component (A) is 20 to 80 mol %.

14. The method according to claim 1, wherein the resin component (A1) further comprises a structural unit (a0) derived from an acrylate ester containing an —$SO_2$— containing cyclic group and which may have the hydrogen atom bonded to the carbon atom on the α-position substituted with a substituent.

15. The method according to claim 1, wherein the resin component (A1) further comprises a structural unit (a3) derived from an acrylate ester containing a polar group-containing aliphatic hydrocarbon group and may have the hydrogen atom bonded to the carbon atom on the α-position substituted with a substituent.

16. The method according to claim 14, wherein the —$SO_2$-containing cyclic group is at least one group selected from the groups represented by general formulae (3-1) to (3-4) shown below:

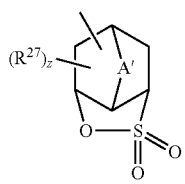
(3-1)

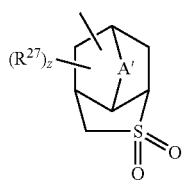
(3-2)

-continued

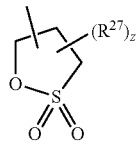
(3-3)

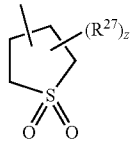
(3-4)

wherein A' represents an oxygen atom, a sulfur atom or an alkylene group of 1 to 5 carbon atoms which may contain an oxygen atom or a sulfur atom; z represents an integer of 0 to 2; and $R^{27}$ represents an alkyl group, an alkoxy group, a halogenated alkyl group, a hydroxyl group, —COOR", —OC(=O)R", a hydroxyalkyl group or a cyano group, wherein R" represents a hydrogen atom or an alkyl group.

17. The method according to claim 1, wherein the resin component (A1) comprises a combination of structural units represented by any one of formulae (A1-11), (A1-13) to (A1-21) and (A1-23) to (A1-26) shown below:

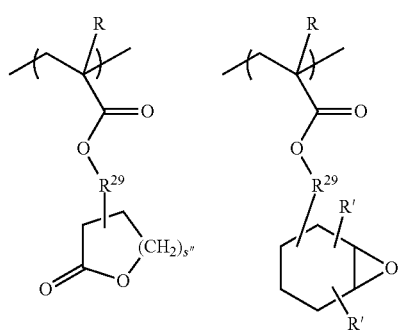
(A1-11)

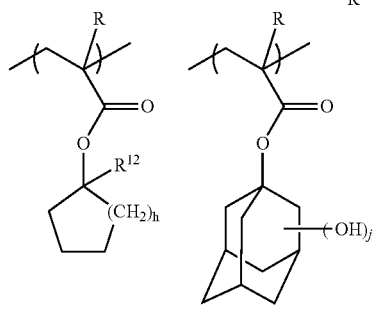

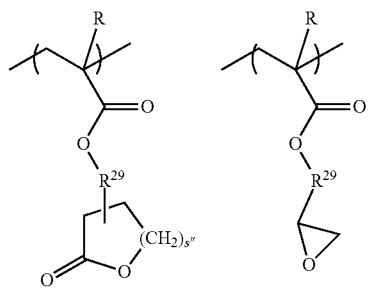
(A1-13)

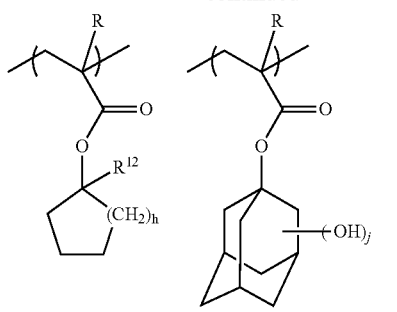
(A1-14)
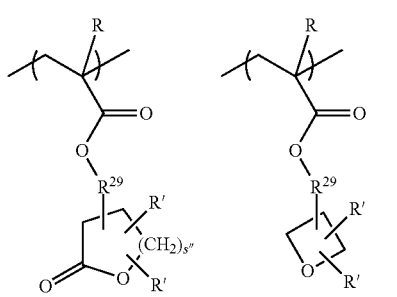
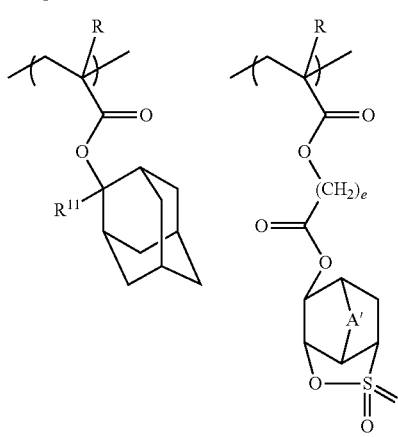
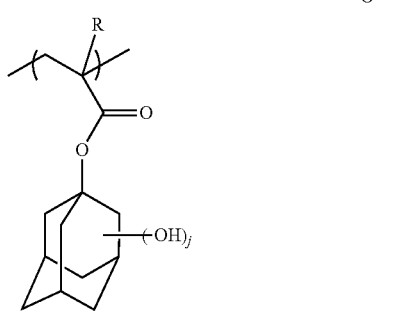
(A1-15)
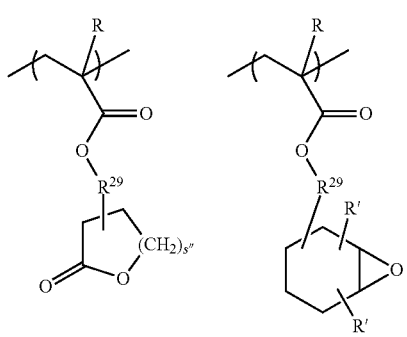
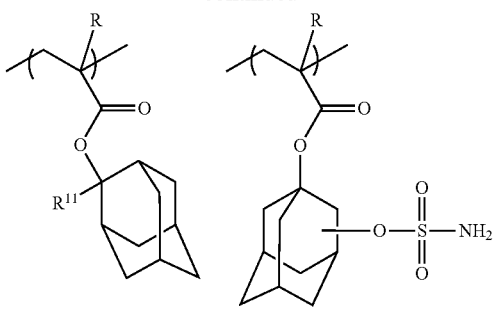
(A1-16)
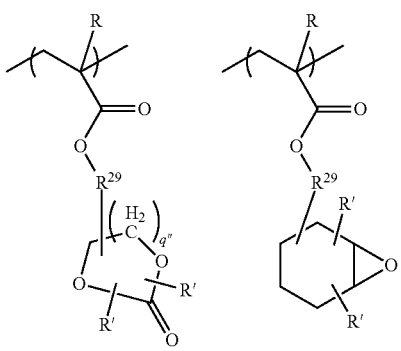
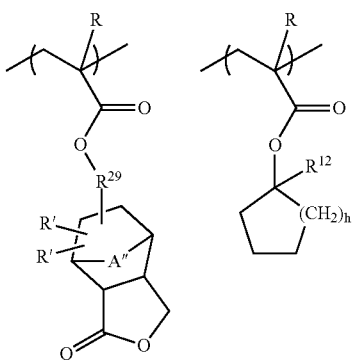
(A1-17)
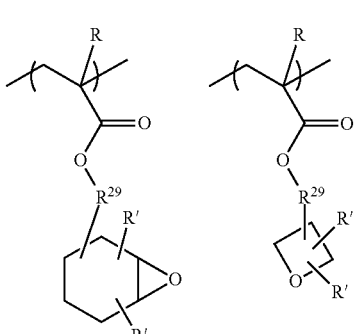
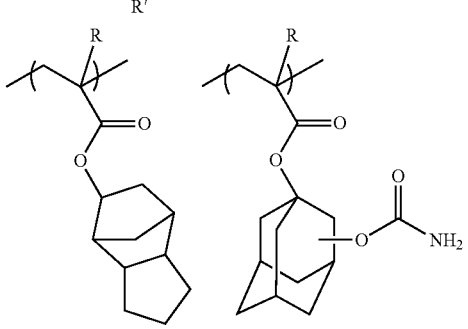

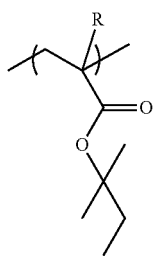
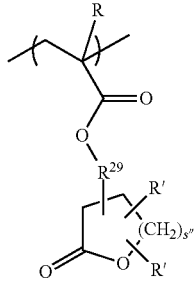
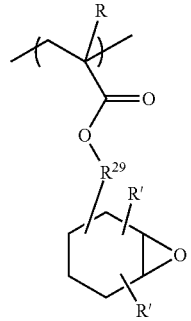
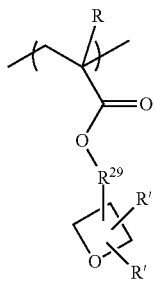
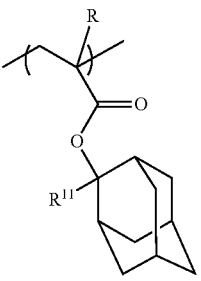
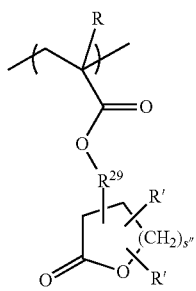
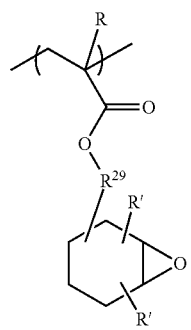
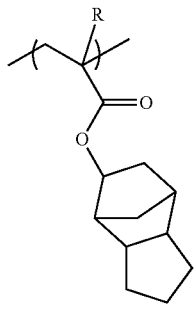
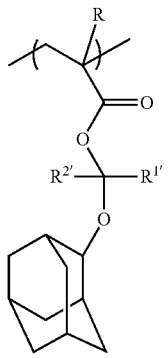
(A1-18)
(A1-19)
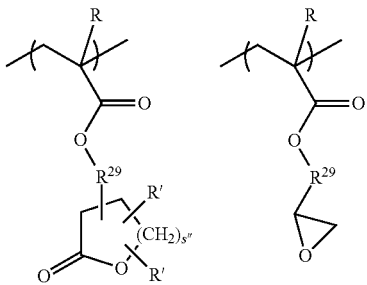
(A1-20)
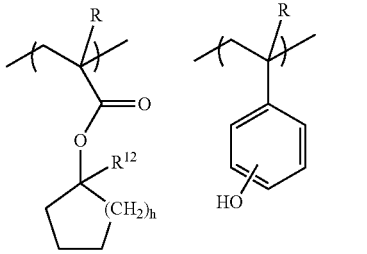
(A1-21)
(A1-23)
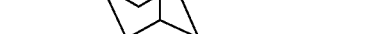

(A1-24)

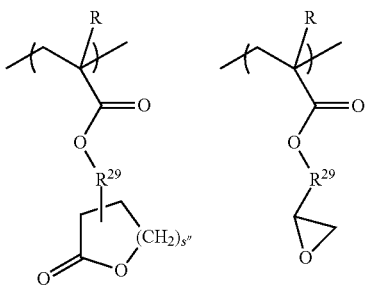

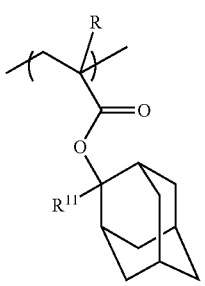

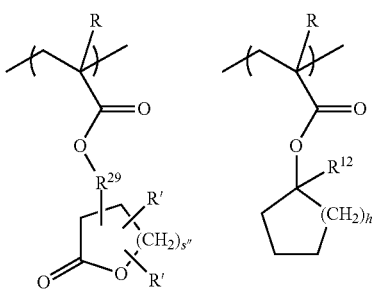

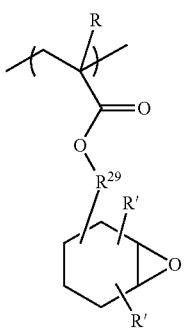

(A1-25)

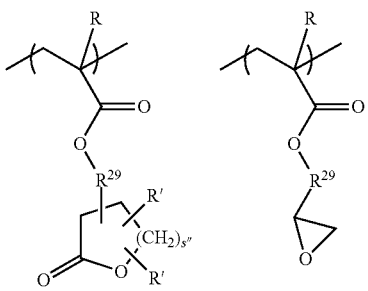

(A1-26)

-continued

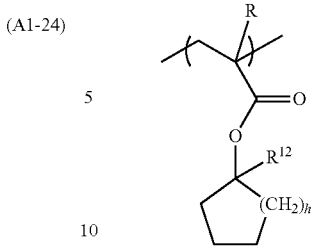

wherein R represents a hydrogen atom, an alkyl group of 1 to 5 carbon atoms or a halogenated alkyl group of 1 to 5 carbon atoms; $R^{29}$ represents a single bond or a divalent linking group; s" represents an integer of 0 to 2; R' represents a hydrogen atom, an alkyl group of 1 to 5 carbon atoms, a halogenated alkyl group of 1 to 5 carbon atoms, a cyano group, a hydroxy group, an alkoxy group of 1 to 5 carbon atoms or —COOR"; R" represents a hydrogen atom or a linear, branched or cyclic alkyl group of 1 to 15 carbon atoms; $R^{12}$ represents an alkyl group of 1 to 7 carbon atoms; and h represents an integer of 1 to 6; j represents an integer of 1 to 3; $R^{11}$ represents an alkyl group of 1 to 5 carbon atoms; e represents an integer of 1 to 3; A' represents an oxygen atom, a sulfur atom or an alkylene group of 1 to 5 carbon atoms which may contain an oxygen atom or a sulfur atom; A" represents an oxygen atom, a sulfur atom or an alkylene group of 1 to 5 carbon atoms which may contain an oxygen atom or a sulfur atom; q" represents an integer of 1 to 3; each of $R^{1\prime}$ and $R^{2\prime}$ independently represents a hydrogen atom or an alkyl group of 1 to 5 carbon atoms; and the plurality of R, $R^{29}$ and R' may be the same or different.

18. The method according to claim 11, wherein the $X\text{-}Q^1\text{-}Rf\text{-}SO_3^-$ in the formula (b1) is at least one anion moiety selected from the group consisting of anion moieties represented by formulae (b1-1) to (b1-8) shown below:

(b1-1)
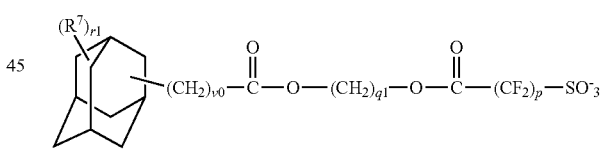

(b1-2)
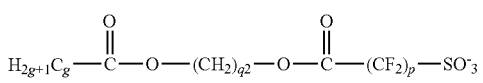

(b1-3)
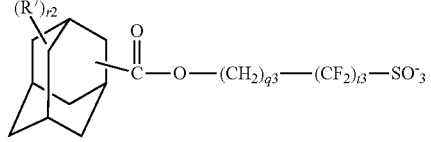

(b1-4)
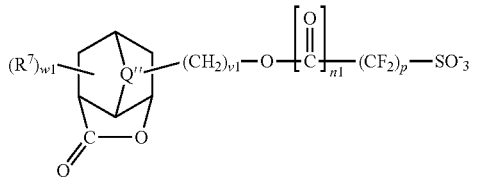

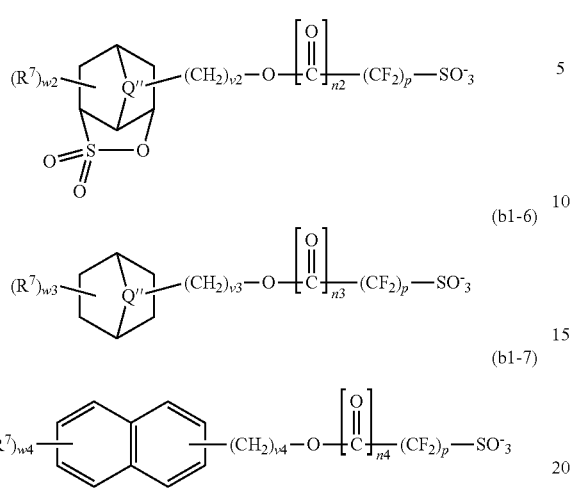
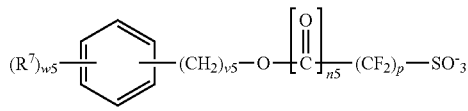

wherein p represents an integer of 1 to 3; each of q1 and q2 independently represents an integer of 1 to 5; q3 represents an integer of 1 to 12; t3 represents an integer of 1 to 3; each of r1 and r2 independently represents an integer of 0 to 3; g represents an integer of 1 to 20; $R^7$ represents a substituent; each of n1 to n5 independently represents 0 or 1; each of v0 to v5 independently represents an integer of 0 to 3; each of w1 to w5 independently represents an integer of 0 to 3; Q″ represents an alkylene group of 1 to 5 carbon atoms, —O—, —S—, —O—$R^{94}$— or —S—$R^{95}$—; and $R^{94}$ and $R^{95}$ each independently represent an alkylene group of 1 to 5 carbon atoms.

* * * * *

UNITED STATES PATENT AND TRADEMARK OFFICE
CERTIFICATE OF CORRECTION

PATENT NO. : 9,134,617 B2
APPLICATION NO. : 14/125020
DATED : September 15, 2015
INVENTOR(S) : Takahiro Senzaki et al.

It is certified that error appears in the above-identified patent and that said Letters Patent is hereby corrected as shown below:

Specification
Col. 1, line 14, "2011, 2011," should be -- 2011, --.
Col. 1, line 22, "copolymer" should be -- copolymer. --.
Col. 1, lines 23-26, above "DESCRIPTION OF RELATED ART" delete "Priority is claimed on Japanese Patent Application No. 2011-130689, filed Jun. 10, 2011, and Japanese Patent Application No. 2011-285196, filed Dec. 27, 2011, the contents of which are incorporated herein by reference.".
Col. 10, line 6, "(—C(C=O)—O—)." should be -- (—C(=O)—O—). --.
Col. 17, lines 17-19, "—C(C=O)—O—, —C(C=O)—, —O—C(C=O)—O—, —C(C=O)—NH—," should be -- "—C(=O)—O—, —C(=O)—, —O—C(=O)—O—, —C(=O)—NH—, --.
Col. 51, line 6, "tert-butyl oxycarbonylmethyl" should be -- tert-butyloxycarbonylmethyl --.
Col. 51, lines 6-7, "tert-butyloxycarbonyl ethyl" should be -- tert-butyloxycarbonylethyl --.
Col. 51, line 31, "—C(C=O)—O—" should be -- —C(=O)—O— --.
Col. 51, line 32, "—(CH$_2$)$_1$—C(C=O)—O—" should be -- —(CH$_2$)$_f$—C(=O)—O— --.
Col. 51, line 67, "(all-1-1)" should be -- (a11-1-1) --.
Col. 52, lines 65-66, "(—C(C=O)—O—)" should be -- (—C(=O)—O—) --.
Col. 54, line 17, "—O—C(C=O)—" should be -- —O—C(=O)— --.
Col. 54, line 29, "β-propionolactone," should be -- β-propiolactone, --.
Col. 56, line 28, "(—C(C=O)—O—)" should be -- (—C(=O)—O—) --.
Col. 76, line 50, after "(—O—)," insert -- a --.
Col. 83, line 2, "—A—O—C(C=O)—B—" should be -- —A—O—C(=O)—B— --.
Col. 87, line 47, "2-norbonyl" should be -- 2-norbornyl --.
Col. 87, line 47, "3-norbonyl" should be -- 3-norbornyl --.
Col. 88, line 4, "(A)" should be -- (a0) --.

Signed and Sealed this
Seventh Day of June, 2016

Michelle K. Lee
*Director of the United States Patent and Trademark Office*

CERTIFICATE OF CORRECTION (continued)
U.S. Pat. No. 9,134,617 B2

Col. 93, lines 41-52:

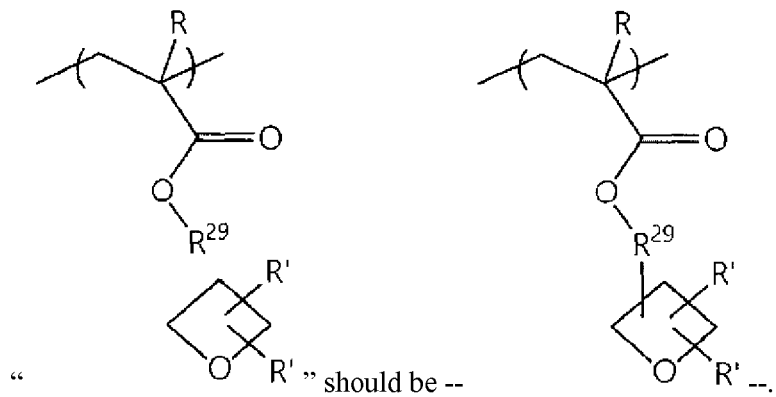

Col. 94, lines 55-63:

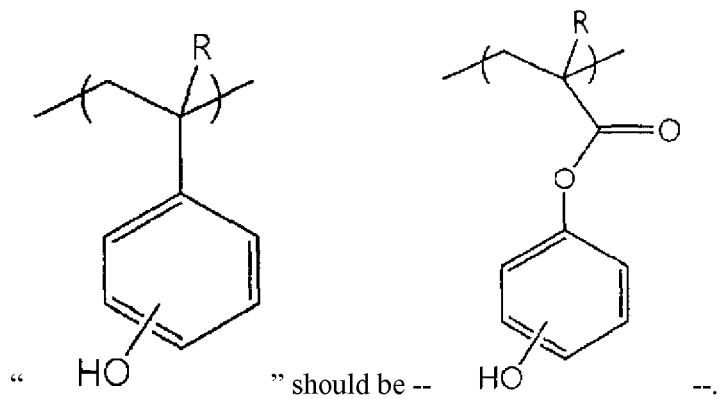

Col. 97, line 60, "$R^{4\prime\prime}$represents" should be -- $R^{4\prime\prime}$ represents --.
Col. 100, lines 8-10, "—C(C=O)—O—, —C(C=O)—, —O—C(C=O)—O—, —C(C=O)—NH—," should be -- —C(=O)—O—, —C(=O)—, —O—C(=O)—O—, —C(=O)—NH—, --.
Col. 101, line 25, "—C(C=O)—O—," should be -- —C(=O)—O—, --.
Col. 103, line 16, "(—C(C=O)—O—)," should be -- (—C(=O)—O—), --.
Col. 103, line 18, "(—C(C=O)—NH—)," should be -- (—C(=O)—NH—), --.
Col. 103, line 19, "(—O—C(C=O)—O—);" should be -- (—O—C(=O)—O—); --.
Col. 103, line 24, "anlkylene" should be -- an alkylene --.
Col. 103, line 25, "—C(=O)—O—$R^{93}$—O—C(C=O)—" should be
-- —C(=O)—O—$R^{93}$—O—C(=O)— --.
Col. 103, lines 47-48, "—$R^{92}$—O—C(C=O)— or —C(=O)—O—$R^{93}$—O—C(C=O)—" should be
-- —$R^{92}$—O—C(=O)— or —C(=O)—O—$R^{93}$—O—C(=O)— --.
Col. 106, line 61, "and R" should be -- and $R^{10}$ --.
Col. 112, line 39, "(methylsulfonyloxyimino)" should be -- -α-(methylsulfonyloxyimino) --.
Col. 112, line 46, "α-(cyclohexyl sulfonyloxyimino)-" should be
-- α-(cyclohexylsulfonyloxyimino)- --.
Col. 113, lines 6-8:

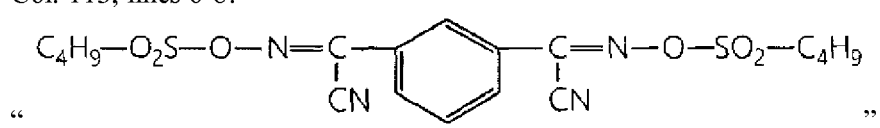

should be

CERTIFICATE OF CORRECTION (continued)
U.S. Pat. No. 9,134,617 B2

--     --.

Col. 117, lines 8-12:

" 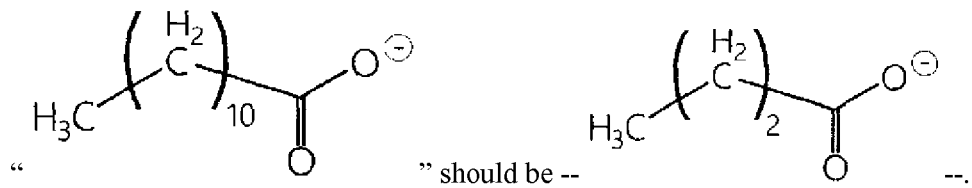 " should be -- --.

Col. 118, lines 63-64, "—O—C(C=O)—R$^{C3}$" should be -- —O—C(=O)—R$^{C3}$ --.
Col. 119, line 51, "—O—C(=O)—C(R$^{C2}$)=CH$_2$ (R$^{C2}$," should be
-- —O—C(=O)—C(R$^{C2'}$)=CH$_2$ (R$^{C2'}$ --.
Col. 119, lines 52-53, "—O—C(C=O)—R$^{C3'}$" should be -- —O—C(=O)—R$^{C3'}$ --.
Col. 138, line 23, "perfluoroalkyl amine" should be -- perfluoroalkylamine --.
Col. 138, line 45, "C—C(C=O)—O—C" should be -- C—C(=O)—O—C --.
Col. 138, line 67, "acetyl carbinol," should be -- acetylcarbinol, --.
Col. 140, line 7, perfluoronpetane;" should be -- perfluoropentane; --.
Col. 141, line 66, "(telomer" should be -- (telomere --.
Col. 142, line 33, "C$_3$F$_{17}$" should be -- C$_8$F$_{17}$ --.
Col. 144, line 58, "-pyrolidone," should be -- pyrrolidone, --.
Col. 148, line 21, "diphenyl ether," should be -- diphenylether, --.
Col. 173, line 37, "6=0.60)." should be -- σ=0.60). --.
Col. 173, line 38, "(PES)" should be -- (PEB) --.
Col. 184, line 35, "(PAS)" should be -- (PAB) --.
Claims
Col. 187, line 17 (claim 1), after "hydrogen" insert -- atom, an alkyl group --.
Col. 188, line 40 (claim 2), after "hydrogen" insert -- atom, an alkyl group --.
Col. 196, line 10 (claim 10), "(b-1-1)" should be -- (b1-1) --.
Col. 196, line 17 (claim 10), "(b-1-2)" should be -- (b1-2) --.
Col. 196, line 21 (claim 10), "(b-1-3)" should be -- (b1-3) --.
Col. 196, line 27 (claim 10), "(b-1-4)" should be -- (b1-4) --.
Col. 196, line 36 (claim 10), "(b-1-5)" should be -- (b1-5) --.
Col. 196, line 44 (claim 10), "(b-1-6)" should be -- (b1-6) --.
Col. 196, line 50 (claim 10), "(b-1-7)" should be -- (b1-7) --.
Col. 197, line 9 (claim 11), "claim 1," should be -- claim 2, --.
Col. 197, line 25 (claim 12), "claim 1," should be -- claim 2, --.
Col. 197, line 29 (claim 13), "claim 1," should be -- claim 2, --.
Col. 197, line 33 (claim 14), "claim 1," should be -- claim 2, --.
Col. 197, line 40 (claim 15), "claim 1," should be -- claim 2, --.
Col. 198, line 25 (claim 17), "claim 1," should be -- claim 2, --.